(12) United States Patent
Nikitin

(10) Patent No.: US 9,917,570 B2
(45) Date of Patent: *Mar. 13, 2018

(54) METHOD AND APPARATUS FOR SIGNAL FILTERING AND FOR IMPROVING PROPERTIES OF ELECTRONIC DEVICES

(71) Applicant: Avatekh, Inc., Lawrence, KS (US)

(72) Inventor: Alexei V. Nikitin, Lawrence, KS (US)

(73) Assignee: Avatekh, Inc., Lawrence, KS (US)

( * ) Notice: Subject to any disclaimer, the term of this patent is extended or adjusted under 35 U.S.C. 154(b) by 89 days.

This patent is subject to a terminal disclaimer.

(21) Appl. No.: 15/271,819

(22) Filed: Sep. 21, 2016

(65) Prior Publication Data

US 2017/0012608 A1 Jan. 12, 2017

Related U.S. Application Data

(63) Continuation of application No. 14/159,033, filed on Jan. 20, 2014, now Pat. No. 9,467,113, which is a
(Continued)

(51) Int. Cl.
*H03M 1/84* (2006.01)
*H03M 1/88* (2006.01)
(Continued)

(52) U.S. Cl.
CPC ...... *H03H 17/0219* (2013.01); *H03H 7/0153* (2013.01); *H03H 11/1256* (2013.01);
(Continued)

(58) Field of Classification Search
CPC ........................................... G06G 7/02
(Continued)

(56) References Cited

U.S. PATENT DOCUMENTS 7,107,306 B2 9/2006 Nikitin
7,133,568 B2 11/2006 Nikitin et al.
(Continued)

OTHER PUBLICATIONS

Assessment of compatibility of planned LightSquared Ancillary Terrestrial Component transmissions in the 1526-1536 MHz band with certified aviation GPS receivers. Federal Aviation Administration status report, Jan. 25, 2012.
(Continued)

*Primary Examiner* — Peguy Jean Pierre
(74) *Attorney, Agent, or Firm* — Erickson Kernell IP, LLC

(57) ABSTRACT

The present invention relates to nonlinear signal processing, and, in particular, to adaptive nonlinear filtering of real-, complex-, and vector-valued signals utilizing analog Nonlinear Differential Limiters (NDLs), and to adaptive real-time signal conditioning, processing, analysis, quantification, comparison, and control. More generally, this invention relates to methods, processes and apparatus for real-time measuring and analysis of variables, and to generic measurement systems and processes. This invention also relates to methods and corresponding apparatus for measuring which extend to different applications and provide results other than instantaneous values of variables. The invention further relates to post-processing analysis of measured variables and to statistical analysis. The NDL-based filtering method and apparatus enable improvements in the overall properties of electronic devices including, but not limited to, improvements in performance, reduction in size, weight, cost, and power consumption, and, in particular for wireless devices, NDLs enable improvements in spectrum usage efficiency.

36 Claims, 156 Drawing Sheets

Basic Nonlinear Differential Limiter (NDL)

Related U.S. Application Data continuation-in-part of application No. 13/715,724, filed on Dec. 14, 2012, now Pat. No. 9,117,099, and a continuation-in-part of application No. 13/662,127, filed on Oct. 26, 2012, now Pat. No. 8,489,666, and a continuation of application No. 13/599,866, filed on Aug. 30, 2012, now Pat. No. 8,990,284.

(60) Provisional application No. 61/754,788, filed on Jan. 21, 2013, provisional application No. 61/762,650, filed on Feb. 8, 2013, provisional application No. 61/783,861, filed on Mar. 14, 2013, provisional application No. 61/873,135, filed on Sep. 3, 2013.

(51) Int. Cl.
| | | |
|---|---|---|
| *H03H 17/02* | (2006.01) | |
| *H03H 7/01* | (2006.01) | |
| *H03H 11/12* | (2006.01) | |
| *H03H 21/00* | (2006.01) | |
| *H03M 1/12* | (2006.01) | |
| *H03H 11/24* | (2006.01) | |

(52) U.S. Cl.
CPC .... *H03H 11/1291* (2013.01); *H03H 17/0201* (2013.01); *H03H 21/0001* (2013.01); *H03H 21/0016* (2013.01); *H03M 1/1235* (2013.01); *H03H 11/24* (2013.01); *H03H 2210/043* (2013.01)

(58) Field of Classification Search
USPC .................................. 341/138, 143, 155, 144
See application file for complete search history.

(56) References Cited

U.S. PATENT DOCUMENTS

| | | | |
|---|---|---|---|
| 7,242,808 B2 | 7/2007 | Nikitin et al. | |
| 7,259,704 B2* | 8/2007 | Mallinson ............ | H03M 3/344 341/143 |
| 7,418,469 B2 | 8/2008 | Nikitin | |
| 7,617,270 B2 | 11/2009 | Nikitin | |
| 2011/0112784 A1 | 5/2011 | Nikitin | |
| 2012/0141122 A1* | 6/2012 | Carusone ........... | H04B 10/6971 398/37 |

OTHER PUBLICATIONS

A. Nikitin; R. Davidchack, T. Sobering, Adaptive Analog Nonlinear Algorithms and Circuits for Improving Signal Quality in the Presence of Technogenic Interference.
S. H. Ardalan and J. J. Paulos. An analysis of nonlinear behavior in delta-sigma modulators. IEEE Transactions on Circuits and Systems, CAS-34(6), 1987.
S. A. Bhatti, Q. Shan, R. Atkinson, M. Vieira, and I. A. Glover. Vulnerability of Zigbee to impulsive noise in electricity substations. In General Assembly and Scientific Symposium, 2011 XXXth URSI, Aug. 13-20, 2011.
R. Bracewell. The Fourier Transform and Its Applications, chapter "Heaviside's Unit Step Function, $H_{(x)}$", pp. 61-65. McGraw-Hill, New York, 3rd edition, 2000.
J. Carey. Noise wars: Projected capacitance strikes back against internal noise. EDN, pp. 61-65, Jan. 19, 2012.
A. Chopra. Modeling and Mitigation of Interference in Wireless Receivers with Multiple Antennae. Phd thesis, The University of Texas at Austin, Dec. 2011.
A. Nikitin, K. Davidchack, J. Smith. Out-of-Band and Adjacent-Channel Interference Reduction by Analog Nonlinear Filters. Mathematics in Defence 2013.
R. Dragomir, S. Puscoci, and D. Dragomir. A synthetic impulse noise environment for DSL access networks. In Proceedings of the 2nd International conference on Circuits, Systems, Control, Signals (CSCS'11) pp. 116-119, 2011.
C. Fischer. Analysis of cellular CDMA systems under UWB interference. In International Zurich Seminar on Communications, pp. 130-133, Feb. 22-24, 2006.
T. B. Gabrielson. Mechanical-thermal noise in micromachined acoustic and vibration sensors. IEEE Transactions on Electron Devices, 40(5): 903-909, 1993.
V. Guillet, G. Lamarque, P. Ravier, and C. Leger. Improving the power line communication signal-to-noise ratio during a resistive load commutation. Journal of Communications, 4(2): 126-132, 2009.
F. Leferink, F. Silva, J. Catrysse, S. Batterman, V. Beauvois, and A. Roc'h. Man-made noise in our living environments. Radio Science Bulletin, (334):49-57, Sep. 2010.
S. R. Mallipeddy and R. S. Kshetrimayum. Impact of UWB interference on IEEE 802.11a WLAN system. In National Conference on Communications (NCC), Jan. 29-31, 2010.
F. Mohd-Yasin, D. J. Nagel, and C. E. Korman. Noise in MEMS. Meas. Sci. Technol., 21 (012001), 2010.
A. V. Nikitin and R. L. Davidchack. Signal analysis through analog representation. Proc. R. Soc. Lond. A, 459 (2033):1171-1192, 2003.
A. V. Nikitin, M. Epard, J. B. Lancaster, R. L. Lutes, and E. A. Shumaker. Impulsive interference in communication channels and its mitigation by SPART and other nonlinear filters, EURASIP Journal on Advances in Signal Processing, 2012 (79), 2012.
A. V. Nikitin. On the impulsive nature of interchannel interference in digital communication systems. In Proc. IEEE Radio and Wireless Symposium, pp. 118-121, Phoenix, AZ, 2011.
A. V. Nikitin, On the interchannel interference in digital communication systems, its impulsive nature, and its mitigation. EURASIP Journal on Advances in Signal Processing, 2011 (137),2011.
C. R. Popa. High-accuracy function synthesizer circuit with applications in signal processing. EURASIP Journal on Advances in Signal Processing, 2012 (146), 2012.
R. P. Sallen and E. L. Key. A practical method of designing RC active filters. IRE Transactions on Circuit Theory, CT-2: 78-85, 1955.
C. E. Shannon. Communication in the presence of noise. Proc. Institute of Radio Engineers, 37(1): 10-21, Jan. 1949.
I. Shanthi and M. L. Valarmathi. Speckle noise suppression of SAR image using hybrid order statistics filters. International Journal of Advanced Engineering Sciences and Technologies (IJAEST 5(2)229-235, 2011.
G. H. Stauffer. Finding the lumped element varactor diode model. High Frequency Electronics, 2(6)22-28, Nov. 2003.
Yang and A. P. Petropulu. Co-channel interference modeling and analysis in a poisson field of interferers in wireless communications. IEEE Transactions on Signal Processing, 51(1): 64-76, 2003.
Y. Zheng. Operational transconductance amplifiers for gigahertz applications. Phd thesis, Queen's University, Kingston, Ontario, Canada, Sep. 2008.
JF Adlard, TC Tozer, AG Burr, Interference Rejection in Impulsive Noise for VLF Communications, Comm Research Group, Dept of Electronics, University of York, UK (1999).
Ambike, Ilow, Hatzinakos, Detection for Binary Transmission in a Mixture of Gaussian Noise & Impulsive Noise Modeled as an Alpha-Stable Process, Dept of Elec., Univ Toronto.
Han-Nien Lin, Analysis of Platform Noise Effect on Performance of Wireless Communication Devices, Feng-Chia Univ. Taiwain, ROC.
B Minch, Analysis & Synthesis of Static Translinear Circuits, Computer Systems Laboratory, Cornell Univ, Tech Rpt CSL-TR-2000-1002, Mar. 2000.

* cited by examiner (a) 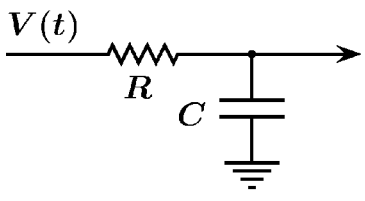
(b) 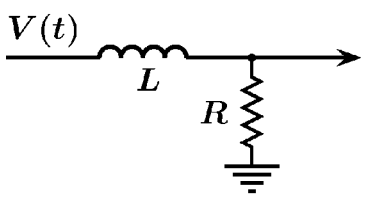
(c) 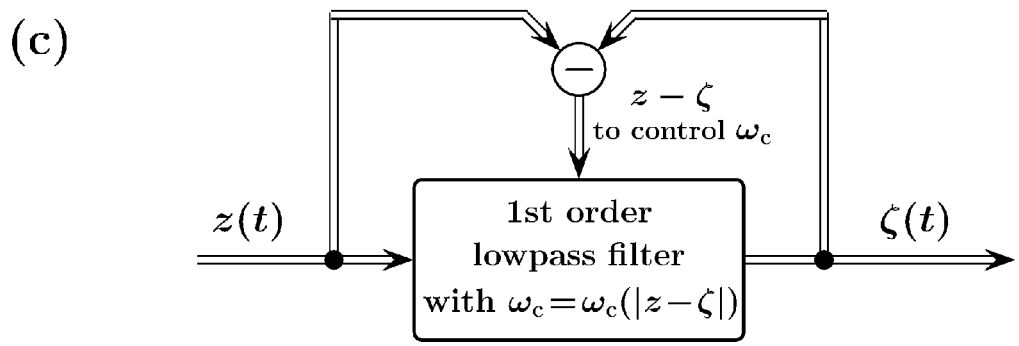
Fig. 9

$$\zeta(t) = z(t) - 2RC\,\dot\zeta(t) - 2\,(RC)^2\,\ddot\zeta(t)$$

$$\left(\tau = 2RC,\quad Q = \frac{1}{\sqrt{2}},\quad R = R\,(|z - \zeta|)\right)$$

Input (thin line), rec. moving window median (dashed)
and respective small-$\alpha$ DcL output (larger $\alpha$).
Rectangular moving window mean is shown by dotted line
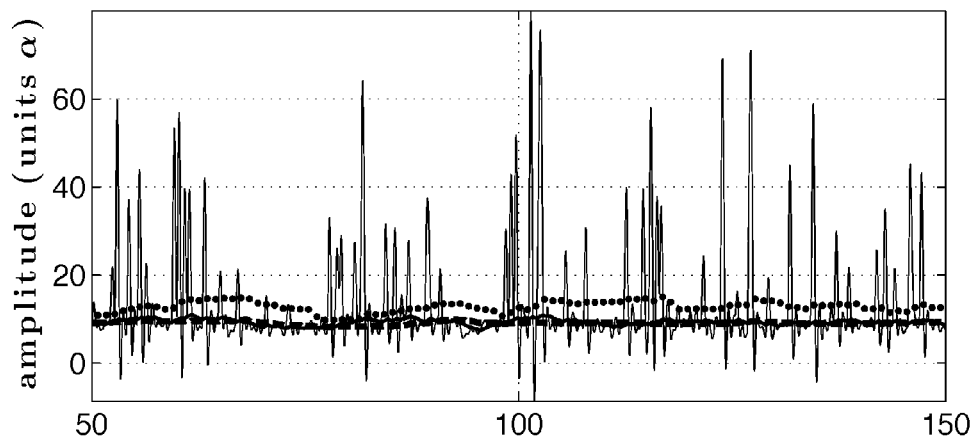
Input (thin line), rec. moving window median (dashed)
and respective small-$\alpha$ DcL output (10 times smaller $\alpha$).
Rectangular moving window mean is shown by dotted line
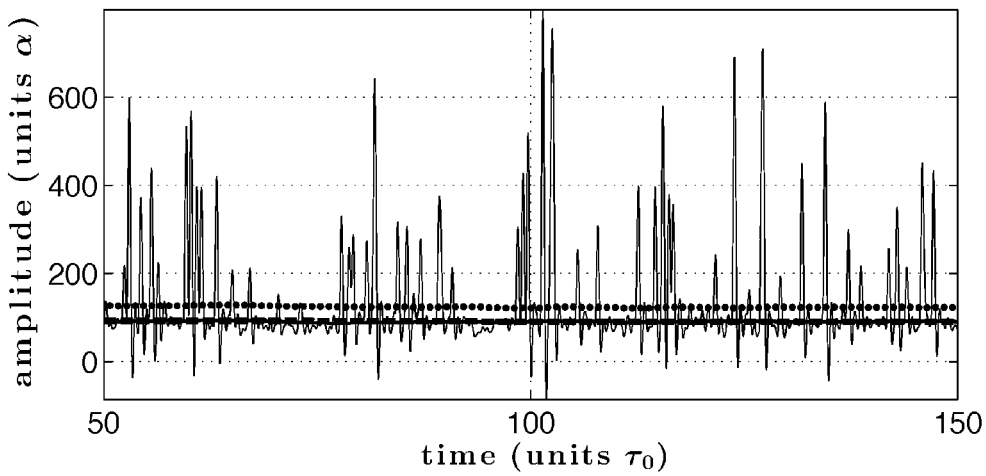
Fig. 16

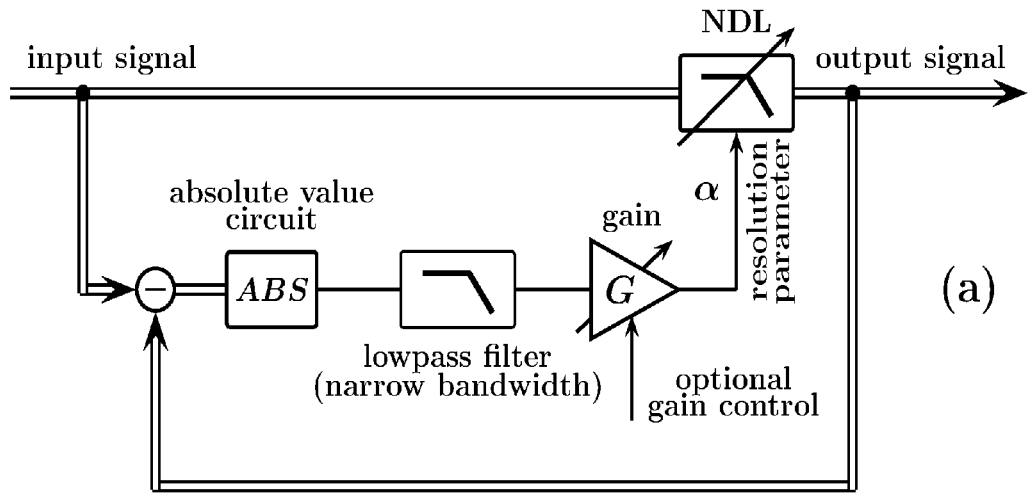
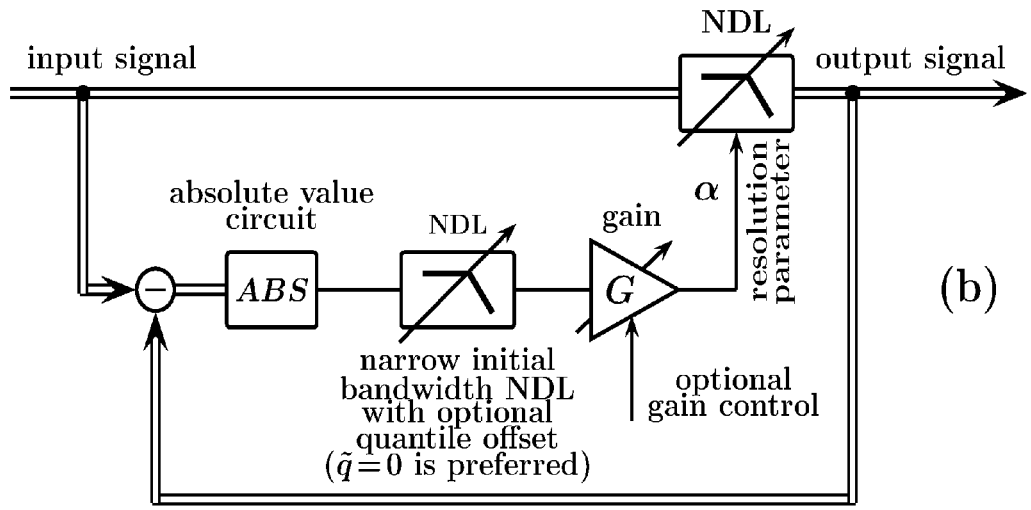
Fig. 24

Adaptive NDL (lowpass-based resolution setting)
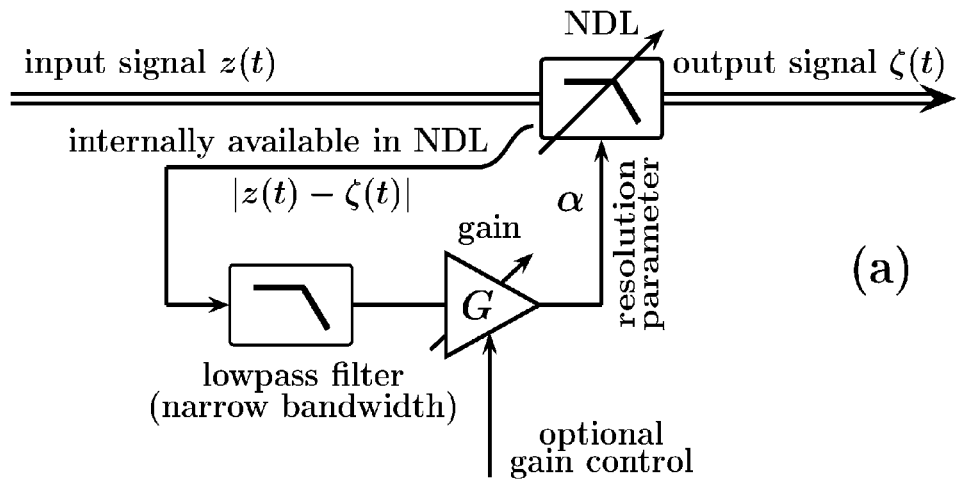
(a)
Adaptive NDL (NDL-based resolution setting)
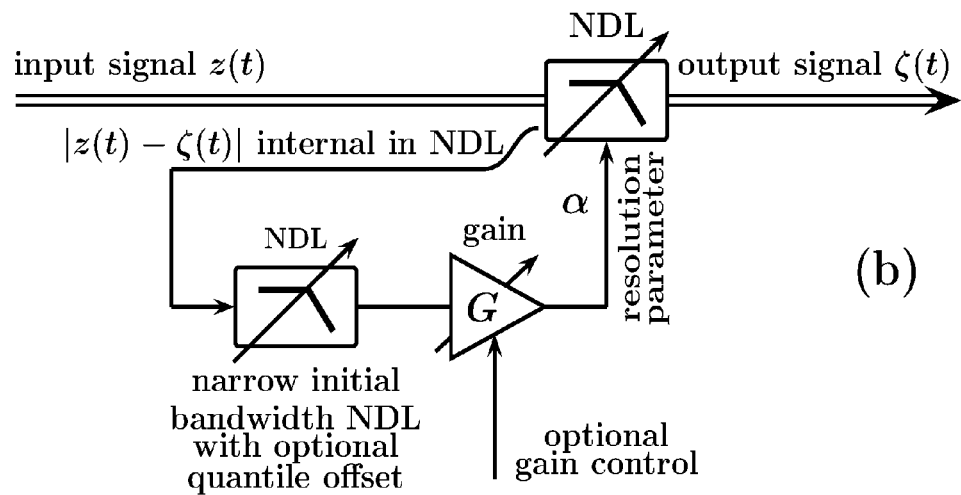
(b)
Fig. 25

$$I_c = \alpha\, g_m \times \begin{cases} \frac{x-\chi}{\alpha} & \text{for } |x-\chi| \leq \alpha \\ \text{sign}(x-\chi) & \text{otherwise} \end{cases}$$

$$\chi(t) = \frac{1}{C}\int dt \left[ \frac{x(t) - \chi(t)}{R(|x - \chi|)} + \tilde{q}\alpha g_m \right],$$

where $R(|x - \chi|) = \dfrac{1}{g_m} \times \begin{cases} 1 & \text{for } |x - \chi| \leq \alpha \\ \dfrac{|x-\chi|}{\alpha} & \text{otherwise} \end{cases}$ $$I_c = \alpha\, g_m \left( \tilde{q} + \begin{cases} \frac{x-\chi}{\alpha} & \text{for } |x-\chi| \leq \alpha \\ \text{sign}(x-\chi) & \text{otherwise} \end{cases} \right)$$

$$\tau = L\frac{\beta}{K} \times \begin{cases} 1 & \text{for } |x - \chi| \leq \alpha \\ \frac{|x-\chi|}{\alpha} & \text{otherwise} \end{cases}$$

if $\dfrac{1}{R(V_c)} = \beta V_c$ and $V_c = \dfrac{1}{K} \times \begin{cases} 1 & \text{for } |x - \chi| \leq \alpha \\ \frac{|x-\chi|}{\alpha} & \text{otherwise} \end{cases}$

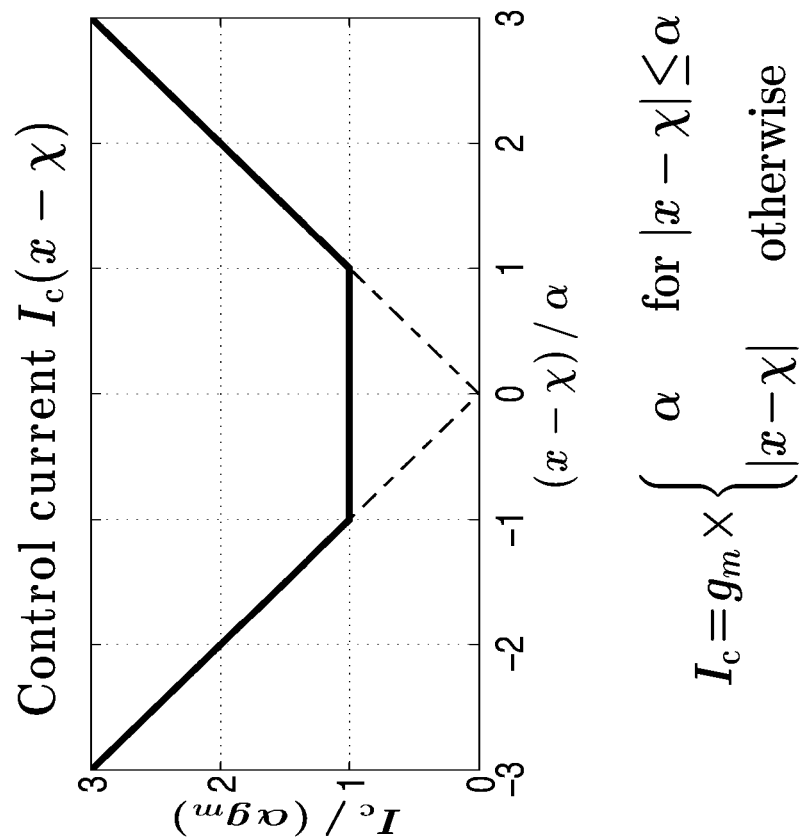
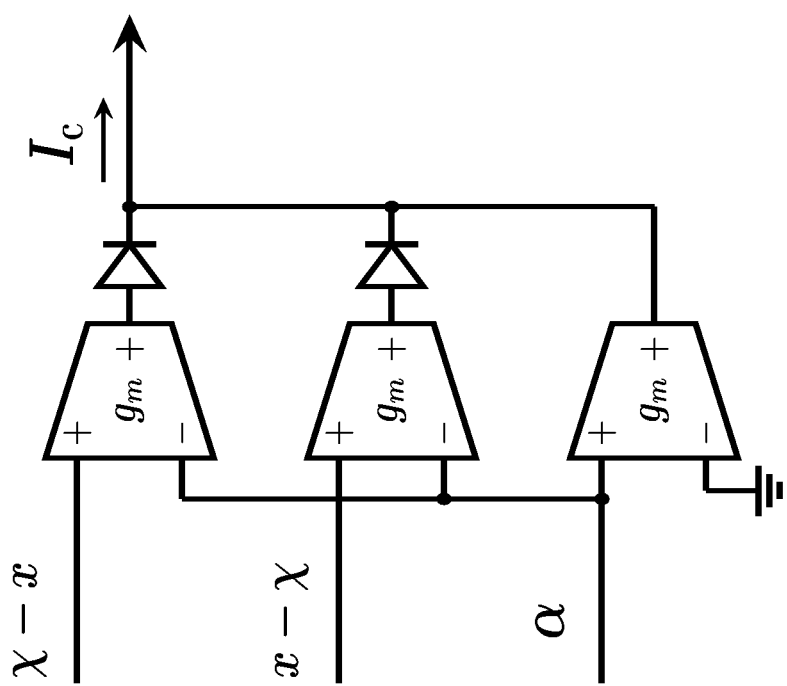
Fig. 47

Example of odd order NDL-based lowpass filter

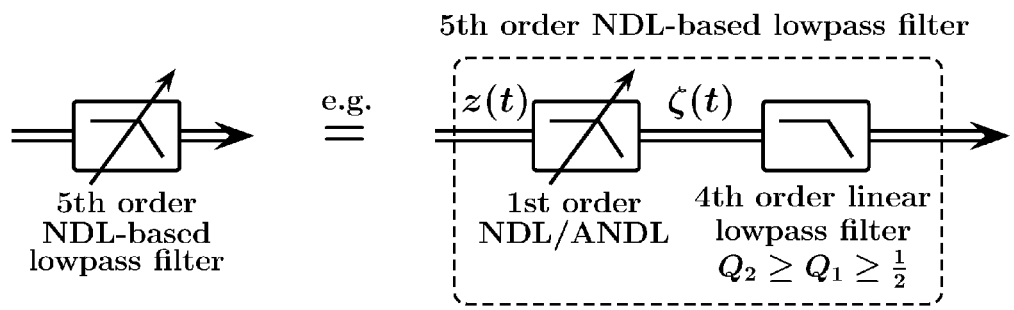

5th order NDL-based lowpass filter

5th order NDL-based lowpass filter

1st order NDL/ANDL

4th order linear lowpass filter $Q_2 \geq Q_1 \geq \frac{1}{2}$

Pole-zero diagram

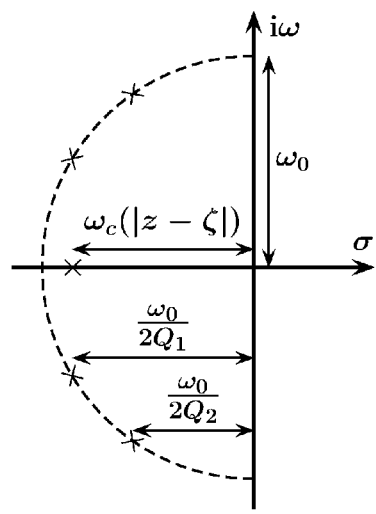

$\omega_c(|z|)$ is non-increasing function of $|z|$:

$$\omega_c(|z| + \varepsilon) \leq \omega_c(|z|) \leq \omega_0 \quad \text{for} \quad \varepsilon > 0$$

E.g. for 1st order CDL:

$$\omega_c(|z - \zeta|) = \omega_0 \times \begin{cases} 1 & \text{for } |z - \zeta| \leq \alpha \\ \frac{\alpha}{|z-\zeta|} & \text{otherwise} \end{cases}$$

Fig. 57

Example of odd order NDL-based lowpass filter

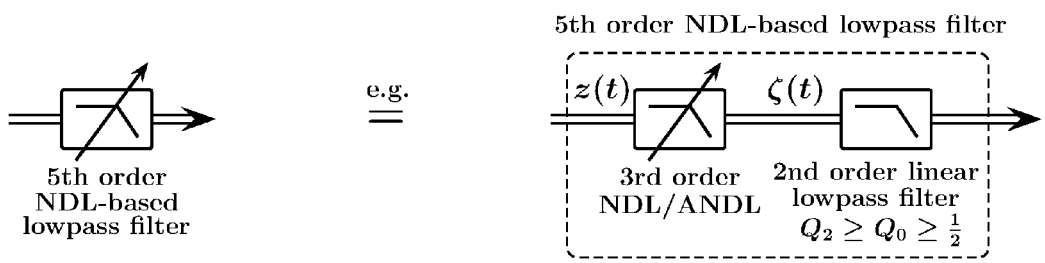

5th order NDL-based lowpass filter e.g. =

5th order NDL-based lowpass filter

3rd order NDL/ANDL

2nd order linear lowpass filter $Q_2 \geq Q_0 \geq \frac{1}{2}$

Pole-zero diagram

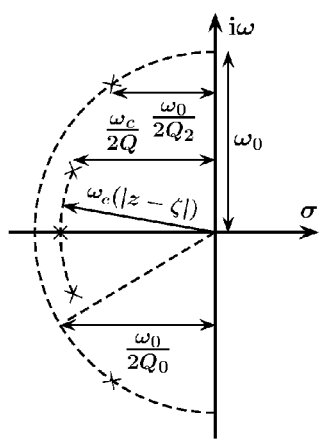

$\omega_c(|z|)$ and $Q(|z|)$ are non-increasing functions of $|z|$:

$$\omega_c(|z| + \varepsilon) \leq \omega_c(|z|) \leq \omega_0 \quad \text{for} \quad \varepsilon > 0$$

and $$Q(|z| + \varepsilon) \leq Q(|z|) \leq Q_0 \quad \text{for} \quad \varepsilon > 0$$

E.g. for 3rd order CDL:

$$\omega_c(|z - \zeta|) = \omega_0 \times \begin{cases} 1 & \text{for } |z - \zeta| \leq \alpha \\ \frac{\alpha}{|z-\zeta|} & \text{otherwise} \end{cases}$$

and $Q(|z|) = Q_0 = \text{const}$

Fig. 58

Example of even order NDL-based lowpass filter

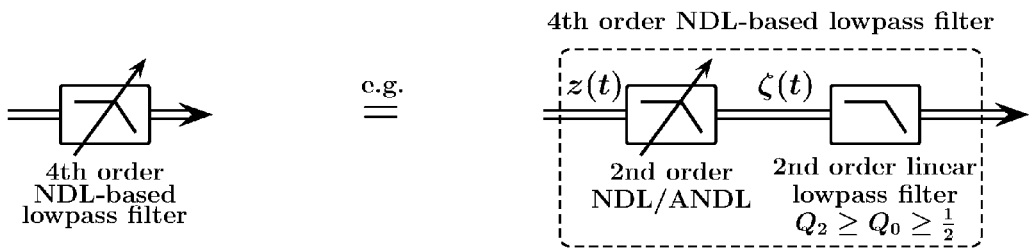

Pole-zero diagram

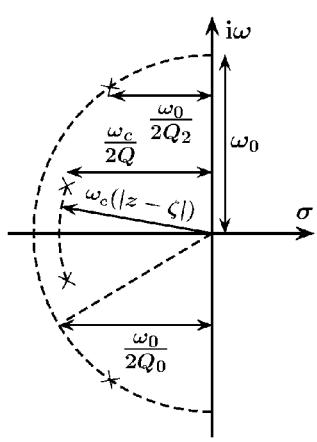

$\omega_c(|z|)$ and $Q(|z|)$ are non-increasing functions of $|z|$:

$$\omega_c(|z| + \varepsilon) \leq \omega_c(|z|) \leq \omega_0 \quad \text{for} \quad \varepsilon > 0$$

and $$Q(|z| + \varepsilon) \leq Q(|z|) \leq Q_0 \quad \text{for} \quad \varepsilon > 0$$

E.g. for 2nd order CDL:

$$\omega_c(|z - \zeta|) = \omega_0 \times \begin{cases} 1 & \text{for } |z - \zeta| \leq \alpha \\ \frac{\alpha}{|z-\zeta|} & \text{otherwise} \end{cases}$$

and $Q(|z|) = Q_0 = \text{const}$

Fig. 59

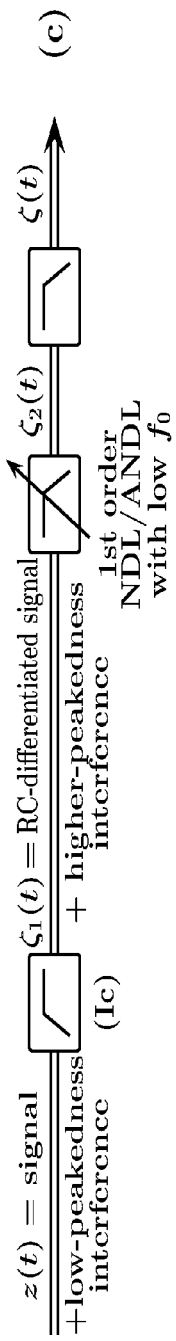
Fig. 64

Recipe for constructing an improved NDL-based filter

Original linear filter

| Linear filter comprising a lowpass stage |

Equivalent linear filter

| Linear filter comprising a 1st sequence of stages followed by a lowpass stage |
| Optionally comprising a 2nd sequence of stages following the lowpass stage |

Improved NDL-based filter

| Filter comprising a 1st sequence of linear stages followed by an NDL stage wherein the 1st sequence of linear stages increases the impulsiveness of the interference |
| Optionally comprising a 2nd sequence of linear stages following the NDL stage |

Fig. 66

Particular illustration of constructing an improved NDL-based bandpass filter
Original linear bandpass filter
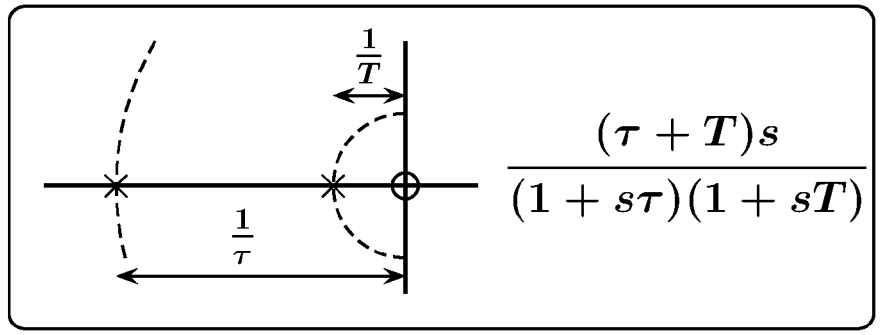
Equivalent linear bandpass filter
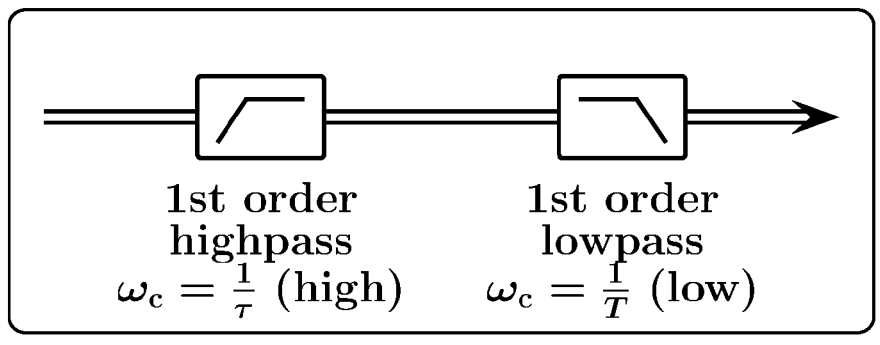
Improved NDL-based bandpass filter
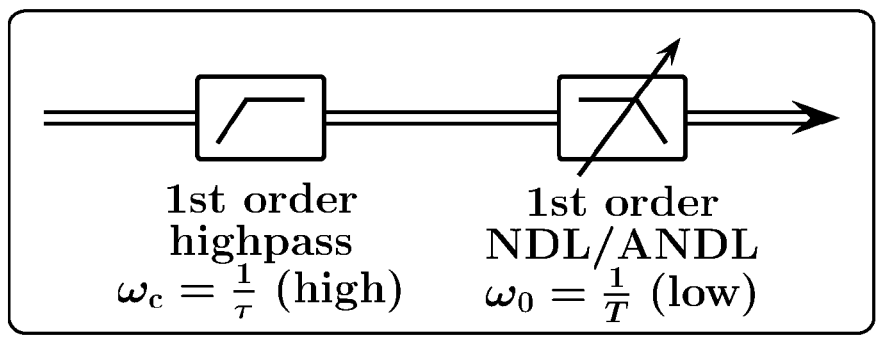
Fig. 67

Particular illustration of constructing
an improved 2nd order NDL-based bandpass filter Original 2nd order linear bandpass filter

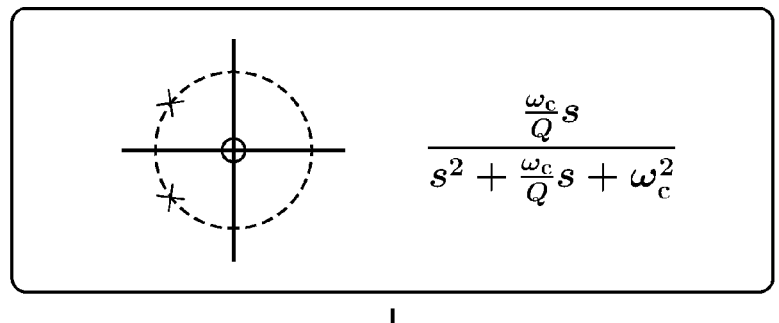

$$\frac{\frac{\omega_c}{Q}s}{s^2 + \frac{\omega_c}{Q}s + \omega_c^2}$$

$\downarrow \equiv$

Equivalent linear filter

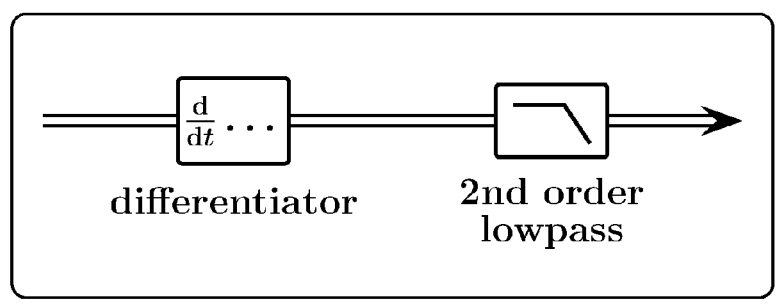

differentiator    2nd order lowpass $\Downarrow$

Improved 2nd order NDL-based bandpass filter

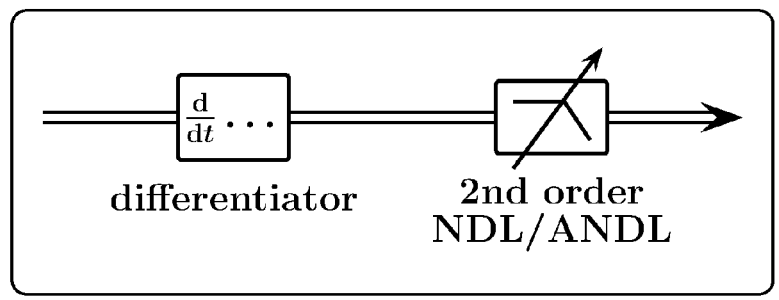

differentiator    2nd order NDL/ANDL

Fig. 68

Idealized particular illustration of constructing an improved NDL-based lowpass filter
Original linear lowpass filter
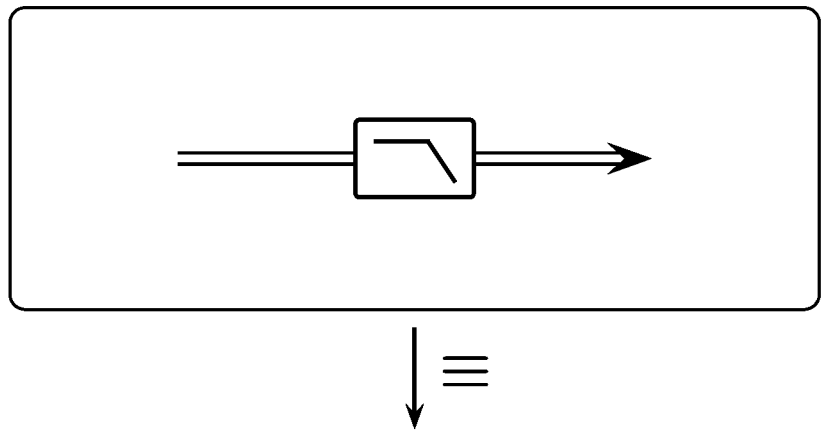
Equivalent linear lowpass filter
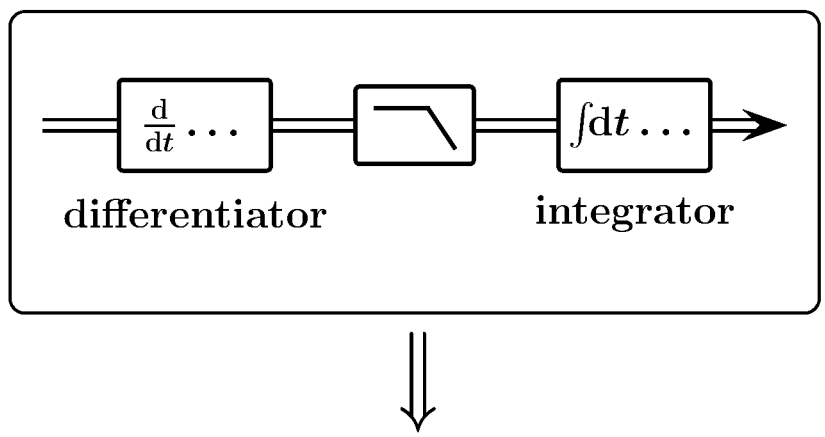
Improved NDL-based lowpass filter
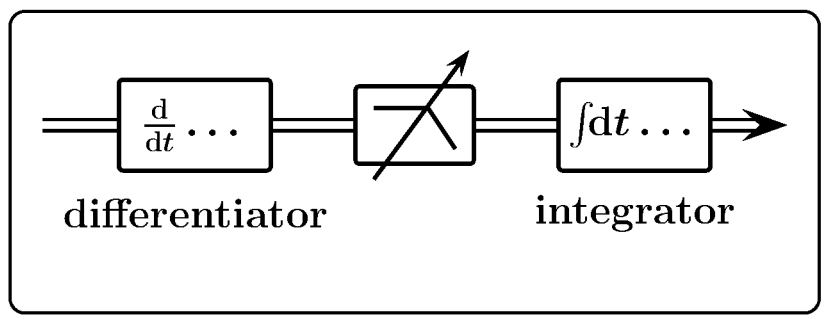
Fig. 69

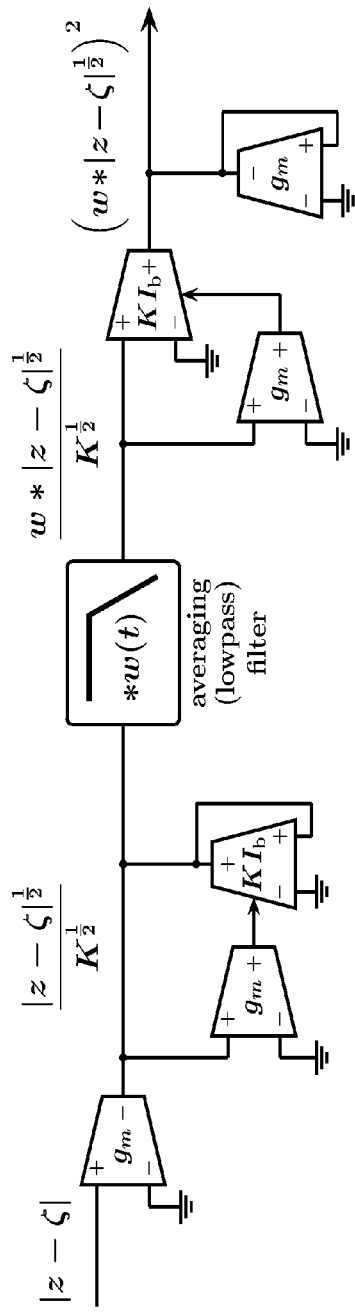
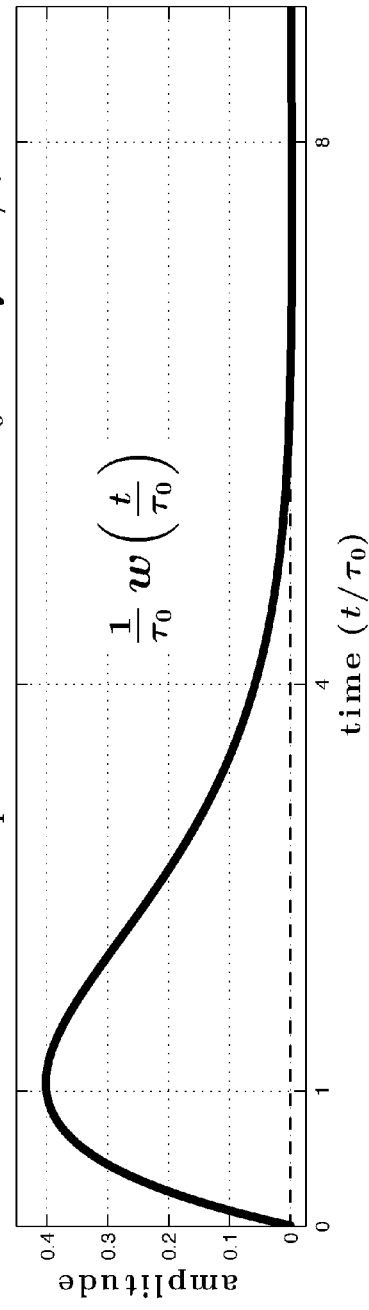
Fig. 115

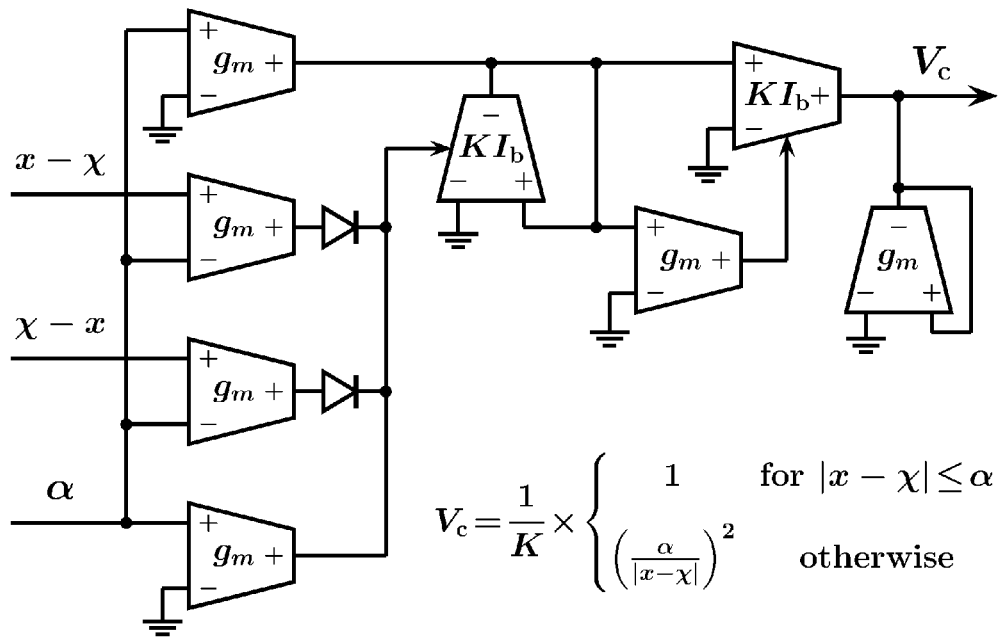
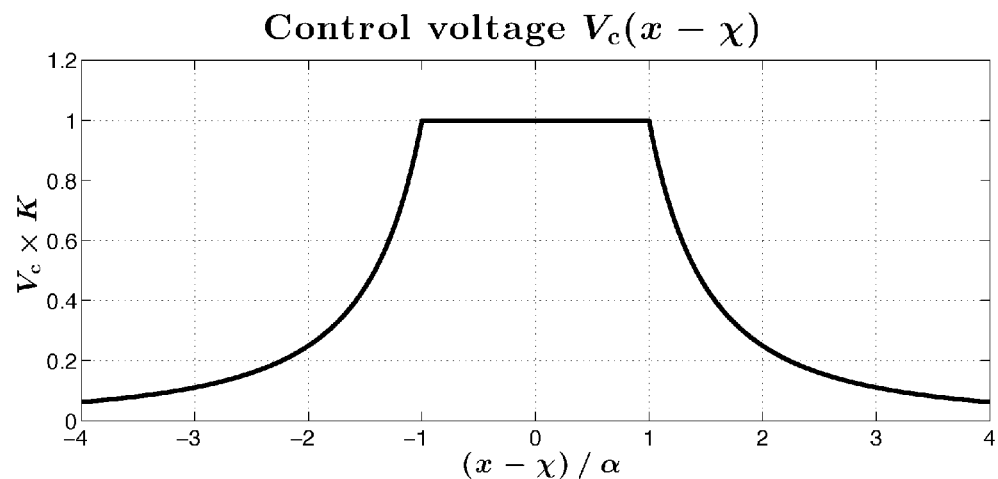
Fig. 118

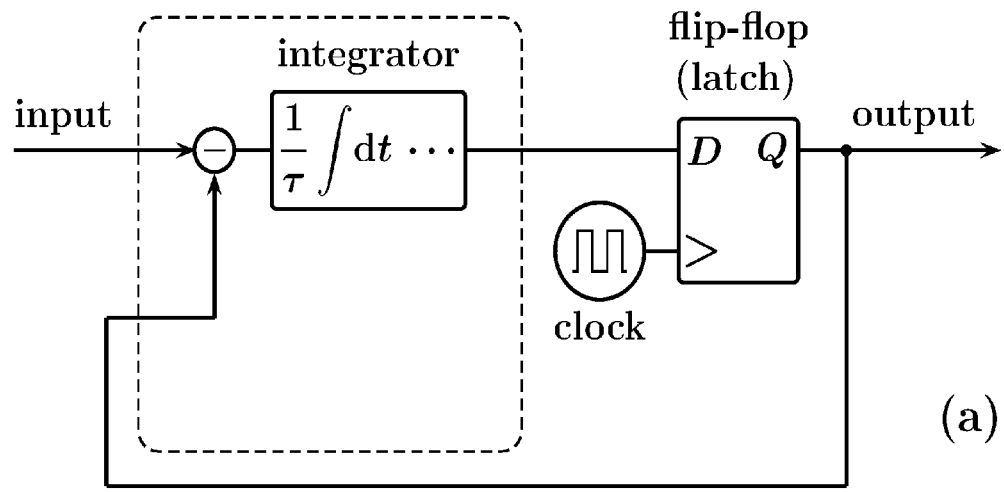
(a)
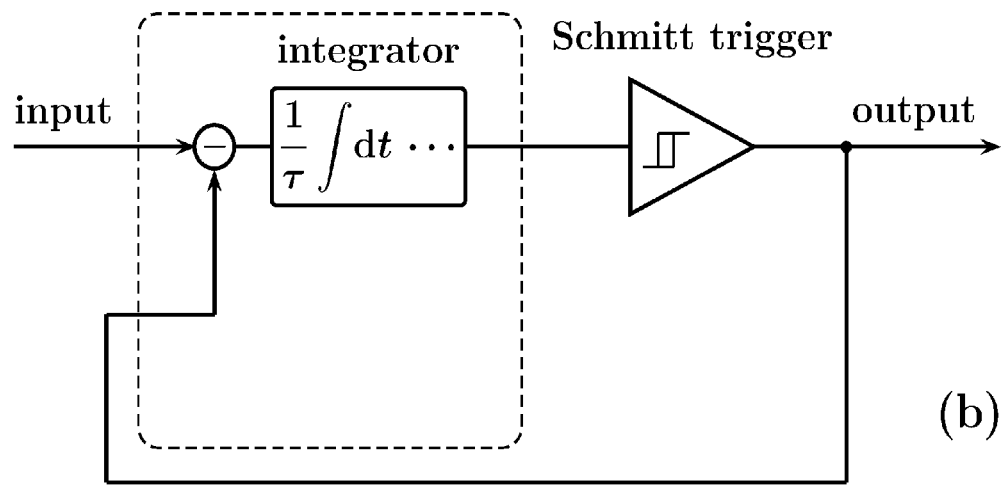
(b)
Fig. 141

$\Delta\Sigma$ noise shaping loop
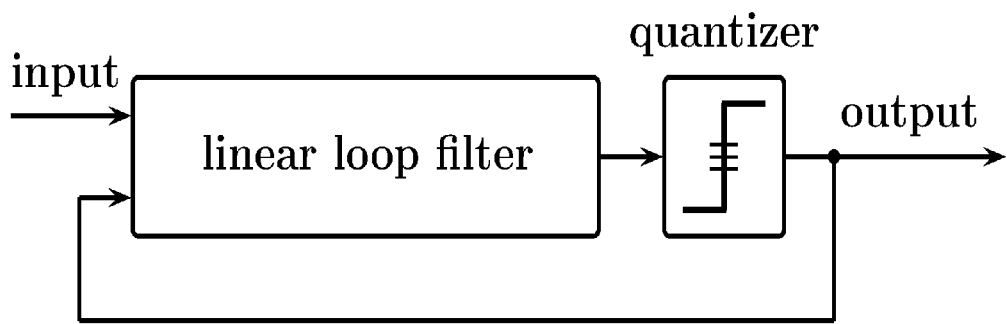
Improved NDL-based $\Delta\Sigma$ noise shaping loop
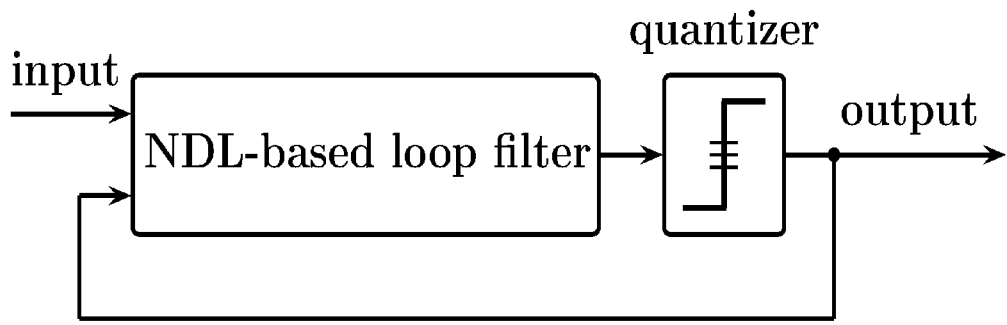
Fig. 147

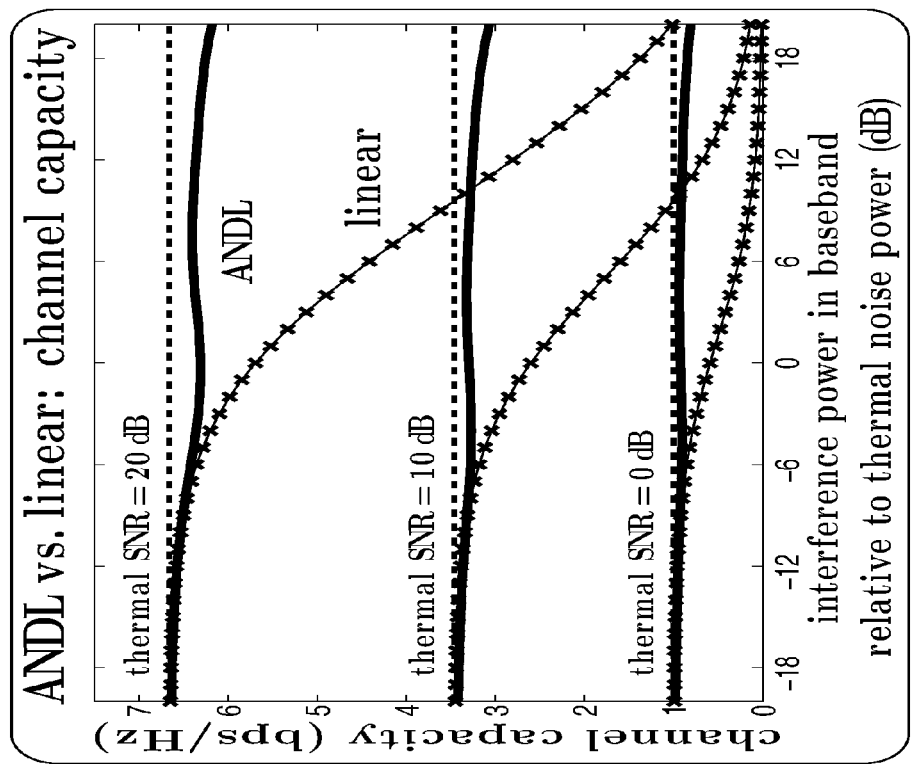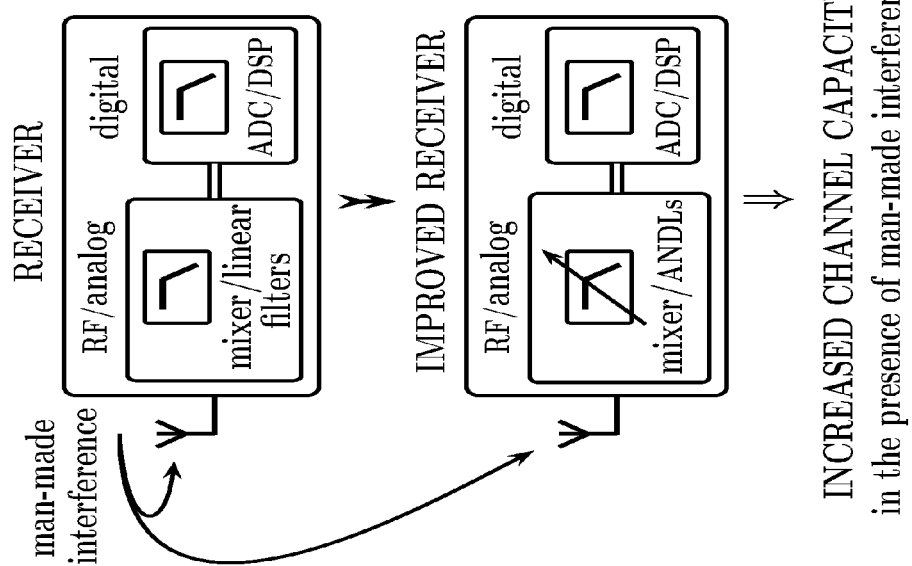
Fig. 151

METHOD AND APPARATUS FOR SIGNAL FILTERING AND FOR IMPROVING PROPERTIES OF ELECTRONIC DEVICES

CROSS REFERENCES TO RELATED APPLICATIONS

This is a continuation of U.S. patent application Ser. No. 14/159,033, filed on 20 Jan. 2014, which is a continuation-in-part of U.S. patent application Ser. No. 13/715,724, filed 14 Dec. 2012 (now U.S. Pat. No. 9,117,099), which is a continuation-in-part of U.S. patent application Ser. No. 13/662,127, filed 26 Oct. 2012 (now U.S. Pat. No. 8,489,666), which is a continuation of U.S. patent application Ser. No. 13/599,866, filed 30 Aug. 2012 (now U.S. Pat. No. 8,990,284), which also claims the benefit of U.S. provisional applications 61/754,788, filed 21 Jan. 2013, 61/762,650, filed 8 Feb. 2013, 61/783,861, filed 14 Mar. 2013, and 61/873,135, filed 3 Sep. 2013.

STATEMENT REGARDING FEDERALLY SPONSORED RESEARCH OR DEVELOPMENT

None.

COPYRIGHT NOTIFICATION

Portions of this patent application contain materials that are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to nonlinear signal processing, and, in particular, to adaptive nonlinear filtering utilizing analog nonlinear differential limiters, and to adaptive real-time signal conditioning, processing, analysis, quantification, comparison, and control. More generally, this invention relates to methods, processes and apparatus for real-time measuring and analysis of variables, including statistical analysis, and to generic measurement systems and processes which are not specially adapted for any specific variables, or to one particular environment. This invention also relates to methods and corresponding apparatus for mitigation of electromagnetic interference, and further relates to improving properties of electronic devices and to improving and/or enabling coexistence of a plurality of electronic devices. The invention further relates to post-processing analysis of measured variables and to post-processing statistical analysis.

BACKGROUND

An electronic device always comprises at least one electronic component (e.g. an antenna, a transducer, a sensor, an active and/or passive filter, an integrated circuit, a power supply/battery) and a plurality of signal paths through which various signals (e.g. input, feedback, control, and output signals) propagate. A signal path may in turn be a signal chain, that is, a series of signal-conditioning electronic components that receive input (data acquired from sampling either real-time phenomena or from stored data) in tandem, with the output of one portion of the chain supplying input to the next.

Signals of interest in various signal paths of an electronic device (such as, for example, a communication or data acquisition and processing device, a biomedical device, or a computer) are affected by various interferences (noise) from natural and man-made sources. Be it a signal from a sensor, or a signal from a transmitter in a communication chain, the amount of noise affecting the signal may be reduced to improve the signal quality and/or other properties of the device (e.g. reduce its size and/or power consumption, the bill of materials, and/or the cost of the components).

For example, the demand for wireless Internet data is exponentially increasing, and the interference in wireless receivers "is the key bottleneck preventing service providers from meeting this demand" (see Chopra [9, p. 21]). This interference comes from various sources including, but not limited to, the circuit noise and the interference from extraneous sources, such as conductive electromagnetic interference (EMI-conductive) and radio frequency interference (RFI), intelligent (co-channel, adjacent-channel interference (ACI)) as well as non-intelligent (commercial electronic devices, powerlines, and platform (clocks, amplifiers, co-located transceivers)) sources, and self-interference (multipath). Such technogenic noise is typically non-Gaussian, and often impulsive (Slattery and Skinner [38], Chopra [9]).

Electrical noise is transmitted into a system through the galvanic (direct electrical contact), electrostatic coupling, electromagnetic induction, or RFI ways. An inappropriate electronic design or layout, or insufficient radio frequency (RF) shielding may drastically reduce system performance and lead to "unexplainable" or "random" system failures or an overall reduction in system performance. Design, layout, and shielding considerations may significantly increase the size, weight, bill of materials, and the cost of an electronic device or system.

A particular example of impulsive interference is electromagnetic interference (EMI), also called radio frequency interference (RFI). It is a widely recognized cause of reception problems in communications and navigation devices. EMI is a disturbance that affects an electrical circuit due to either conduction or radiation emitted from a source internal or external to the device. EMI may interrupt, obstruct, or otherwise degrade the effective performance of the device, and limit its link budget. The detrimental effects of EMI are broadly acknowledged in the industry and include: (i) reduced signal quality to the point of reception failure, (ii) increased bit errors which degrade the system and results in lower data rates and decreased reach, and (iii) increased power output of the transmitter, which increases its interference with nearby receivers and reduces the battery life of a device.

A major and rapidly growing source of EMI in communication and navigation receivers is other transmitters that are relatively close in frequency and/or distance to the receivers. Multiple transmitters and receivers are increasingly combined in single devices, which produces mutual interference. A typical example is a smartphone equipped with cellular, WiFi, Bluetooth, and GPS receivers, or a mobile WiFi hotspot containing an HSDPA and/or LTE receiver and a WiFi transmitter operating concurrently in close physical proximity. Other typical sources of strong EMI are on-board digital circuits, clocks, buses, and switching power supplies. This physical proximity, combined with a wide range of possible transmit and receive powers, creates a variety of challenging interference scenarios. Existing empirical evidence (Slattery and Skinner [38], Leferink et al. [19], Nikitin et al. [28]) and its theoretical support (Nikitin [29, 24]) show that such interference often manifests itself as impulsive noise, which in some instances may dominate over the thermal noise (Yang and Petropulu [40], Slattery and Skinner [38], Nikitin et al. [28]).

A particular source of impulsive noise in digital communication systems is interchannel interference (Nikitin [29, 24], Nikitin et al. [28]). For example, a strong close transmitter (e.g. WiFi) may noticeably interfere with a receiver of a weak signal (e.g. GPS) even when the separation of their frequency bands exceeds the respective nominal bandwidths of the channels by orders of magnitude. When time domain observations of such far-out-of-band interference are made at the receiver frequency, in a relatively wide bandwidth to avoid excessive broadening of the transients, this interference is likely to appear impulsive.

The amount of the interchannel out-of-band (OOB) interference depends on the strength of the antenna coupling (Nikitin et al. [28]). This coupling may be changed by the shape and the orientation of the antennas, shielding, and the distance between the antennas. Increasing the distance between the antennas generally contributes to the overall size of the device (e.g. smartphone), while shielding increases its weight, bill of materials, and its cost.

The OOB emissions may be partially mitigated by additional filtering. For example, one may apply additional high-order lowpass filtering to the modulating signal, or bandpass filtering to the modulated carrier, under the constraint that the bandwidth of those additional filters must be sufficiently large in comparison with the bandwidth of the pulse shaping filter in the modulator in order to not significantly affect the designed signal (Nikitin [29, 24]). These additional filters increase the circuit complexity, component count, size and cost, and decrease the reliability of the device.

The non-idealities in hardware implementation of designed modulation schemes such as the non-smooth behavior of the modulator around zero exacerbate the OOB emissions (Nikitin [29, 24], Nikitin et al. [28]). Thus, in order to keep these emissions at a low level, expensive high-quality components such as integrated circuit (IC) modulators and power amplifiers may be used, which increases the complexity and the cost of the components. The OOB emissions are also exacerbated by the coupling of other interfering signals from the adjacent circuitry (Nikitin et al. [28]), which imposes additional limitations on the layout, shielding, and the overall size and cost of the device, and limits the amount of space left for other components, e.g. a battery.

The impulsive noise problem also arises when devices based on the Ultra-wideband (UWB) technology interfere with narrowband communication systems such as WLAN (Mallipeddy and Kshetrimayum [20]) or CDMA-based cellular systems (Fischer [13]). A UWB device is seen by a narrowband receiver as a source of impulsive noise, which degrades the performance of the receiver and increases its power consumption (Fischer [13]).

As an example for wired communication systems, a major impairment for Digital Subscriber Line (DSL) technologies is impulse noise in the telephone lines (Dragomir et al. [12]). This noise limits the performance of a DSL system, and increases its cost and power consumption through the necessity to deploy various nonlinear impulsive noise reduction techniques.

As yet another example, capacitive touchscreens in modern smartphones are ubiquitous but prone to false and erratic response due to noise from the product in which they reside. Noise comes from both the internal DC/DC-converter subsystem and the display drivers. One of the steady current trends in the telecommunications industry is the push toward thinner phones with multi-touch displays. Achieving this goal means direct lamination of capacitive-touch sensors to the display, moving the sensor inside the display, and overcoming many other challenges with antennas and ground loading. It is no longer acceptable to just use a shield layer in the sensor structure to block display noise, as it adds too much cost and thickness. Also, charger noise physically couples into the sensor through the battery charger during the presence of touch. Its effects include degraded accuracy or linearity of touch, false or phantom touches, or even an unresponsive or erratic touchscreen (Carey [8]).

Other systems impeded by the impulsive noise and artifacts are various sensor systems, including active radar and all coherent imaging systems such as synthetic aperture radar (SAR) [37]. A common example is various medical imaging systems such as ultrasonic, which are generally affected by multiplicative shot (or speckle) noise. Typically, various methods of reduction of the speckle noise involve non-real-time adaptive and non-adaptive speckle filtering of the acquired images, or multi-look processing. In order to effectively filter the speckle noise, the imaging data bandwidth needs to be greatly increased. This leads to a "too much data" problem and to a dramatic increase in the computational load (e.g. increase in memory and DSP requirements).

Since the introduction of the micromachining process, wherein mechanical structures are etched from blocks of silicon, a number of microelectromechanical systems (MEMS) have been produced. This size reduction is attractive for many applications but, since the ratio of mechanical to thermal energy diminishes as the device mass is reduced, MEMS are susceptible to both internal and external (for example, acoustic) limiting noises, especially in harsh environments, which may often be non-Gaussian and impulsive (see Gabrielson [14], Mohd-Yasin et al. [22], for example).

Advances in digital VLSI technologies lead to wider use of the delta-sigma ($\Delta\Sigma$) modulation-based analog-to-digital converters (ADCs) as a cost effective alternative for high resolution (greater than 12 bits) converters, which can be ultimately integrated on digital signal processor ICs. However, due to high nonlinearity of the delta-sigma modulation, $\Delta\Sigma$ converters are highly susceptible to misbehavior when their input contains high-amplitude transients (impulse noise) (Ardalan and Paulos [4], Janssen and van Roermund [17]), which decreases the system performance. When such transients are present, larger size and more expensive converters may need to be used, increasing the overall size and cost of a device and its power consumption.

In audio applications, impulse (acoustic) noise includes unwanted, almost instantaneous (thus impulse-like) sharp sounds (like clicks and pops). Noises of this kind are usually caused by electromagnetic interference, scratches on the recording disks, and poor synchronization in digital recording and communication. High levels of such a noise (200+ Decibels) may damage internal organs, while 180 Decibels (e.g. high power gunshots at close distance) are enough to destroy or damage human ears.

An impulse noise filter may be used to enhance the quality of noisy signals, in order to achieve robustness in audio applications, pattern recognition, and adaptive control systems. A classic filter used to remove impulse noise is the median filter, at the expense of signal degradation due to nonlinear distortions introduced by such a filter. Thus it is quite common, in order to get better performing impulse noise filters, to use model-based systems that know the properties of the noise and source signal (in time or frequency), in order to remove only impulse obliterated samples. Such model-based systems are slow (not real-time), and hardware and computationally intensive (e.g. memory and DSP intensive). In addition, digital median filters themselves require memory and are computationally expensive, and thus increase cost, complexity, and power consumption of a system.

Switched-mode power supplies (SMPS) are used as replacements for the linear regulators when higher efficiency, smaller size or lighter weight are required. However, their switching currents cause impulsive noise problems (as both the emitted RFI and the electronic noise at the output terminals) if not carefully suppressed by adequate EMI filtering and RF shielding, which contributes to an increased size, weight, circuit complexity, and cost.

The current trend in SMPSs is toward smaller devices which necessitates higher frequency operation of the SMPS oscillator. Most configurations also allow the clock frequency to vary based on the output load characteristics, making the coupled noise impulsive and somewhat aperiodic. Most of the SMPSs now operate in the range from hundreds of kHz to a few MHz, placing the noise in the same frequency range where the power-supply rejection ratio (PSRR) of analog components reaches a minimum. This necessitates designers to increase the power bus filtering, which adds significant cost.

WirelessHART is a standard that defines a protocol stack that can employ any short range wireless technologies (WLAN, Bluetooth, ZigBee) at its physical layer. Many companies in the health, oil exploration and other sectors have adopted WirelessHART. Its use in electricity supply industry, however, is limited because reliable operation is at risk due to short, but intense, field transients extending into the RF and microwave spectrum during faults and/or switching events [5]. Electrical substations contain transformers, circuit breakers, isolators, cables, voltage regulators, and other equipment for control and protection. Both partial and full discharges may occur within, and across, any degraded insulation forming part of these components of a plant. These discharges generate rapid changes in current and thus lead to the radiation of electromagnetic noise typically consisting of a quasi-random train of short (nanosecond) impulses. Corona discharge is one form of partial discharge, which occurs when the potential gradient in the gas (usually air) around a charged object (which may or may not be a conductor) exceeds the breakdown threshold. Power system switching events and fault transients also give rise to the radiation of unwanted impulsive noise that may interfere with the reliability or performance of wireless receivers generally and wireless sensor networks (WSNs) in particular (Bhatti et al. [5]). Thus there is a need for effective impulsive noise mitigation to enable reliable operation of the devices such as ZigBee receivers in impulsive noise environments.

In any cable or power line communications, impulse noise is known to be the most difficult noise to filter (Guillet et al. [15]). In particular, non periodic asynchronous impulse noise is impossible to predict. To overcome this problem, the signal-to-noise ratio is generally improved by detecting and/or filtering the noise. This leads, however, to heavy detection and computing time in comparison with the disturbance duration, and contributes to the decreased performance and the increased size, weight, circuit complexity, and cost.

Interference mitigation methods may be classified as either static methods (e.g. layout and shielding, spectrum allocation) that avoid interference through device design or network planning, or as active digital methods (e.g. controlling/managing protocols such as multiple access protocols, interference alignment and/or cancellation, or statistical mitigation) that estimate and cancel interference during data transmission (Chopra [9]). All these methods contribute to the decreased performance and the increased power consumption, size, weight, circuit complexity, and cost.

Most state-of-the-art analog mitigation methods of EMI focus on reducing the interference before it reaches the receiver (e.g. through shielding, physical separation to reduce coupling, and other layout techniques), and none of these methods allows effective EMI filtering once it has entered the receiver chain. After the interference has entered the signal path, only computationally and silicon intensive nonlinear, non-real-time digital signal processing solutions are offered.

Since a signal of interest typically occupies a different and/or narrower frequency range than the noise, linear filters are applied to the incoming mixture of the signal and the noise in order to reduce the frequency range of the mixture to that of the signal. This reduces the power of the interference to a fraction of the total, limited to the frequency range of the signal.

However, the noise having the same frequency power spectrum may have various peakedness (for example, as measured by excess kurtosis; see Section 13.2.1 of this disclosure for a discussion of measures of peakedness), and be impulsive or non-impulsive. For example, white shot noise is much more impulsive than white thermal noise, while both have identically flat power spectra. Linear filtering in the frequency domain does not discriminate between impulsive and non-impulsive noise contributions, and does not allow mitigation of the impulsive noise relative to the non-impulsive. In addition, reduction in the bandwidth of an initially impulsive noise by linear filtering typically reduces the peakedness and makes the noise less impulsive (more 'Gaussian-like'), decreasing the ability to separate the signal from the noise based on the peakedness.

Effective suppression of impulsive interferences in the signal path typically requires nonlinear means, for example, processing based on order statistics. These means may be employed either through digital signal processing, or in the analog signal chain. The nonlinear filters in the analog signal chain may range from simple slew rate limiting filters to more sophisticated analog rank filters described, for example, in U.S. Pat. Nos. 7,133,568 and 7,242,808 (Nikitin and Davidchack [27]), and U.S. Pat. Nos. 7,107,306, 7,418,469, and 7,617,270 (Nikitin [23]).

However, the practical use of nonlinear filters is limited as it typically results in complicated design considerations and in multiple detrimental effects on normal signal flow (signal degradation). These filters may cause various nonlinear distortions and excessive attenuation of the signal, and their effect on the useful signal components is typically unpredictable and depends on the type and magnitude of the interfering signal.

The invention described by Nikitin [25] overcomes some of the limitations of the prior art by introducing a new family of filters (referred to as 'SPART', and, in particular, 'FrankenSPART' filters) which behave nonlinearly only during the occurrence of relatively high power disturbances, and maintain linear behavior otherwise. When an interference contains an impulsive component, SPART filters have the ability to improve the signal-to-noise ratio even if the spectral density of the noise lies entirely within the passband of the signal. They also do so without the traditional limitations of "clamping"-type limiters, such as slow recovery from saturation, phase reversal, and generation of excessive harmonics.

A FrankenSPART filter obtains the time derivative of the output as the difference between the input signal and a feedback of the output signal, then produces the output by comprising the following steps: (i) applying a comparator to confine said derivative to a certain range, (ii) linearly transforming the output of the comparator to introduce the slew rate and quantile parameters, and (iii) integrating said linearly transformed output of the comparator.

There are several significant limitations of the SPART filter family based on the FrankenSPART filtering method. These limitations relate to their implementations, configurability, performance, and applicability.

The implementations of the SPART filters rely on the use of comparators, since applying a comparator function is a required step in the SPART filtering method. A required step of applying a comparator complicates the topology and configurability of the SPART filters. Comparators (including clamping amplifiers) also suffer from a number of limitations that preclude their use in precision circuits, specifically large offsets, overdrive requirements, and response time limits. Practical implementation of comparators for the SPART filters may be complicated and expensive, as their range needs to be well defined and controlled, and this range is coupled to the subsequent linear transformation of the comparator output. In addition, the comparator functions are not defined for complex-valued and multidimensional vector signals by Nikitin [25], which limits the applicability of the SPART filters in complex-valued and multidimensional signal processing.

The required linear transformation step of the SPART filters is necessary for its configurability. While implementing a gain (and a level shift) is a relatively simple task, in the SPART filters the gain of the linear transformation stage is coupled with the range of the comparator. Most filtering tasks may require that the time parameter of a SPART filter remains constant, while its slew rate parameter is adjusted. In order to maintain a constant time parameter, both the gain of the linear transformation stage and the range of the comparator in a SPART filter need to be simultaneously and proportionally changed. This complicates the topology and configurability of the SPART filters and limits their dynamic range.

While the required explicit integration step in the SPART filters is a well-known task, constructing an explicit integrator introduces a limiting complication in the design and implementation. As a total, the need for the three explicit stages in a SPART filter increases the complexity, noise, and the component count of the circuit, while limiting its frequency performance (as a consequence of additional delays and frequency limitations of the stages) and its dynamic range.

In its linear regime, a FrankenSPART filter is identical to an RC integrator, that is, to a 1st order lowpass filter, where the time constant of the latter is equal to the time parameter of the FrankenSPART. A 1st order filter does not provide a selective frequency response needed for many applications. Thus, for example, in order to use a FrankenSPART filter in a communication channel, its time parameter needs to be sufficiently small so it does not significantly affect the baseband signal (see, for example, Nikitin [24]). A small time parameter degrades both the FrankenSPART circuit performance and its ability to effectively mitigate the impulsive noise.

When the interference affecting the signal of interest is impulsive, the prior art typically views this as a problem presenting an additional challenge rather then an opportunity to increase the overall effectiveness of the mitigation of the interference. Thus the prior art does not offer interference reduction methods that intentionally increase the impulsiveness of the interference in order to increase the effectiveness of its mitigation. This constitutes yet another common limitation of the typical prior art methods outlined in this section.

SUMMARY

The present invention overcomes the shortcomings of the prior art through the introduction of the novel filter family, Nonlinear Differential Limiters (NDL), which are applicable to real as well as complex-valued and multidimensional vector signals. NDLs implement nonlinear signal processing functions in a way substantially distinct from the prior art, and offer new functionality, simplicity, configurability, and universality not achievable in the prior art. In addition, the novel NDL-based filtering method and apparatus enable improvements in the overall properties of electronic devices including, but not limited to, improvements in performance, reduction in size, weight, cost, and power consumption, and, in particular for wireless devices, improvements in spectrum usage efficiency.

A basic NDL may be viewed as an analog feedback circuit having the following behavior: When the magnitude of a difference between the input and the output ('the difference signal') is small (in particular, in comparison with some internal standard such as thermal voltage, or with an explicitly supplied resolution parameter), the NDL behaves as a linear lowpass filter of a certain order, characterized by a set of parameters (coefficients). The parameters, or coefficients, of an NDL may be defined as the parameters/coefficients of the corresponding linear lowpass filter. For example, these parameters may be specified as the locations of the poles in the S-plane, and these locations themselves may, in turn, be given by the cutoff frequencies and the quality factors of the poles. For larger absolute values of the difference signal, the NDL parameters (coefficients) are dynamically modified in a manner that limits the output of the NDL in comparison with the respective linear filter.

As described further in this disclosure, a typical configuration of an NDL defines these parameters as functions of the magnitude of the difference signal, and, in particular, as functions of this magnitude in relation to the resolution parameter. For example, if the filter parameters are specified as the locations of the poles in the S-plane, than the NDL output may be limited by moving some of these poles closer to the origin (thus reducing the cutoff frequencies of the poles), or moving the poles closer to the real axis (thus decreasing the quality factors of the poles).

A bandwidth of a lowpass filter may be defined as an integral over all frequencies (from zero to infinity) of a product of the frequency with the filter frequency response, divided by an integral of the filter frequency response over all frequencies. Then, for a lowpass filter, the reduction of the cutoff frequency and/or the reduction of the pole quality factor both result in the reduction of the filter bandwidth, as the latter is a monotonically increasing function of the cutoff frequency, and a monotonically increasing function of the pole quality factor. Thus an NDL may be defined in terms of the behavior of its bandwidth expressed through the filter parameters, as schematically illustrated in FIG. 1.

As shown in FIG. 1, when the magnitude of the difference signal is sufficiently small, an NDL behaves as a linear lowpass filter of a certain order, characterized by a set of parameters leading to a particular bandwidth. These parameters are such functions of the magnitude of the difference signal that the resulting bandwidth is a nonincreasing function of this magnitude when the latter takes larger values.

"For sufficiently small $|z|$" may be understood in its typical meaning that there exists such $\epsilon > 0$ that a specified condition is met for $|z| \le \epsilon$, for example, $B(|z|) = B_0$ for $|z| \le \epsilon$ in FIG. 1. Likewise, "for sufficiently large x" may mean that there exists such a that a specified effect or condition is true for $x \ge a$.

FIG. 2 provides a representative example of several functional dependencies of a bandwidth of an NDL filter on the magnitude of the difference signal. In this example, the bandwidth as a function of $|z|$ is given by the following equation:

$$B(|z|) = B_0 \times \{(a|z|^\gamma)^b + \exp[-(a|z|^\gamma)^b]\}^{-\frac{1}{b}}, \quad (1)$$

where a, b, and $\gamma$ are positive parameters, and $B_0$ is the initial bandwidth.

When $b \to \infty$ in equation (1), B ($|z|$) remains constant and equal to $B_0$ as long as $|z| \le a^{-1/\gamma}$. Then the quantity $a^{-1/\gamma}$ may be defined as a resolution parameter $\alpha$, $\alpha = a^{-1/\gamma}$. As may be seen in FIG. 2, when the parameter b is large (e.g. b=10 in FIG. 2), the bandwidth remains approximately constant for $|z| < a^{-1/\gamma}$.

In FIG. 3, an NDL is further characterized by a resolution parameter $\alpha$ so that "sufficiently small" translates into "sufficiently small in comparison with the resolution parameter" (for example, into "smaller than the resolution parameter").

The response of any NDL approaches that of a corresponding linear lowpass filter in the limit of a large resolution parameter, and thus, given a proper linear lowpass filter and a sufficiently large resolution parameter, an NDL replacing the linear filter in a device does not degrade the performance of the device, regardless of the noise composition. If an NDL circuit with a proper set of coefficients is deployed sufficiently early in the signal chain of a channel in a communication receiver or a data acquisition system affected by non-Gaussian impulsive noise, it may be shown that there exists such resolution parameter that maximizes signal-to-noise ratio and improves the quality of the channel.

Here and thereafter "proper" and/or "properly" may be understood in a context of satisfying certain conditions and/or requirements. For example, "a proper linear lowpass filter" in the previous paragraph may mean that the linear lowpass filter is appropriate for adequate performance of the device, and is not just any arbitrary linear lowpass filter.

More generally, given an electronic device comprising a plurality of signal paths through which various signals (e.g. input, feedback, control, and output signals) propagate, and characterized by various properties (such as, for example, size, dimensions, form factor, weight, bill of materials, total cost, cost of components, cost of materials, performance specifications, power consumption, battery size, circuit complexity, component count, reliability, and other properties and their combinations), deployment of an NDL in a signal path improves properties of the device. These improvements may include, for example, reduction in size, reduction of dimensions, reduction in form factor, reduction in weight, reduction in bill of materials, reduction of total cost, reduction in cost of components, reduction in cost of materials, increase in performance specifications, reduction of power consumption, increase of battery size, reduction in circuit complexity, reduction in component count, increase in reliability, and/or other improvements and their combinations.

If a device additionally includes an electronic lowpass filter, the improvement in properties of the device may also be achieved by replacing this lowpass filter by a corresponding NDL (that is, by an NDL with the set of parameters equal to those of the linear filter in the limit of small resolution parameter).

In addition to lowpass filters, any arbitrary linear filters (including highpass, bandpass, allpass, bandreject, etc.) may be converted into NDL-based filters to achieve improvement in properties of an electronic device utilizing such filters.

Even though an NDL is an analog filter, it may be implemented digitally, for example, in field-programmable gate arrays (FPGA) or software. A digital NDL requires little memory and typically is inexpensive computationally, which makes it suitable for real-time implementations.

Further scope and the applicability of the invention will be clarified through the detailed description given hereinafter. It should be understood, however, that the specific examples, while indicating preferred embodiments of the invention, are presented for illustration only. Various changes and modifications within the spirit and scope of the invention should become apparent to those skilled in the art from this detailed description. Furthermore, all the mathematical expressions, diagrams, and the examples of hardware implementations are used only as a descriptive language to convey the inventive ideas clearly, and are not limitative of the claimed invention.

BRIEF DESCRIPTION OF FIGURES

FIG. 9. Nonlinear differential limiter as 1st order lowpass filter with feedback-controlled frequency parameter.

FIG. 16. Comparison, for a real weak-sense stationary random input signal, of the outputs of small-$\alpha$ DcLs and the median filters with appropriate rectangular moving windows, for larger (upper panel) and 10 times smaller (lower panel) values of the resolution parameter.

FIG. 24. Illustrative block diagrams of adaptive (real- and/or complex-valued) NDLs (ANDLs).

FIG. 25. Illustrative block diagrams of adaptive (real- and/or complex-valued) NDLs (ANDLs) using the internally available absolute value of the difference signal.

FIG. 47. OTA-based example of a control current circuit for the 'LR' CDL shown in FIG. 46.

FIG. 57. Example of odd order NDL-based lowpass filter comprising 1st order NDL.

FIG. 58. Example of odd order NDL-based lowpass filter comprising 3rd order NDL.

FIG. 59. Example of even order NDL-based lowpass filter comprising 2nd order NDL.

FIG. 64. Improved NDL-based bandpass filters comprising LFE highpass filters/differentiators to increase peakedness of the interference.

FIG. 66. General schematic illustration of constructing an improved NDL-based filter comprising a linear front-end (LFE) filter to increase the impulsiveness of the interference. In the figure, an LFE filter is referred to as "a 1st sequence of linear stages."

FIG. 67. Particular illustration of constructing an improved NDL-based bandpass filter.

FIG. 68. Particular illustration of constructing an improved 2nd order NDL-based bandpass filter.

FIG. 69. Idealized particular illustration of constructing an improved NDL-based lowpass filter.

FIG. 115. Example of windowed Squared Mean Root (SMR) circuit.

FIG. 118. Example of a conceptual schematic of a control voltage circuit (CVC) for the DoL shown in FIG. 117.

Figure 120:
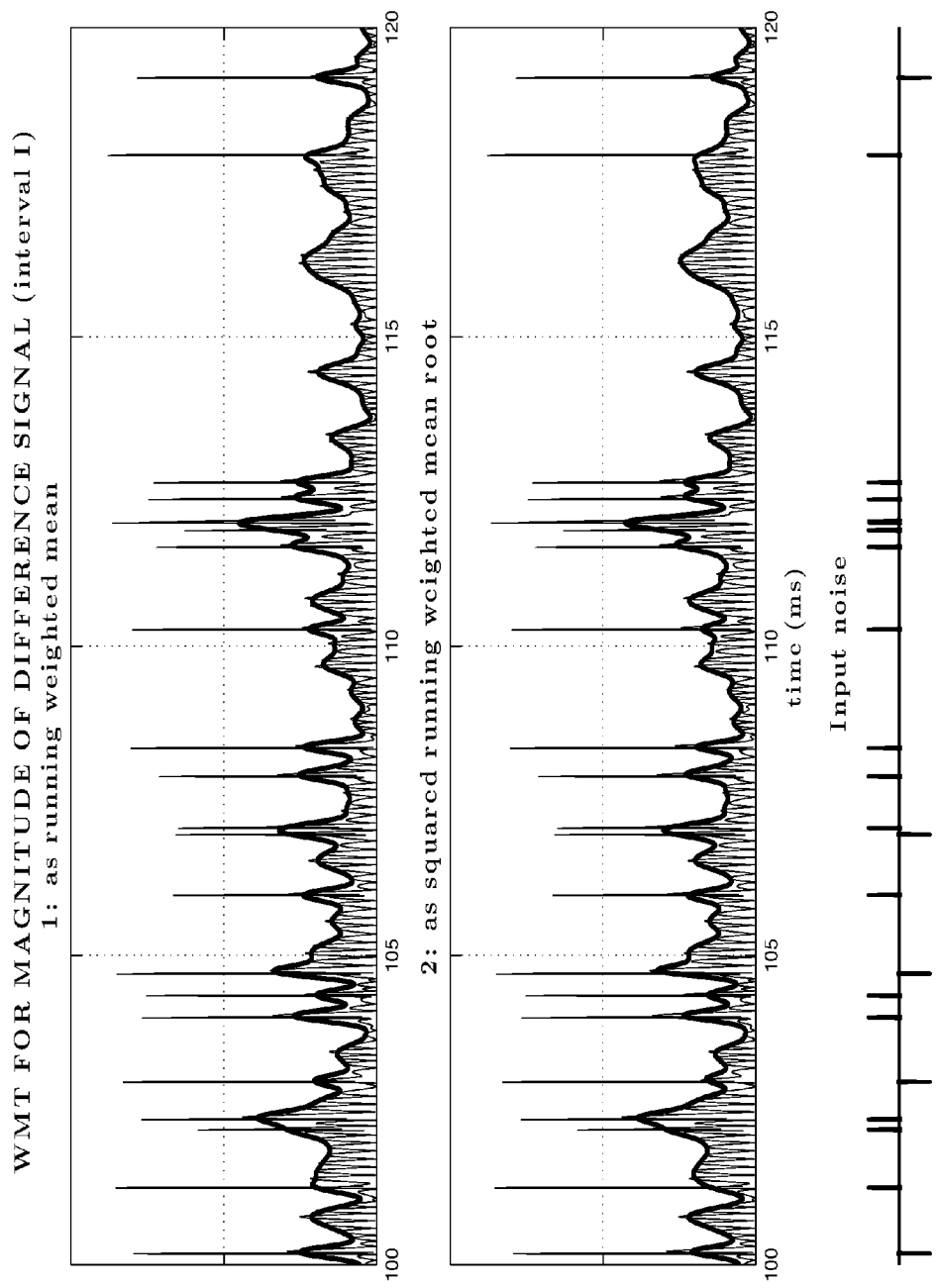

FIG. 120. Delayed outputs of the absolute value circuits (thin lines), and the gained outputs $\alpha(t)$ of the WMT circuits (thick lines) for the time interval I. The input noise pulses are indicated at the bottom of the figure.

Figure 121:
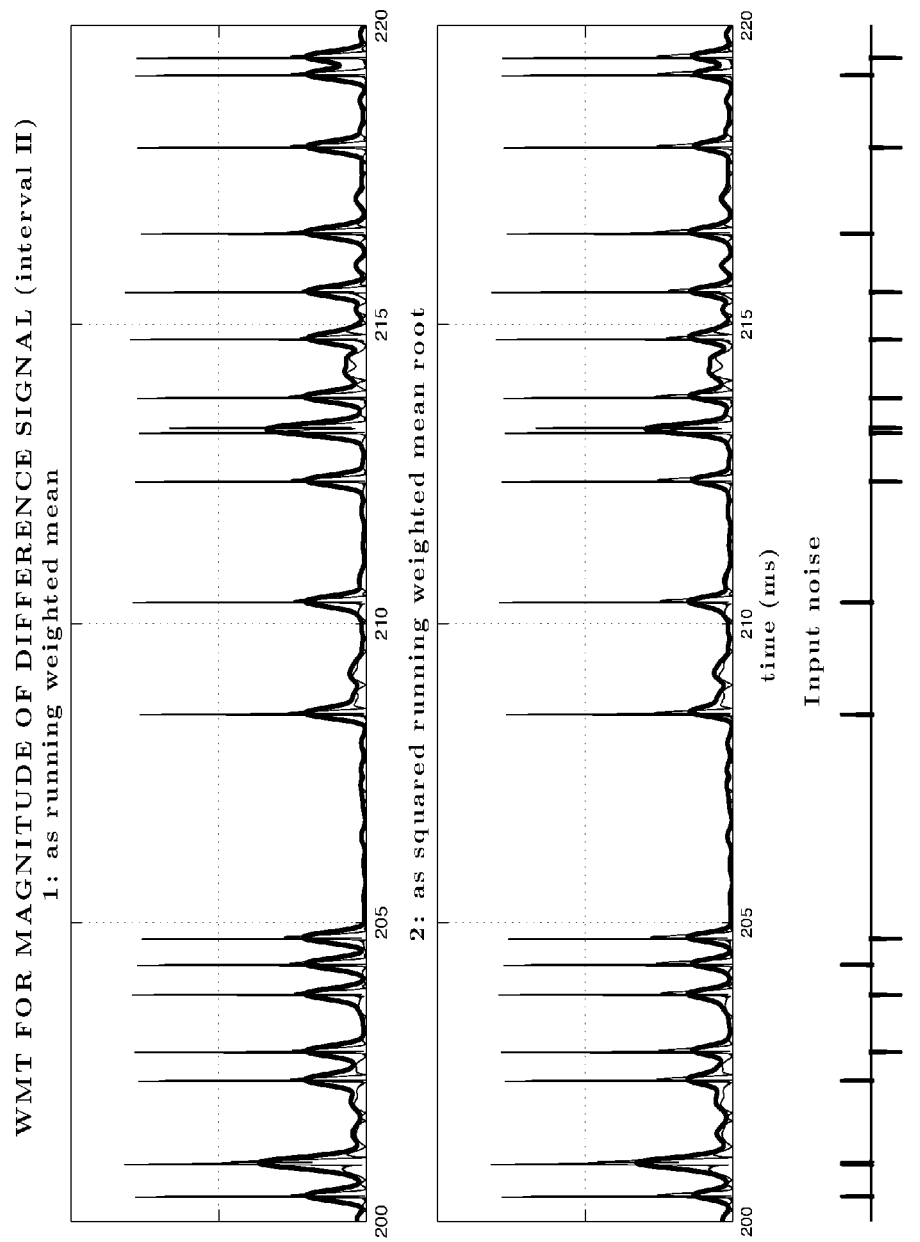

FIG. 121. Delayed outputs of the absolute value circuits (thin lines), and the gained outputs $\alpha(t)$ of the WMT circuits (thick lines) for the time interval II. The input noise pulses are indicated at the bottom of the figure.

Figure 122:
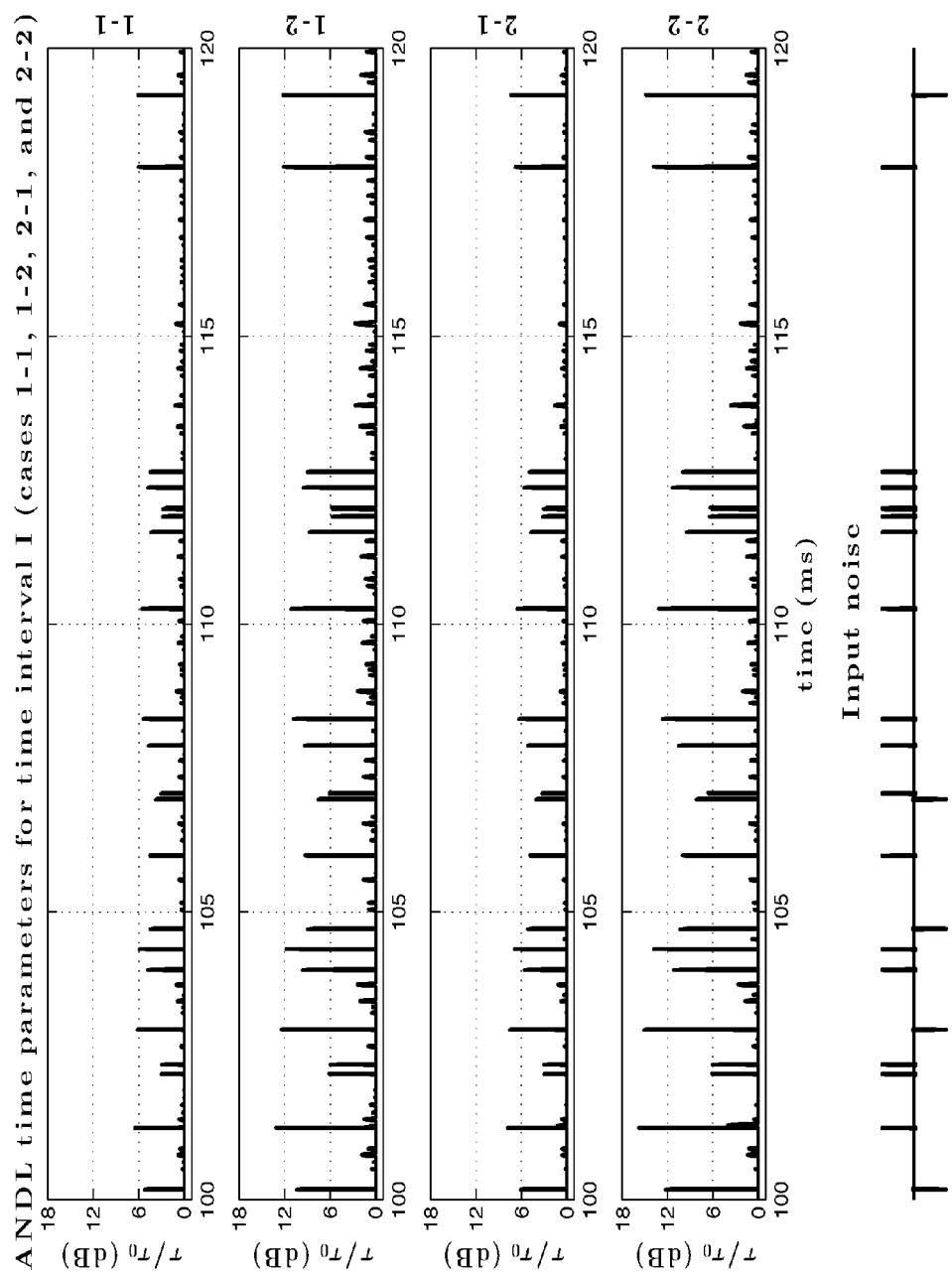

FIG. 122. NDL time parameters versus time for the circuits in the arrangements 1-1, 1-2, 2-1, and 2-2 shown in FIG. 116, for the time interval I. The input noise pulses are indicated at the bottom of the figure.

Figure 123:
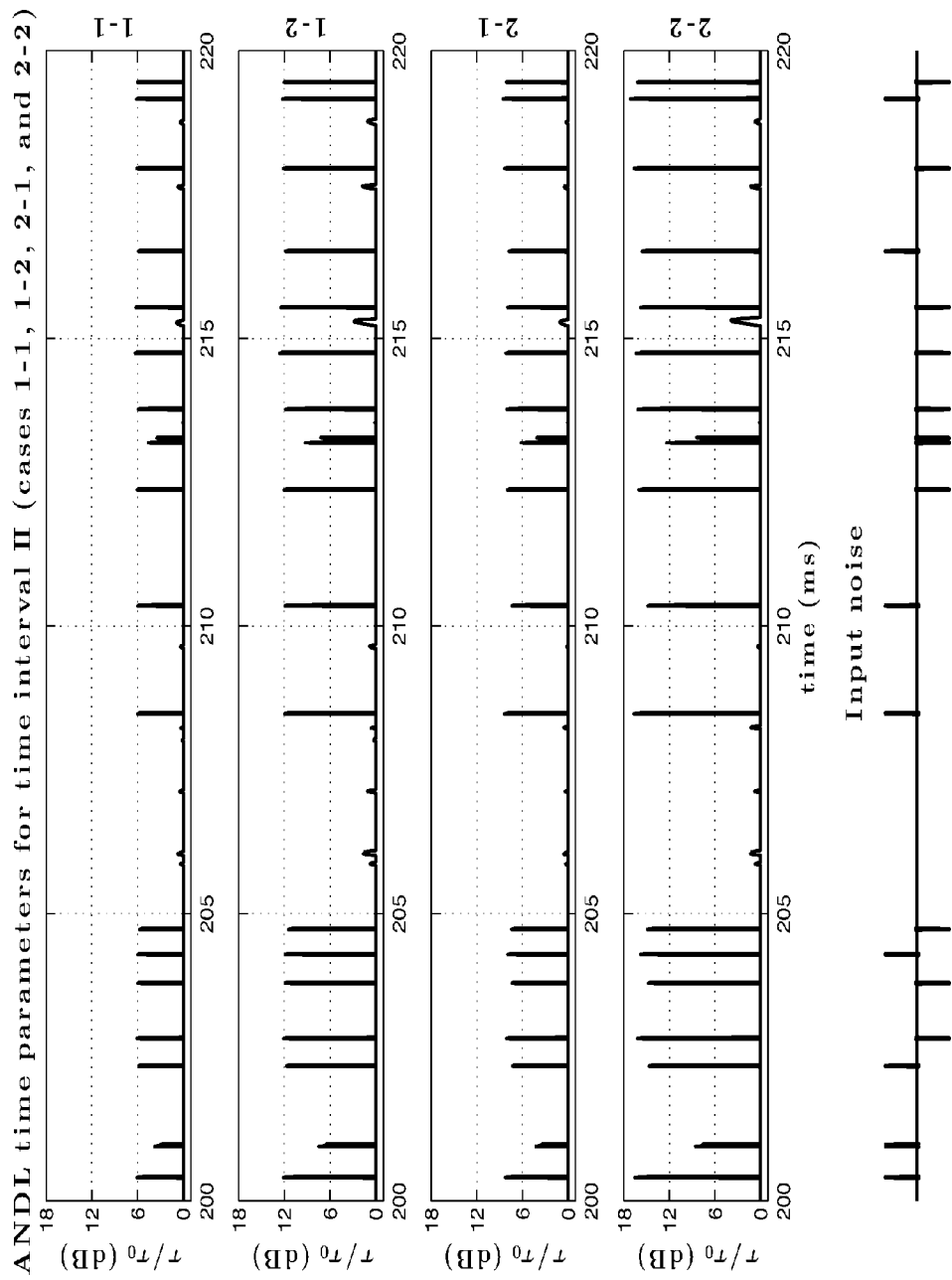

FIG. 123. NDL time parameters versus time for the circuits in the arrangements 1-1, 1-2, 2-1, and 2-2 shown in FIG. 116, for the time interval II. The input noise pulses are indicated at the bottom of the figure.

Figure 124:
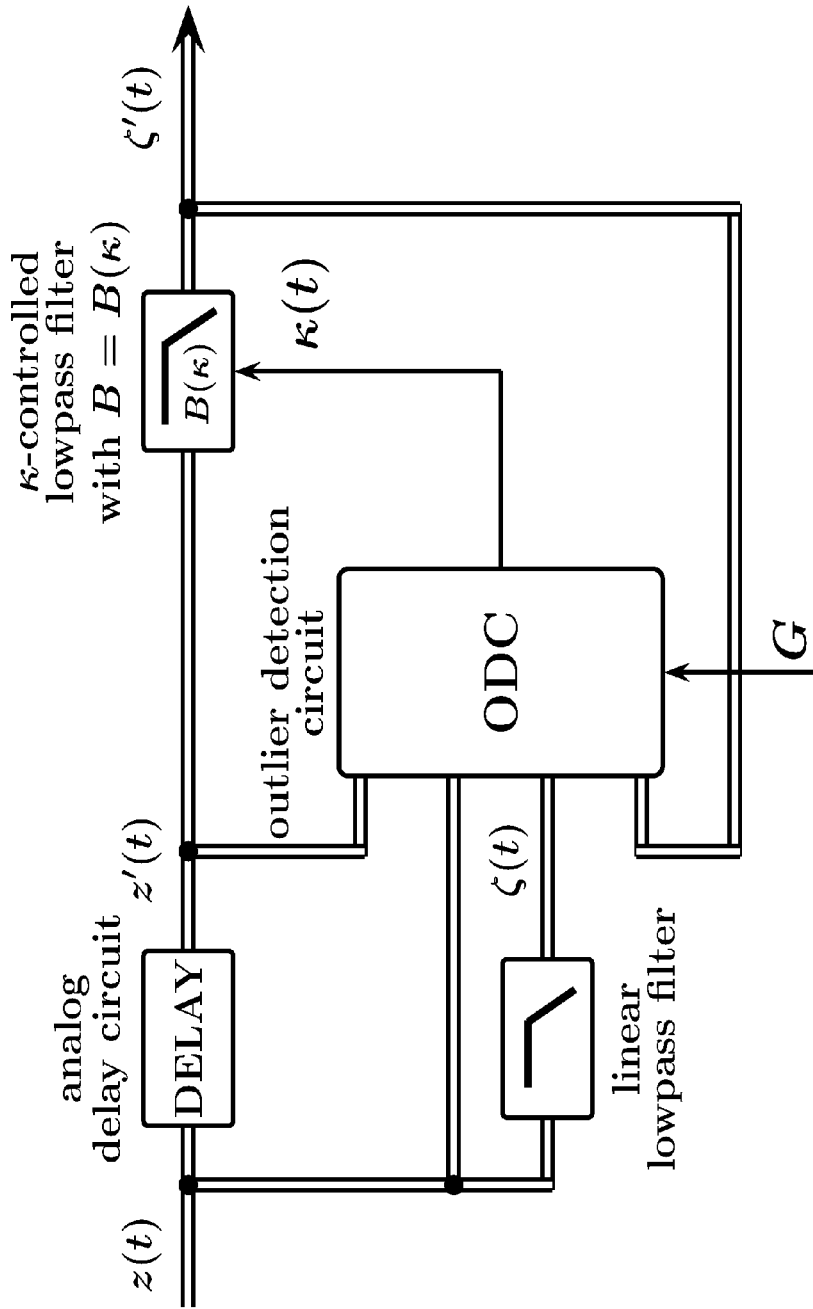

FIG. 124. Block diagram of an ANDL comprising an Outlier Detector Circuit (ODC).

Figure 125:
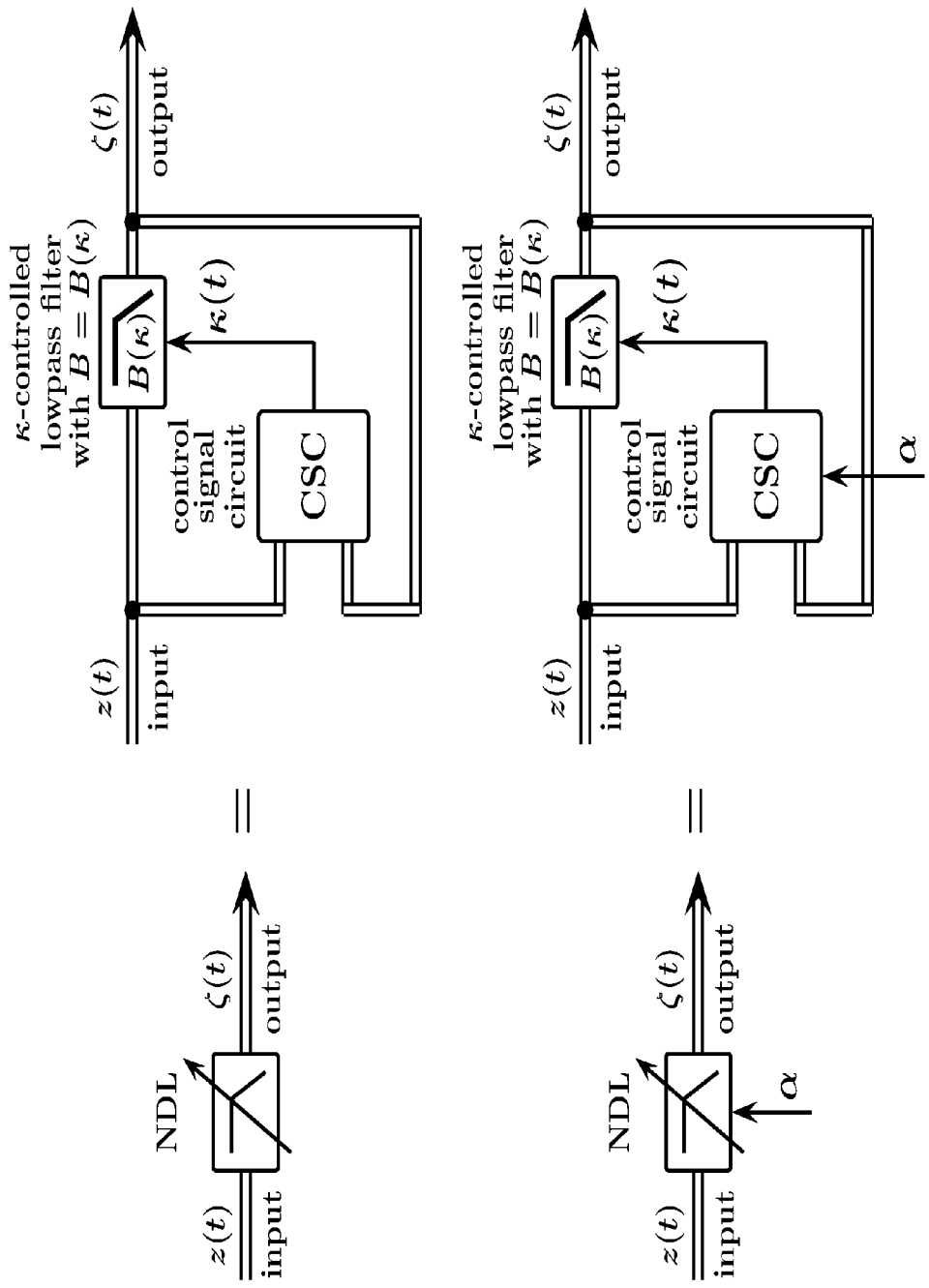

FIG. 125. Clarification of the relationship between a $\kappa$-controlled lowpass filter and an NDL/$\alpha$-controlled NDL.

Figure 126:
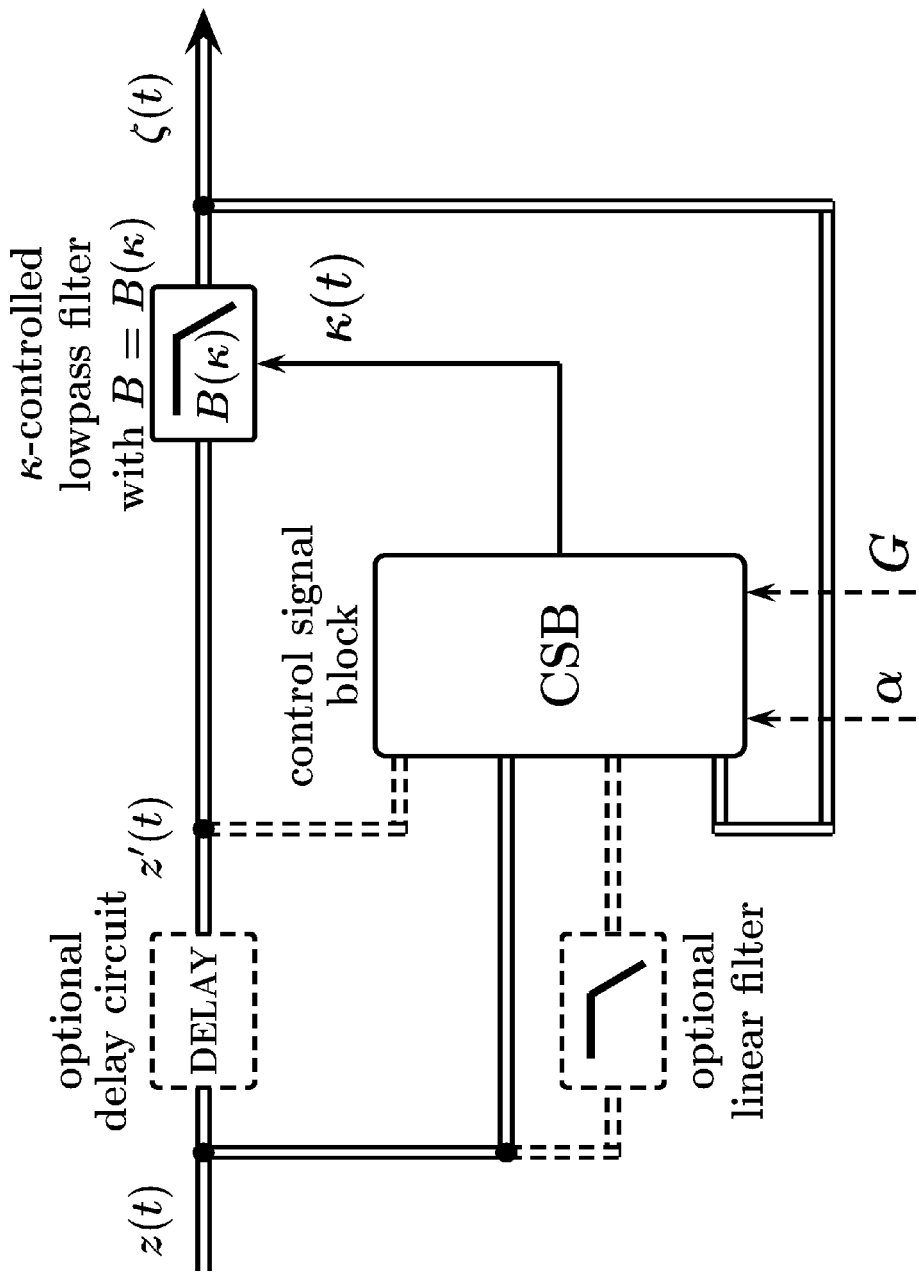

FIG. 126. Block diagram of an NDL/ANDL comprising a Control Signal Block (CSB).

Figure 127:
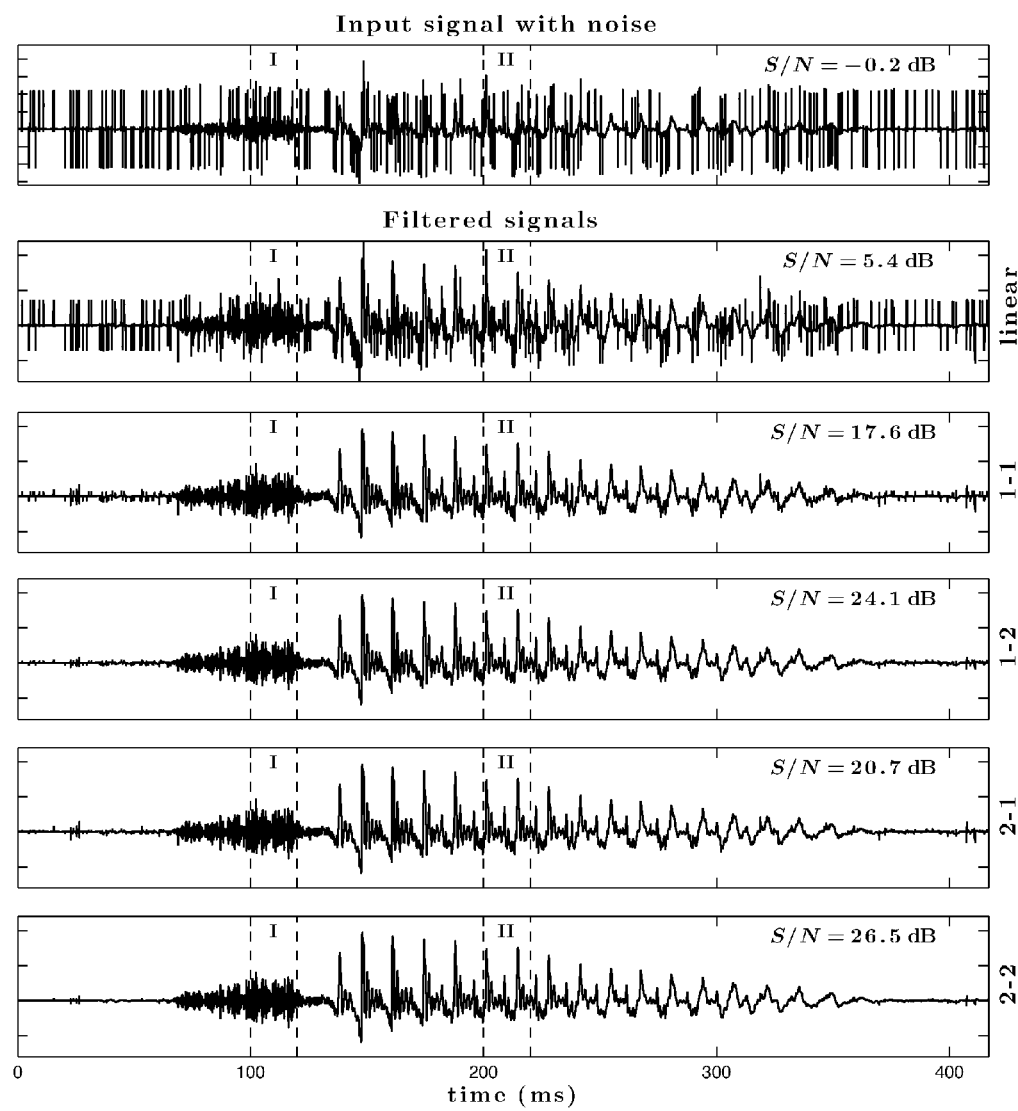

FIG. 127. Incoming signal of interest (a fragment of a speech signal) affected by a white impulsive noise (top panel), and the respective signals filtered by a linear lowpass filter and the ANDLs in the arrangements 1-1, 1-2, 2-1, and 2-2 shown in FIG. 116.

Figure 128:
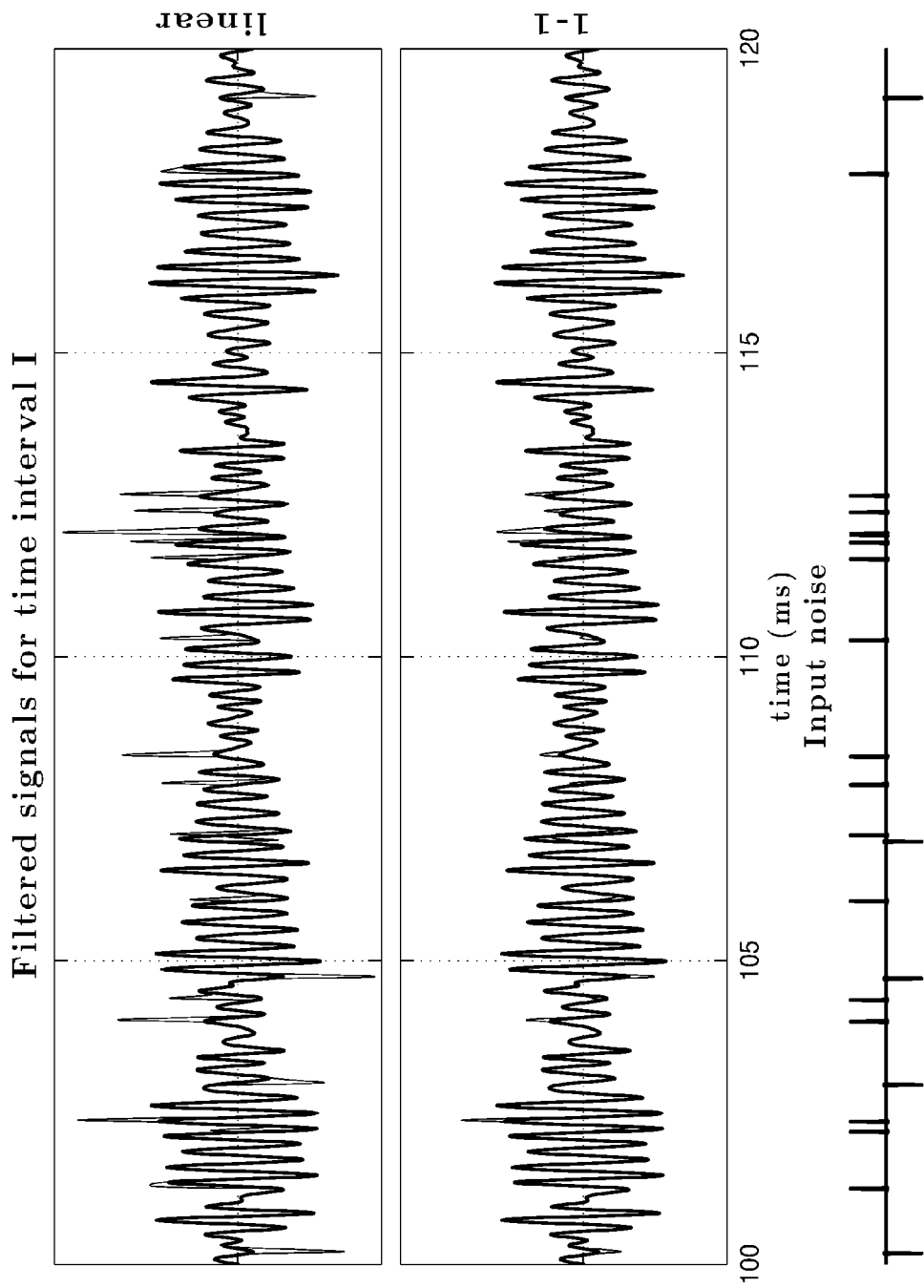

FIG. 128. Closer look, for the arrangement 1-1 (the least effective), at the specific time interval I indicated by the vertical dashed lines in FIG. 127, corresponding to a fricative consonant. The filtered signal without noise is shown by the thick lines, while the outputs of the respective filters for the noisy signal are shown by the thin lines.

Figure 129:
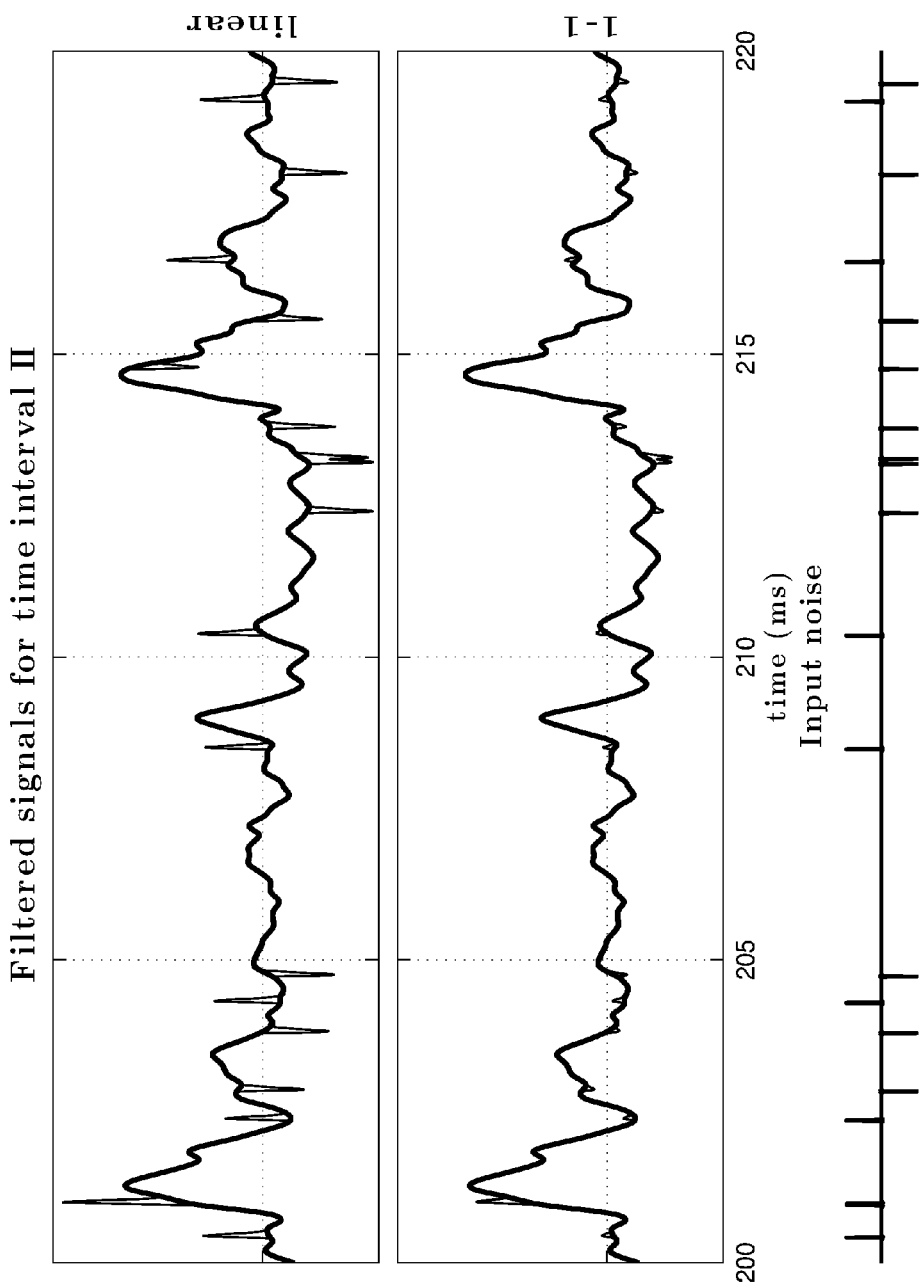

FIG. 129. Closer look, for the arrangement 1-1 (the least effective), at the specific time interval II indicated by the vertical dashed lines in FIG. 127, corresponding to a vowel. The filtered signal without noise is shown by the thick lines, while the outputs of the respective filters for the noisy signal are shown by the thin lines.

Figure 130:
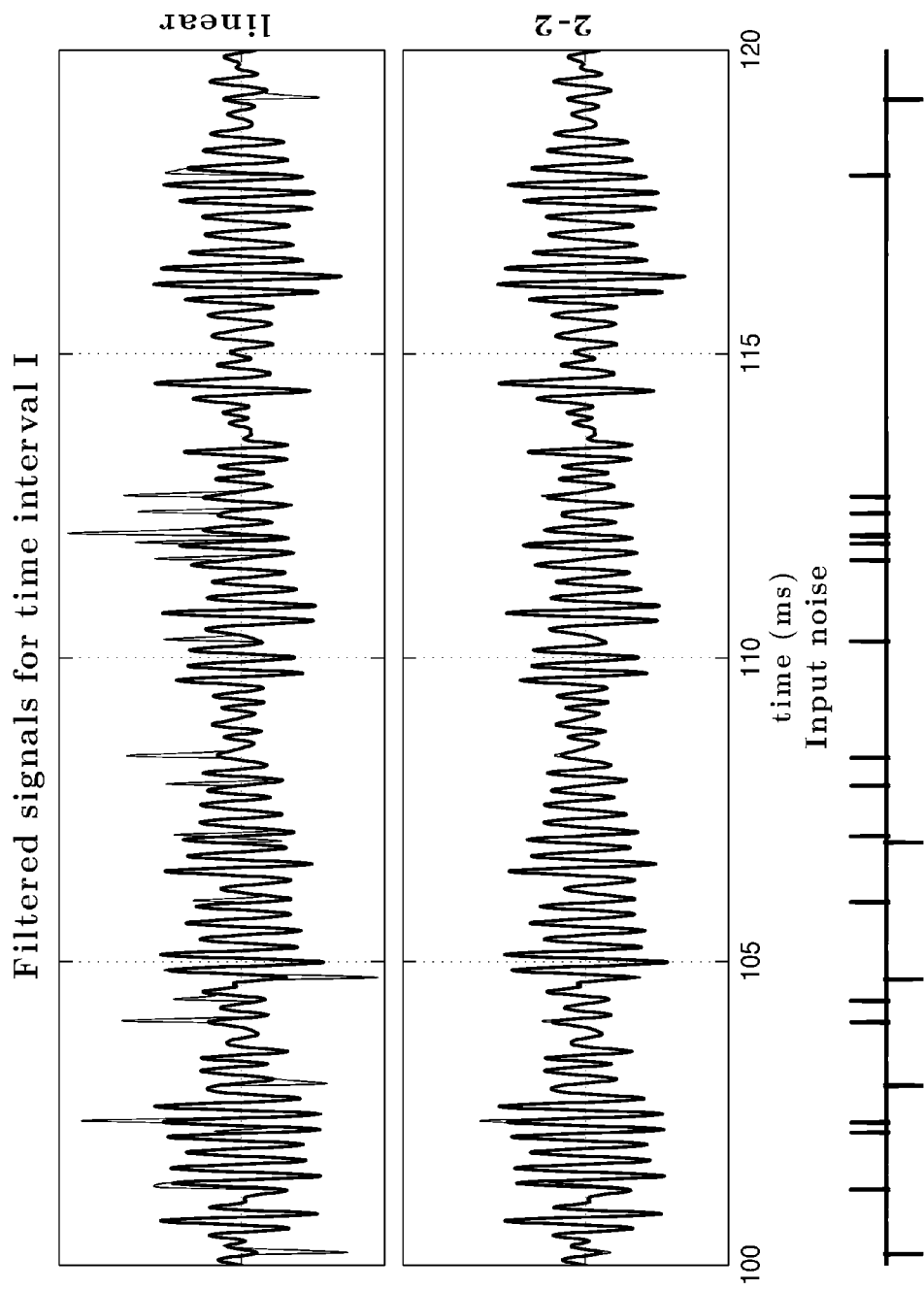

FIG. 130. Closer look, for the arrangement 2-2 (the most effective), at the specific time interval I indicated by the vertical dashed lines in FIG. 127, corresponding to a fricative consonant. The filtered signal without noise is shown by the thick lines, while the outputs of the respective filters for the noisy signal are shown by the thin lines.

Figure 131:
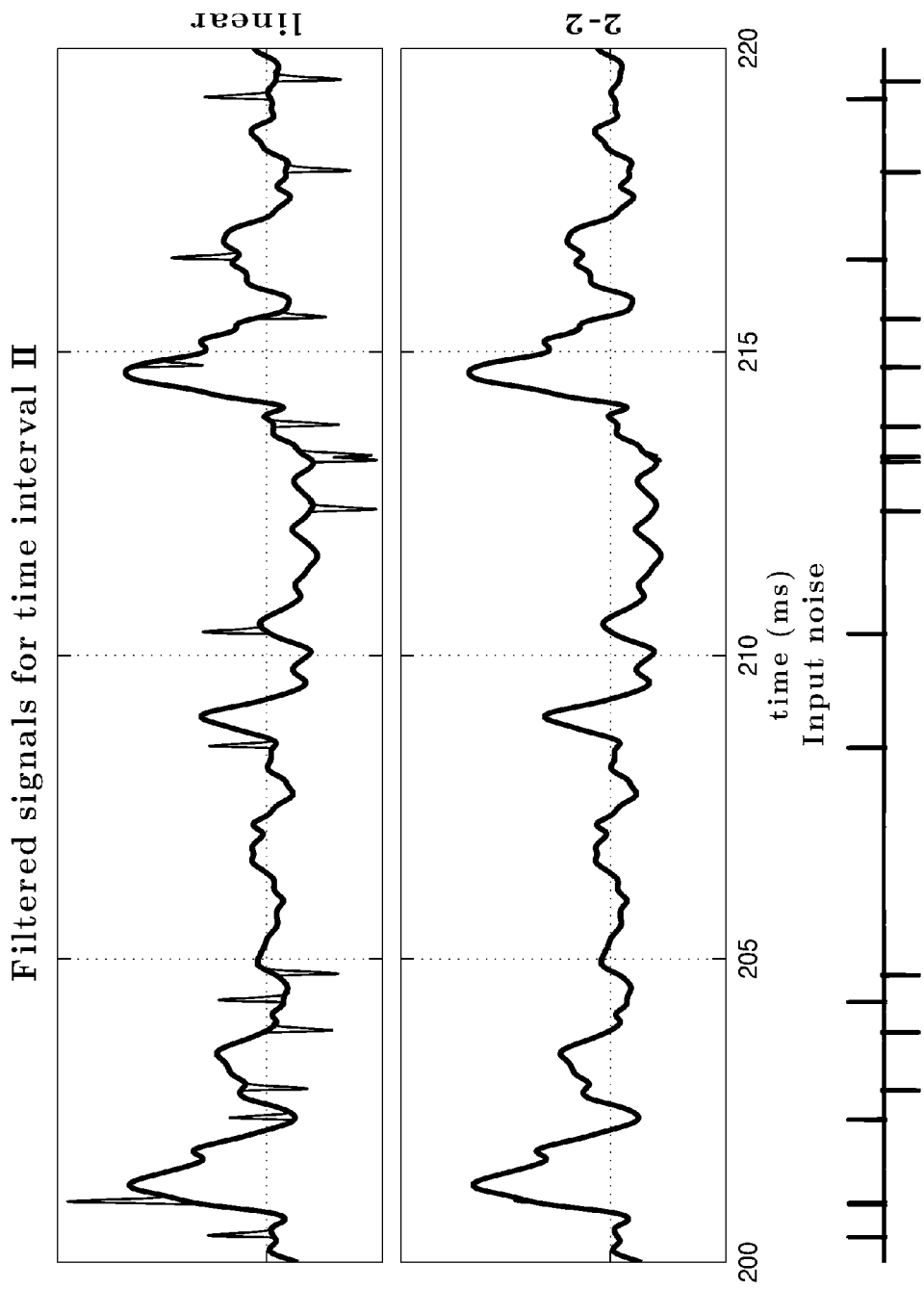

FIG. 131. Closer look, for the arrangement 2-2 (the most effective), at the specific time interval II indicated by the vertical dashed lines in FIG. 127, corresponding to a vowel. The filtered signal without noise is shown by the thick lines, while the outputs of the respective filters for the noisy signal are shown by the thin lines.

Figure 132:
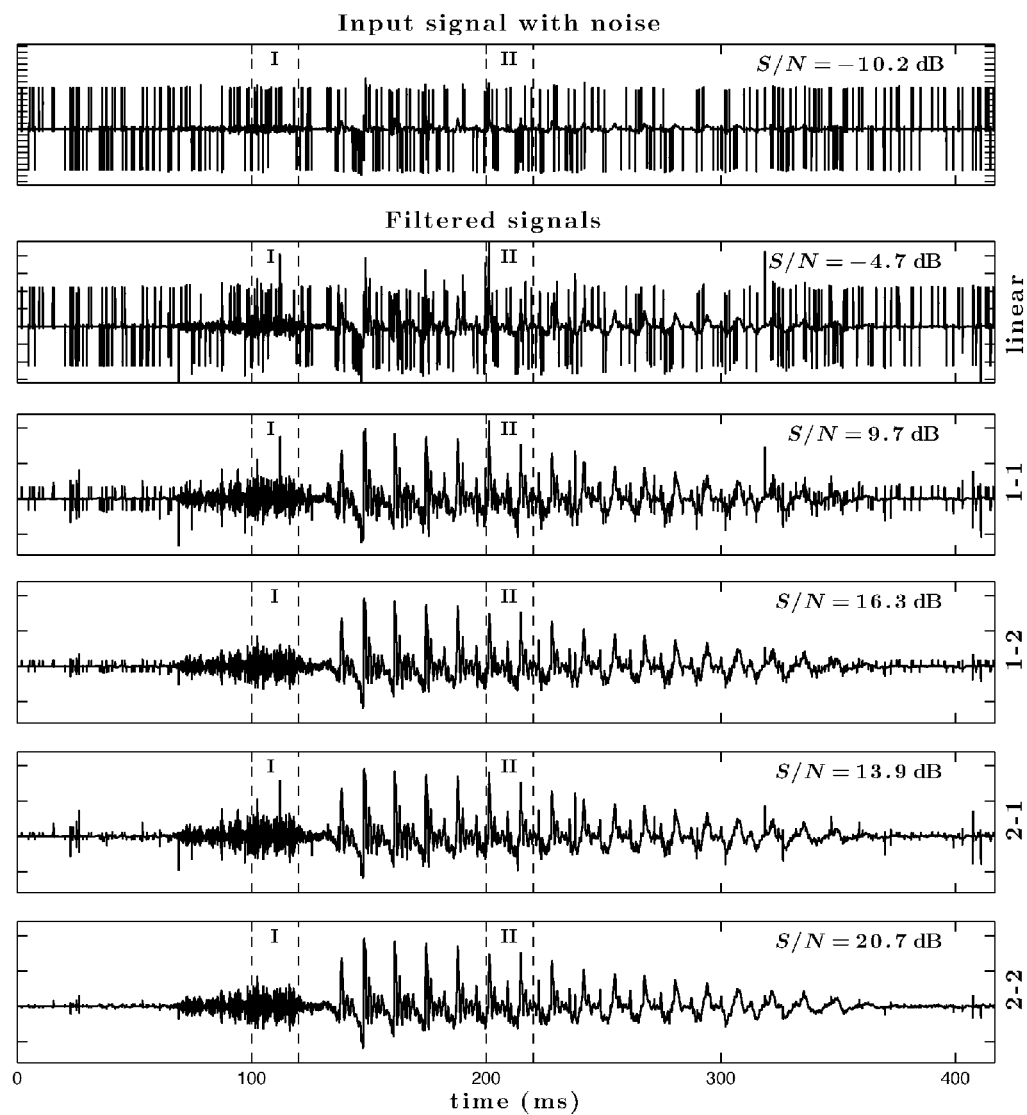

FIG. 132. Example of FIG. 127 repeated for stronger (by 10 dB in power) impulsive noise.

Figure 133:
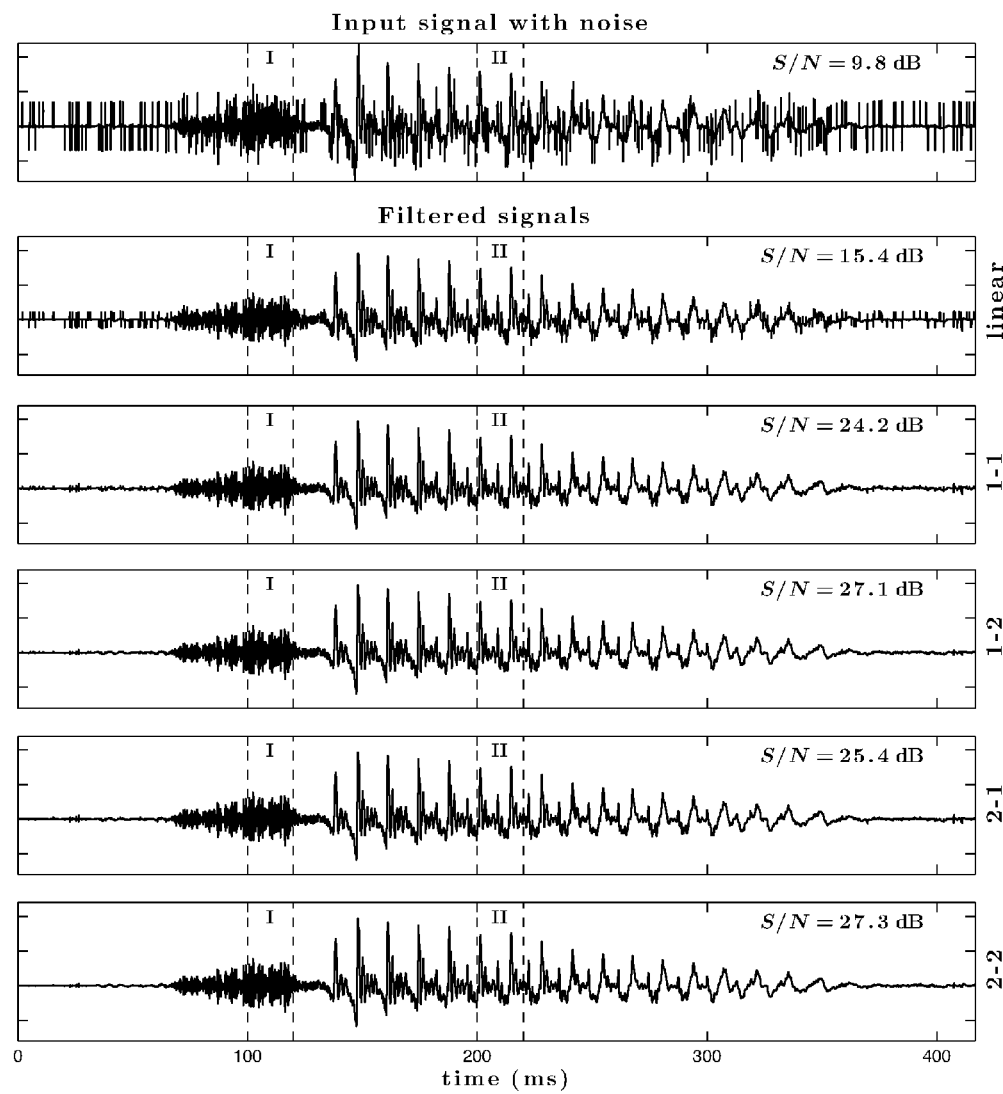

FIG. 133. Example of FIG. 127 repeated for weaker (by −10 dB in power) impulsive noise.

Figure 134:
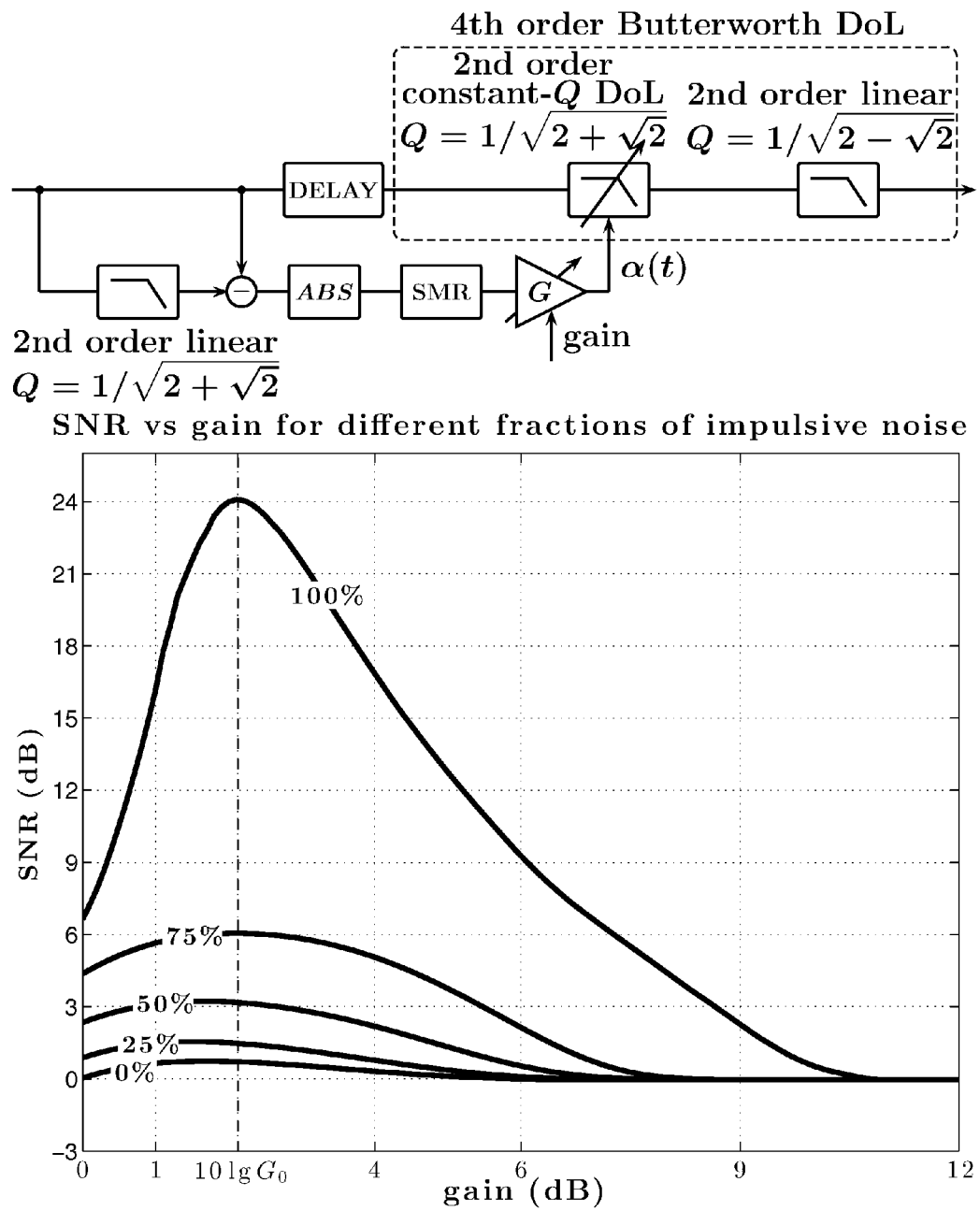

FIG. 134. Improvements in the signal quality (SNR) by the ANDL shown at the top of the figure when the total noise is a mixture of the impulsive and thermal noises. The lower panel shows the total SNR as a function of the ANDL gain G for different fractions of the impulsive noise in the mixture (from 0 to 100%).

Figure 135:
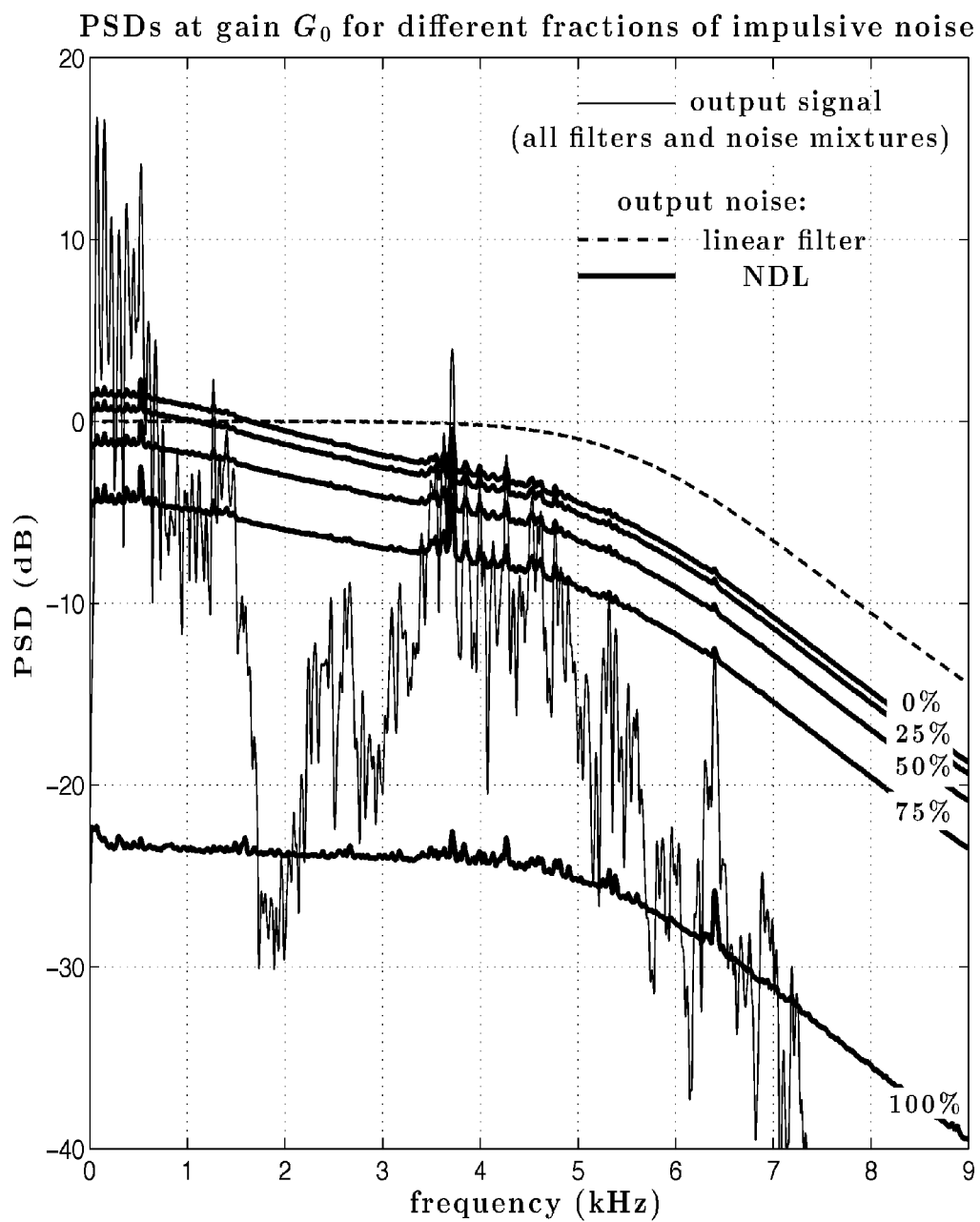

FIG. 135. Power spectral densities (PSDs) of the filtered signal of interest (thin solid line), the residual noise of the linear filter (dashed line), and the PSDs of the residual noise of the ANDL-filtered signals, for the gain value $G_0$ marked in FIG. 134 and different fractions of the impulsive noise (thick lines).

Figure 136:
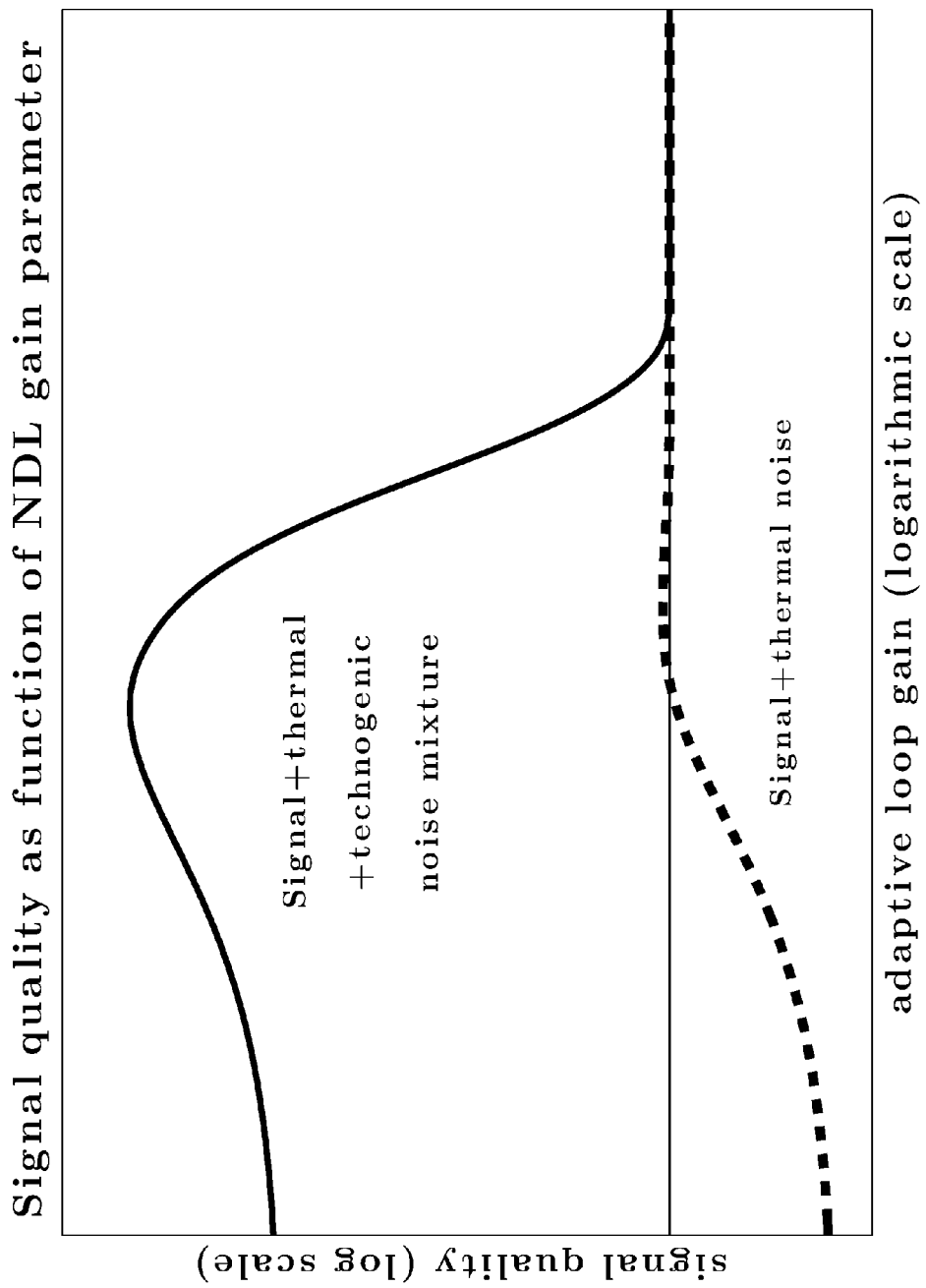

FIG. 136. Qualitative illustration of improving quality of a signal of interest by a generic adaptive NDL characterized by the gain in its adaptive loop, when the signal is affected by an interfering noise.

Figure 137:
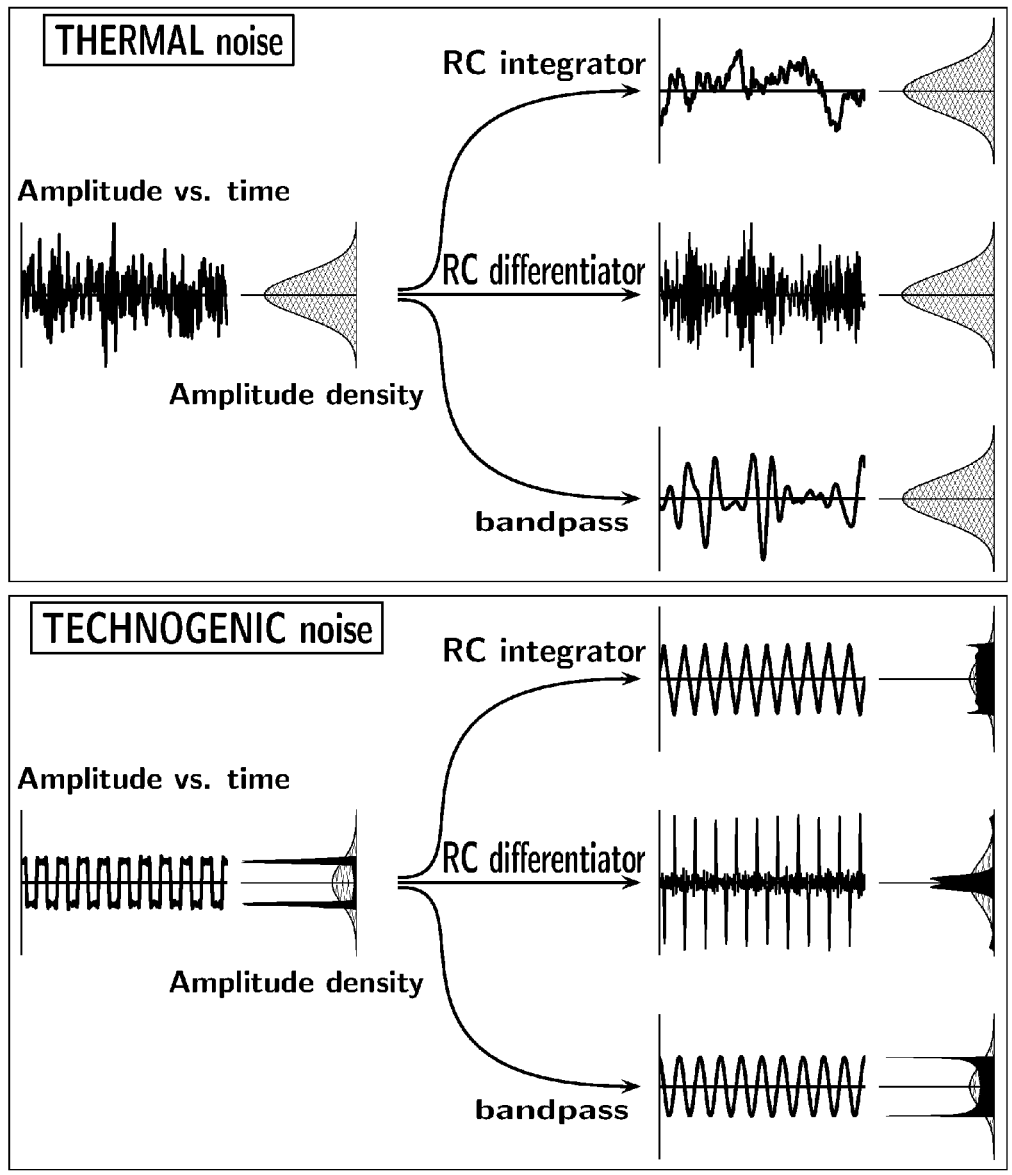

FIG. 137. Illustration of the effect of linear filtering on amplitude distributions of thermal (upper panel) and technogenic (lower panel) signals.

Figure 138:
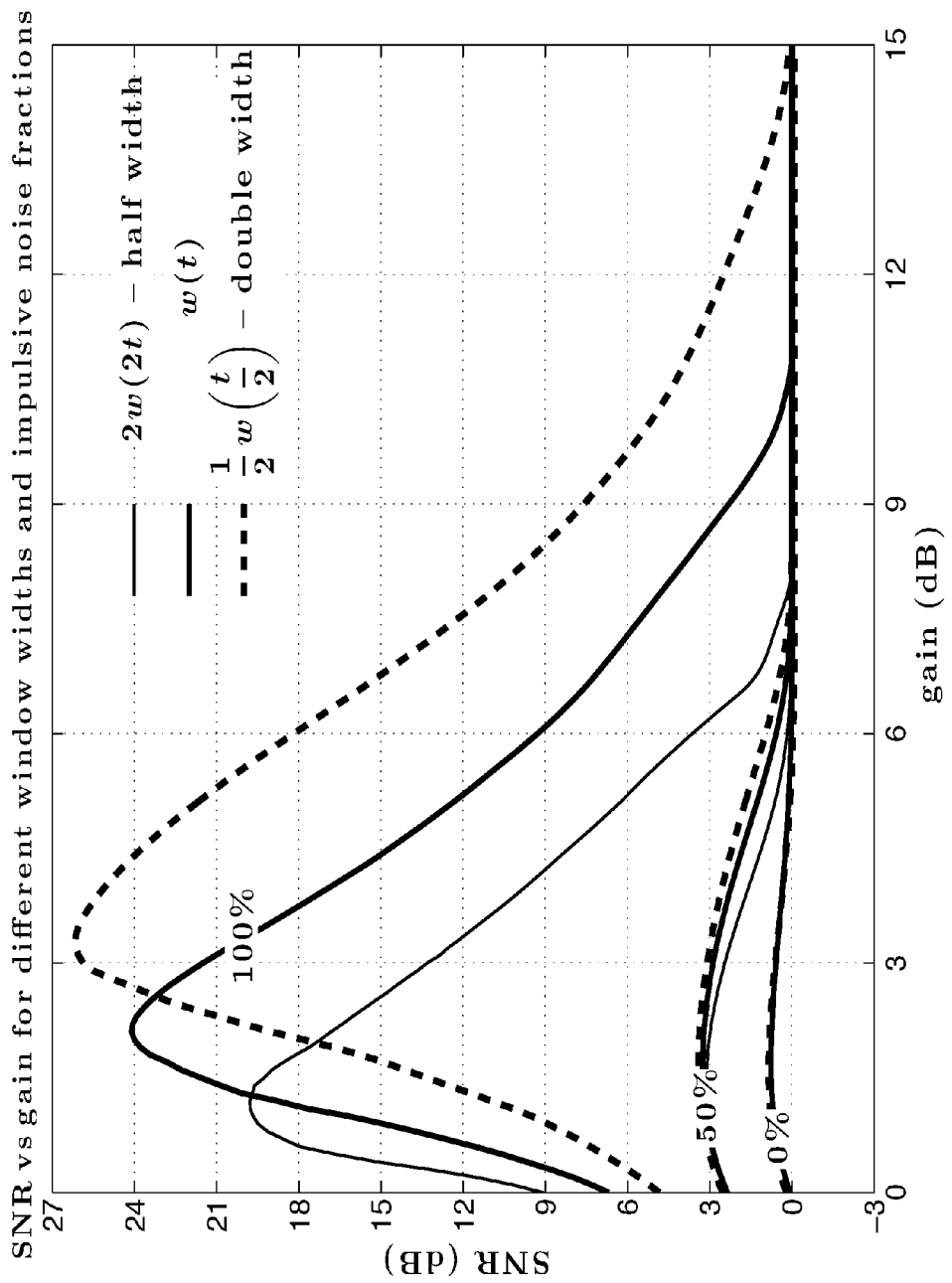

FIG. 138. Illustration of the dependence of the "signal quality vs. gain" curves on the width of the window function of the WMT circuit, for several different fractions of the impulsive noise in the mixture (0%, 50%, and 100%).

Figure 139:
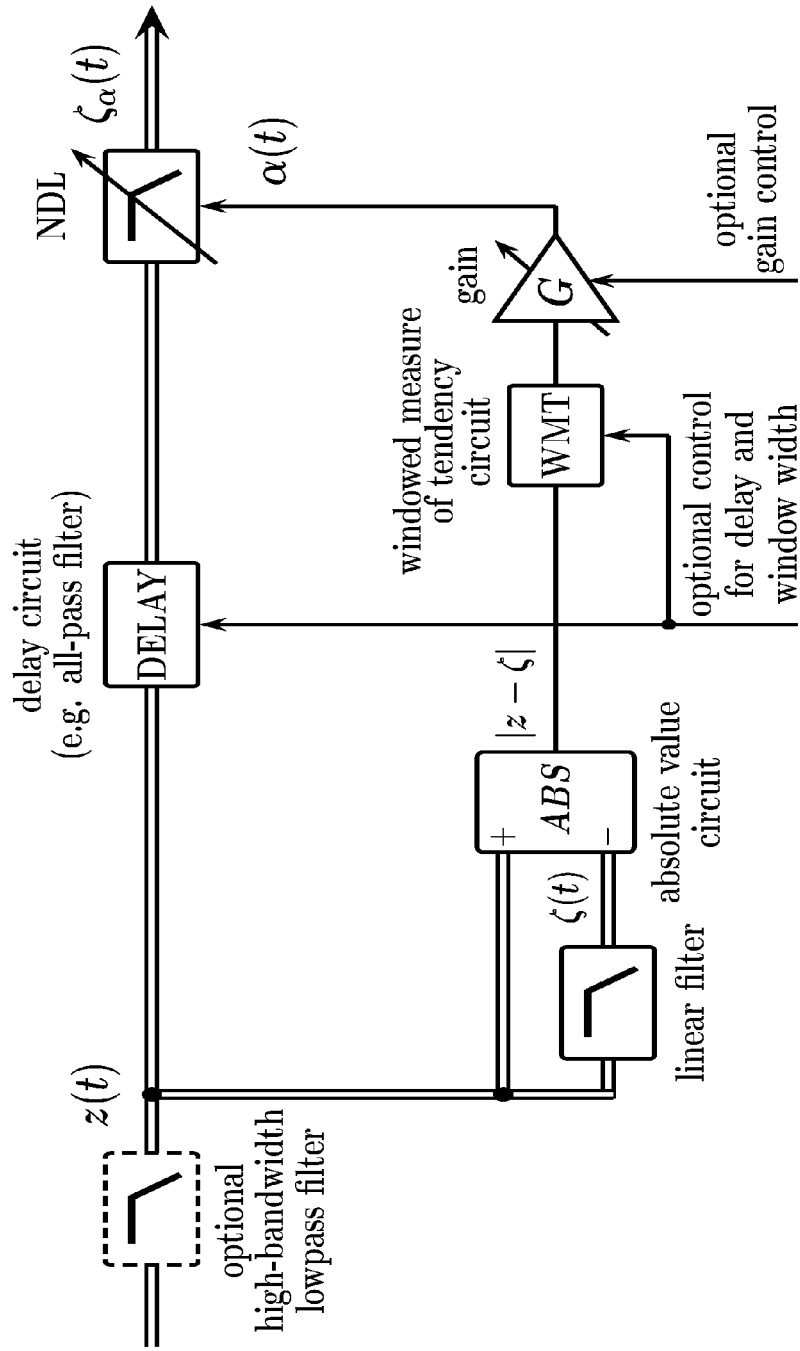

FIG. 139. Illustrative diagram of an Adaptive Nonlinear Differential Limiter explicitly showing controls for the gain, delay, and the width of the WMT sub-circuit's window.

Figure 140:
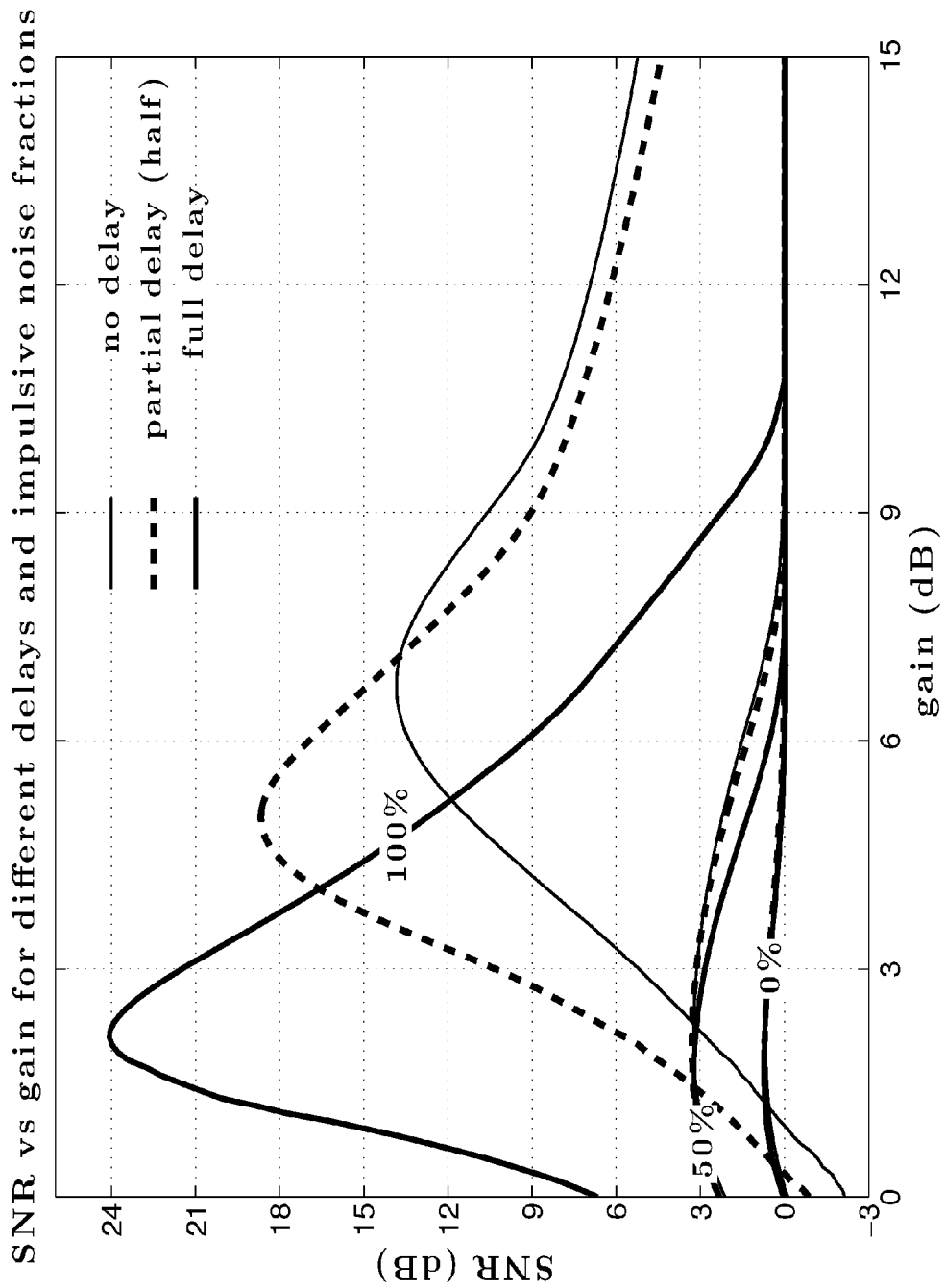

FIG. 140. Illustration of the dependence of the "signal quality vs. gain" curves on the delay introduced by the delay circuit, for several different fractions of the impulsive noise in the mixture (0%, 50%, and 100%).

FIG. 141. Simplified diagrams of 1st order $\Delta\Sigma$ modulators.

Figure 142:
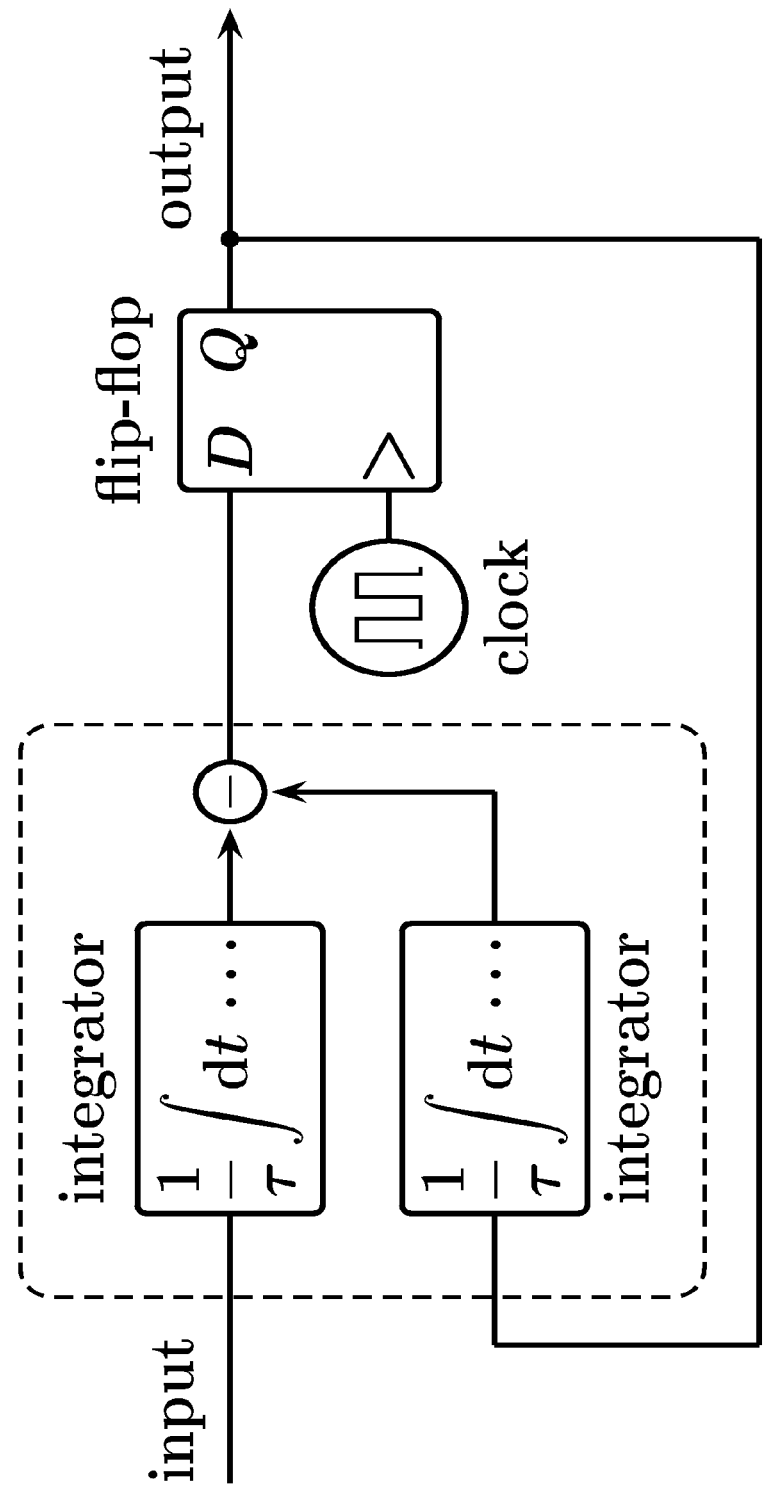

FIG. 142. Simplified diagram of a modified $\Delta\Sigma$ modulator that is equivalent to the one shown in FIG. 141(a).

Figure 143:
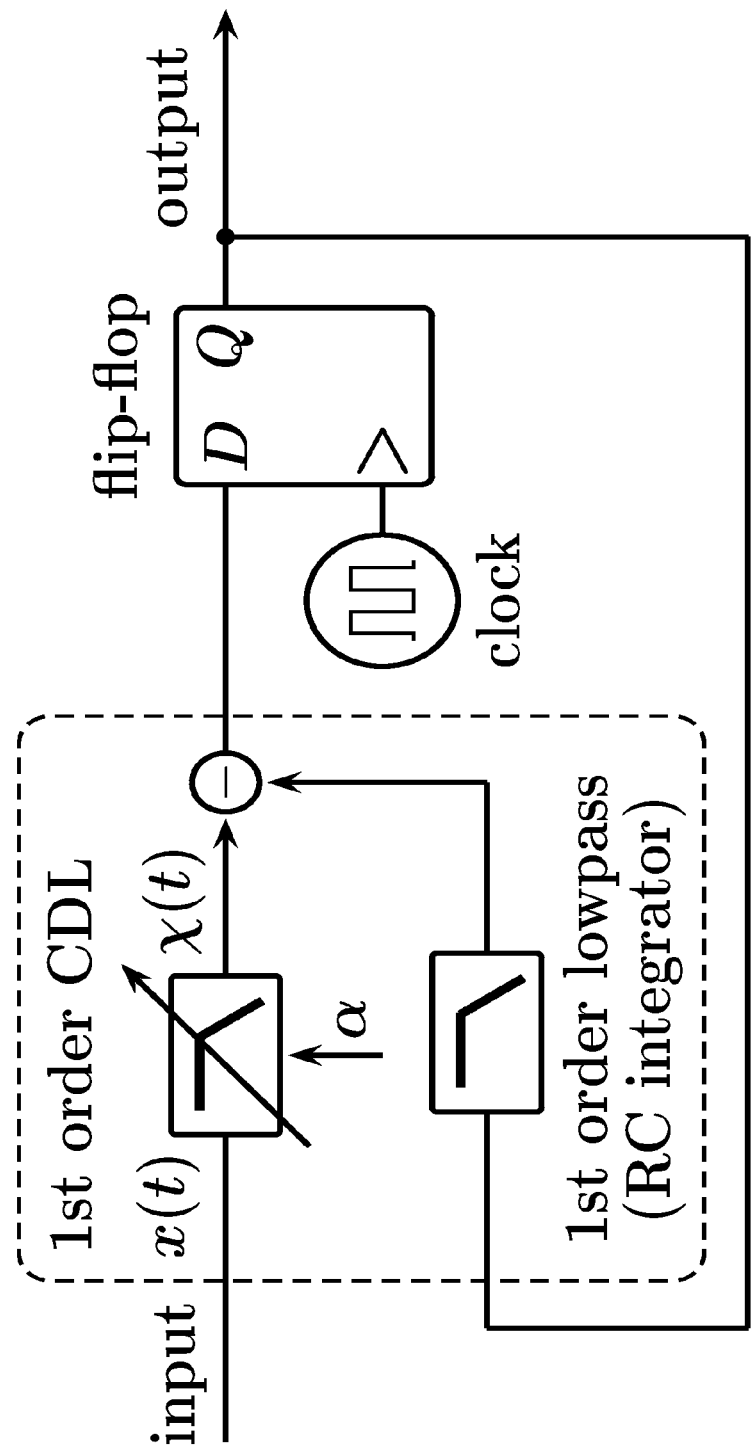

FIG. 143. Simplified diagram of an improved $\Delta\Sigma$ modulator.

Figure 144:
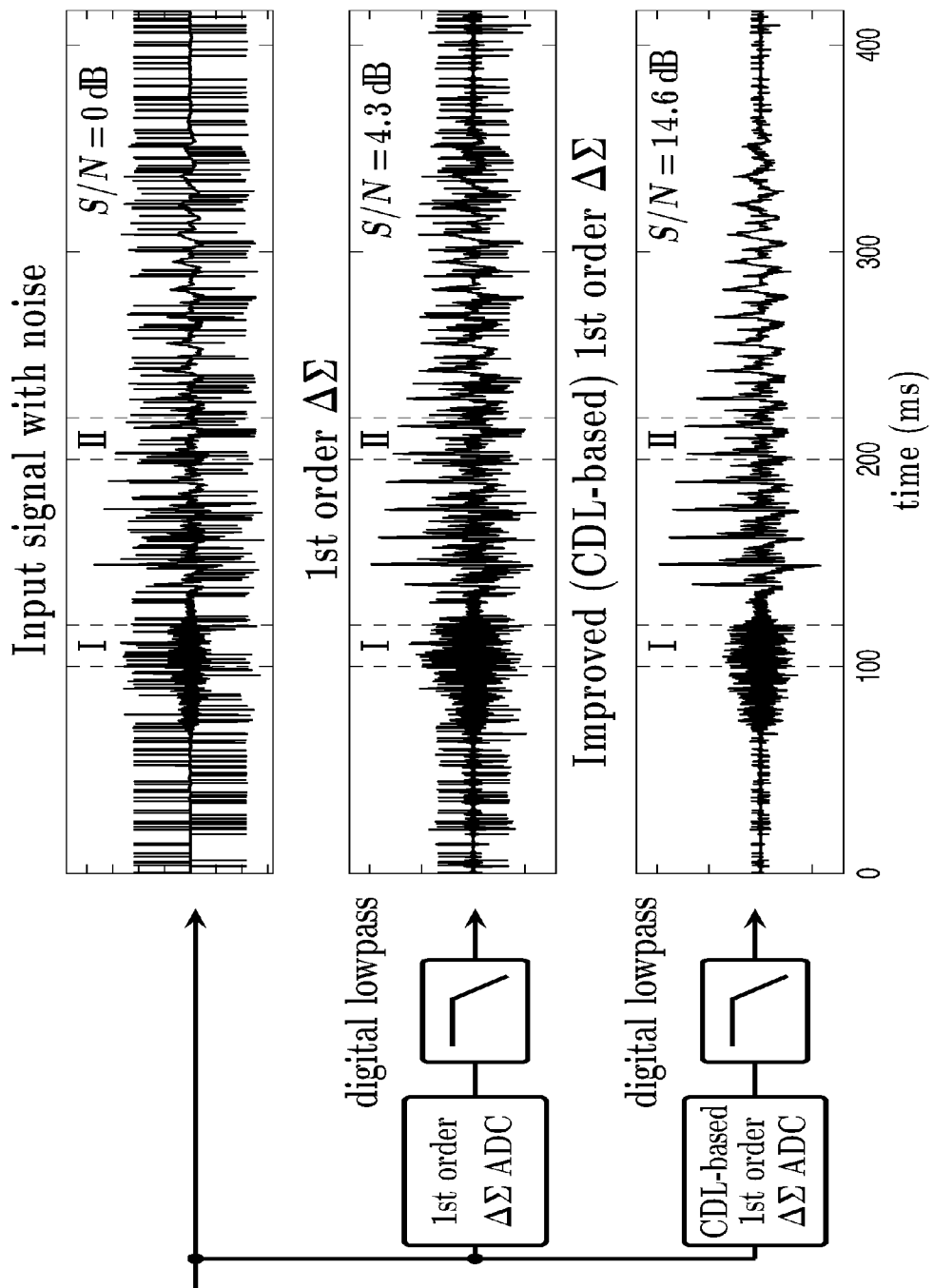

FIG. 144. Incoming signal of interest (a fragment of a speech signal) affected by a white impulsive noise (top panel), and the respective signals acquired by a 1st order $\Delta\Sigma$ ADC (middle panel) and an improved CDL-based 1st order $\Delta\Sigma$ ADC (bottom panel), and subsequently filtered by digital lowpass filters to within approximately 8 kHz band.

Figure 145:
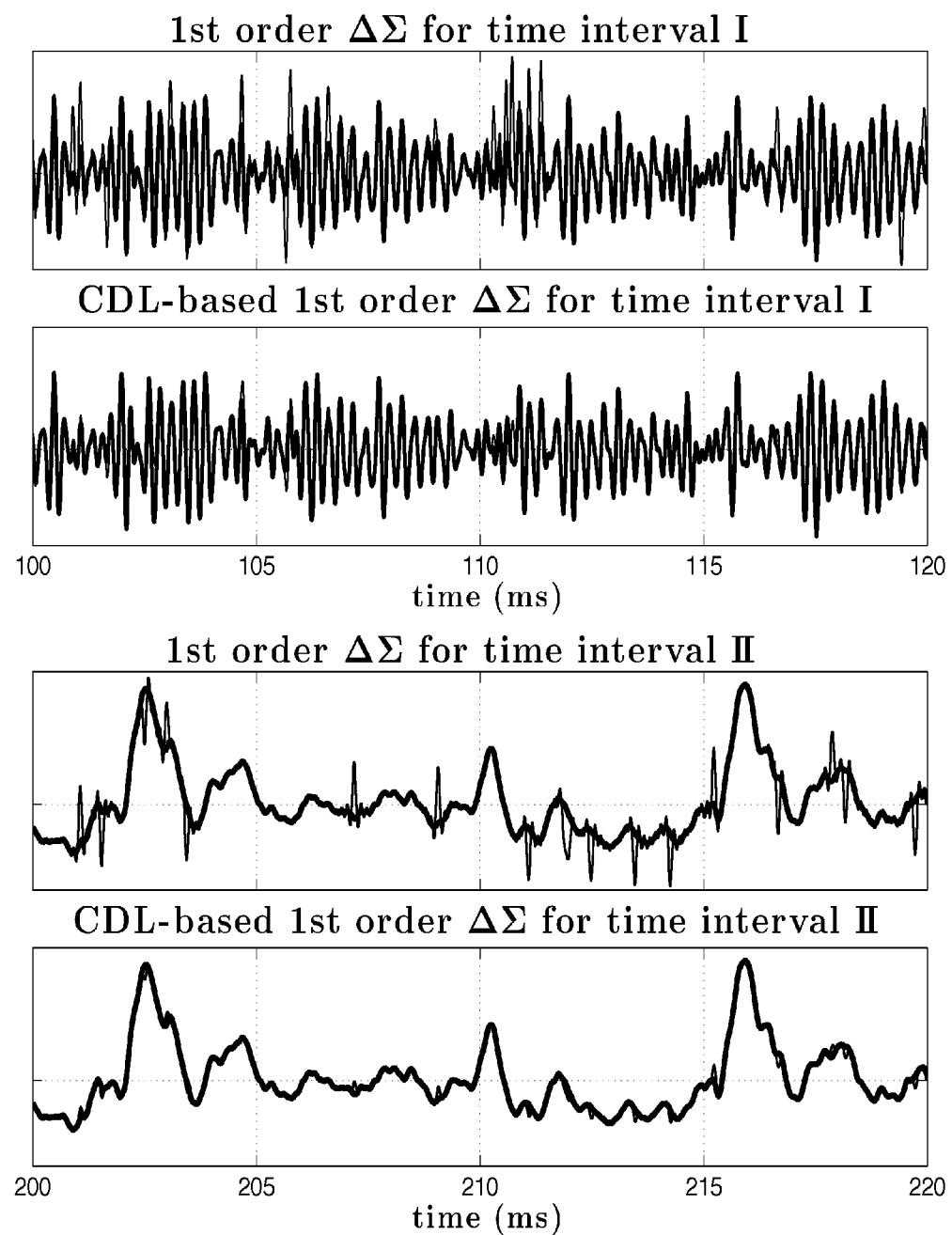

FIG. 145. Closer look at the specific time intervals I and II indicated by the vertical dashed lines in FIG. 144.

Figure 146:
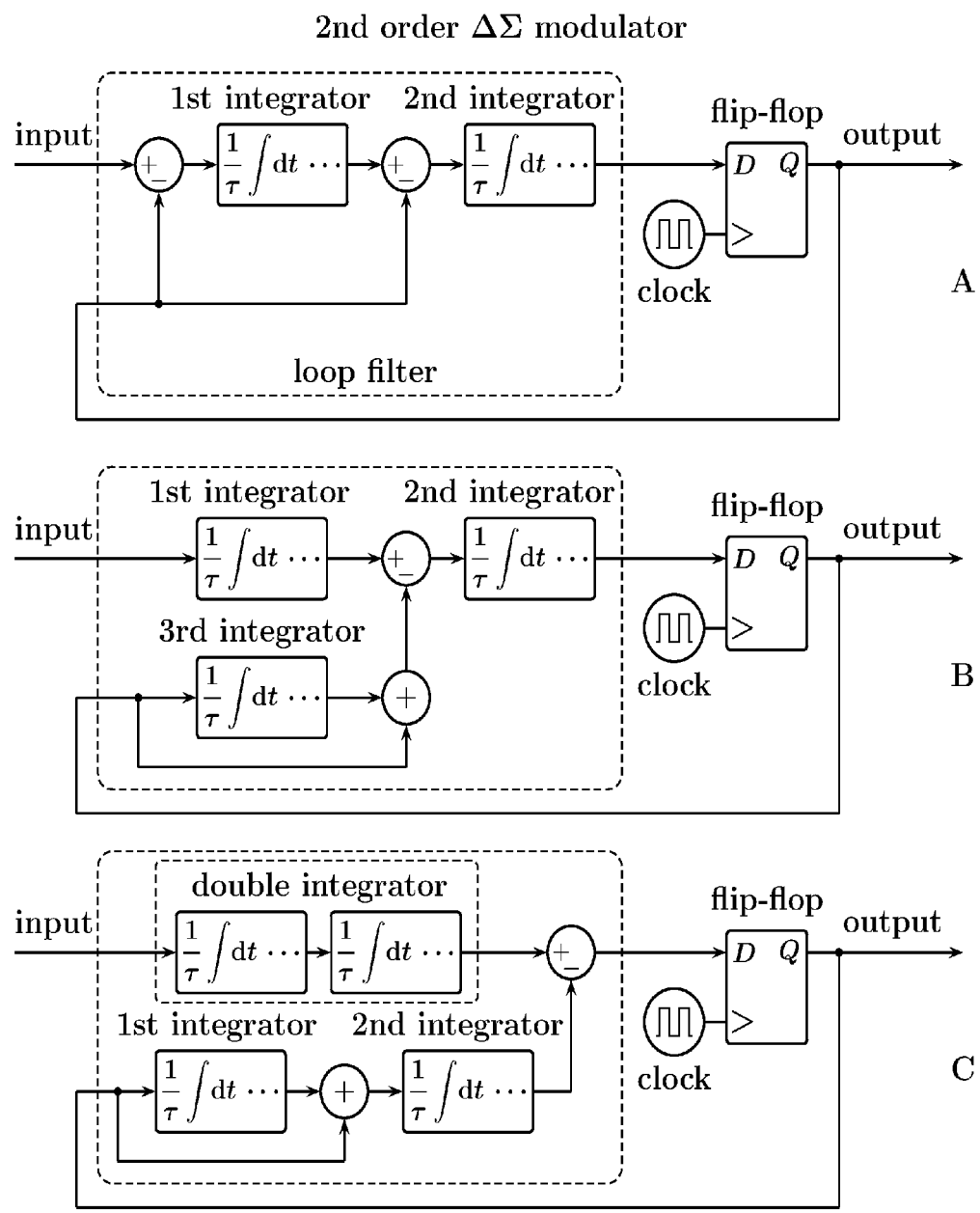

FIG. 146. Examples of equivalent configurations of a second order $\Delta\Sigma$ modulator.

FIG. 147. Illustration of improving $\Delta\Sigma$ modulators by replacing linear loop filters in the noise-shaping loops by NDL-based loop filters.

Figure 148:
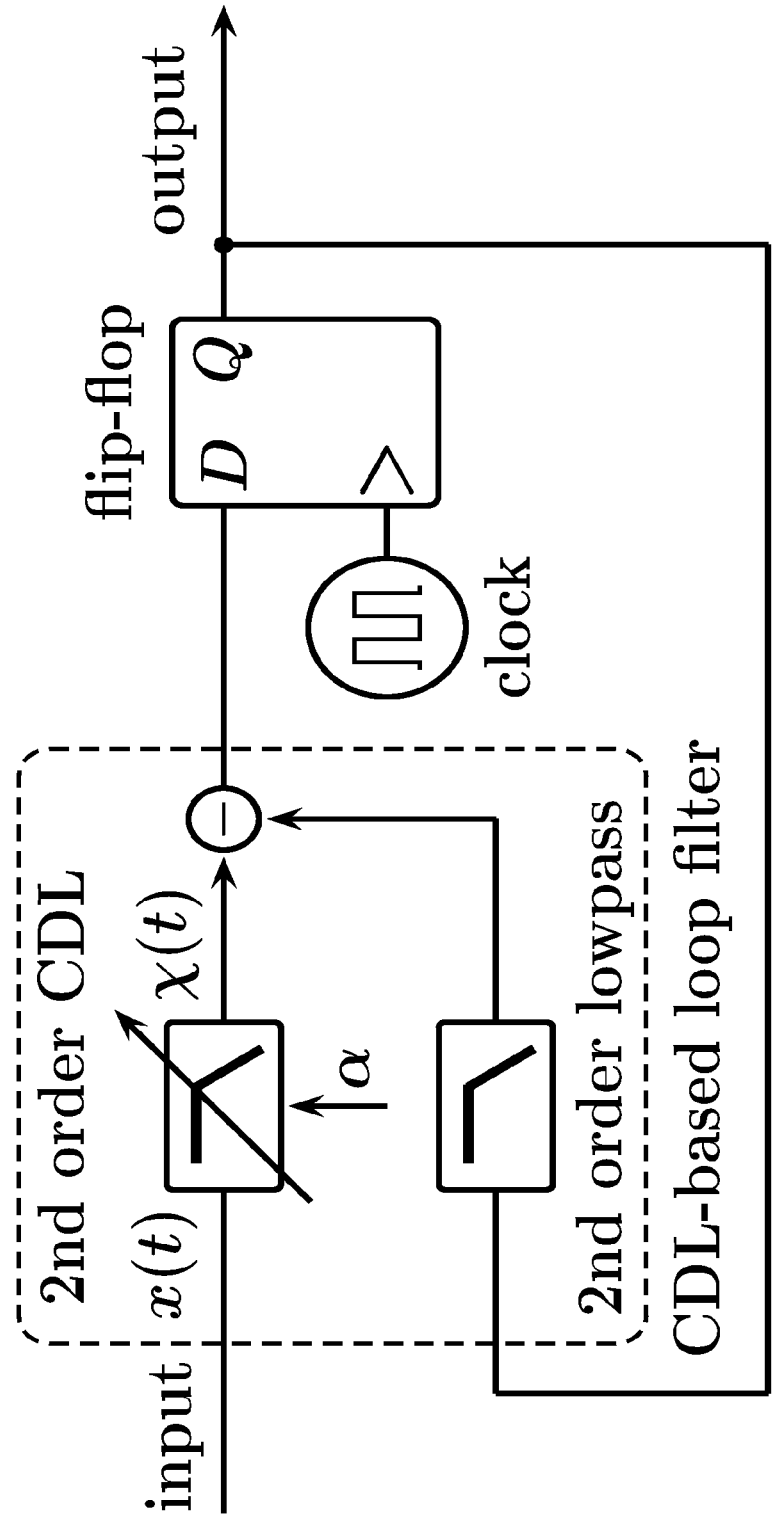

FIG. 148. Example of an improved 2nd order $\Delta\Sigma$ modulator where the loop filter is a CDL-based loop filter consisting of a 2nd order linear lowpass filter and a 2nd order CDL.

Figure 149:
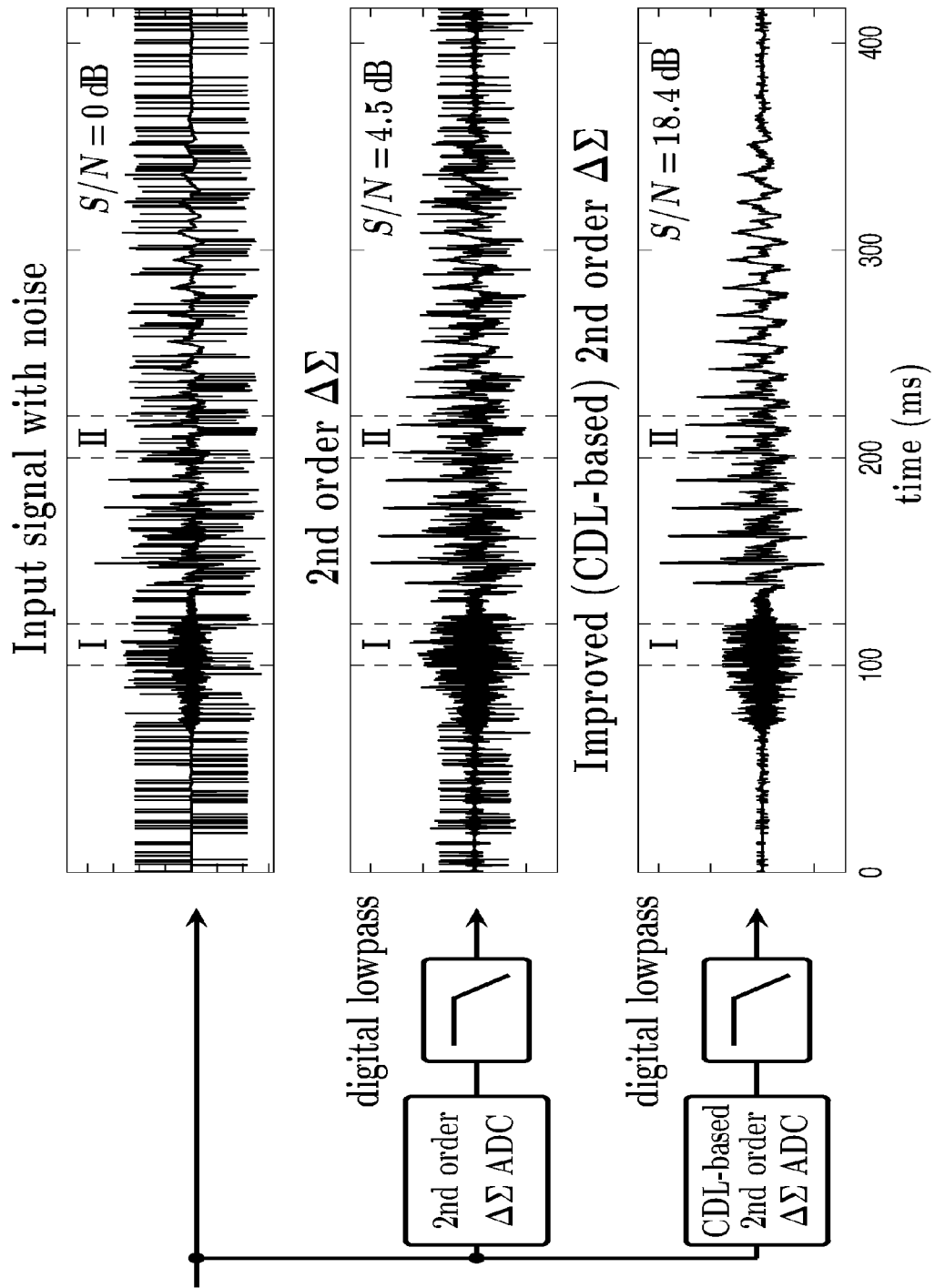

FIG. 149. Incoming signal of interest (a fragment of a speech signal) affected by a white impulsive noise (top panel), and the respective signals acquired by a 2nd order $\Delta\Sigma$ ADC (middle panel) and an improved CDL-based 2nd order ΔΣ ADC shown in FIG. 148 (bottom panel), and subsequently filtered by digital lowpass filters to within approximately 8 kHz band.

Figure 150:
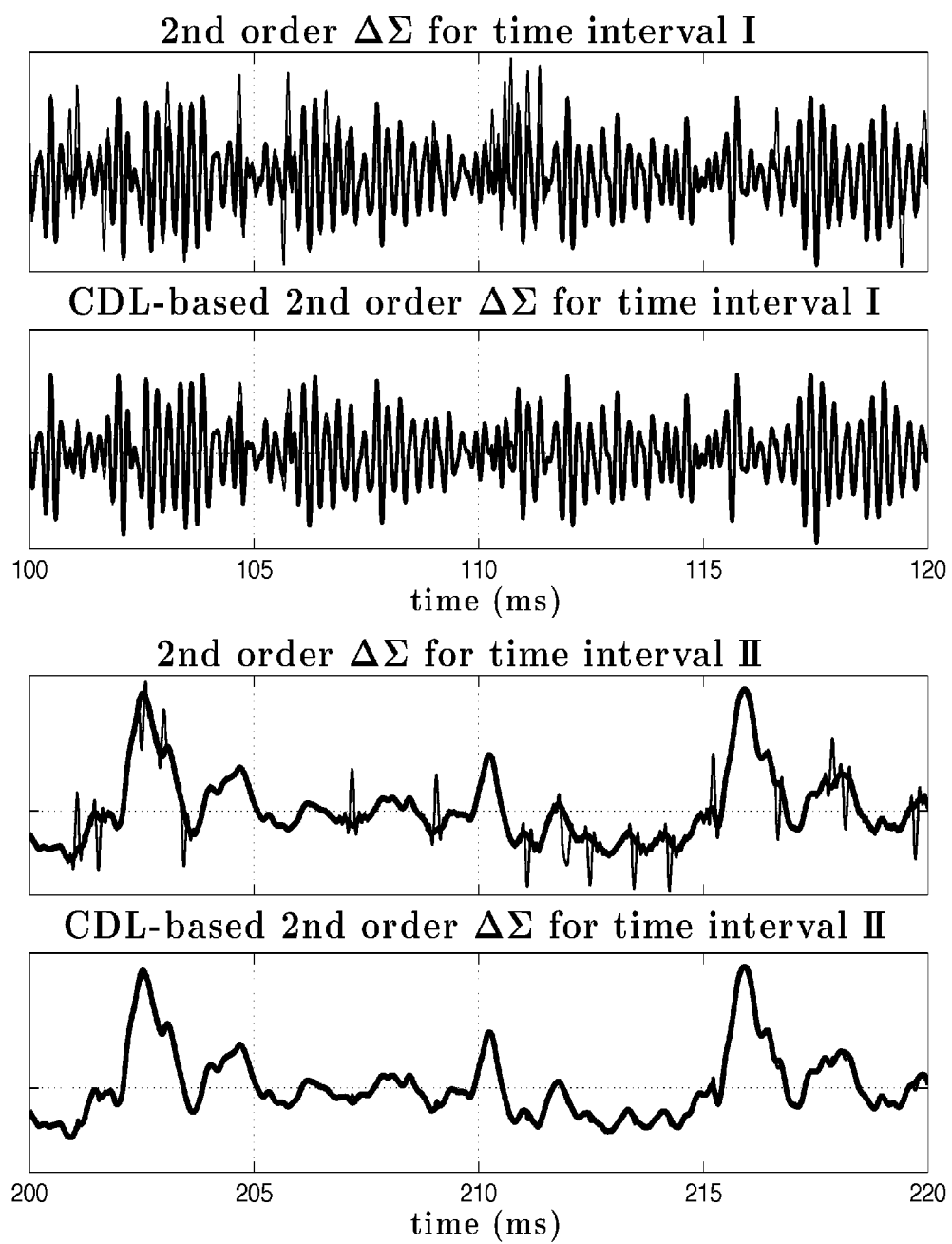

FIG. 150. Closer look at the specific time intervals I and II indicated by the vertical dashed lines in FIG. 149.

FIG. 151. Simplified concept of improving receiver performance in the presence of technogenic (man-made) interference, where NDLs/ANDLs are used as a replacement, or in conjunction with the existing mixer/linear filters.

Figure 152:
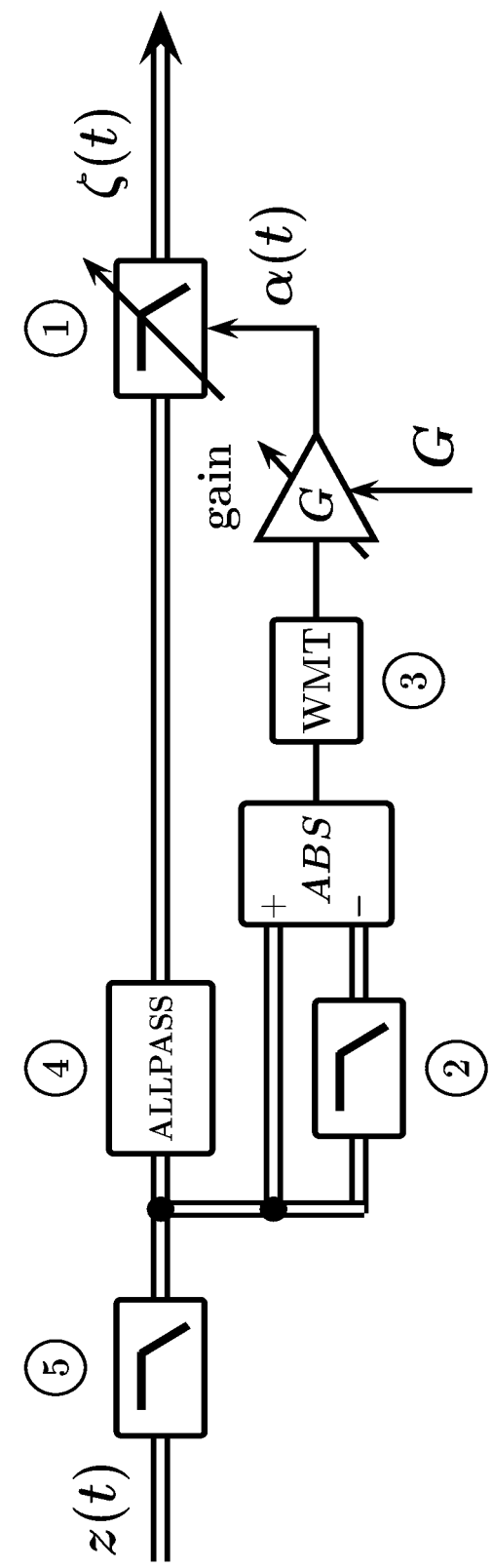

FIG. 152. Example of an ANDL that may be used to replace a linear lowpass filter in a receiver.

Figure 153:
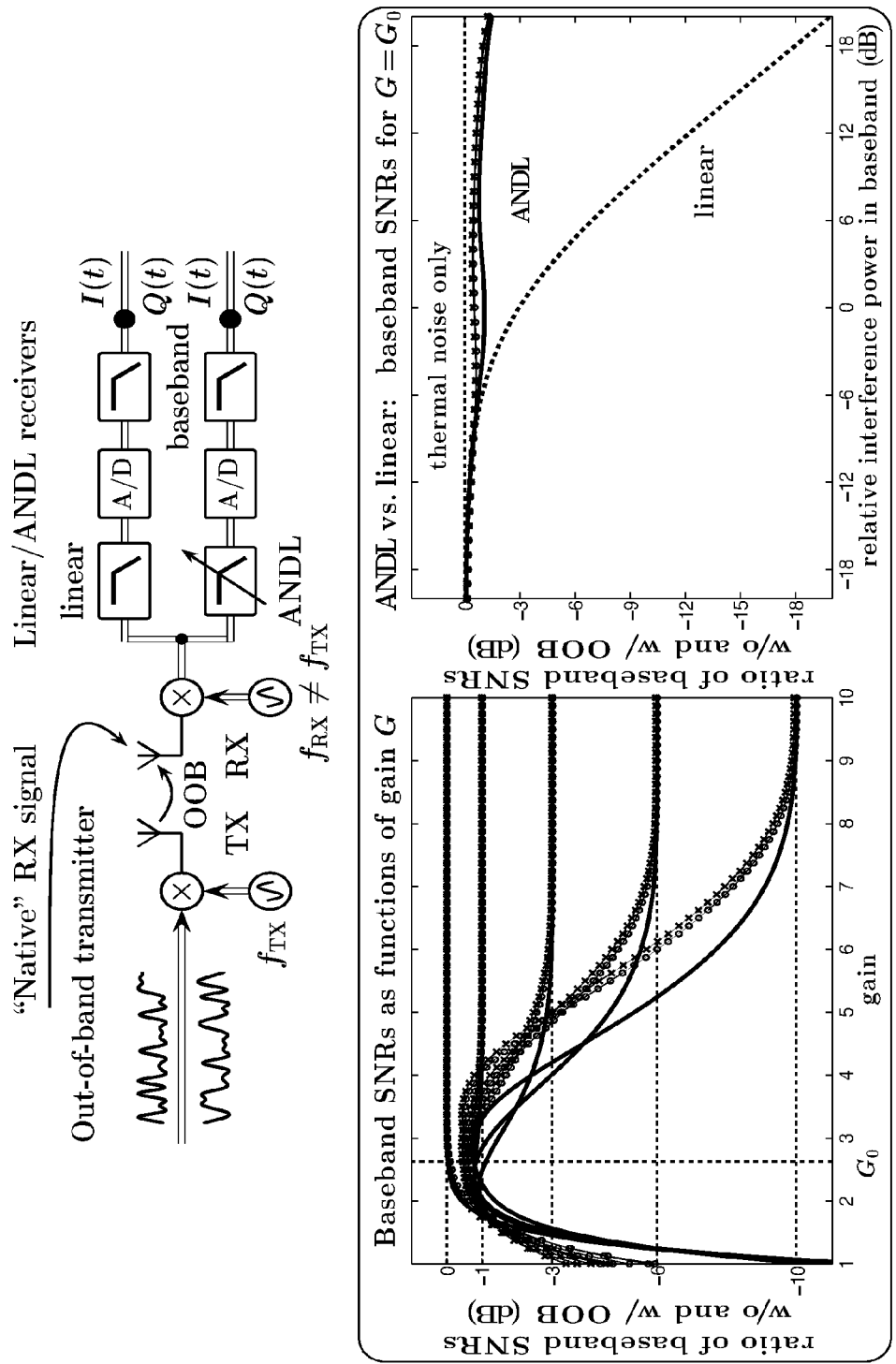

FIG. 153. Illustrative example of reducing technogenic interference by an ANDL shown in FIG. 152.

Figure 154:
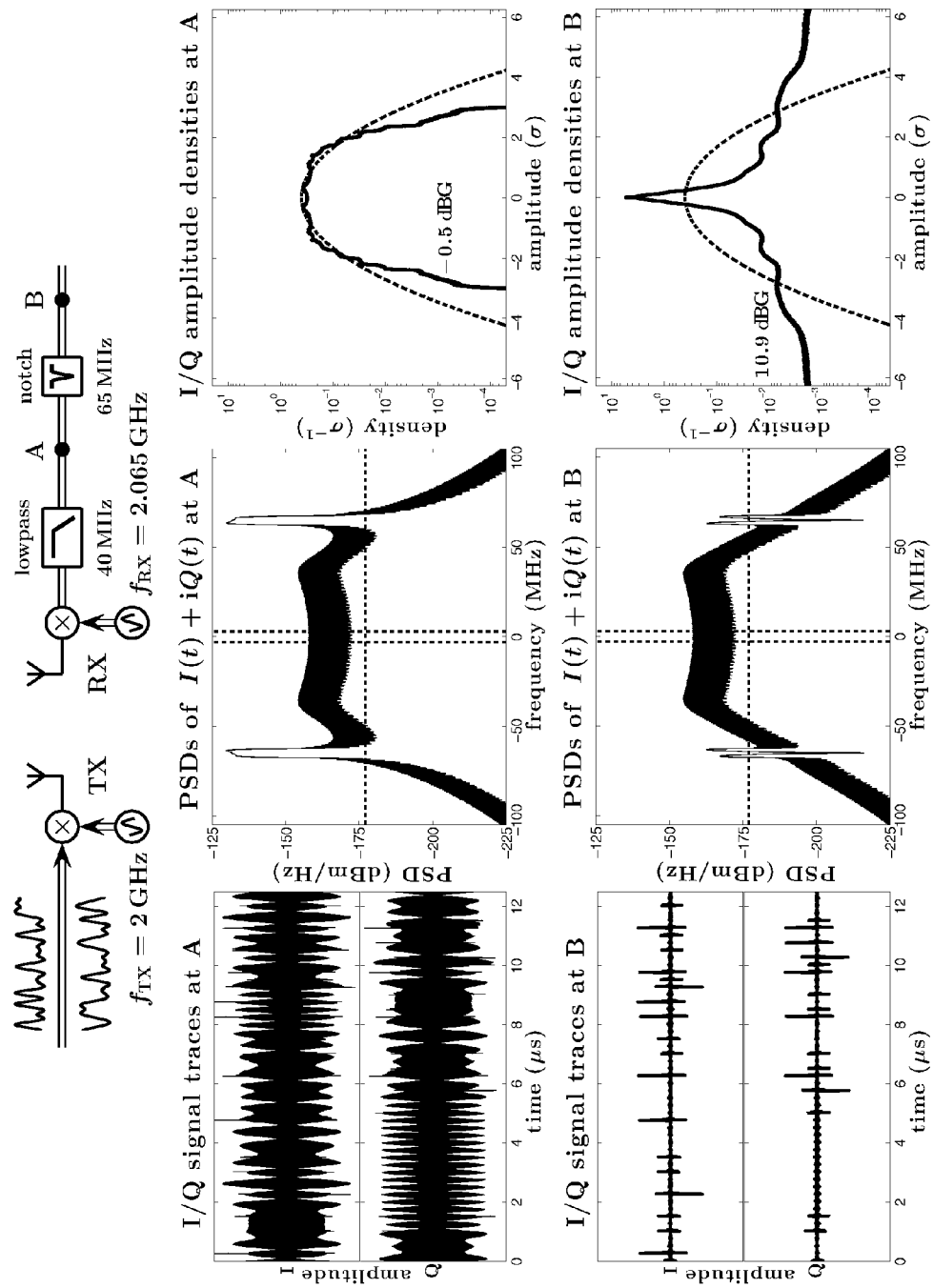

FIG. 154. Time (left panels) and frequency (middle panels) domain quantification, and the average amplitude densities of the in-phase (I) and quadrature (Q) components (right panels) of the receiver signal without thermal noise after the lowpass filter (upper row of panels), and after the lowpass filter cascaded with a 65 MHz notch filter (lower row of panels), for a particular interference example in the transmitter-receiver pair schematically shown at the top.

Figure 155:
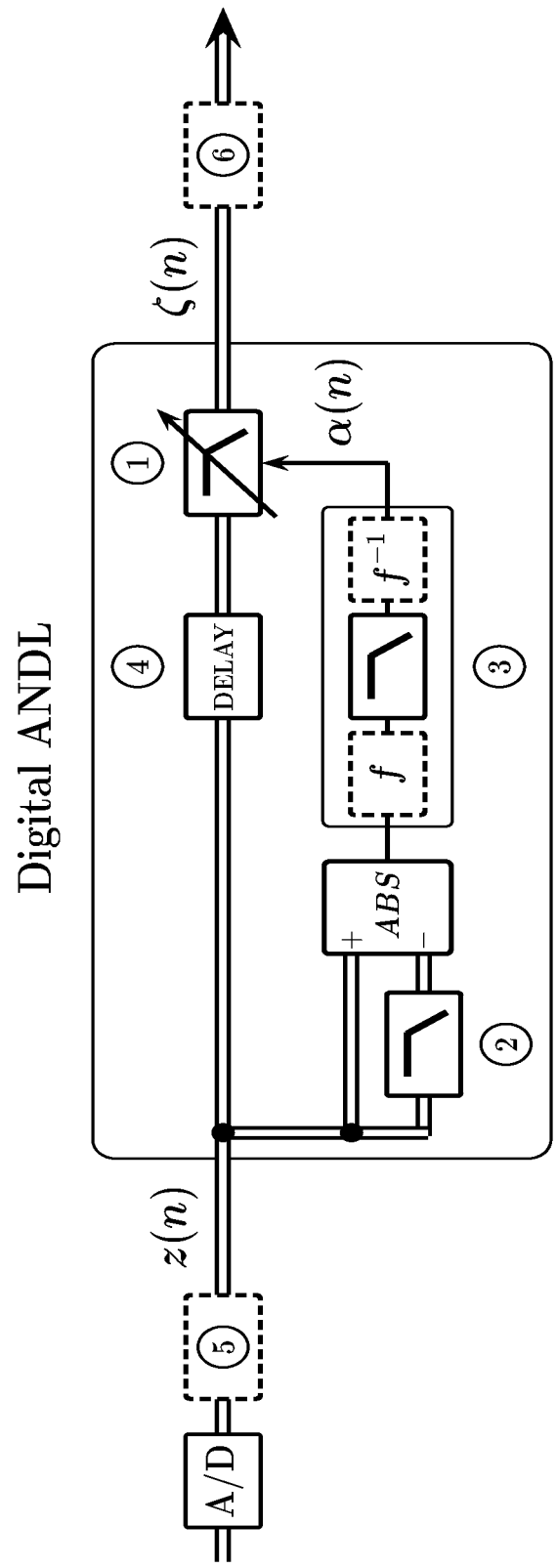

FIG. 155. Example of a digital ANDL.

Figure 156:
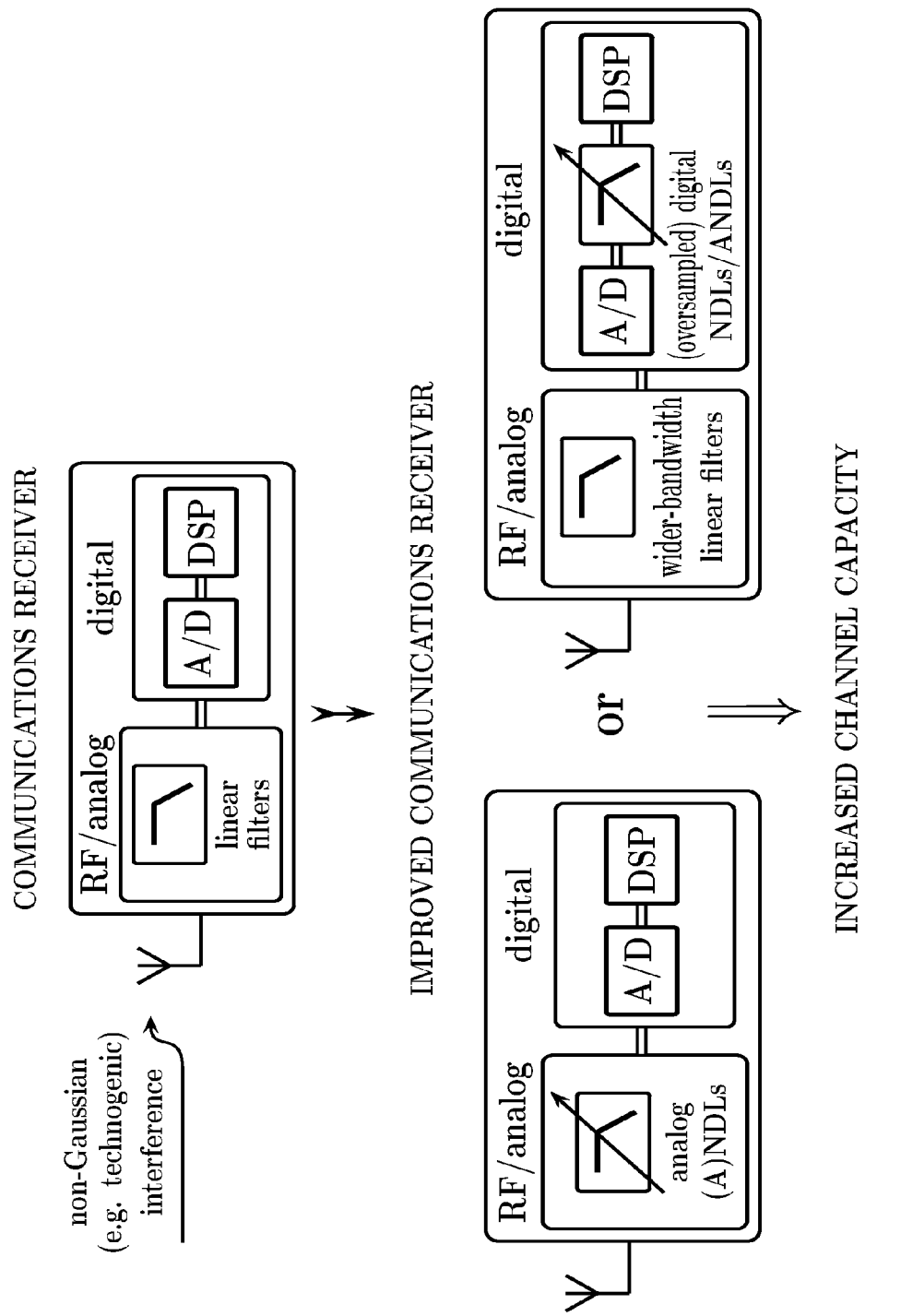

FIG. 156. Schematic illustration of improving wireless and/or wired communications receivers (e.g. through providing resistance to man-made interference) by means of deploying analog or digital NDLs/ANDLs.

ABBREVIATIONS

ACI: Adjacent-Channel Interference; A/D: Analog-to-Digital Converter; ADC: Analog-to-Digital Converter; AFE: Analog Front End; aka: also known as; ANDL: Adaptive Nonlinear Differential Limiter; ARP: Adaptive Resolution Parameter; ASIC: Application-Specific Integrated Circuit; ASSP: Application-Specific Standard Product; AWGN: Additive White Gaussian Noise; CDL: Canonical Differential Limiter; CDMA: Code Division Multiple Access; CMOS: Complementary Metal-Oxide-Semiconductor; CSB: Control Signal Block; CSC: Control Signal Circuit; CTΔΣ: Continuous-Time Delta-Sigma; DAC: Digital-to-Analog Converter; DC: Direct Current; DcL: Differential critical Limiter; DoL: Differential over-Limiter; DSL: Digital Subscriber Line; DSP: Digital Signal Processing/Processor; DTΔΣ: Discrete-Time Delta-Sigma; EMI: Electromagnetic Interference; FIR: Finite Impulse Response; FPGA: Field Programmable Gate Array; FWHM: Full Width at Half Maximum; GPS: Global Positioning System; HSDPA: High Speed Downlink Packet Access; IC: Integrated Circuit; ICI: Inter-Channel Interference; I/Q: In-phase/Quadrature; IQR: interquartile range; LCD: Liquid Crystal Display; LFE: Linear Front End; MAD: Mean/Median Absolute Deviation; MATLAB: MATrix LABoratory (numerical computing environment and fourth-generation programming language developed by MathWorks); MCT: Measure of Central Tendency; MEMS: MicroElectroMechanical System; MOS: Metal-Oxide-Semiconductor; MT: Measure of Tendency; NDL: Nonlinear Differential Limiter; ODC: Outlier Detector Circuit; OOB: Out-Of-Band; PDF: Probability Density Function; PSD: Power Spectral Density; PSRR: Power-Supply Rejection Ratio; RF: Radio Frequency; RFI: Radio Frequency Interference; RMS: Root Mean Square; RRC: Root Raised Cosine; RX: Receiver; SAR: Synthetic Aperture Radar; SMPS: Switched-Mode Power Supply; SMR: Squared Mean Root; SNR: Signal to Noise Ratio; SPART: Single Point Analog Rank Tracker; TX: Transmitter; UWB: Ultra-wideband; VGA: Variable-Gain Amplifier; VLSI: Very-Large-Scale Integration; WiFi: Wireless Fidelity (a branded standard for wirelessly connecting electronic devices); WLAN: Wireless Local Area Network; WMT: Windowed Measure of Tendency; WSN: Wireless Sensor Network; ZigBee: a specification for a suite of communication protocols based on an IEEE 802 standard for personal area networks (the name refers to the waggle dance of honey bees)

DETAILED DESCRIPTION

As required, detailed embodiments of the present invention are disclosed herein. However, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

Moreover, except where otherwise expressly indicated, all numerical quantities in this description and in the claims are to be understood as modified by the word "about" in describing the broader scope of this invention. Practice within the numerical limits stated is generally preferred. Also, unless expressly stated to the contrary, the description of a group or class of materials as suitable or preferred for a given purpose in connection with the invention implies that mixtures or combinations of any two or more members of the group or class may be equally suitable or preferred.

The detailed description of the invention is organized as follows.

Section 1 ("Linear lowpass filters") provides an introductory general discussion of linear lowpass filters.

Section 2 ("Nonlinear differential limiters") introduces basic nonlinear differential limiters and provides their general discussion.

Section 3 ("Mathematical description of 1st order differential limiter") contains mathematical description of a 1st order NDL. In 3.1 ("Specifying range of linear behavior by resolution parameter") this NDL is further characterized by a resolution parameter, and in 3.2 ("1st order differential limiters as 1st order lowpass filters with feedback-controlled parameter") a 1st order differential limiter is described as a 1st order lowpass filter with a feedback-controlled parameter.

Section 4 ("2nd order differential limiters") provides a general description of a 2nd order NDL along with illustrative examples of its implementation.

Section 5 ("Canonical differential limiters (CDLs)") introduces the canonical differential limiters (CDLs) as NDLs with a particular dependence of their bandwidth and/or filter parameters on the difference signal.

Section 6 ("Differential critical limiters") introduces the differential critical limiters (DcLs) as NDLs with a particular type of dependence of their filter parameters on the difference signal. Subsection 6.1 ("Differential critical limiters with quantile offsets") discusses differential critical limiters with quantile offsets, and shows that such limiters may be used as analog rank filters for scalar as well as complex and vector signals.

Subsection 6.2 ("Numerical implementation of CDL with optional quantile offset") provides an example of numerical implementation of a 1st order DcL (CDL) with optional quantile offset for a real and/or complex signal.

Section 7 ("Real-time tests of normality and real-time detection and quantification of impulsive interference") discusses the use of small-$\alpha$ DcLs with quantile offsets for construction of various real-time methods and apparatus for tests of normality and for detection and quantification of impulsive interference.

Section 16 ("Adaptive NDLs (ANDLs)") introduces NDLs with a resolution parameter that is adaptively controlled by negative feedback.

Section 9 ("Differential over-limiters (DoLs)") describes the differential over-limiters as NDLs with a particular type of dependence of their filter parameters on the difference signal.

Section 10 ("Examples of OTA-based implementations of NDLs") provides examples of idealized algorithmic implementations of nonlinear differential limiters based on the operational transconductance amplifiers (OTAs). Transconductance cells based on the metal-oxide-semiconductor (MOS) technology represent an attractive technological platform for implementation of such active nonlinear filters as NDLs, and for their incorporation into IC-based signal processing systems. NDLs based on transconductance cells offer simple and predictable design, easy incorporation into ICs based on the dominant IC technologies, small size (10 to 15 small transistors are likely to use less silicon real estate on an IC than a real resistor), and may be usable from the low audio range to gigahertz applications. The examples of this section also illustrate how NDLs that comprise electronic components may be implemented through controlling values of these components by the difference between the input signal and a feedback of the output signal.

Subsection 10.1 ("'RC' implementation of 1st order CDL") provides an illustration of a 1st order CDL implemented as an RC integrator with a control of the resistive element, while Subsection 10.2 ("Complex-valued 1st order CDL and DoL") illustrates extensions of this implementation to include complex-valued 1st order CDLs and DoLs.

Subsection 10.3 ("CDLs with quantile offset") describes illustrative implementations of CDLs with quantile offsets for both real- and complex-valued signals.

Subsection 10.4 ("OTA implementation of 1st order CDL with control of resistive element"), Subsection 10.5 ("OTA implementation of 1st order CDL with control of reactive element"), and Subsection 10.6 ("OTA implementation of 1st order CDL with control of both resistive and reactive elements") show that when a 1st order lowpass filter is an LR circuit, this filter can be converted into an NDL by controlling either or both the resistive and the reactive elements.

Subsection 10.7 ("OTA implementations of 1st order complex-valued CDL and DoL with control of resistive elements") extends the implementation of Subsection 10.4 to complex-valued CDLs and DoLs.

Subsection 10.8 ("Complex-valued 'RC' CDL with varicaps") provides an illustration of a 1st order CDL implemented as an RC integrator with a control of the reactive element (capacitance).

Subsection 10.9 ("OTA-based implementation of 2nd order CDL") provides an example of an OTA-based implementation of a 2nd order CDL with a constant pole quality factor.

Section 11 ("Examples of high-order NDLs for replacement of lowpass filters") illustrates the construction of higher-order NDL-based lowpass filters by converting initial stages of cascaded lowpass filters into NDLs/ANDLs, and Subsection 11.1 ("Improved FrankenSPART filtering circuit") provides a discussion of improved FrankenSPART-based filters.

Section 12 ("Improved NDL-based filters comprising linear front-end filters to suppress non-impulsive component of interference and/or to increase its peakedness") discusses improving effectiveness of NDL-based filters by preceding the basic NDLs with linear front-end filters in order to suppress the non-impulsive component of the interference and/or to increase the peakedness of the interference.

Section 13 ("Examples of NDL applications") and its divisions provide some illustrations of NDL uses, along with clarifying discussions.

Subsection 13.1 ("NDL-based antialiasing filters to improve performance of ADCs") gives an illustration of using an NDL/ANDL filter as a replacement for an antialiasing filter to improve performance of an analog-to-digital converter.

Subsection 13.2 ("Impulsive noise mitigation") and its divisions illustrate the basic principles of the impulsive noise mitigation by nonlinear differential limiters.

Subsection 13.2.1 ("Measures of peakedness") discusses measures of peakedness that may be used to quantify impulsiveness of a signal. Subsection 13.2.2 ("Impulsive and non-impulsive noises and their peakedness along the signal processing chain") illustrates that peakedness of a signal may not be revealed by its power spectra, and that peakedness of impulsive noise typically decreases as the noise bandwidth is reduced by linear filtering.

Subsection 13.2.3 ("Linear filtering of signal affected by impulsive and non-impulsive noises of the same power") illustrates that, when linear filtering is used in the signal chain and the signal is affected by independent impulsive and/or non-impulsive noises of the same noise power density, there is no difference in the power densities for signals affected by impulsive and/or non-impulsive noise, and that the signal-to-noise ratios along the signal processing chain remain the same regardless the noise composition/peakedness.

In Subsection 13.2.4 ("NDL-based filtering of signal affected by impulsive and non-impulsive noises"), an NDL replaces a respective linear filter in the anti-aliasing portion of the signal chain. This example shows that, if an impulsive noise component is present, the NDL-based anti-aliasing filter may lower the noise floor throughout the subsequent signal chain (including the baseband) without affecting the signal.

Subsection 13.2.5 ("Mitigation of impulsive noise coupled from adjacent circuitry") discusses and illustrates NDL-based mitigation of impulsive noise in a simplified interference scenario where the noise is coupled into the signal chain from adjacent circuitry.

Subsection 13.2.6 ("Improving NDL-based mitigation of interference when the latter comprises impulsive and non-impulsive components") provides discussion and an illustrative example of NDL-based mitigation of interference when the latter comprises impulsive and non-impulsive components, while Subsection 13.2.7 ("Increasing peakedness of interference to improve its NDL-based mitigation") discusses and illustrates increasing peakedness of interference as a means to improve its NDL-based mitigation, including the mitigation of sub-Gaussian (non-impulsive) noise.

While the examples of Subsections 13.2.1 through 13.2.7 are given for real-valued signals, Subsection 13.2.8 ("Mitigation of impulsive noise in communication channels by complex-valued NDL-based filters") addresses the use of complex-valued NDLs and/or ANDLs for mitigation of impulsive noise in a communication channel. Subsection 13.2.8 also discusses a measure of peakedness for complex-valued signals, and provides performance comparison for several different NDLs and ANDLs.

Subsection 13.3 ("Mitigation of inter- and/or adjacent-channel interference") discusses and illustrates a particular problem of mitigating interchannel and/or adjacent-channel interference, which is an increasingly prevalent problem in the modern communications industry due to an elevated value of wireless spectrum.

Section 14 ("Method and apparatus for detection and quantification of impulsive component of interference") outlines a method and apparatus for obtaining knowledge about the composition of a noise mixture comprising impulsive and non-impulsive components. This knowledge may be used to design improved NDL-based filters comprising linear front-end filters for suppression of the non-impulsive component of the interference. Such improved NDL-based filters may greatly increase the effectiveness of the interference mitigation when the interfering signal comprises a mixture of impulsive and non-impulsive components.

Section 15 ("Improvements in properties of electronic devices") provides discussion and illustrative examples of improving physical, commercial, and/or operational properties of electronic devices through NDL-based mitigation of interference (in particular, that of technogenic origin) affecting signals of interest in a device.

Section 16 ("Adaptive NDLs for non-stationary signals and/or time-varying noise conditions") introduces fully adaptive high-order NDLs suitable for improving quality of non-stationary real, complex, and/or vector signals of interest under time-varying noise conditions.

Section 17 ("NDL-based $\Delta\Sigma$ modulators") discusses and illustrates how NDLs may improve $\Delta\Sigma$ modulators by replacing linear loop filters in the noise-shaping loops by NDL-based loop filters.

Section 18 ("Communications receivers resistant to technogenic interference") outlines providing resistance to the technogenic interference in communications receivers, independent of the modulations schemes and communication protocols, by replacing certain existing linear filters in the receiver (for example, the anti-aliasing filters preceding the analog-to-digital converters) by NDLs/ANDLs.

Subsection 18.1 ("Increasing peakedness of interference to improve its NDL-based mitigation") provides a practical example of increasing peakedness of interference to improve its NDL-based mitigation, while Subsection 18.2 ("Digital NDLs/ANDLs") discusses digital implementations of NDLs/ANDLs.

1 Linear Lowpass Filters

The general transfer function of a lowpass filter is obtained by the linear mapping of the Laplace transform of the input $x(t)$ to the output $\chi(t)$ and may be written as follows:

$$\frac{\mathcal{L}\{x(t)\}}{\mathcal{L}\{\chi(t)\}} = \frac{G_0}{\Pi_k(1+a_k s + b_k s^2)}, \quad (2)$$

where $s=\sigma+i\omega$ is the complex frequency, $G_0$ is the gain at $s=0$, and $a_k>0$ and $b_k \geq 0$ are the filter coefficients.

For a linear filter all coefficients $a_k$ and $b_k$ are constants, and the ratio $Q_k=\sqrt{b_k}/a_k$ is defined as the pole quality.

The multiplication of the denominator terms in equation (2) with each other yields an $n^{th}$ order polynomial of s, with n being the filter order.

Different sets of the coefficients $a_k$ and $b_k$ distinguish among different filter types such as Butterworth, Chebyshev, Bessel, and other filters.

Since the coefficients $a_k$ and $b_k$ for a specific filter type are in a definite relation to each other, a lowpass filter of a given type and order may be characterized by a single parameter such as, for example, the cutoff frequency.

Without loss of generality, the gain $G_0$ may be set to unity to simplify the subsequent discussions of nonlinear differential limiters. One skilled in the art will recognize that a non-unity gain may be easily handled through appropriate scaling of the output signal and its feedback.

For a first-order filter, the coefficient b is always zero, $b=0$, thus yielding $$\frac{\mathcal{L}\{x(t)\}}{\mathcal{L}\{\chi(t)\}} = \frac{1}{1+as} = \frac{1}{1+\tau_c s} = \frac{1}{1+s/\omega_c}, \quad (3)$$

where $\omega_c=1/\tau_c=1/a$ is the corner or cutoff frequency.

The transfer function of the 1st order filter given by equation (3) has a single pole at $s=-\omega_c$.

For a second-order filter, the transfer function is $$\begin{aligned}\frac{\mathcal{L}\{x(t)\}}{\mathcal{L}\{\chi(t)\}} &= \frac{1}{1+as+bs^2} \\ &= \frac{1}{1+\tau_c s/Q + \tau_c^2 s^2} \\ &= \frac{1}{1+s/(\omega_c Q)+s^2/\omega_c^2},\end{aligned} \quad (4)$$

where $Q=\sqrt{b}/a$ is the pole quality factor and $\omega_c=1/\tau_c=1/\sqrt{b}$ is the cutoff frequency.

When $Q>\frac{1}{2}$, the transfer function of the 2nd order filter given by equation (4) has two complex poles at $$s = -\frac{\omega_c}{2Q}\left(1 \pm i\sqrt{4Q^2-1}\right)$$

on the circle of radius $\omega_c$.

When $Q \leq \frac{1}{2}$, the transfer function of the 2nd order filter given by equation (4) has two real negative poles at $$s = -\frac{\omega_c}{2Q}\left(1 \pm \sqrt{1-4Q^2}\right),$$

thus corresponding to two cascaded 1st order lowpass filters.

An $n^{th}$-order filter may be constructed by cascading filters of lower order. A filter with an even order number $n=2m$ consists of m second-order stages only, while filters with an odd order number $n=2m+1$ include an additional first-order stage (m+1 stages total).

In hardware implementations, in order to avoid saturation of individual stages, the filters are typically cascaded in the order of rising $Q_k$ values. Thus, for example, an odd-order filter contains a 1st order filter as the first stage.

Since a lowpass filter of an arbitrary order may be constructed by cascading filters of 1st and 2nd order, the subsequent discussion of the Nonlinear Differential Limiters (NDLs) will focus on the NDLs of the first and second order.

When an $n^{th}$-order filter is constructed from cascaded filters, the final output $\chi(t)$ as well as the intermediate outputs $\chi_k(t)$ of the stages may be obtained.

For complex and vector signals, the transfer function given by equation (2) describes the mapping of the respective components (for example, the real and imaginary components of a complex signal) of the input and the output.

2 Nonlinear Differential Limiters

For a linear filter all coefficients $a_k$ and $b_k$ in equation (2) are constants, and when the input signal x(t) is increased by a factor of K, the output is also increased by the same factor, as is the difference between the input and the output. For convenience, we will call the difference between the input and the output $x(t)-\chi(t)$ the difference signal.

When an $n^{th}$-order filter is constructed from cascaded filters, we may also obtain the intermediate difference signals such as $x(t)-\chi_k(t)$ and the difference signals $\chi_i(t)-\chi_k(t)$ between various stages, k>1.

A transient outlier in the input signal will result in a transient outlier in the difference signal of a filter, and an increase in the input outlier by a factor of K will result, for a linear filter, in the same factor increase in the respective outlier of the difference signal.

If a significant portion of the frequency content of the input outlier is within the passband of the linear filter, the output will typically also contain an outlier corresponding to the input outlier, and the amplitudes of the input and the output outliers will be proportional to each other.

The reduction of the output outliers, while preserving the relationship between the input and the output for the portions of the signal not containing the outliers, may be done by proper dynamic modification of some of the filter coefficients in equation (2) based on the magnitude (for example, the absolute value) of the total and/or partial difference signals. A filter comprising such proper dynamic modification of the filter coefficients based on the magnitude of the difference signal(s) is a Nonlinear Differential Limiter (NDL).

Since the filters disclosed in the present invention limit the magnitude of the output outliers, these filters are called limiters. Since the proper dynamic modification of the filter coefficients is based on the magnitude of the difference signal(s), these filters are called differential. Since at least some of the filter coefficients depend on the instantaneous magnitude of the difference signal(s), these coefficients are functions of time and the differential equations describing the filter behavior are no longer linear but nonlinear. As a consequence, these filters are nonlinear. Hence we may refer to the present invention generally by the term Nonlinear Differential Limiters, or NDLs.

When any of the coefficients in equation (2) depend on the difference signal(s), the resulting NDL filter is no longer linear in general. However, if the coefficients remain constant as long as the magnitude of the difference signal(s) remains within a certain range, the behavior of the NDL filter will be linear during that time.

An NDL may be configured to behave linearly as long as the input signal does not contain outliers. By specifying a proper dependence of the NDL filter parameters on the difference signal(s) it may be ensured that, when the outliers are encountered, the nonlinear response of the NDL filter limits the magnitude of the respective outliers in the output signal.

For example, for both 1st and 2nd order filters given by equations (3) and (4), respectively, their cutoff (corner) frequency $\omega_c$ may be dynamically modified by making it a non-increasing continuous function of the absolute value of the difference signal $|x(t)-\chi(t)|$: $\omega_c=\omega_c(|x-\chi|)\geq\omega_c(|x-\chi|+\epsilon)$ for $\epsilon>0$. While this absolute value remains small, the cutoff frequency should remain essentially constant and equal to some initial maximum value $\omega_c=\omega_c(0)=\omega_0$.

When this absolute value becomes larger, the cutoff frequency should become a decreasing function of its argument, $$\omega_c(|z|+\epsilon)<\omega_c(|z|)\leq\omega_0 \text{ for } \epsilon>0, \quad (5)$$

for example, inversely proportional to $|x(t)-\chi(t)|$.

Since the cutoff frequency $\omega_c$ represents the absolute (radial) value of the filter poles in the S-plane, such dependence of the cutoff frequency on the difference signal will result in the poles moving closer to the origin as the absolute value of the difference signal increases, approaching the origin ($\omega_c=0$) in the limit of large absolute values of the difference.

For a 2nd order filter given by equation (4), an alternative (or additional) modification of the filter parameters may be accomplished by making the pole quality factor Q a non-increasing continuous function of the absolute value of the difference signal $|x(t)-\chi(t)|$: $Q=Q(|x-\chi|)\geq Q(|x-\chi|+\epsilon)$ for $\epsilon>0$. While said absolute value remains small, the pole quality factor remains essentially constant and equal to some initial maximum value $Q=Q(0)=Q_0$.

When said absolute value becomes larger, the pole quality factor should become a decreasing function of its argument, $$Q(|z|+\epsilon)<Q(|z|)\leq Q_0 \text{ for } \epsilon>0, \quad (6)$$

for example, inversely proportional to $|x(t)-\chi(t)|$.

If the maximum value of the pole quality factor $Q_0$ is larger than ½, the initial reduction of Q, while $Q\geq½$, results in the filter poles moving closer to the real axis in the S-plane while remaining on the circle of radius $\omega_c$.

The further reduction in Q results in two real negative poles at $$s=-\frac{\omega_c}{2Q}(1\pm\sqrt{1-4Q^2}),$$

thus corresponding to two cascaded 1st order lowpass filters. The pole quality factor approaches zero in the limit of large absolute values of the difference signal, moving one pole further away from the origin, while moving the other pole closer to the origin. The resulting filter approaches a single 1st order lowpass filter with the pole at $s=-\omega_c Q$ (close to the origin).

It should be noted that, if the bandwidth of a lowpass filter is defined as an integral over all frequencies (from zero to infinity) of a product of the frequency with the filter frequency response, divided by an integral of the filter frequency response over all frequencies, the reduction of the cutoff frequency and/or the reduction of the pole quality factor both result in the reduction of the filter bandwidth, as the latter is a monotonically increasing function of the cutoff frequency, and a monotonically increasing function of the pole quality factor.

Additional details of various dependencies of the NDL filter bandwidth and parameters on the difference signal(s) will be discussed further in this disclosure.

When an $n^{th}$-order filter is constructed from a sequence of cascaded filters, any subsequence of the intermediate stages (for example, between the intermediate signals $\zeta_i(t)$ and $\zeta_k(t)$) may be designated as an NDL. In practice, for more effective suppression of the broadband transients, the initial subsequence (between $z(t)$ and $\zeta_k(t)$) may be preferred.

3 Mathematical Description of 1st Order Differential Limiter

A 1st order differential limiter may be viewed as a 1st order lowpass filter with a feedback-dependent time (or frequency) parameter, where the parameter is a monotonic function (non-decreasing for time, and non-increasing for frequency) of the absolute value of the difference between the input and the output signals. More precisely, given a complex-valued or vector input signal $z(t)$, the output $\zeta(t)$ of such a limiter may be described by $$\zeta(t) = \int dt \frac{z(t) - \zeta(t)}{\tau_c(|z - \zeta|)} \quad (7)$$
$$= \int dt \omega_c(|z - \zeta|)[z(t) - \zeta(t)],$$

where $$\tau_c(|z| + \varepsilon) \geq \tau_c(|z|) \geq \tau_0 \text{ for } \varepsilon > 0, \quad (8)$$

and $$\omega_c(|z| + \varepsilon) \leq \omega_c(|z|) \leq \omega_0 \text{ for } \varepsilon > 0. \quad (9)$$

For vector signals, the magnitude (absolute value) of the difference signal may be defined as the square root of the sum of the squared components of the difference signal.

Both time and frequency parameters are real and positive parameters, and both integrands in equation (7) represent the rate of change of the output signal.

Figure 1:
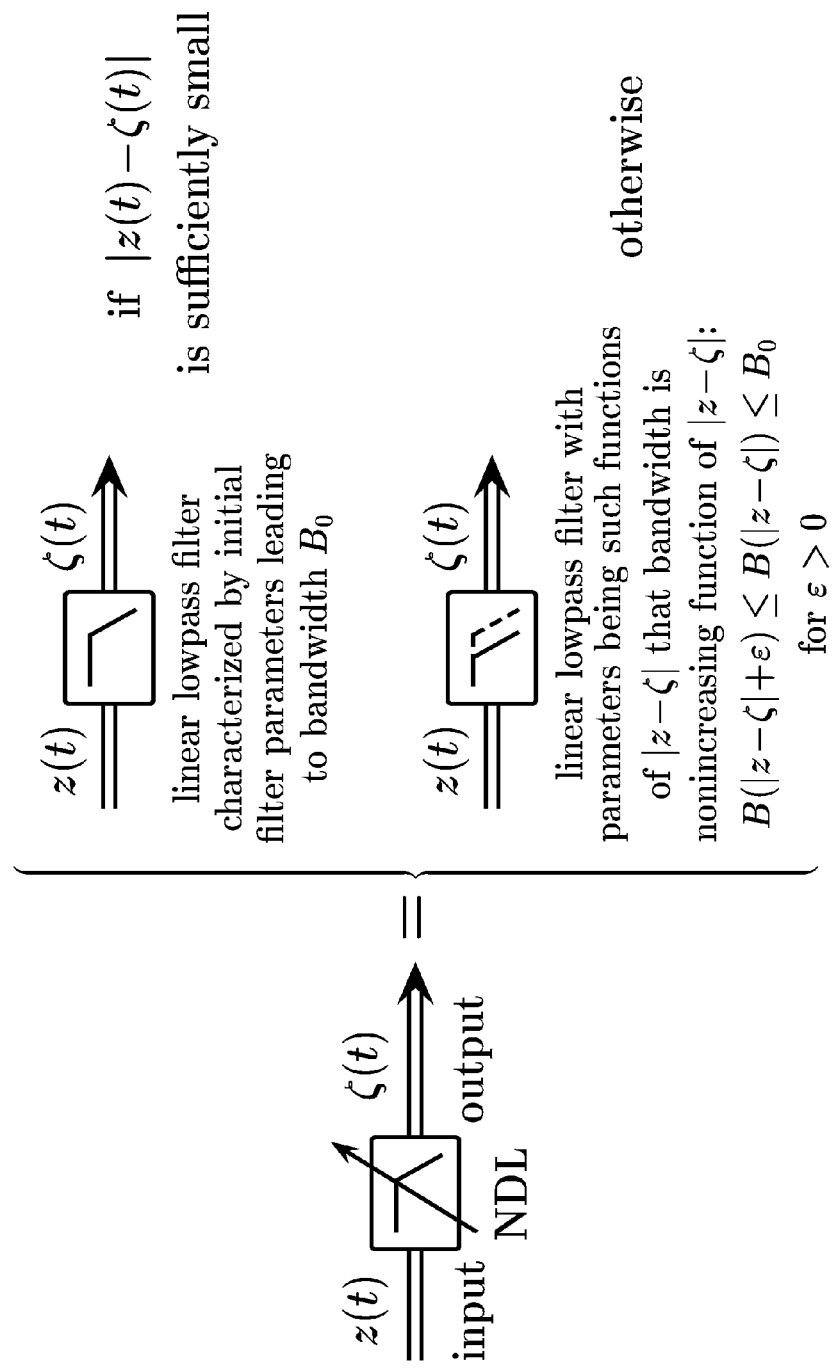
FIG. 1. Illustrative diagram of a Nonlinear Differential Limiter.
Figure 2:
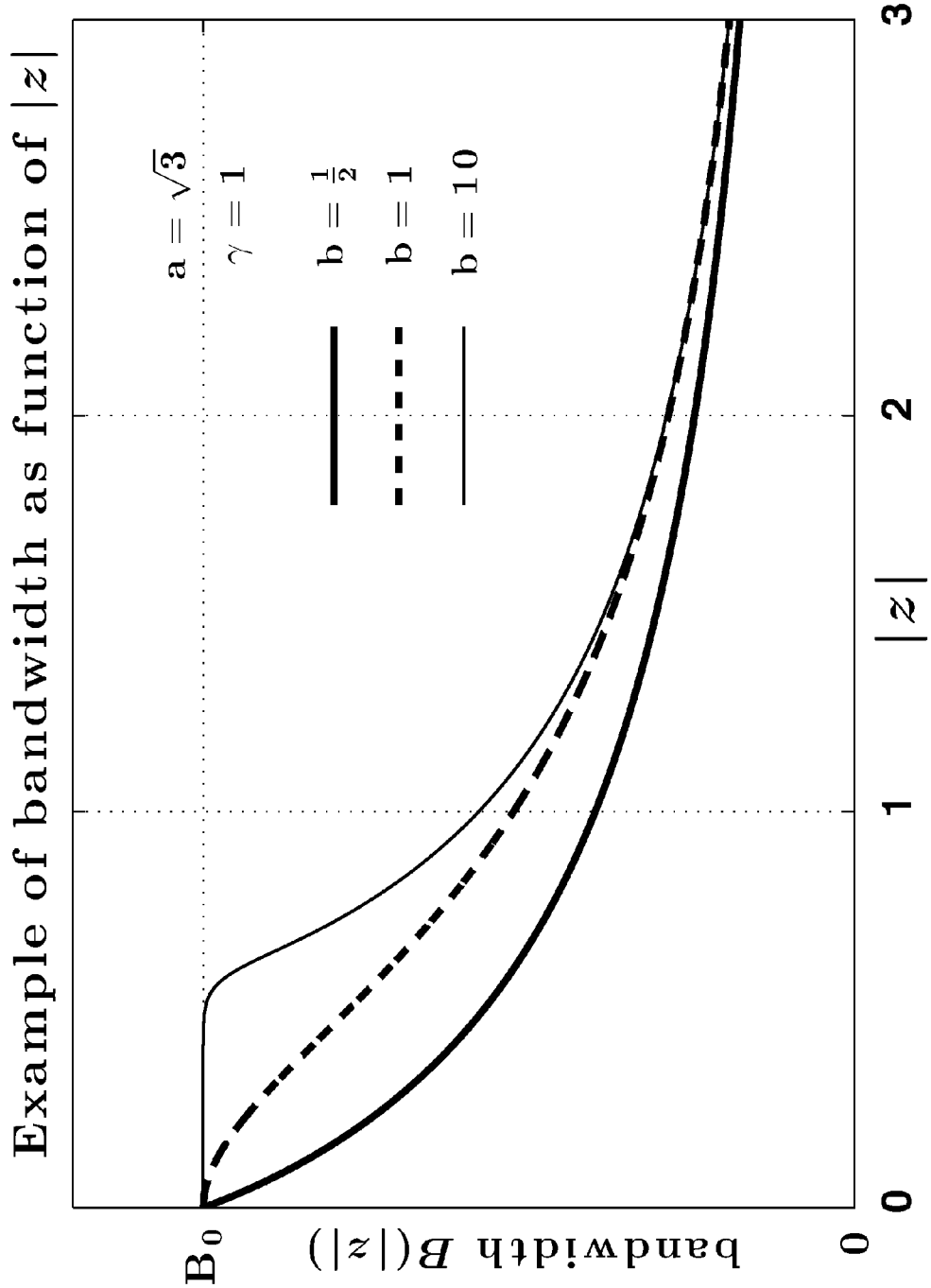
FIG. 2. Illustrative functional dependence of bandwidth on magnitude of difference signal.
Figure 3:
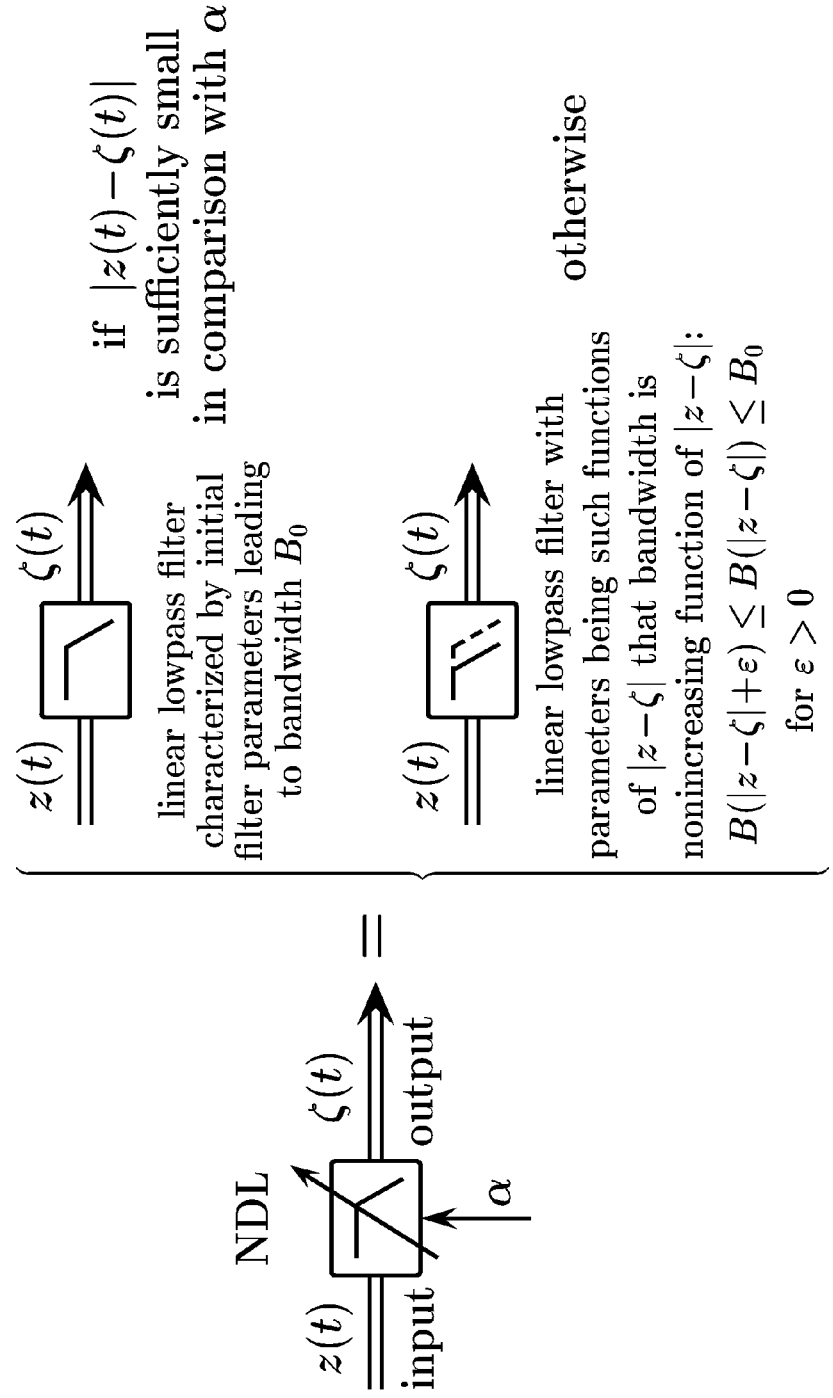
FIG. 3. Illustrative diagram of a Nonlinear Differential Limiter further characterized by a resolution parameter.
Figure 4:
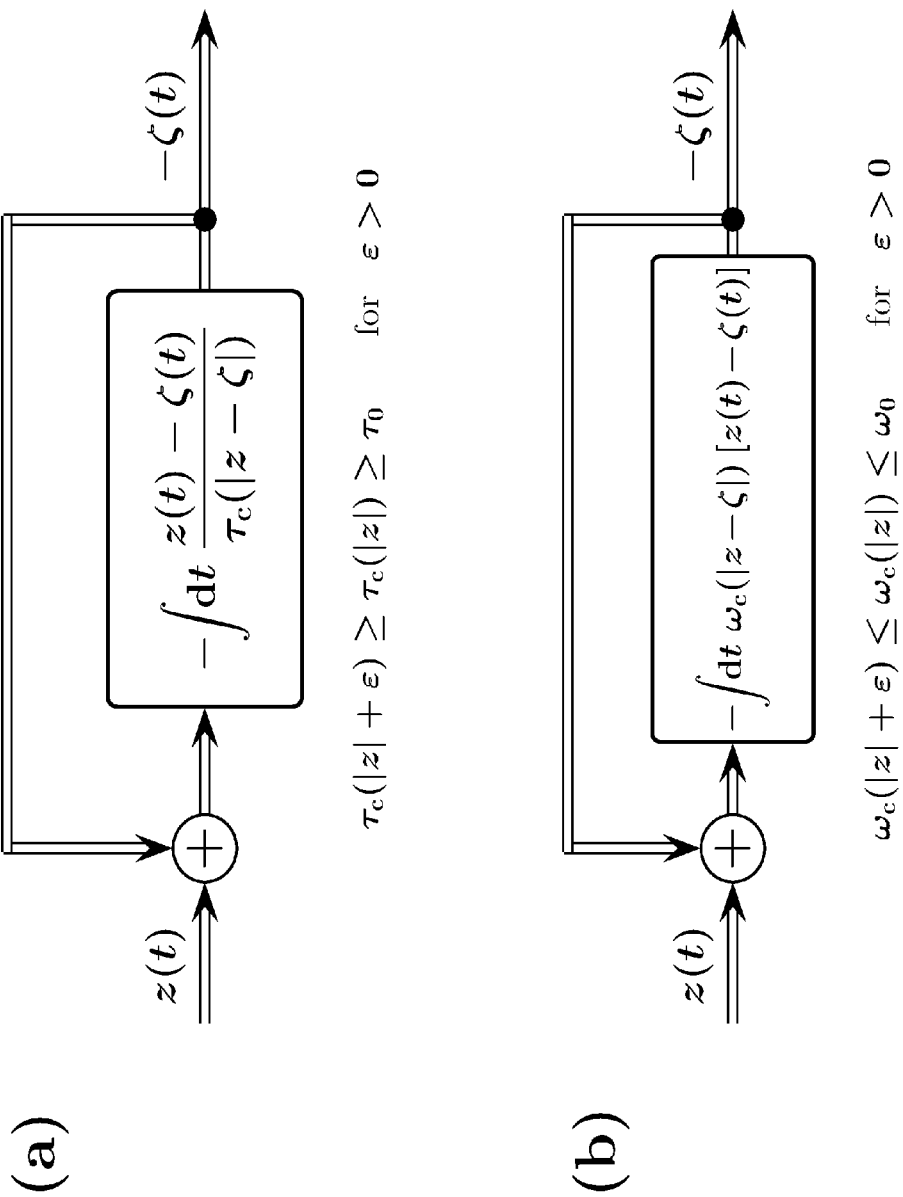
FIG. 4. Simplified block diagram of a 1st order nonlinear differential limiter method and/or circuit according to equation (7).
Figure 5:
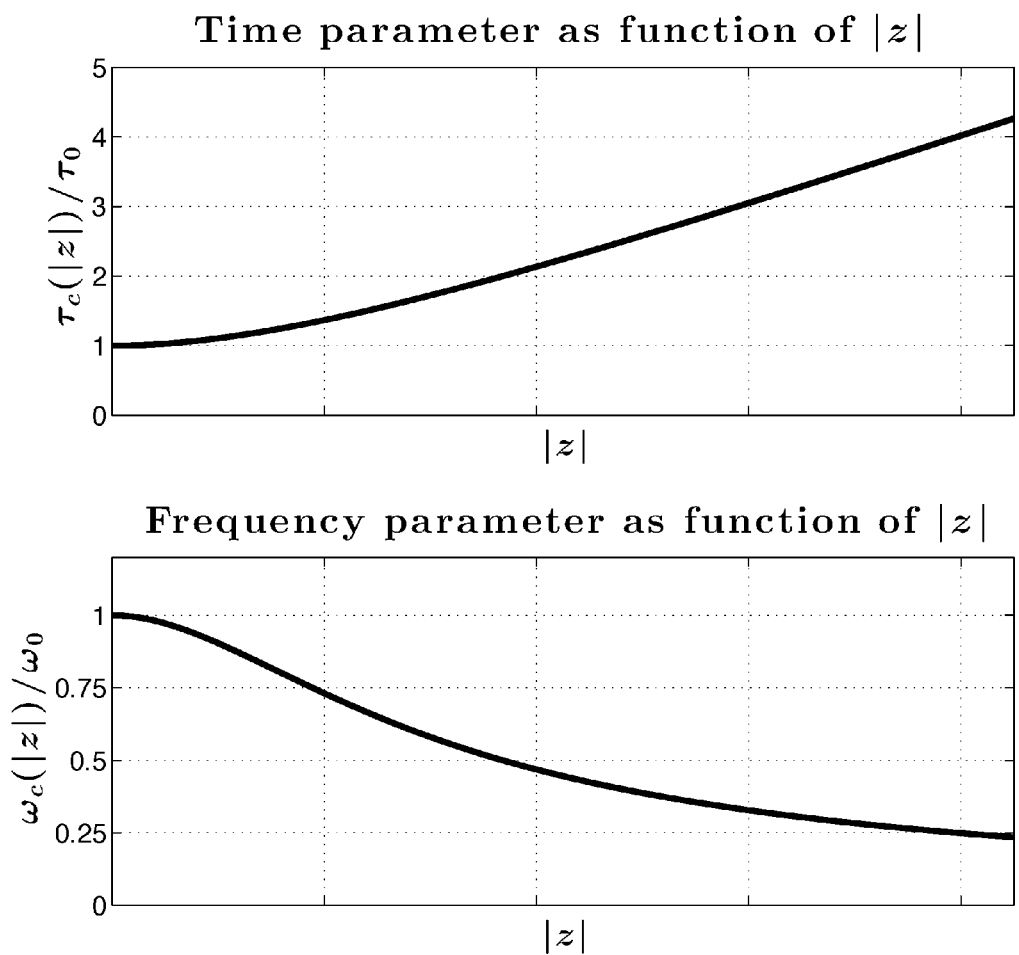
FIG. 5. Example of time and frequency parameters as functions of the absolute value of the difference signal according to equations (8) and (9).

FIG. 4 shows equations (7), (8), and (9) as block diagrams, providing figure descriptions of a 1st order nonlinear differential limiter method and/or circuit. FIG. 5 provides an example of time and frequency parameters as functions of the absolute value of the difference signal according to equations (8) and (9).

Based on equations (7), (8), and (9), and on FIG. 4 and FIG. 5, a 1st order NDL method and/or circuit may be given the following descriptions:

Given an input signal, a 1st order NDL produces an output signal, wherein the output signal is an antiderivative of a ratio of a difference signal and a time parameter, wherein the difference signal is the difference between the input signal and the output signal, and wherein the time parameter is a nondecreasing function of the magnitude of the difference signal.

Equivalently, given an input signal, a 1st order NDL produces an output signal, wherein the output signal is an antiderivative of a product of a difference signal and a frequency parameter, wherein the difference signal is the difference between the input signal and the output signal, and wherein the frequency parameter is a nonincreasing function of the magnitude of the difference signal.

3.1 Specifying Range of Linear Behavior by Resolution Parameter

The range of linear behavior of a 1st order NDL may be further controlled by specifying a resolution parameter $\alpha$ as follows:

$$\zeta(t; \alpha) = \int dt \frac{z(t) - \zeta(t; \alpha)}{\tau_c(|z - \zeta|)} \quad (10)$$
$$= \int dt \omega_c(|z - \zeta|)[z(t) - \zeta(t; \alpha)],$$

where $$\begin{cases} \tau_c(|z|) = \tau_0 \text{ when } |z| \text{ is sufficiently small in comparison with } \alpha \\ \tau_c(|z| + \varepsilon) > \tau_c(|z|) \text{ for } \varepsilon > 0 \text{ otherwise} \end{cases} \quad (11)$$

and $$\begin{cases} \omega_c(|z|) = \omega_0 \text{ when } |z| \text{ is sufficiently small in comparison with } \alpha \\ \omega_c(|z| + \varepsilon) < \omega_c(|z|) \text{ for } \varepsilon > 0 \text{ otherwise} \end{cases} \quad (12)$$

One may see from equation (11) that when the magnitude of the difference signal is small in comparison with the resolution parameter, the time parameter is equal to the minimum value of the time parameter, and when the magnitude of the difference signal is large in comparison with the resolution parameter, the time parameter is an increasing function of the magnitude of the difference signal.

One may also see from equation (12) that when the magnitude of the difference signal is small in comparison with the resolution parameter, the frequency parameter is equal to the maximum value of the frequency parameter, and when the magnitude of the difference signal is large in comparison with the resolution parameter, the frequency parameter is a decreasing function of the magnitude of the difference signal.

Figure 6:
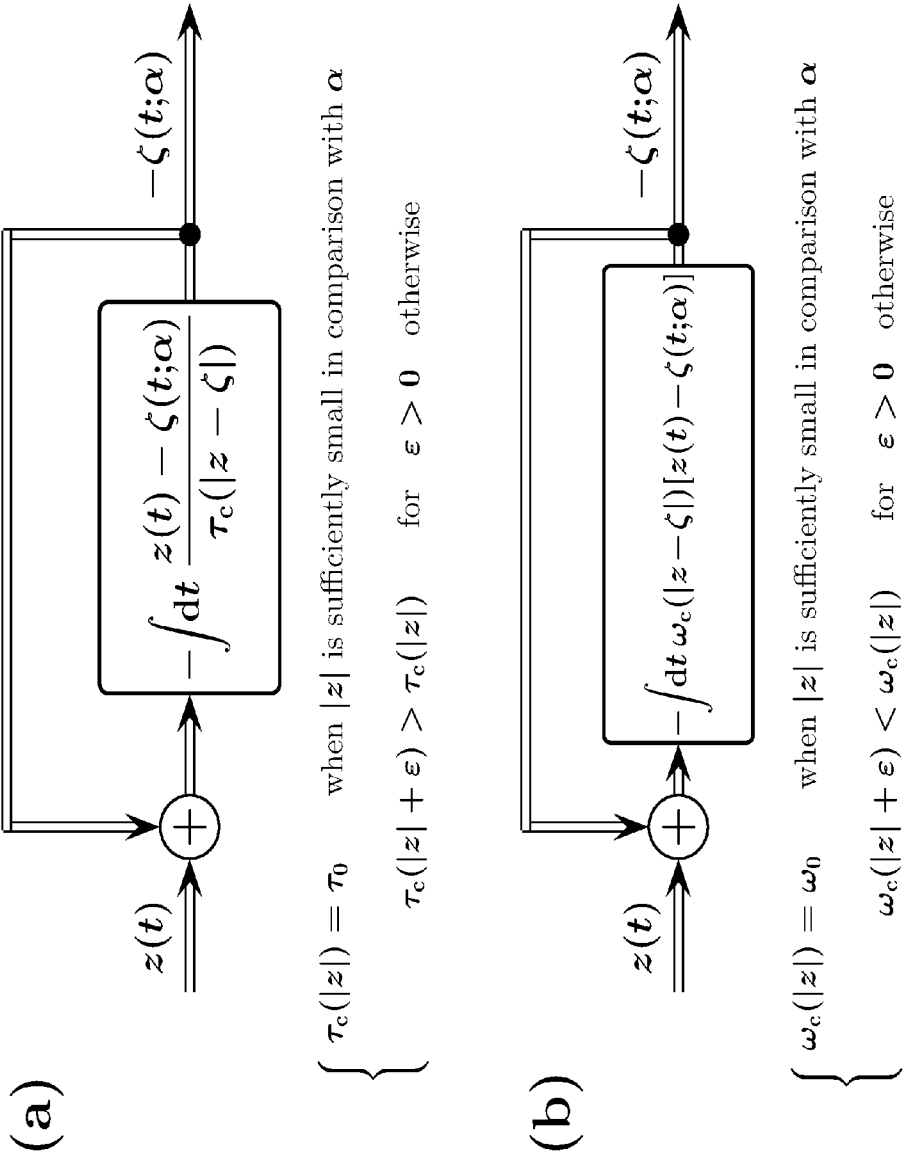
FIG. 6. Simplified block diagram of a 1st order nonlinear differential limiter method and/or circuit with specified resolution parameter according to equation (10).
Figure 7:
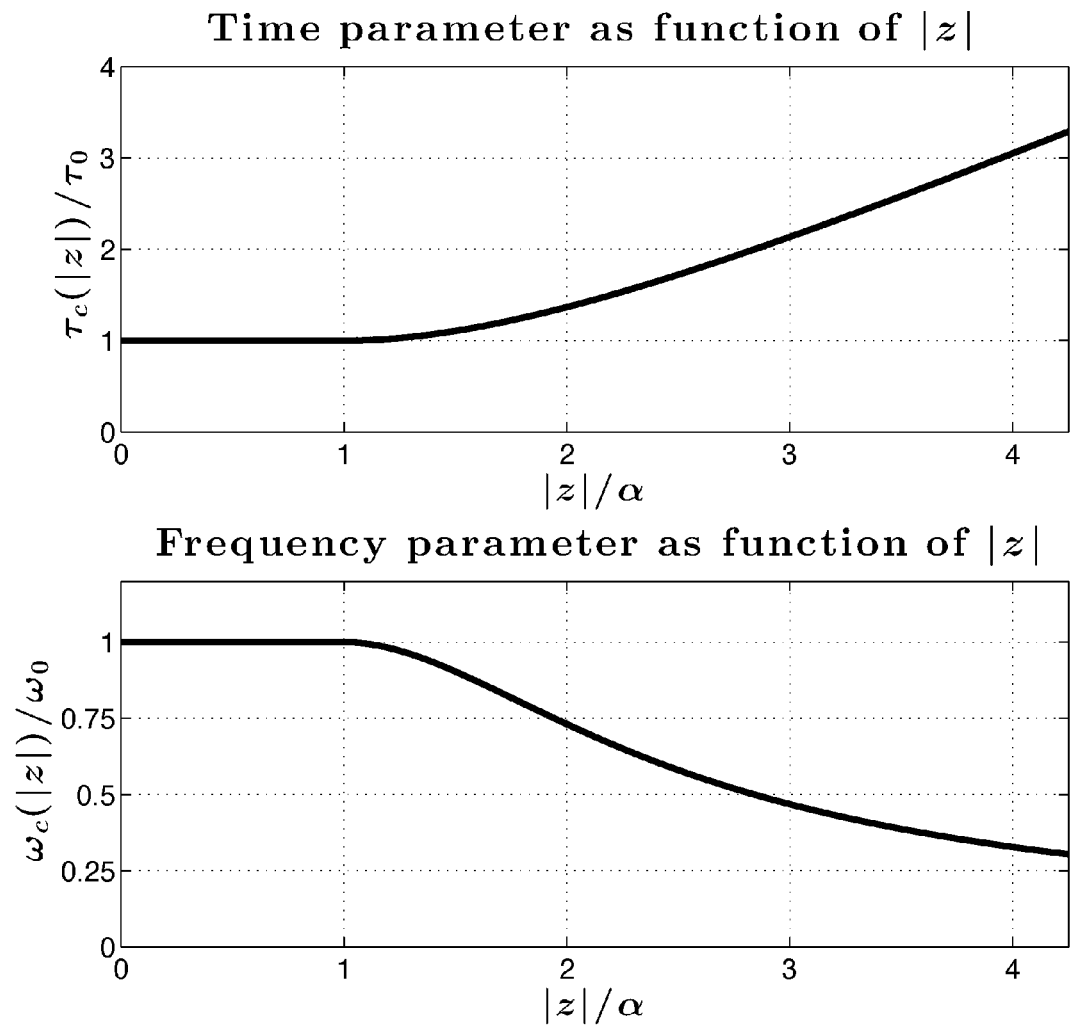
FIG. 7. Example of time and frequency parameters as functions of the absolute value of the difference signal with specified resolution parameter according to equations (11) and (12).

FIG. 6 shows equations (10), (11), and (12) as block diagrams, providing figure descriptions of nonlinear differential limiter method and/or circuit with specified resolution parameter. FIG. 7 provides an example of time and frequency parameters as functions of the magnitude of the difference signal according to equations (11) and (12).

3.2 1st Order Differential Limiters as 1st Order Lowpass Filters with Feedback-Controlled Parameter One skilled in the art will recognize that when the time parameter is constant, and/or the frequency parameter is constant, equation (7) describes the response of a 1st order lowpass filter. This is illustrated in panels (a) and (b) of FIG. 8, and in panels (a) and (b) of FIG. 9.

Figure 8:
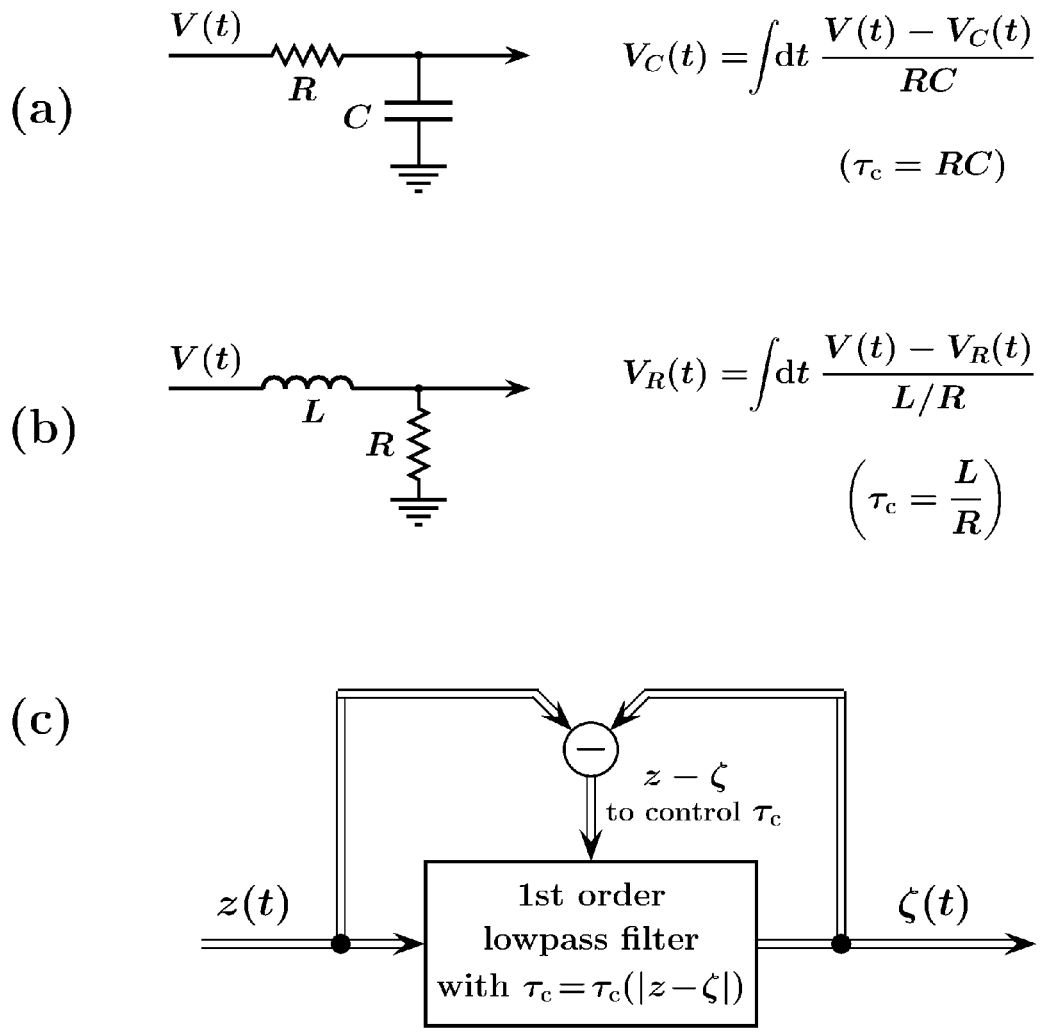
FIG. 8. Nonlinear differential limiter as 1st order lowpass filter with feedback-controlled time parameter.

Thus a 1st order NDL may be implemented by controlling, in a proper manner, both or either the resistive element and/or the reactive element in such a filter with the difference signal, as schematically indicated in panel (c) of FIG. 8, and in panel (c) of FIG. 9.

Note that the integrals in panels (a) and (b) of FIG. 8, and in panels (a) and (b) of FIG. 9 simply represent a convenient form of the mathematical relationship between the output of the limiter and the difference signal, and no explicit integration is actually required.

For example, the equation in panel (a) of FIG. 8 may be rewritten as $$V_C(t) = V(t) - \tau_c \dot{V}_C(t), \quad (13)$$

where the dot denotes the time derivative, which represents the output signal as the difference between the input signal and a signal proportional to the time derivative of the output.

Figure 10:
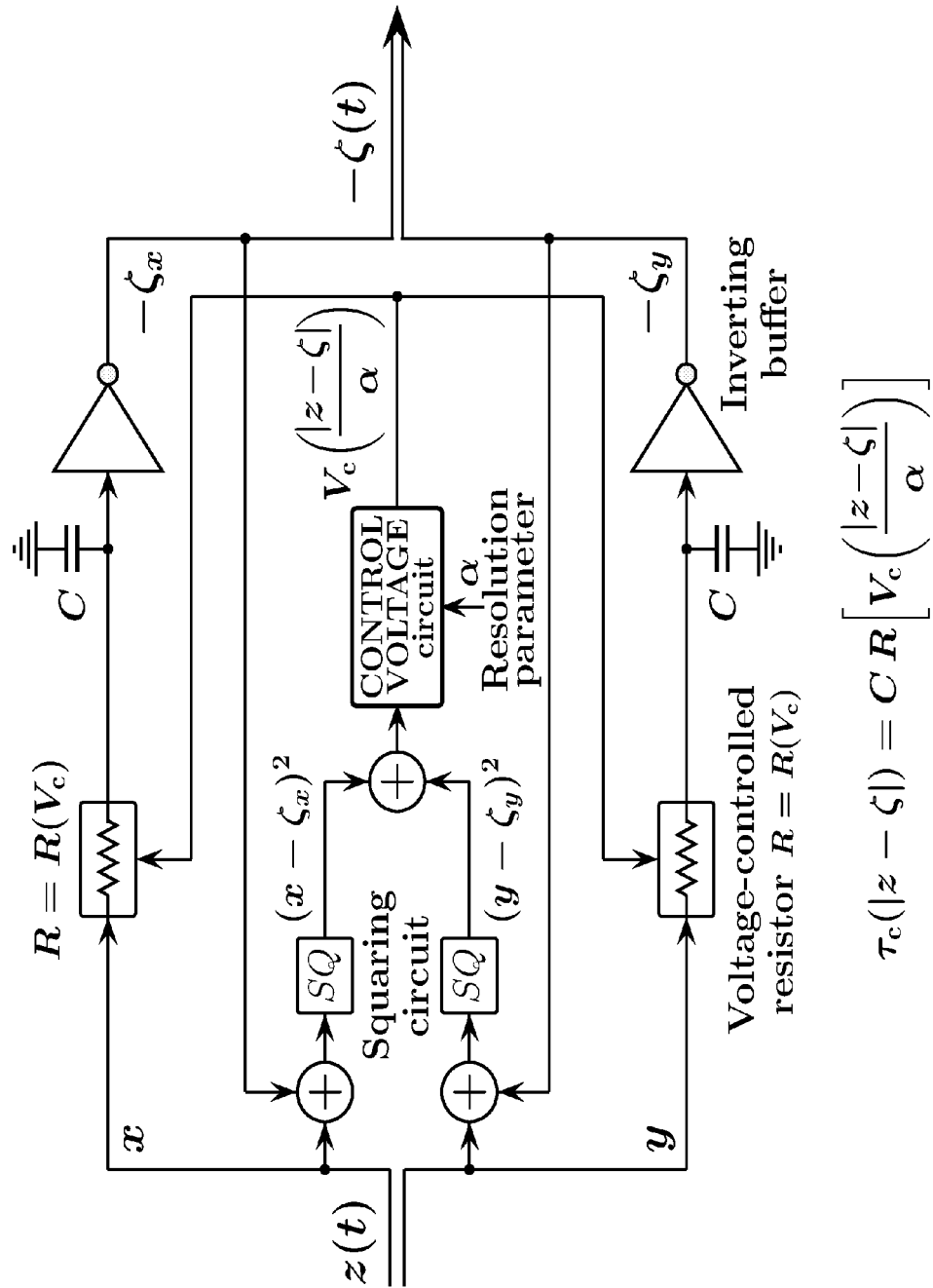
FIG. 10. Simplified block diagram of an illustrative circuit for electronic implementation of a complex-valued NDL, where the control of the time/frequency parameter is accomplished by a voltage-controlled resistor.

FIG. 10 shows a simplified block diagram of an illustrative circuit for electronic implementation of a complex-valued 1st order NDL, where the control of the time/frequency parameter is accomplished by a voltage-controlled resistor.

4 2nd Order Differential Limiters

The equation for the 1st order NDL may be written as $$\zeta(t) = z(t) - \tau \dot{\zeta}(t), \quad (14)$$

where the dot denotes the time derivative, and the non-decreasing time parameter $\tau = \tau(|z-\zeta|)$ equals to the cutoff time parameter $\tau_c = \tau_c(|z-\zeta|)$ defined previously.

Similarly, starting from equation (4) and setting the time parameter $\tau = \tau_c/Q$ for convenience of the subsequent analysis, the equation for the 2nd order NDL may be written as $$\zeta(t) = z(t) - \tau \dot{\zeta}(t) - (\tau Q)^2 \ddot{\zeta}(t), \quad (15)$$

where the double dot denotes the second time derivative.

As was discussed in Section 2, either $\tau_c$ or Q, or both $\tau_c$ and Q may be made functions of the magnitude of the difference signal (non-decreasing for $\tau_c$, and non-increasing for Q). However, it should be easy to see that the form of equation (15) allows us to consider only the two cases of either (i) only $\tau$, or (ii) both $\tau$ and Q being functions of the magnitude of the difference signal. In this disclosure, a constant pole quality factor Q=const is normally assumed, and the attention is focused on the variable $\tau$ only, unless specifically stated otherwise.

Figure 11:
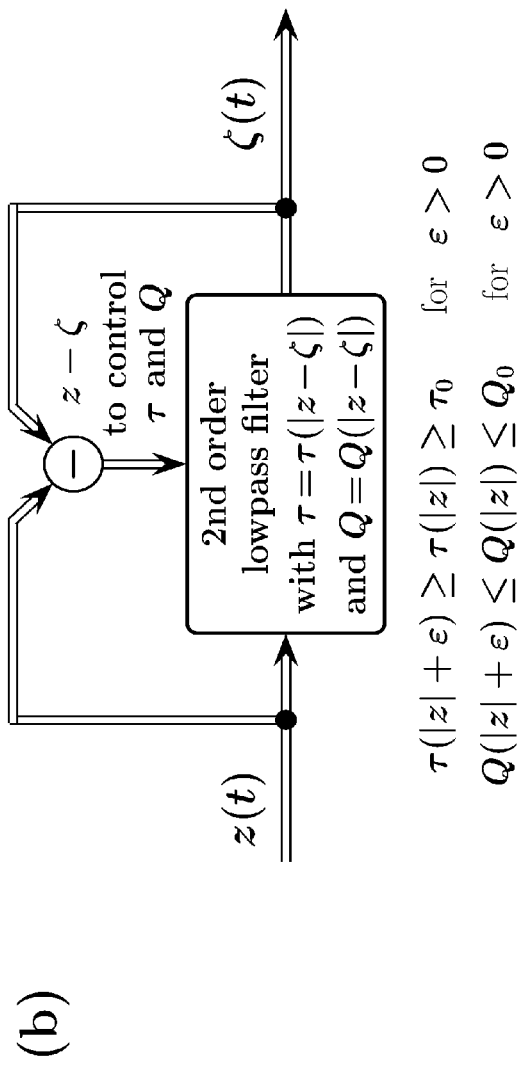
FIG. 11. Nonlinear differential limiter as 2nd order RLC lowpass filter with feedback-controlled time parameter and pole quality factor.

Panel (a) of FIG. 11 provides a simple illustration of a 2nd order linear RLC filter according to equation (15). This circuit may be transformed into a 2nd order NDL by making any combination of the circuit elements properly dependent on the absolute value of the difference signal, as schematically indicated in panel (b) of FIG. 11.

For example, the cutoff frequency $\omega_c$ of the RLC filter shown in FIG. 11 is independent of the resistance R, while the pole quality factor Q is proportional to the resistance. Thus making the resistance in the circuit a non-increasing function of the absolute value of the difference signal (strictly decreasing for a large argument), $R=R(|z-\zeta|)$, will implement a constant-$\omega_c$ NDL filter described in Section 2.

If the resistance R and the inductance L of the RLC circuit shown in FIG. 11 depend on the absolute value of the difference signal in such a way that the ratio L/R is a non-decreasing function of $|z-\zeta|$ while the ratio $\sqrt{L}/R$ is constant, the resulting filter is a constant-Q 2nd order NDL.

Figure 12:
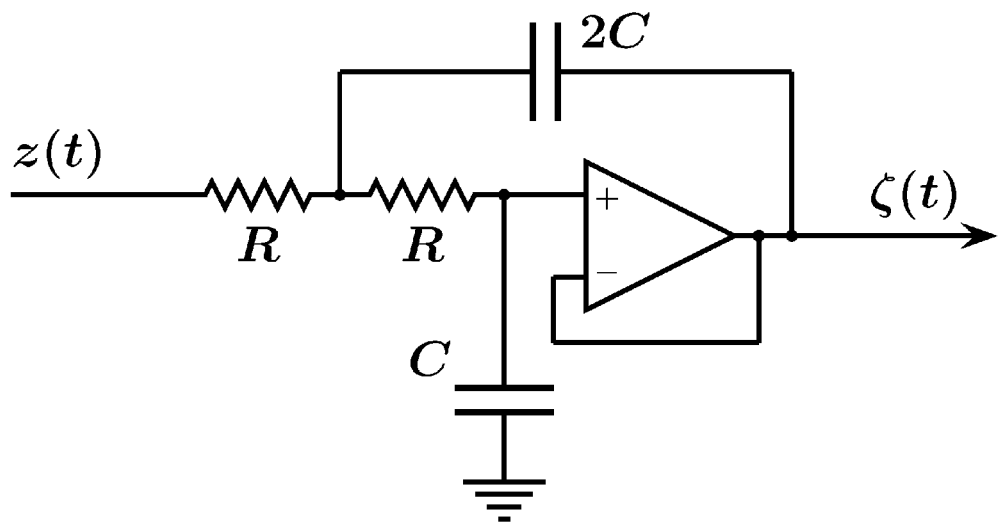
FIG. 12. Nonlinear differential limiter as 2nd order Butterworth lowpass filter (Sallen-Key topology) with feedback-controlled time parameter.

FIG. 12 provides another simplified illustration of a 2nd order constant-Q NDL filter. The lowpass filter is a 2nd order Butterworth filter (Q=$1/\sqrt{2}$ based on the Sallen-Key topology (Sallen and Key [32]). This circuit may be transformed into a 2nd order NDL by making the resistance R a non-increasing function of the absolute value of the difference signal (strictly decreasing for a large argument), $R=R(|z-\zeta|)$.

Detailed descriptions of various dependencies of the NDL filter parameters on the difference signal and examples of implementation of different NDLs are provided further in this disclosure.

5 Canonical Differential Limiters (CDLs)

When a frequency response of an NDL is characterized by the same shape for all values of the difference signal, and a bandwidth of an NDL is a continuous function that is constant ($B_0$) for small values of the magnitude of the difference signal, and is inversely proportional to this magnitude for larger values of the magnitude, $B(|z|) \propto |z|^{-1}$, then the NDL is a canonical differential limiter, or CDL.

When $\gamma=1$, a bandwidth of a CDL may be described by equation (1) in the limit $b \to \infty$, namely by $$B(|z|) = \lim_{b \to \infty} B_0 \times \{(\alpha|z|)^b + \exp[-(\alpha|z|)^b]\}^{-\frac{1}{b}}. \quad (16)$$

Further introducing a resolution parameter $\alpha = a^{-1}$, equation (16) for the bandwidth of a CDL may be rewritten as $$B(|z|) = B_0 \times \begin{cases} 1 & \text{for } |z| \leq \alpha \\ \dfrac{\alpha}{|z|} & \text{otherwise} \end{cases}. \quad (17)$$

When the time parameter of a nonlinear differential limiter is given by $$\tau(|z-\zeta|) = \tau_0 \times \begin{cases} 1 & \text{for } |z-\zeta| \leq \alpha \\ \dfrac{|z-\zeta|}{\alpha} & \text{otherwise} \end{cases}, \quad (18)$$

the NDL is a canonical differential limiter (CDL).

For a 2nd order CDL the pole quality factor is a constant, Q=const. For example, the filter shown in FIG. 12 will be a 2nd order CDL if the resistance R is given by $$R(|z-\zeta|) = R_0 \times \begin{cases} 1 & \text{for } |z-\zeta| \leq \alpha \\ \dfrac{|z-\zeta|}{\alpha} & \text{otherwise} \end{cases}. \quad (19)$$

It should be noted that the integrands in equation (7) for the 1st order NDL represent the rate of change of the output signal, and the absolute values of the integrands are equal to the absolute value of the rate of change of the output. Thus the absolute value of the rate of change of the output is a function of the absolute value of the difference signal.

One may see from equation (18) that the absolute rate of change of the output of the 1st order CDL is proportional to the absolute value of the difference signal in the interval $0 \leq |z| \leq \alpha$, and remains constant at the maximum value $\alpha/\tau_0$ for larger absolute values of the difference signal.

Figure 13:
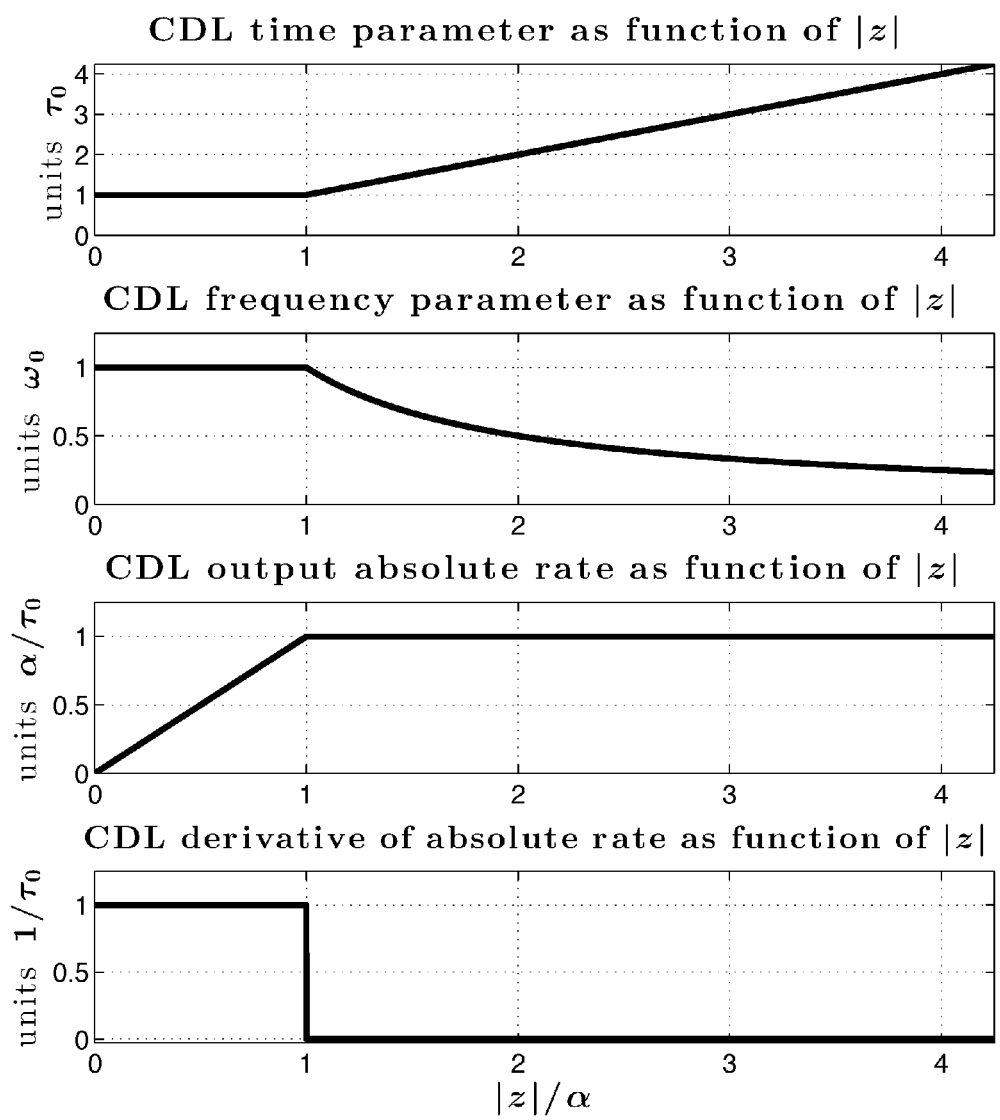
FIG. 13. Time and frequency parameters, and the output absolute rate of change with its derivative, as functions of the absolute value of the difference signal for a 1st order canonical differential limiter.

FIG. 13 shows the time and frequency parameters, and the output absolute rate of change with its derivative, as functions of the absolute value of the difference signal for a 1st order canonical differential limiter.

Figure 14:
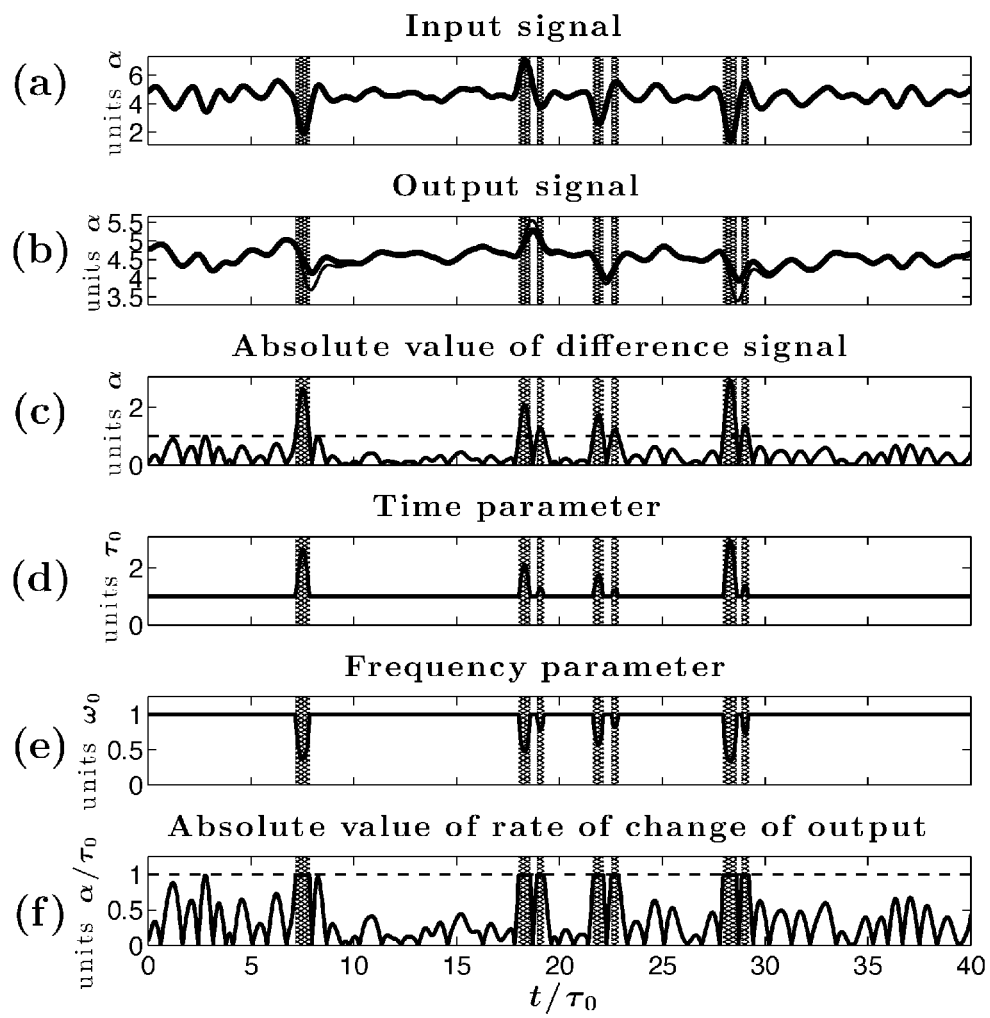
FIG. 14. Example showing a real input signal (panel (a)), the output signal (panel (b)), the absolute value of the difference signal (panel (c)), the time parameter (panel (d)), the frequency parameter (panel (e)), and the absolute rate of change of the output signal (panel (f)) as functions of time for a 1st order canonical differential limiter. The cross-hatched areas indicate the time intervals where the CDL has nonlinear behavior. For comparison, the dashed line in panel (b) shows the output of a 1st order lowpass filter with the time constant equal to the minimum value of the time parameter.

FIG. 14 provides an example showing a real input signal (panel (a)), the output signal (panel (b)), the absolute value of the difference signal (panel (c)), the time parameter (panel (d)), the frequency parameter (panel (e)), and the absolute rate of change of the output signal (panel (f)) as functions of time for a 1st order canonical differential limiter. In the figure, the cross-hatched areas indicate the time intervals where the CDL has nonlinear behavior. For comparison, the thinner line in panel (b) shows the output of a 1st order lowpass filter with the time constant equal to the minimum value of the time parameter.

6 Differential Critical Limiters

A 1st order differential critical limiter (DcL) may be defined by requiring that (i) the absolute rate of change of the output signal is constant in the limit of large difference signal, and (ii) the derivative of the absolute rate of change of the output signal is a non-increasing function of the absolute value of the difference signal.

For both 1st and 2nd order critical limiters, when the time parameter is viewed as a function of the absolute value of the difference signal, its first derivative is a non-decreasing function monotonically approaching a constant value in the limit of a large argument.

A bandwidth of a DcL may be described by equation (1) with $\gamma=1$, namely by $$B(|z|) = B_0 \times \{(a|z|)^b + \exp[-(a|z|)^b]\}^{-\frac{1}{b}}. \quad (20)$$

One should easily see that the canonical differential limiter is also a differential critical limiter.

As another example, the time parameter given by $$\tau(|z|) = \tau_0 \frac{|z|/\alpha}{1 - e^{-|z|/\alpha}} \quad (21)$$

leads to a differential critical limiter since $$\lim_{|z| \to \infty} \frac{|z|}{\tau(|z|)} = \frac{\alpha}{\tau_0} = \text{const}, \quad (22)$$

and since $$\frac{d}{d|z|} \frac{|z|}{\tau(|z|)} = \frac{1}{\tau_0} e^{-|z|/\alpha}, \quad (23)$$

which is a monotonically decreasing function of $|z|$.

Figure 15:
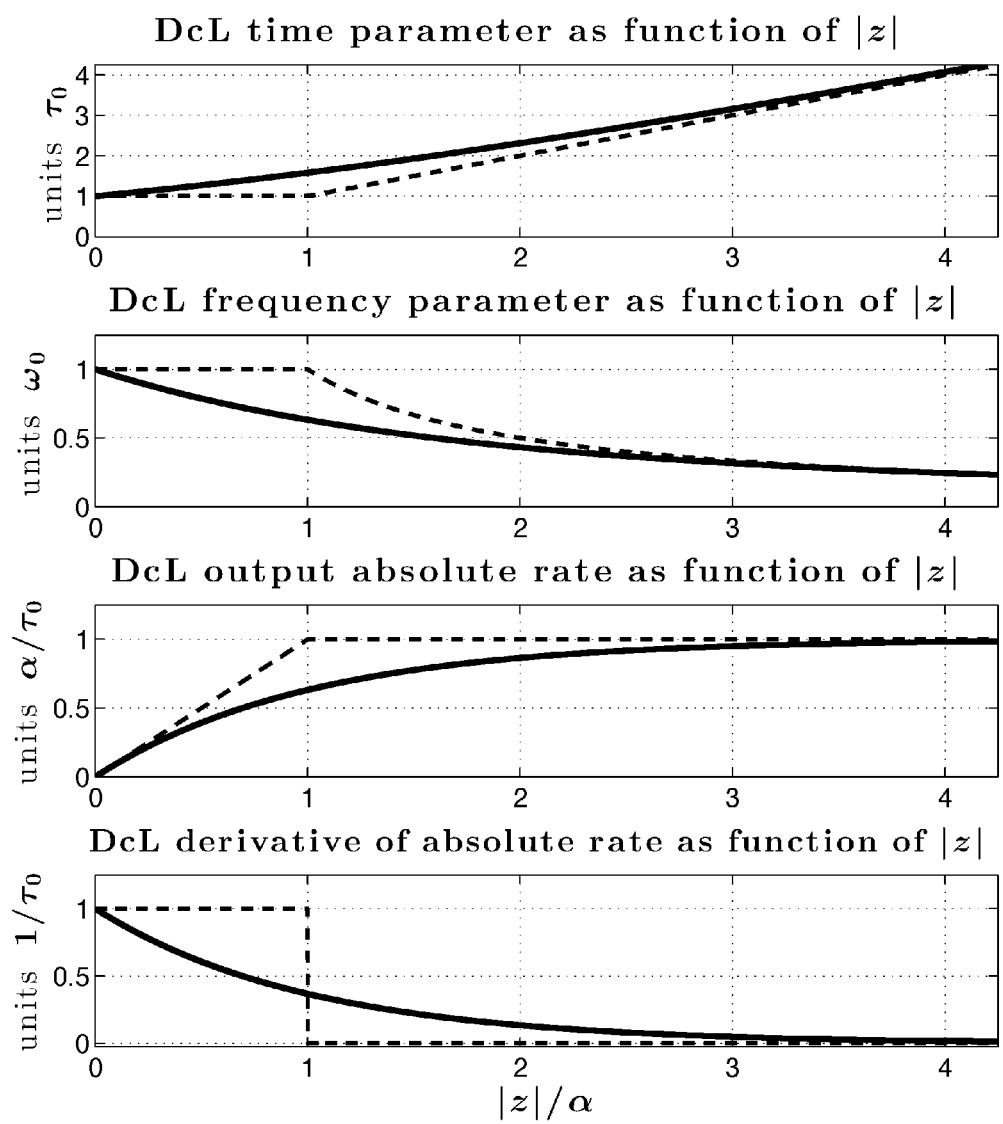
FIG. 15. Particular example of time and frequency parameters, and the output absolute rate of change and its derivative, as functions of the absolute value of the difference signal for a 1st order differential critical limiter. For comparison, the corresponding functions for the canonical differential limiter are shown by the dashed lines.

For the above example of the time parameter of a differential critical limiter, FIG. 15 shows, for the 1st order limiter, the time and frequency parameters, and the output absolute rate of change and its derivative, as functions of the absolute value of the difference signal. For comparison, the corresponding functions for the canonical differential limiter are shown by the dashed lines.

6.1 Differential Critical Limiters with Quantile Offsets

Generalizing the equations (2.3) and (2.5) on page 1174 in Ref. [26] (Nikitin and Davidchack [26]) for a complex- or vector-valued input signal $z(t)$, the output $z_{\tilde{q}}(t)$ of a complex- or vector-valued quantile filter in a moving rectangular time window of width $T$ may be given implicitly by $$\frac{1}{T} \int_{t-T}^{t} ds \, \text{sign}[z_{\tilde{q}}(t) - z(s)] = \tilde{q}, \quad (24)$$

where $\tilde{q}$ is a complex or vector quantile offset parameter, $|\tilde{q}|<1$, and $\text{sign}(z)=z/|z|$.

For real signals, the quantile offset parameter is real, and is related to the quantile $q$ as $\tilde{q}=2q-1$. For example, $\tilde{q}=0$ for the median, or second quartile, $(q=\frac{1}{2})$, $\tilde{q}=-\frac{1}{2}$ for the first quartile $(q=\frac{1}{4})$, and $\tilde{q}=\frac{1}{2}$ for the third quartile $(q=\frac{3}{4})$.

Given an input signal and the minimum time parameter (or, equivalently, the maximum frequency parameter), for sufficiently small resolution parameter $\alpha$ the output of a differential critical limiter may be approximated as $$\zeta(t) \approx \frac{\alpha}{\tau_0} \int dt \frac{z(t) - \zeta(t)}{|z(t) - \zeta(t)|} \quad (25)$$

$$= \frac{\alpha}{\tau_0} \int dt \, \text{sign}[z(t) - \zeta(t)].$$

Equation (25) also holds for any NDL for which equation (22) holds, that is, an NDL such that the absolute rate of change of the output signal is constant $\alpha/\tau_0$ in the limit of a large difference signal. This includes, but is not limited to, CDL and DcL filters.

For a large variety of input signals, the output given by equation (25) is approximately equal to the output of a complex median filter in some time window. The width $T$ of this window approximately equals to the minimum value of the time parameter ($\tau_0$), scaled by the ratio of a measure of deviation of the input signal and the resolution parameter $\alpha$.

For example, if the input signal is a weak-sense stationary random signal, equation (25) approximates the output of a complex median filter in a moving time window of approximate width $T$, $$T \approx \frac{4 \text{median}(|z - \bar{z}|)}{\alpha} \tau_0, \quad (26)$$

where $\bar{z}$ is the mean value of the incoming signal in a time interval of width $T$ (in the respective moving window), and the median is taken for the same time interval.

FIG. 16 illustrates this, for a real weak-sense stationary random input signal, by comparing the outputs of such small-$\alpha$ DcLs and the median filters with appropriate rectangular moving windows, for larger (upper panel) and 10 times smaller (lower panel) values of the resolution parameter. In this example, the input signal has a skewed distribution so that the mean and the median central tendencies are different. For comparison with the median, the outputs of the averaging filters within the same rectangular moving windows are shown by the dotted lines.

To enable DcLs to approximate arbitrary complex (or vector) quantile filters, equation (10) may be modified by introducing a complex (or vector) quantile offset parameter $\tilde{q}$ as follows:

$$\zeta_{\tilde{q}}(t) = \int dt \left[ \frac{z(t) - \zeta_{\tilde{q}}(t)}{\tau(|z - \zeta_{\tilde{q}}|)} + \tilde{q} \frac{\alpha}{\tau_0} \right], \quad (27)$$

where $|\tilde{q}|<1$. Then, for a sufficiently small resolution parameter, $$\zeta_{\tilde{q}}(t) \approx \frac{\alpha}{\tau_0} \int dt \{\text{sign}[z(t) - \zeta_{\tilde{q}}(t)] + \tilde{q}\}. \quad (28)$$

Figure 17:
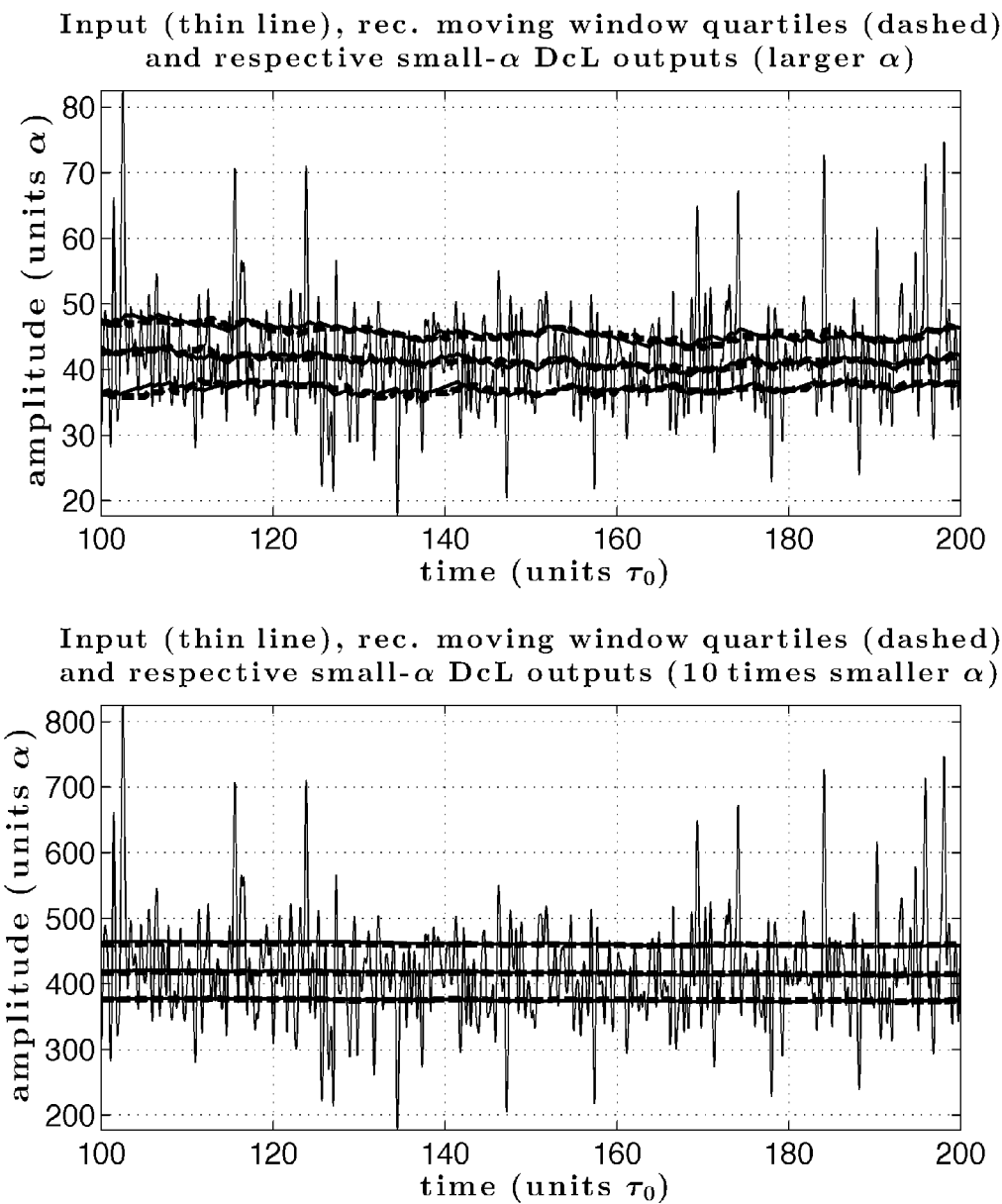
FIG. 17. Comparison, for a real weak-sense stationary random input signal, the quartile outputs of small-$\alpha$ DcLs with the respective outputs of quartile filters with appropriate rectangular moving windows, for larger (upper panel) and 10 times smaller (lower panel) values of the resolution parameter.

FIG. 17 compares, for a real weak-sense stationary random input signal, the quartile outputs of small-α DcLs with the respective outputs of quartile filters with appropriate rectangular moving windows, for larger (upper panel) and 10 times smaller (lower panel) values of the resolution parameter.

Figure 18:
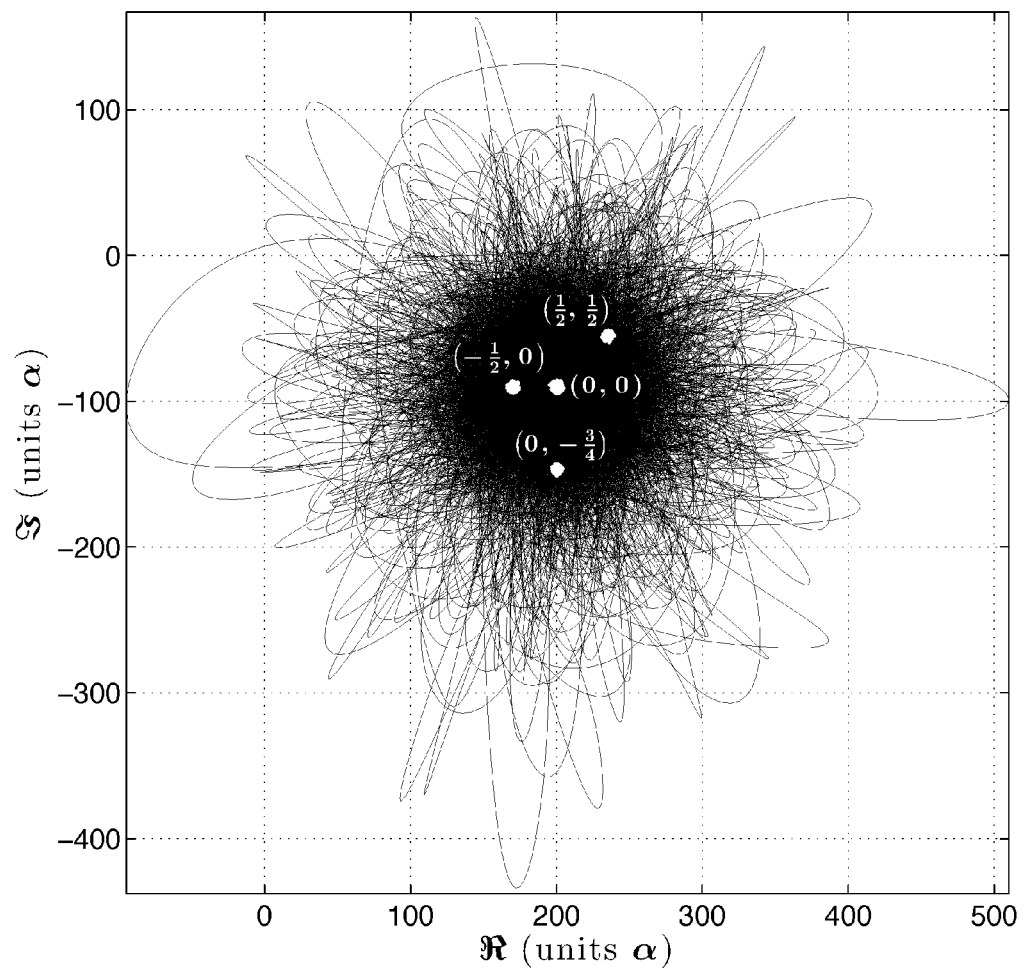
FIG. 18. Phase-space plots of a complex weak-sense stationary random input signal (black and complex quantile outputs (for the offset quantile parameters (0, 0), (½, ½), (0, −¾), and (−½, 0)) of a small-$\alpha$ CDL (white).

FIG. 18 shows the phase-space plots of a complex weak-sense stationary random input signal (black) and complex quantile outputs (for the offset quantile parameters (0, 0), (½, ½), (0, −¾), and (−½, 0)) of a small-α CDL (white).

One skilled in the art will recognize that constellation diagrams of various modulation schemes may be represented in terms of quantities expressed through the quantile offset parameters discussed in this section (e.g. complex for quadrature carriers, or four-dimensional for modulation schemes of fiber optics and optical communications), and thus DcLs with quantile offsets may be used in methods and devices for modulation and demodulation of communication signals.

Figure 19:
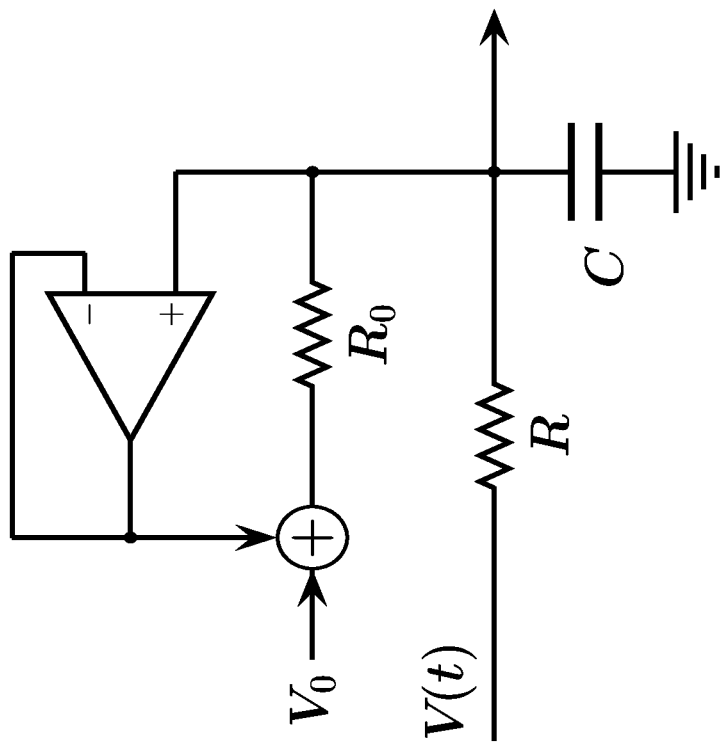
FIG. 19. Simplified block diagram of an illustrative implementation of equation (27) in an electronic circuit.

FIG. 19 shows a simplified block diagram of an illustrative implementation of equation (27) in an electronic circuit.

6.2 Numerical Implementation of CDL with Optional Quantile Offset

Even though an NDL is an analog filter by definition, it may be easily implemented digitally, for example, in a Field Programmable Gate Array (FPGA) or software. A digital NDL requires very little memory and typically is inexpensive computationally, which makes it suitable for real-time implementations.

An example of a numerical algorithm implementing a finite-difference version of a 1st order CDL filter with optional quantile offset is given by the following MATLAB function:

```
function zeta = CDLq(z,t,tau0,alpha,dq)
    zeta = zeros(size(z));
    dt = diff(t);
    zeta(1) = z(1) + alpha(1)*dq;
    for i = 2:length(z);
        dZ = z(i)-zeta(i-1);
        if abs(dZ)<=alpha
            tau = tau0+dt(i-1);
        else
            tau = (tau0+dt(i-1))*abs(dZ)/alpha;
        end
        zeta(i) = zeta(i-1) + (dZ/tau + dq*alpha/(tau0+dt(i-1)))*dt(i-1);
    end
return
```

7 Real-Time Tests of Normality and Real-Time Detection and Quantification of Impulsive Interference The interquartile range (IQR), mean or median (or other measures of central tendency), and standard or absolute deviation from the mean or median (or from other measures of central tendency) of a signal may be used in a simple test of whether or not the amplitude of the signal is normally distributed, i.e. the signal is Gaussian.

For example, if the signal (or noise) x(t) is Gaussian, then the standard score of the quantile q is $\sqrt{2}\mathrm{erf}^{-1}(2q-1) = \sqrt{2}\mathrm{erf}^{-1}(\tilde{q})$, where $\mathrm{erf}^{-1}$ is the inverse error function. Given the mean value $\bar{x}$ and the standard deviation σ for the signal in some (moving) window, if the signal is Gaussian, the third quartile is $$Q_3 = \bar{x} + \sigma\sqrt{2}\,\mathrm{erf}^{-1}\left(\frac{1}{2}\right) \approx \bar{x} + \frac{2\sigma}{3}, \tag{29}$$

and the first quartile is $$Q_1 = \bar{x} + \sigma\sqrt{2}\,\mathrm{erf}^{-1}\left(-\frac{1}{2}\right) \approx \bar{x} - \frac{2\sigma}{3}. \tag{30}$$

If the actual values of the third and/or first quartiles differ substantially from the calculated values, then the signal is not Gaussian.

Since small-α DcLs with quantile offsets allow us to obtain outputs of quantile filters with time windows of arbitrary width (see equations (26) and (27)), we may obtain a couple of such outputs for two different values of $\tilde{q}$ (for example, one positive and one negative) and compare them with the corresponding outputs of the circuits measuring the central tendency of the signal (e.g. the mean or median) and a deviation from this central tendency. If the relations between the measured values differ substantially from those based on the assumption of the signal being Gaussian, then the signal is not Gaussian. Thus we may construct a variety of real-time tests of normality, and use them for real-time detection and quantification of the presence of impulsive interference.

More generally, the measures of central tendency (MCT) and/or deviation may be obtained as linear combinations (e.g. the weighted sums and/or differences) of the outputs of small-α DcLs with different quantile offsets. On the other hand, these measures may be obtained by alternative means having different sensitivity to the outliers, for example, as the outputs of mean or median filters (for the central tendency) and/or as the outputs of circuits for obtaining the root mean square (RMS) or the average absolute value. One skilled in the art would recognize that a variety of such alternative measures may be constructed, including the measures based on the different weighted sums and/or differences of the outputs of small-α DcLs with various quantile offsets.

Figure 20:
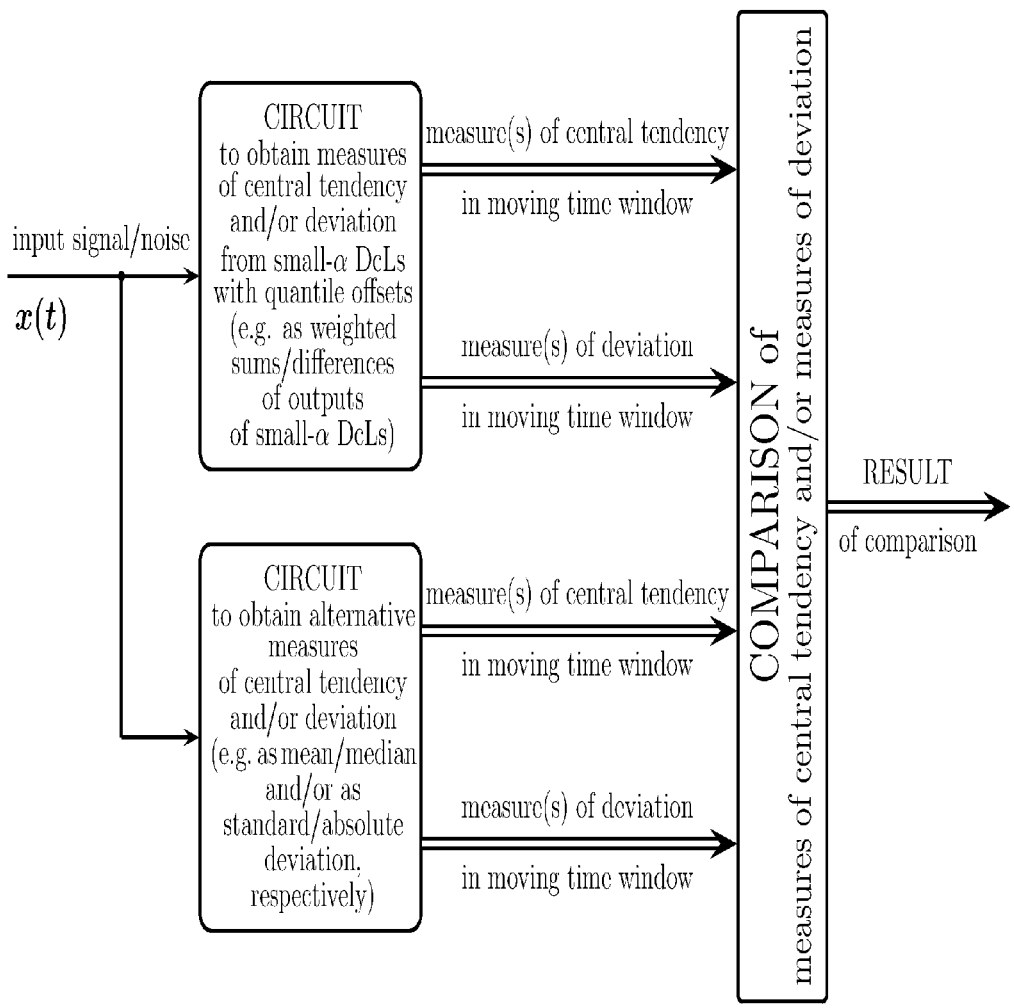
FIG. 20. Simplified block diagram of a method and apparatus for real-time tests of normality, and for real-time detection and quantification of impulsive interference.

As an example, FIG. 20 provides a simplified block diagram of a method and apparatus for real-time tests of normality, and for real-time detection and quantification of impulsive interference. On one hand, the measures of central tendency and/or deviation may be obtained as linear combinations (e.g. the weighted sums and/or differences) of the outputs of small-α DcLs with different quantile offsets. On the other hand, these measures may be obtained by alternative means, e.g. as the outputs of mean or median filters (for the central tendency) and/or as the outputs of circuits for obtaining the root mean square (RMS) or the average absolute value. These differently obtained measures of central tendency and/or deviation may be compared to each other, and the result(s) of such comparison will be indicative of the signal being Gaussian or not Gaussian, or of the absence or presence of impulsive interference.

For example, under the Gaussian assumption, we may equate the measures of central tendency of the signal as $$\chi_{\tilde{q}}(t) + \chi_{-\tilde{q}}(t) = 2\bar{x}(t), \tag{31}$$

were $\bar{x}(t)$ is the central tendency of the signal x(t) (e.g. the mean or median) measured in a moving window of time of width T, $\chi_{\tilde{q}}(t)$ is given by equation (27), and the measures of deviation from the central tendency as $$\chi_{\tilde{q}}(t) - \chi_{-\tilde{q}}(t) = 2\sigma_T(t)\sqrt{2}\,\mathrm{erf}^{-1}(\tilde{q}), \tag{32}$$

were $\sigma_T(t)$ is the standard deviation of the signal in a moving window of time of width T (see equation (26)). If the actual measured values for the central tendencies and/or deviations are significantly different from those required by the equalities of equations (31) and (32), the signal is not Gaussian.

Since it is generally easier (and less expensive) in practice to obtain a measure of absolute deviation (MAD) rather than standard deviation, equation (32) may be re-written as $$\chi_{\tilde{q}}(t)-\chi_{-\tilde{q}}(t)=(\text{absolute deviation from mean/median})\times 2\sqrt{\pi}\text{erf}^{-1}(\tilde{q}). \qquad (33)$$

In practice, the absolute deviation from mean/median of the signal in a moving window of time of width T may be approximated by $$(\text{absolute deviation})=\langle (|x(t)-\bar{x}(t)|)_T, \qquad (34)$$

where $\bar{x}(t)$ is the output of either averaging (giving absolute deviation from the mean), or median (giving absolute deviation from the median) filter in a moving window of time of width T. Then equation (33) becomes $$\chi_{\tilde{q}}(t)-\chi_{-\tilde{q}}(t)=2\sqrt{\pi}\langle |x(t)-\bar{x}(t)|\rangle_T \text{erf}^{-1}(\tilde{q}). \qquad (35)$$

Figure 21:
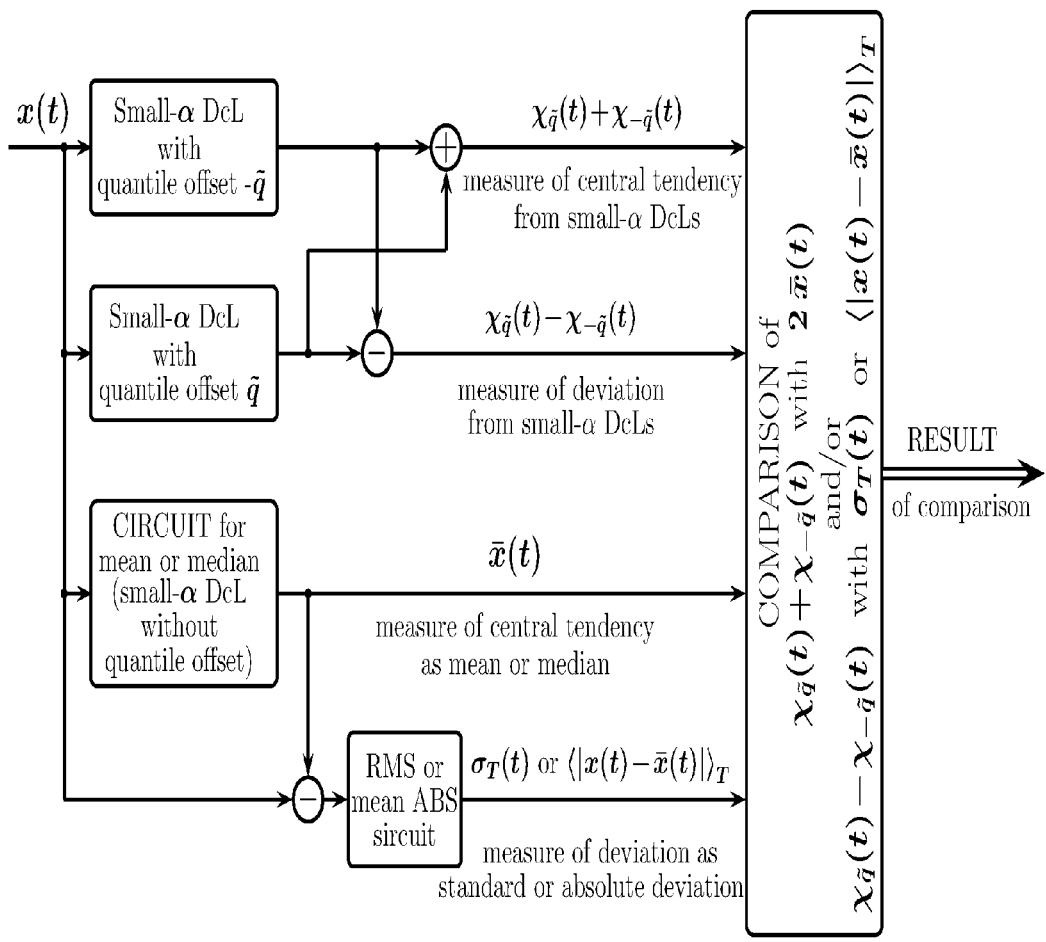
FIG. 21. Particular block diagram example of a method and apparatus for a real-time test of normality, and for real-time detection and quantification of impulsive interference according to equations (31) through (35).

FIG. 21 provides a particular block diagram example of a method and apparatus for a real-time test of normality, and for real-time detection and quantification of impulsive interference according to equations (31) through (35).

Figure 22:
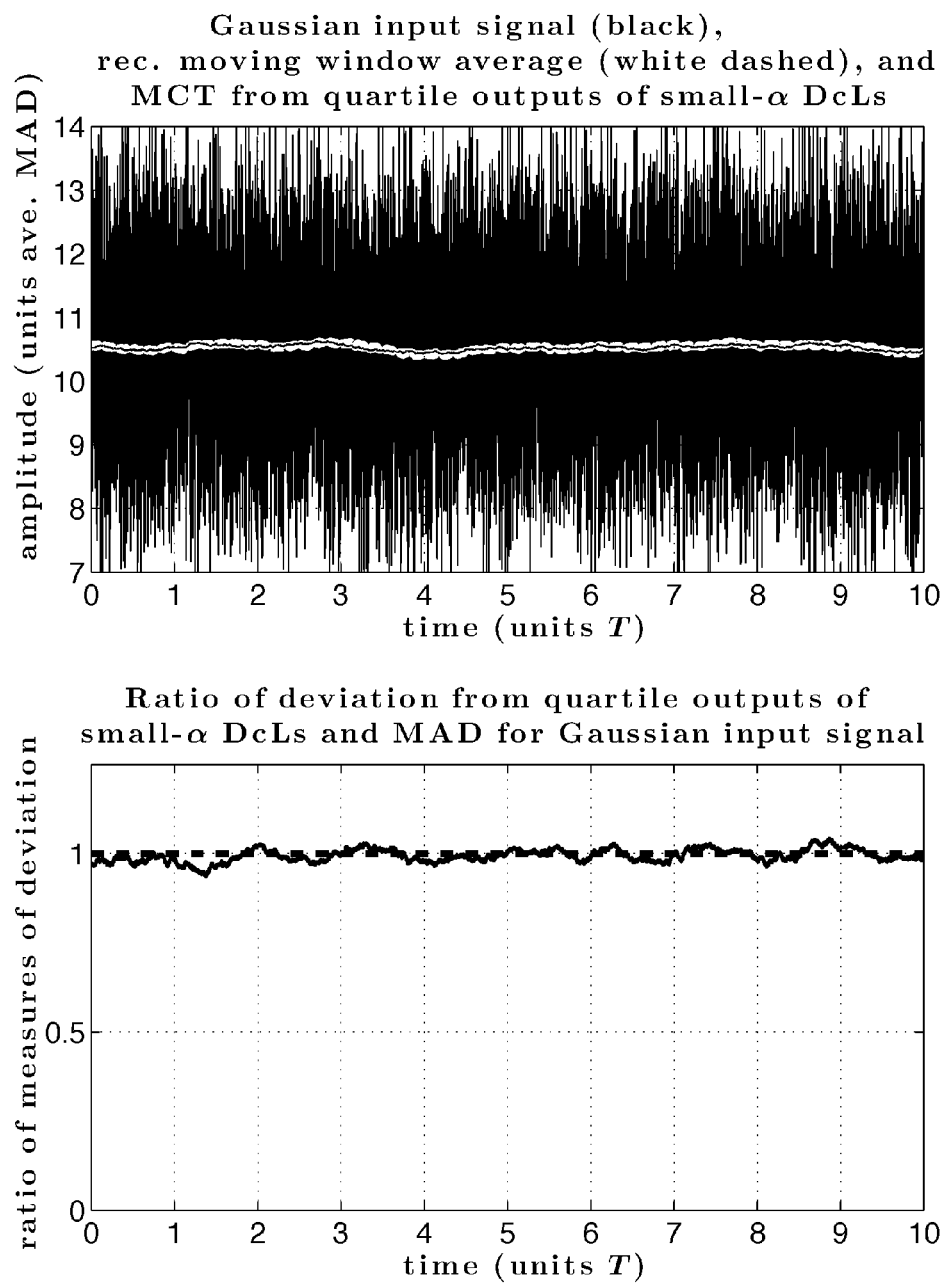
FIG. 22. Simulated example of a real time test of normality according to equations (31) and (35), with $\tilde{q}=\frac{1}{2}$, for a Gaussian input signal (thermal noise).
Figure 23:
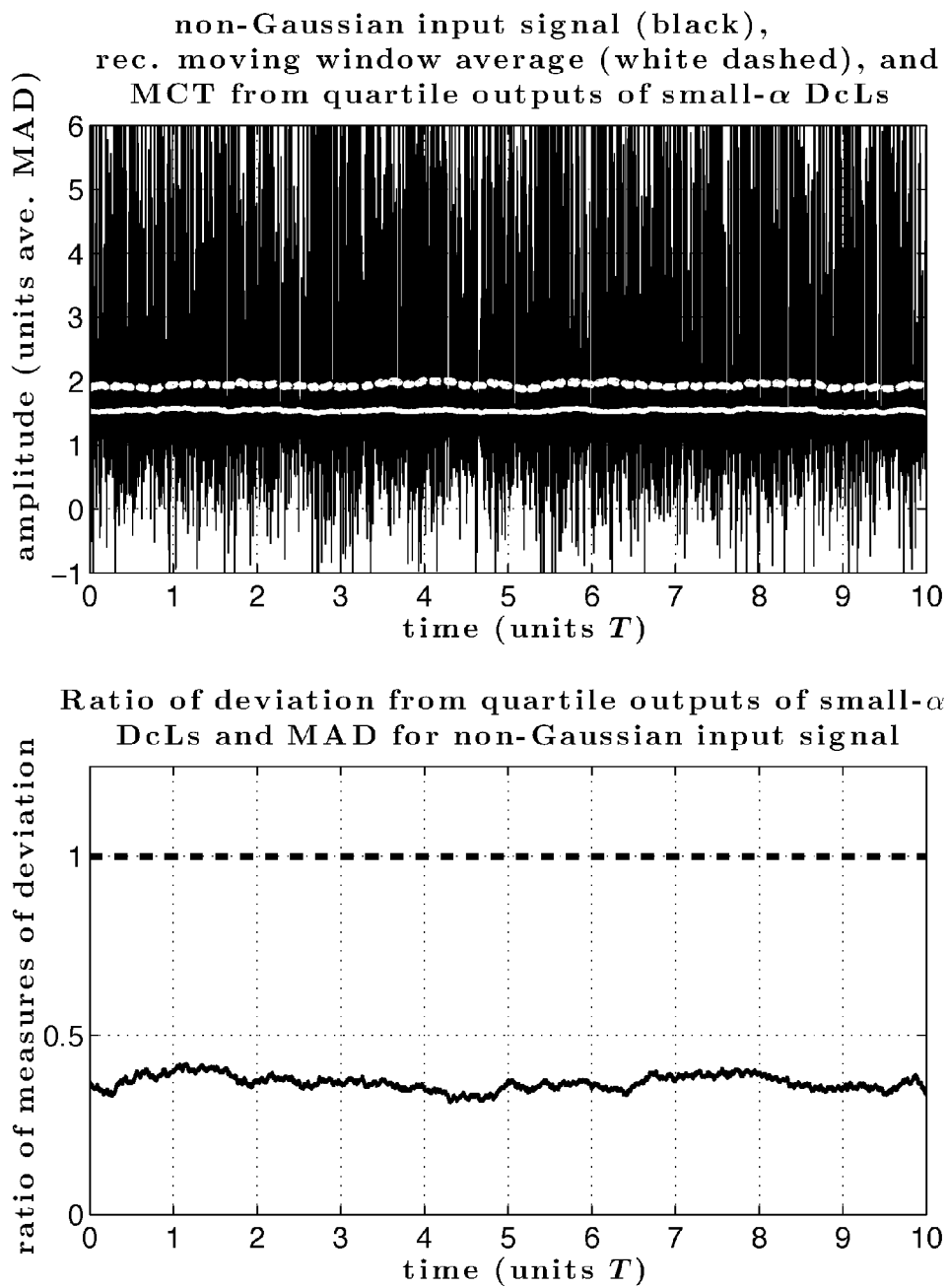
FIG. 23. Simulated example of a real time test of normality according to equations (31) and (35), with $\tilde{q}=\frac{1}{2}$, for a non-Gaussian input signal (mixture of thermal noise and asymmetric impulsive noise).

FIG. 22 shows a simulated example of a real time test of normality according to equations (31) and (35), with $\tilde{q}=\frac{1}{2}$, for a Gaussian input signal (thermal noise), while FIG. 23 shows a simulated example of such a test for a non-Gaussian input signal (mixture of thermal noise and asymmetric impulsive noise). In the lower panel of FIG. 23, smaller-than-unity value of the ratio of the deviations obtained as an IQR using small-$\alpha$ DcLs and as MAD is an indication that the input signal is impulsive.

8 Adaptive NDLs (ANDLs)

The range of linear behavior of an NDL may be determined and/or controlled by the resolution parameter $\alpha$. Given an NDL and its input signal $z(t)$, the magnitude/power of the output $\zeta(t)$ is a monotonically increasing function of $\alpha$ for small $\alpha$, approaching a steady (constant) value in the limit of large $\alpha$. On the other hand, the magnitude/power of the average absolute value of the difference signal $z(t)-\zeta(t)$ is a monotonically decreasing function of $\alpha$ for small $\alpha$, approaching a steady (constant) value in the limit of large $\alpha$. This property may be utilized to implement a negative feedback to adaptively control the resolution parameter of an NDL in order to ensure optimal suppression of the signal outliers such as impulsive noise.

FIG. 24 provides an illustration of such an adaptive NDL (ANDL), where the average absolute value of the difference signal $z(t)-\zeta(t)$ is obtained either by means of a lowpass filter (panel (a)) with sufficiently narrow bandwidth (e.g. order of magnitude narrower than the initial bandwidth of the ANDL in the limit of large resolution parameter), or by an NDL (panel (b)) with sufficiently narrow initial bandwidth.

Note that the outputs of the lowpass filter (panel (a)) and the NDL (panel (b)) both provide measures of tendency (MTs) of a magnitude of the difference signal, and that these MTs may also constitute measures of deviation of the difference signal from its central tendency (e.g. from zero).

It should be pointed out that an external absolute value circuit is not necessary for the implementation of an adaptive NDL, since the absolute value of the difference signal $|z(t)-\zeta(t)|$ is normally required (directly or indirectly) for the NDL operation, and is typically already available internally in an NDL. Thus this value may be made externally available and used in an ANDL as illustrated in FIG. 25.

Figure 26:
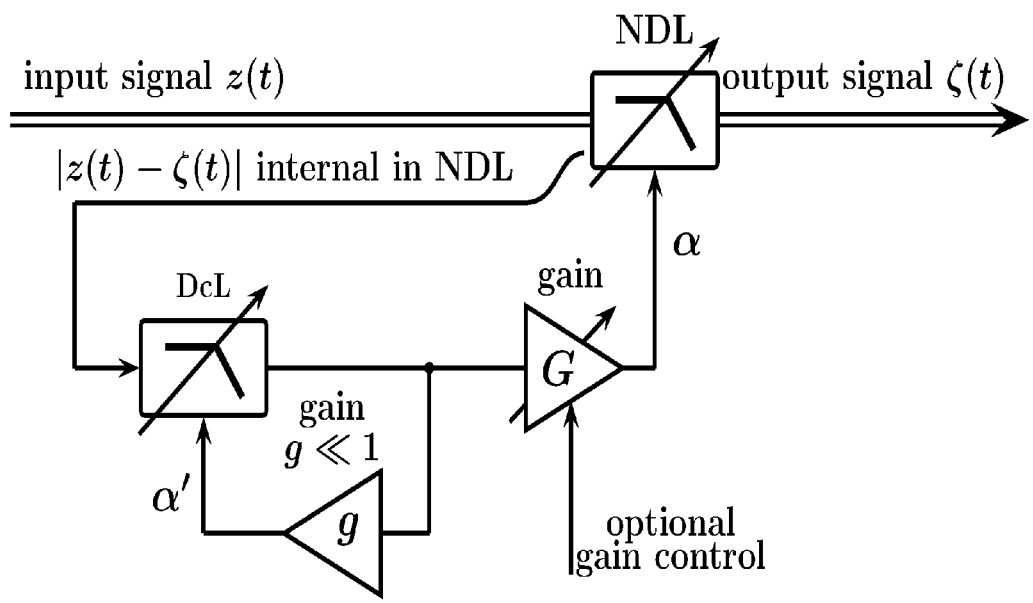
FIG. 26. Illustrative block diagram of an adaptive NDL (ANDL) using a small-$\alpha$ DcL operating on the absolute value of the difference signal to automatically adjust the value of the resolution parameter.

Since a median filter is robust to outliers (impulsive noise), a small-$\alpha$ DcL operating on the absolute value of the difference signal may be used to automatically adjust the value of $\alpha$, as illustrated in FIG. 26. The optimization of performance of such an adaptive NDL may be achieved by controlling the gain G of the amplifier in the feedback. This gain may be set according to specifications, or it may be (optionally) controlled by an external (feedback) signal indicative of the desired performance of the NDL.

The small gain $g \ll 1$ (e.g. one-tenth) ensures that the DcL operates in its small-$\alpha$ regime. Then, a DcL approximates a quantile filter (e.g. median filter for a zero quantile offset) in a moving time window of approximate width T given by (see equation (26))

$$T \approx \frac{4}{g}\tau_0, \qquad (36)$$

where $\tau_0$ is the minimum value of the DcL time parameter.

One skilled in the art will recognize that the small-$\alpha$ DcL in FIG. 26 may be replaced by any other means for obtaining a quantile measure of the absolute value of the difference signal $|z(t)-\zeta(t)|$ in a moving time window, for example, by the filters described by Nikitin and Davidchack [27], Nikitin [23, 25].

For vector signals, the magnitude (absolute value) of the difference signal may be defined as the square root of the sum of the squared components of the difference signal. One skilled in the art will recognize that an adaptive NDL for vector signals may be constructed in a manner similar to the complex-valued NDLs shown in FIG. 24 through FIG. 26.

9 Differential Over-Limiters (DoLs)

For a 1st order differential critical limiter, the absolute rate of change of the output signal is constant in the limit of a large difference signal. This implies that in that limit the time parameter increases linearly with the absolute value of the difference signal. Equivalently, the frequency parameter and the bandwidth decrease in inverse proportion to the absolute value of the difference signal.

If the increase in the time parameter (or, equivalently, the decrease in the frequency parameter) of an NDL is faster than that of a DcL in the limit of a large magnitude of the difference signal, the resulting NDL is a differential over-limiter (DoL). In a 1st order DoLs, the absolute rate of change of the output signal in the limit of a large difference signal approaches zero instead of a maximum constant value of a DcL filter.

An example of functional dependency of a DoL bandwidth on the absolute value of the difference signal may be given by equation (1) with the requirement that $\gamma=1+\beta>1$, $$B(|z|) = B_0 \times \left\{(a|z|^{1+\beta})^b + \exp\left[-(a|z|^{1+\beta})^b\right]\right\}^{-\frac{1}{b}}. \qquad (37)$$

It may be easily seen that the DoL bandwidth given by equation (37) is $B(|z|) \propto 1/|z|^{1+\beta}$ for large $|z|$, and decays faster than a bandwidth of a DcL ($B(|z|) \propto |z|^{-1}$ for large $|z|$).

Under certain conditions, such faster decrease of the bandwidth of a DoL in comparison with that of a DcL may provide improved impulsive interference suppression, as illustrated further in this disclosure.

A particular example of the functional dependency of the DoL time parameter on the absolute value of the difference signal may be given by equation (38) below:

$$\tau(|z-\zeta|) = \tau_0 \times \begin{cases} 1 & \text{for } |z-\zeta| \le \alpha \\ \left(\frac{|z-\zeta|}{\alpha}\right)^{1+\beta} & \text{otherwise} \end{cases}, \quad (38)$$

where $\beta>0$ and a single resolution parameter $\alpha$ replaces the two parameters a and b of equation (37).

Figure 27:
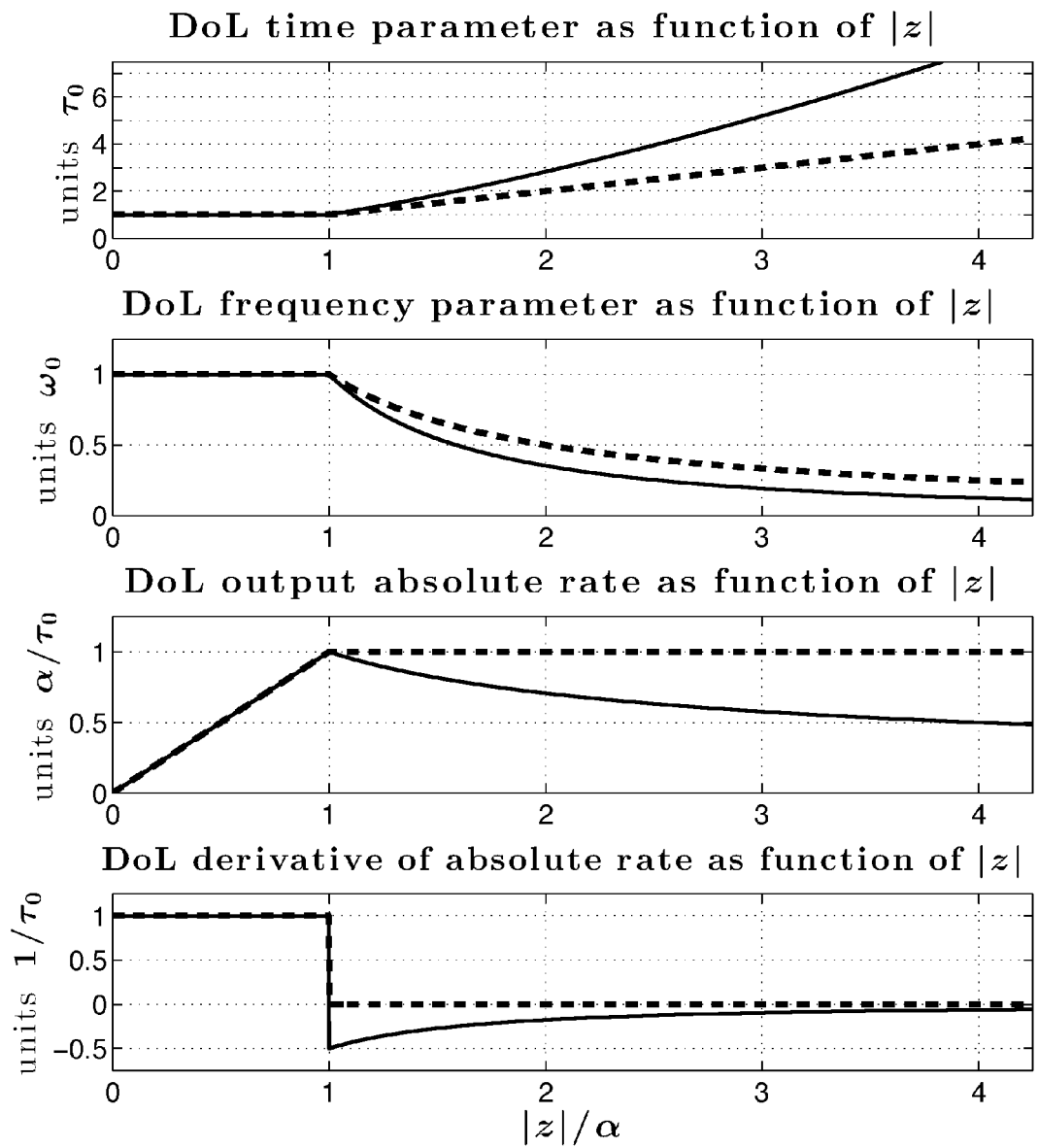
FIG. 27. Particular example ($\beta=\frac{1}{2}$ in equation (38)) of time and frequency parameters, and the output absolute rate of change and its derivative, as functions of the absolute value of the difference signal for a 1st order differential over-limiter. For comparison, the corresponding functions for the canonical differential limiter are shown by the dashed lines.

FIG. 27 provides a particular example ($\beta=\frac{1}{2}$ in equation (38)) of the time and frequency parameters, and the output absolute rate of change and its derivative, as functions of the absolute value of the difference signal for a 1st order differential over-limiter. For comparison, the corresponding functions for the canonical differential limiter are shown by the dashed lines.

10 Examples of OTA-Based Implementations of NDLs

This section provides examples of idealized algorithmic implementations of nonlinear differential limiters based on the operational transconductance amplifiers (OTAs) (see, for example, Schaumann and Van Valkenburg [35], Zheng [41]). Transconductance cells based on the metal-oxide-semiconductor (MOS) technology represent an attractive technological platform for implementation of such active nonlinear filters as NDLs, and for their incorporation into IC-based signal processing systems. NDLs based on transconductance cells offer simple and predictable design, easy incorporation into ICs based on the dominant IC technologies, small size (10 to 15 small transistors are likely to use less silicon real estate on an IC than a real resistor), and may be usable from the low audio range to gigahertz applications.

The examples of this section also illustrate how NDLs that comprise electronic components may be implemented through controlling values of these components by the difference between the input signal and a feedback of the output signal. These examples include a variety of common blocks and components (such as voltage- and current-controlled resistors, inductors, and capacitors, and the circuits for control voltages and currents) which may be used by one skilled in the art to construct NDLs of arbitrary behavior, order, and complexity. These blocks and components may be varied in many ways, and such variations are not to be regarded as a departure from the spirit and scope of this invention, and all such modifications will be obvious to one skilled in the art.

10.1 'RC' Implementation of 1st Order CDL

Figure 28:
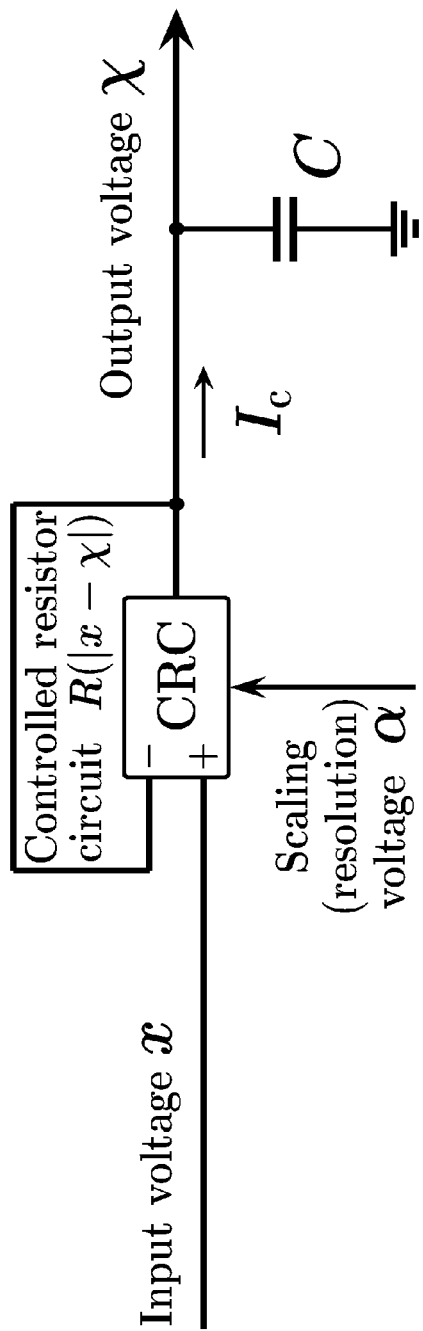
FIG. 28. Generalized block diagram of an 'RC' implementation of a 1st order CDL.

FIG. 28 shows a generalized block diagram of an 'RC' implementation of a 1st order CDL with a control of the resistive element. If the resistance of the controlled resistor circuit depends on the absolute value of the difference signal as $$R(|x-\mathcal{X}|) = \frac{1}{g_m} \times \begin{cases} 1 & \text{for } |x-\mathcal{X}| \le \alpha \\ \frac{|x-\mathcal{X}|}{\alpha} & \text{otherwise} \end{cases}, \quad (39)$$

the resulting filter is a 1st order CDL with the time parameter $$\tau = RC = \frac{C}{g_m} \times \begin{cases} 1 & \text{for } |x-\mathcal{X}| \le \alpha \\ \frac{|x-\mathcal{X}|}{\alpha} & \text{otherwise} \end{cases}. \quad (40)$$

Figure 29:
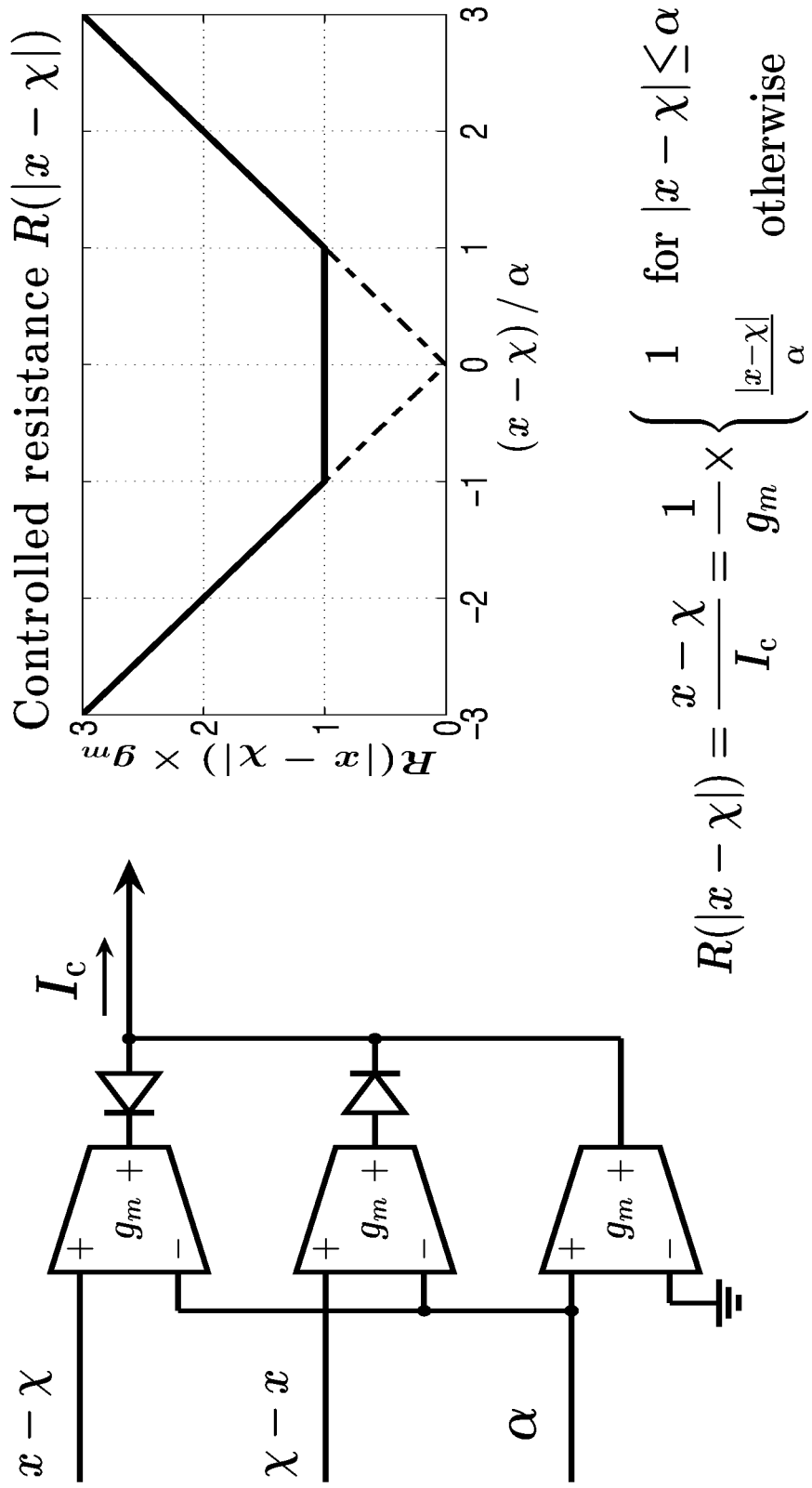
FIG. 29. Controlled resistor circuit for the CDL shown in FIG. 28.
Figure 30:
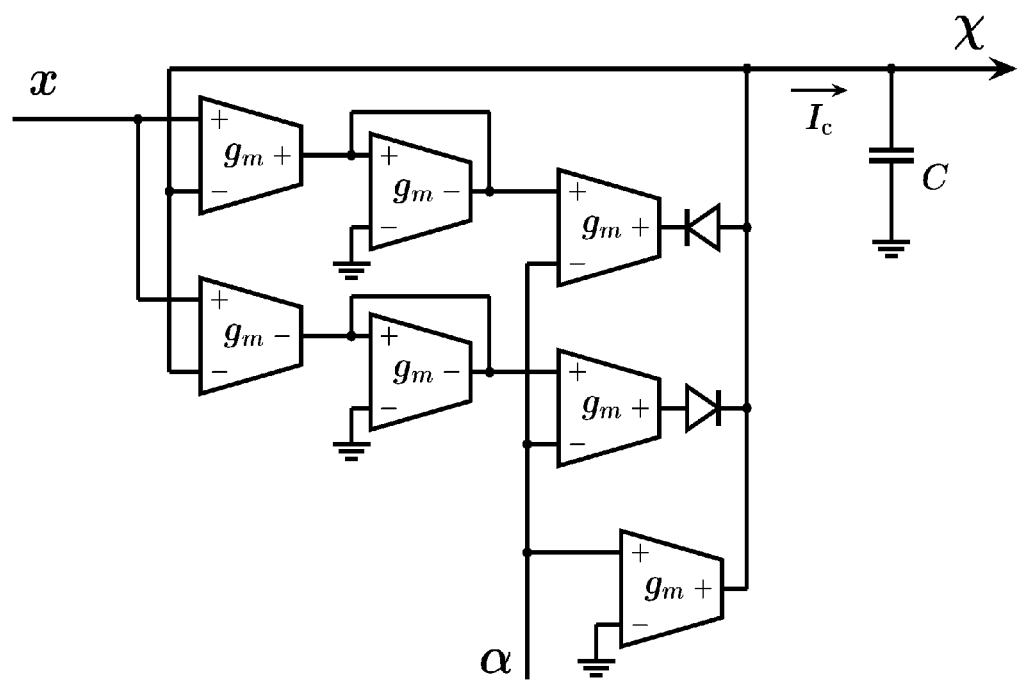
FIG. 30. Conceptual schematic for the CDL shown in FIG. 28.

FIG. 29 provides an OTA-based example of a controlled resistor circuit for the CDL shown in FIG. 28, and FIG. 30 shows an example of conceptual schematic for the CDL outlined in FIG. 28.

The circuit shown in FIG. 28 is a 1st order lowpass filter consisting of electronic components (a resistor and a capacitor) and having a bandwidth which may be characterized as an inverse of the product of the values of the resistance R and the capacitance C. When applied to an input signal (voltage) x(t), this filter produces an output filtered signal (voltage) $\chi$(t). The value of the resistance R is dynamically controlled by the difference between the input signal and a feedback of the output filtered signal. The dependence of the controlled resistance on this difference is further characterized by a resolution parameter $\alpha$ and is configured in such a way that the resistance remains constant and equal to an initial value as long as the magnitude (the absolute value) of the difference remains smaller than the resolution parameter. When the magnitude of the difference is larger than the resolution parameter, the resistance increases proportionally to the magnitude of the difference, increasing the time parameter of the filter and decreasing its bandwidth.

10.2 Complex-Valued 1st Order CDL and DoL

Figure 31:
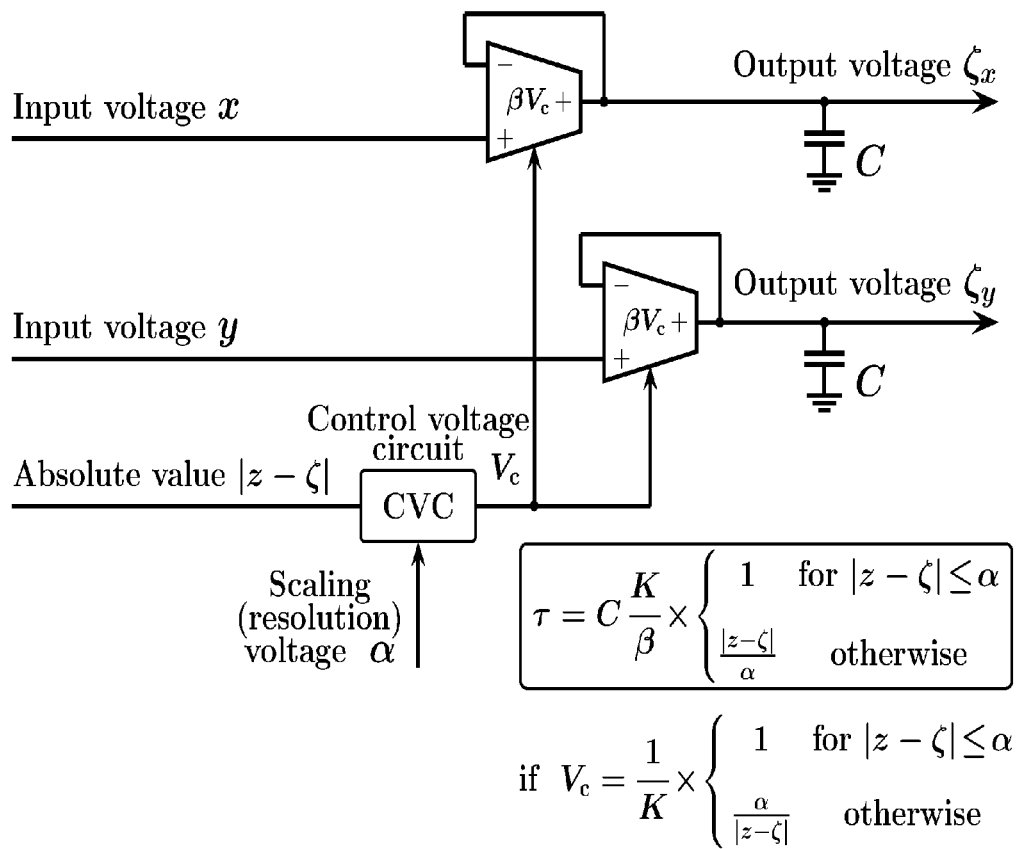
FIG. 31. Generalized block diagram of an 'RC' implementation of a 1st order complex-valued CDL.

FIG. 31 shows an example of a generalized block diagram of an 'RC' implementation of a 1st order complex-valued CDL. If the control voltage is given by $$V_c(|z-\zeta|) = \frac{1}{K} \times \begin{cases} 1 & \text{for } |z-\zeta| \le \alpha \\ \frac{\alpha}{|z-\zeta|} & \text{otherwise} \end{cases}, \quad (41)$$

the resulting filter is a 1st order complex-valued CDL with the time parameter $$\tau = C\frac{K}{\beta} \times \begin{cases} 1 & \text{for } |z-\zeta| \le \alpha \\ \frac{|z-\zeta|}{\alpha} & \text{otherwise} \end{cases}. \quad (42)$$

Figure 32:
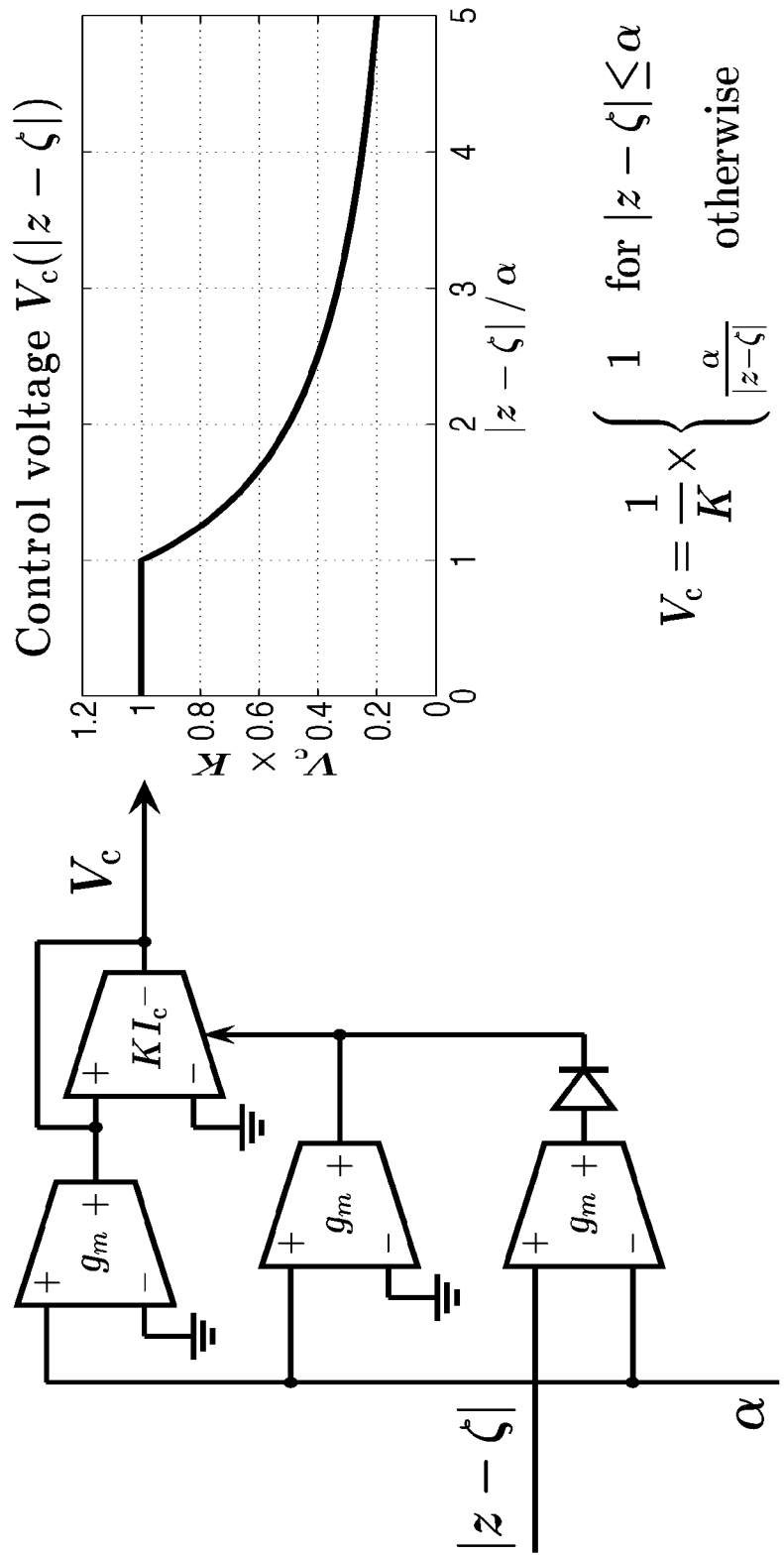
FIG. 32. Control voltage circuit for the complex-valued CDL shown in FIG. 31.
Figure 33:
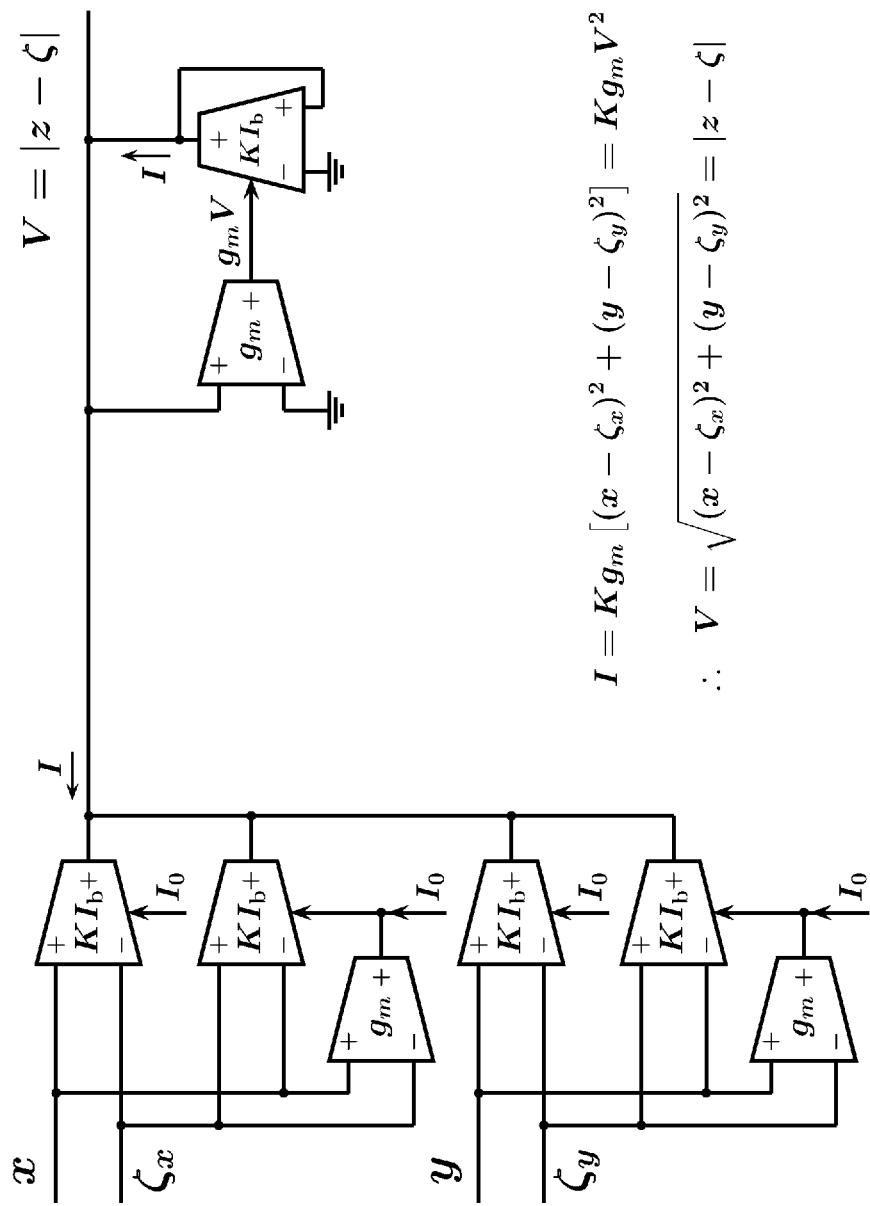
FIG. 33. Absolute value circuit for obtaining the magnitude of the complex difference signal used in the control voltage circuit of FIG. 32.

FIG. 32 provides an OTA-based example of a control voltage circuit for the complex-valued CDL shown in FIG. 31, and FIG. 33 provides an OTA-based example of an absolute value circuit for obtaining the magnitude of the complex difference signal used in the control voltage circuit of FIG. 32.

Figure 34:
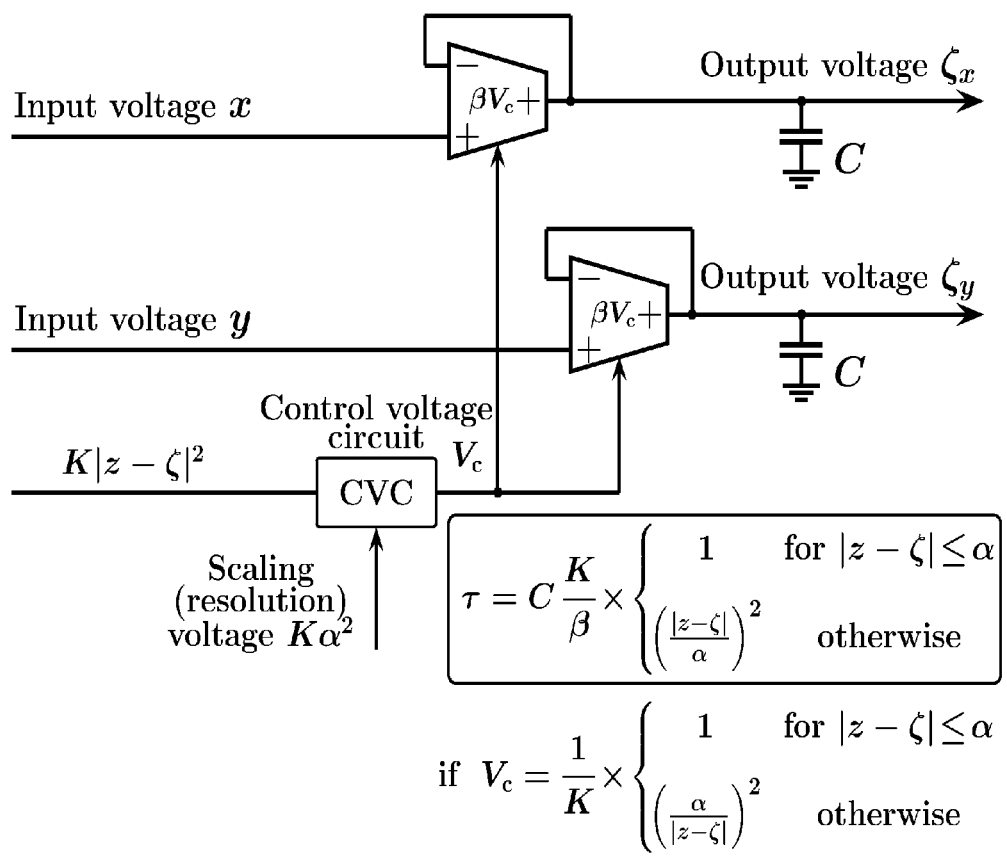
FIG. 34. Generalized block diagram of an 'RC' implementation of a particular 1st order complex-valued DoL.

FIG. 34 shows an example of a generalized block diagram of an 'RC' implementation of a particular ($\beta=1$ in equation (38)) 1st order complex-valued DoL. If the control voltage is given by $$V_c(|z-\zeta|) = \frac{1}{K} \times \begin{cases} 1 & \text{for } |z-\zeta| \le \alpha \\ \left(\frac{\alpha}{|z-\zeta|}\right)^2 & \text{otherwise} \end{cases}, \quad (43)$$

the resulting filter is a 1st order complex-valued DoL with the time parameter $$\tau = C\frac{K}{\beta} \times \begin{cases} 1 & \text{for } |z-\zeta| \leq \alpha \\ \left(\frac{|z-\zeta|}{\alpha}\right)^2 & \text{otherwise} \end{cases}. \quad (44)$$

Figure 35:
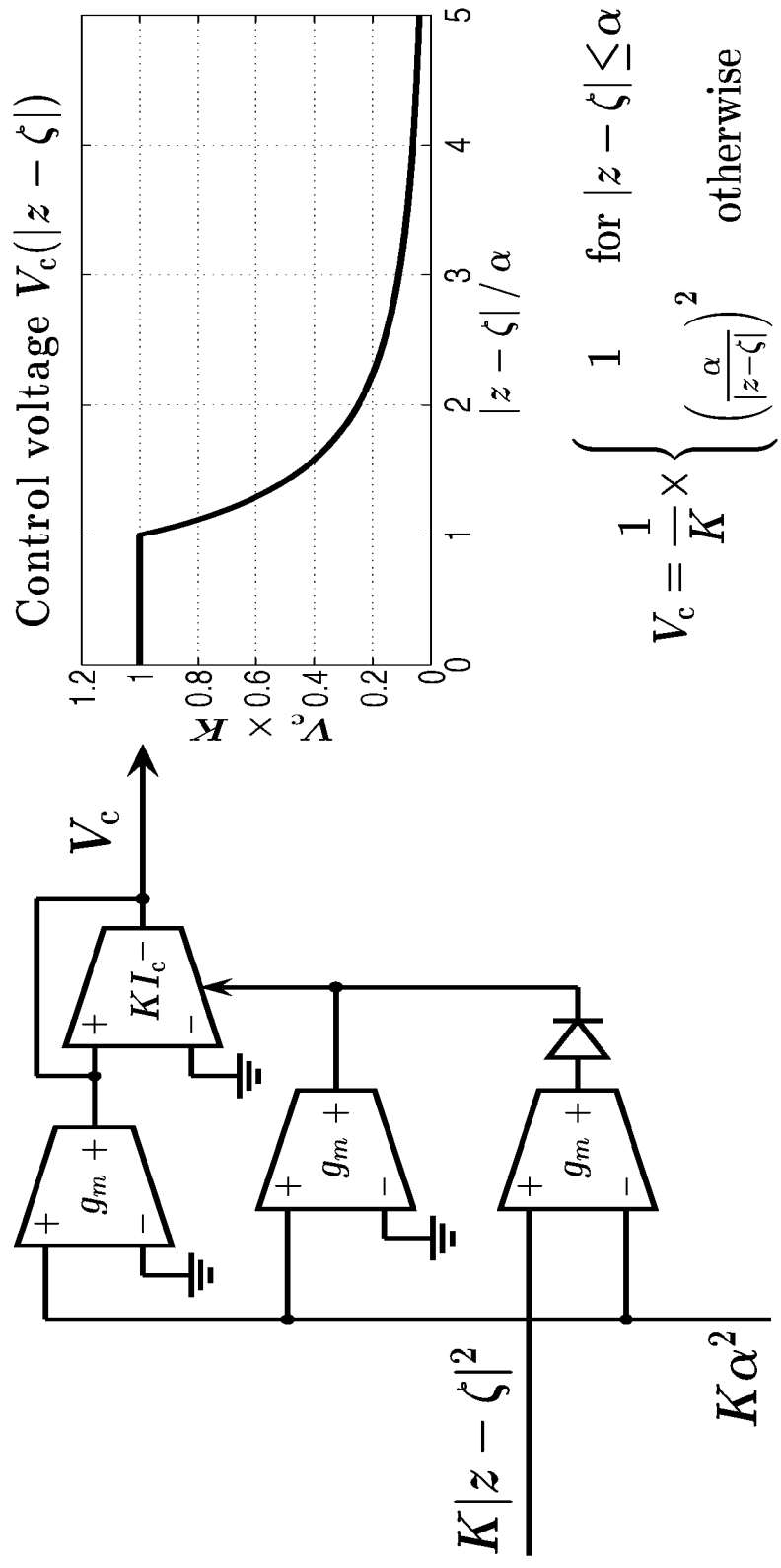
FIG. 35. Control voltage circuit for the complex-valued DoL shown in FIG. 34.
Figure 36:
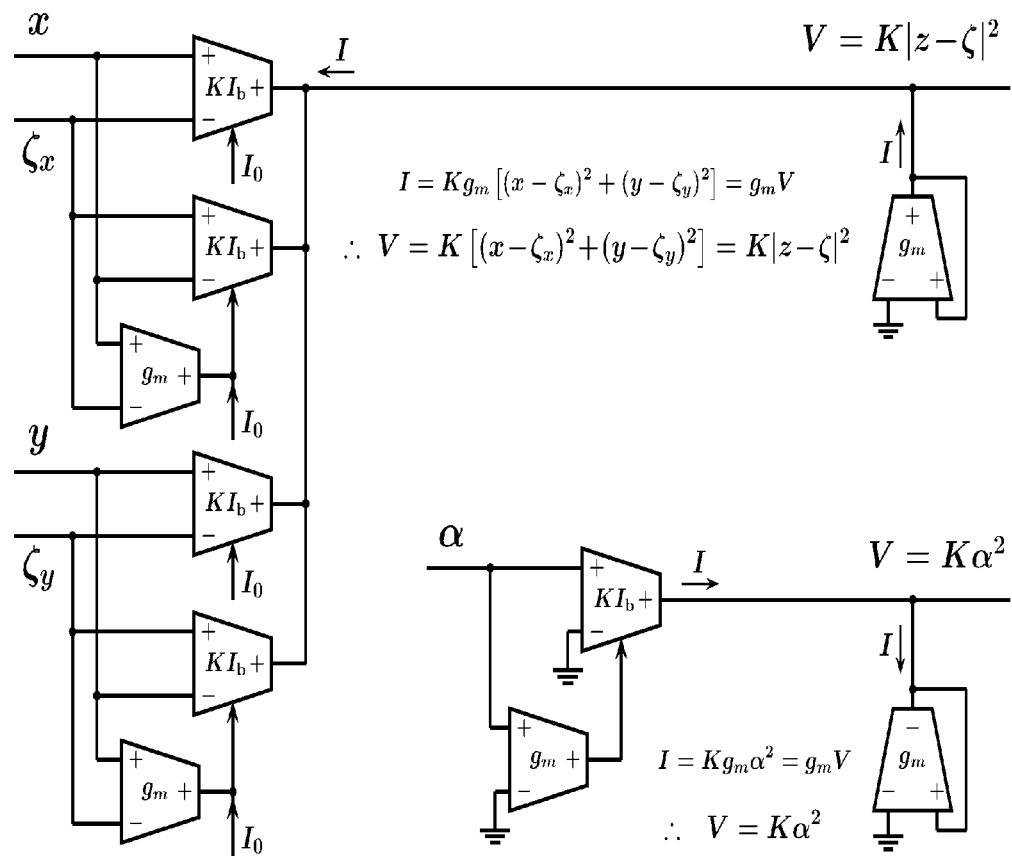
FIG. 36. Squaring circuits for obtaining the signals used in the control voltage circuit of FIG. 35.

FIG. 35 provides an OTA-based example of a control voltage circuit for the complex-valued DoL shown in FIG. 34, and FIG. 36 provides an OTA-based example of squaring circuits for obtaining the signals used in the control voltage circuit of FIG. 35.

10.3 CDLs with Quantile Offset

Figure 37:
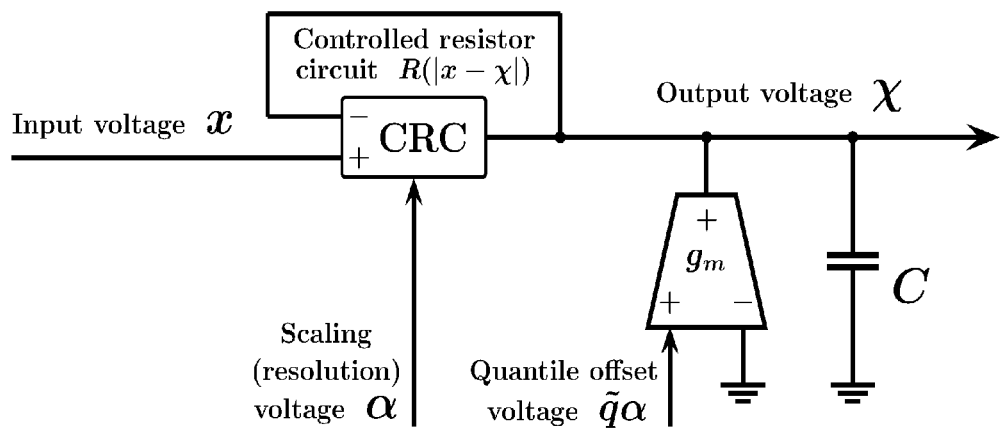
FIG. 37. Generalized block diagram of an 'RC' implementation of a 1st order CDL with quantile offset.

FIG. 37 shows a generalized block diagram of an 'RC' implementation of a 1st order CDL with quantile offset. If equation (39) describes the resistance of the controlled resistor circuit, then the output of the filter is given by $$\chi(t) = \frac{1}{C}\int dt \left[\frac{x(t) - \chi(t)}{R(|x - \chi|)} + \tilde{q}\alpha g_m\right], \quad (45)$$

corresponding to equation (27).

Figure 38:
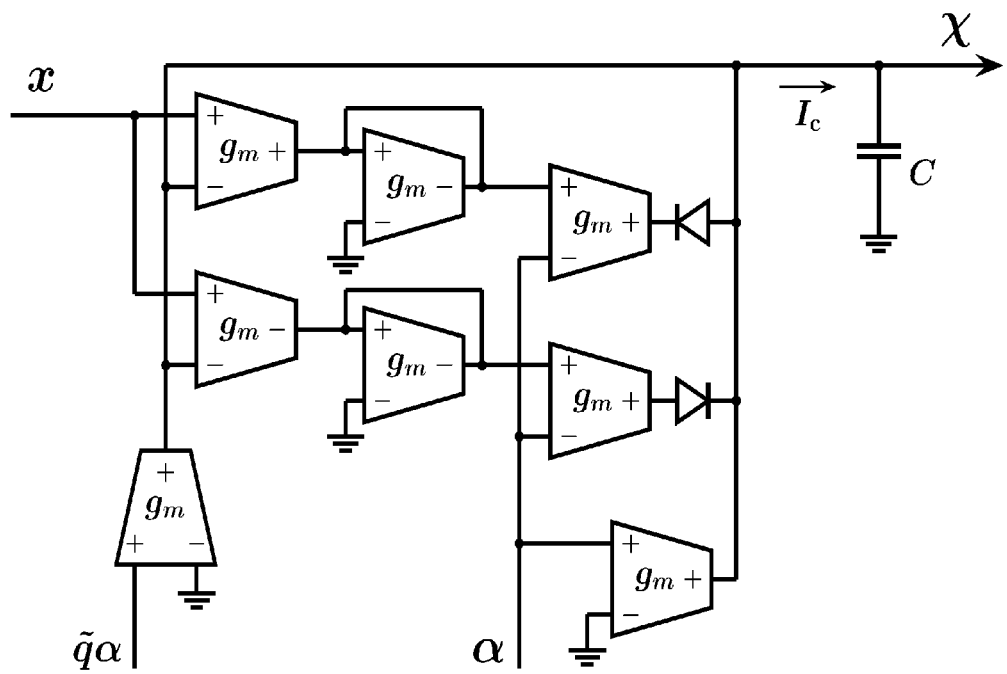
FIG. 38. Conceptual schematic for the CDL with quantile offset shown in FIG. 37.

FIG. 38 provides an example of conceptual schematic for the CDL with quantile offset shown in FIG. 37.

Figure 39:
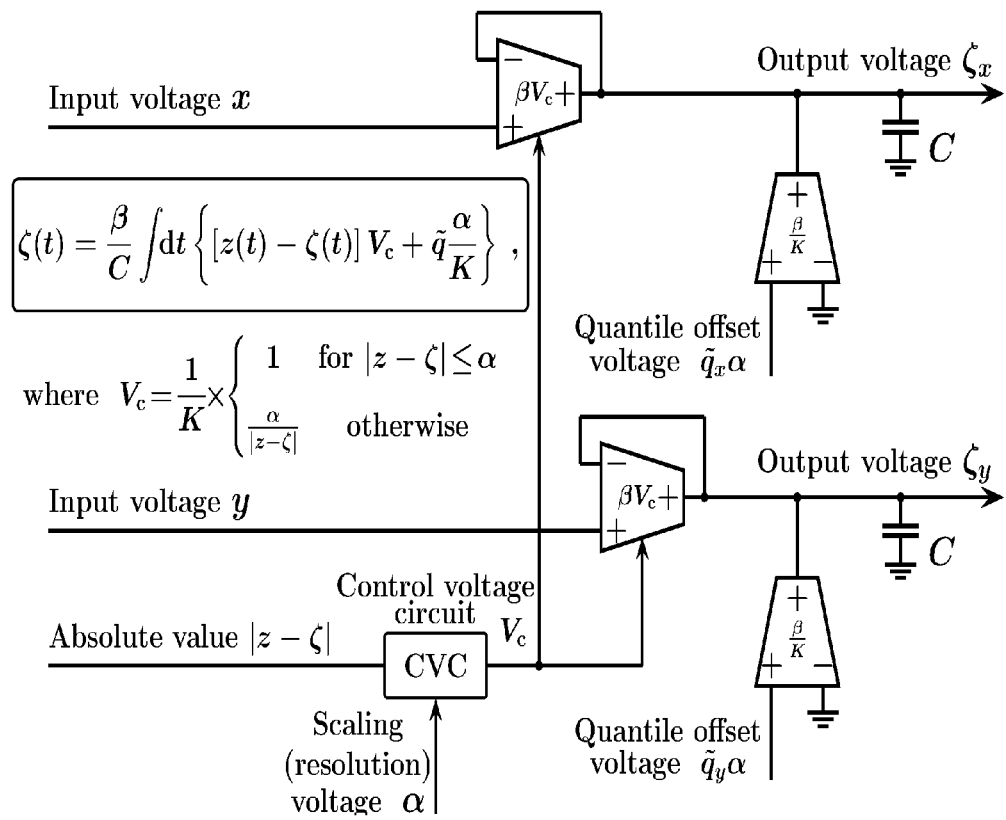
FIG. 39. Generalized block diagram of an 'RC' implementation of a 1st order complex-valued CDL with quantile offset.

FIG. 39 shows a generalized block diagram of an 'RC' implementation of a 1st order complex-valued CDL with quantile offset. If equation (41) describes the voltage of the control voltage circuit, then the output of the filter is given by $$\zeta(t) = \frac{\beta}{C}\int dt \left\{[z(t) - \zeta(t)]V_c(|z-\zeta|) + \tilde{q}\frac{\alpha}{K}\right\}, \quad (46)$$

corresponding to equation (27).

As discussed in Section 6.1, differential critical limiters (including CDLs) with quantile offsets may be used as analog rank filters for scalar as well as complex and vector signals. One skilled in the art will recognize that constellation diagrams of various modulation schemes may be represented in terms of quantities expressed through the quantile offset parameters discussed in Section 6.1 (e.g. complex for quadrature carriers, or four-dimensional for modulation schemes of fiber optics and optical communications), and thus DcLs/CDLs with quantile offsets may be used in methods and devices for modulation and demodulation of communication signals.

Figure 40:
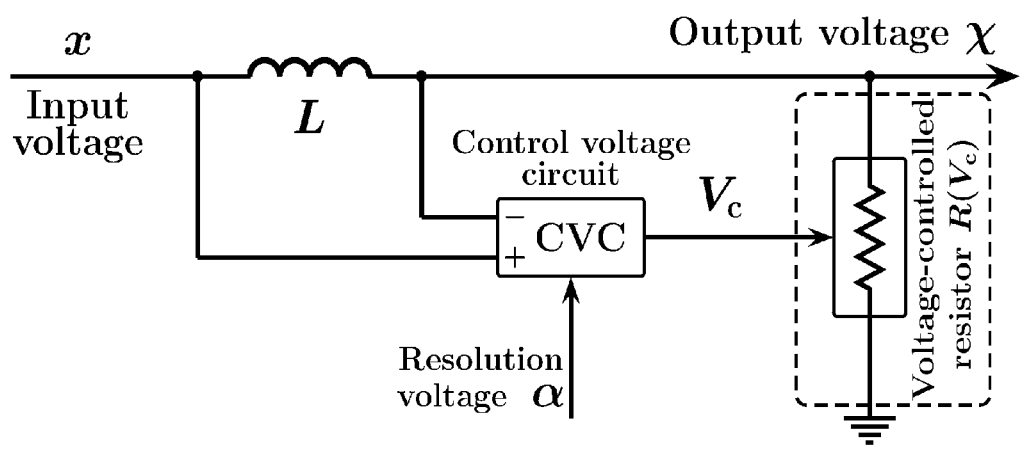
FIG. 40. Generalized block diagram of an 'LR' implementation of a 1st order CDL with the control of the resistive element.

10.4 'LR' OTA Implementation of 1st Order CDL with Control of Resistive Element FIG. 40 shows an example of a generalized block diagram of an 'LR' implementation of a 1st order CDL with the control of the resistive element, where the inductive element is implemented as an OTA-based active inductor (see, for example, Schaumann and Van Valkenburg [35], Zheng [41]). If the resistance is given by $$\frac{1}{R(V_c)} = \beta V_c, \quad (47)$$

and the control voltage is given by $$V_c = \frac{1}{K} \times \begin{cases} 1 & \text{for } |x - \chi| \leq \alpha \\ \frac{|x - \chi|}{\alpha} & \text{otherwise} \end{cases}, \quad (48)$$

then the resulting filter is a 1st order CDL with the time parameter $$\tau = L\frac{\beta}{K} \times \begin{cases} 1 & \text{for } |x - \chi| \leq \alpha \\ \frac{|x - \chi|}{\alpha} & \text{otherwise} \end{cases}. \quad (49)$$

Figure 41:
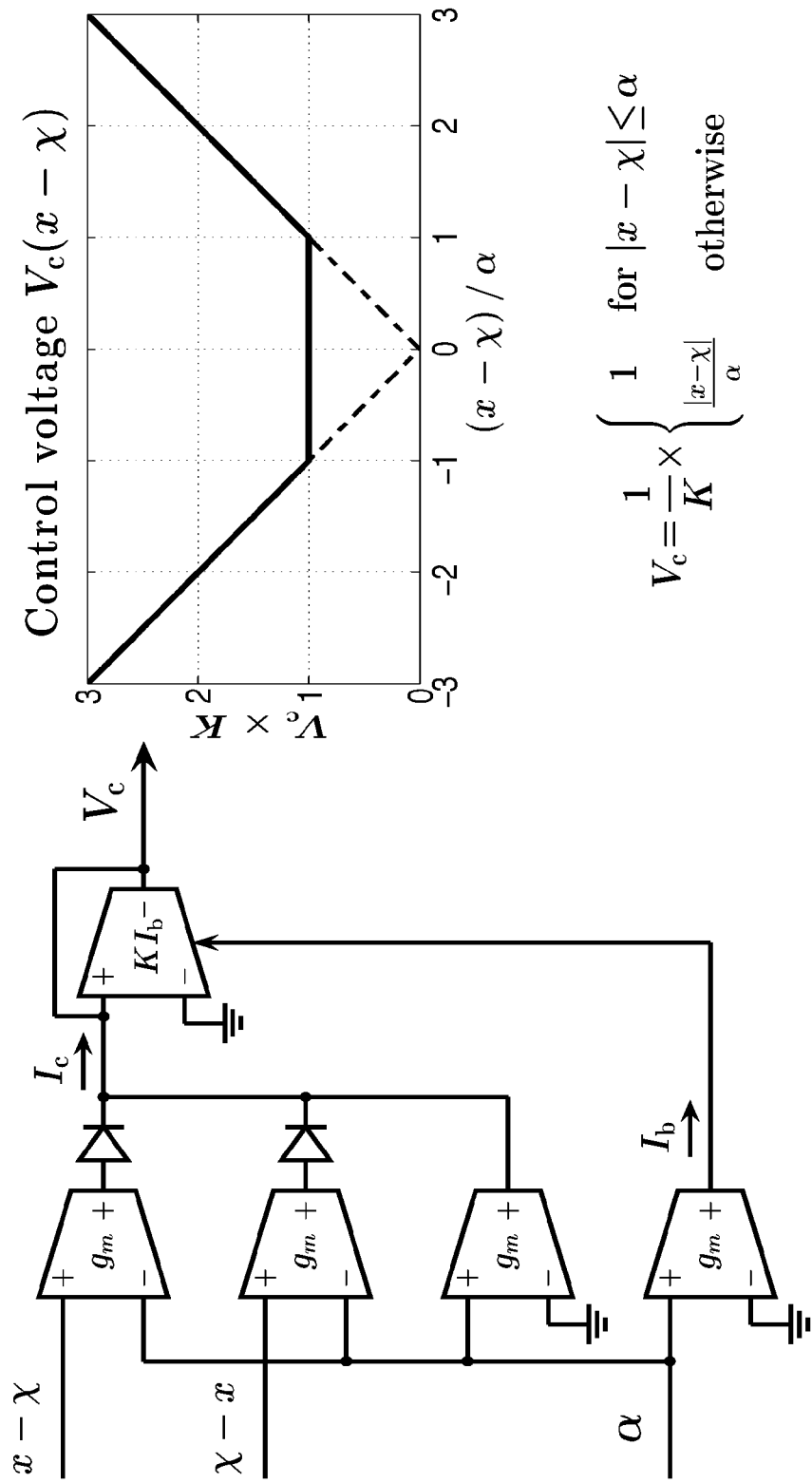
FIG. 41. OTA-based example of a control voltage circuit for the 'LR' CDL shown in FIG. 40.
Figure 42:
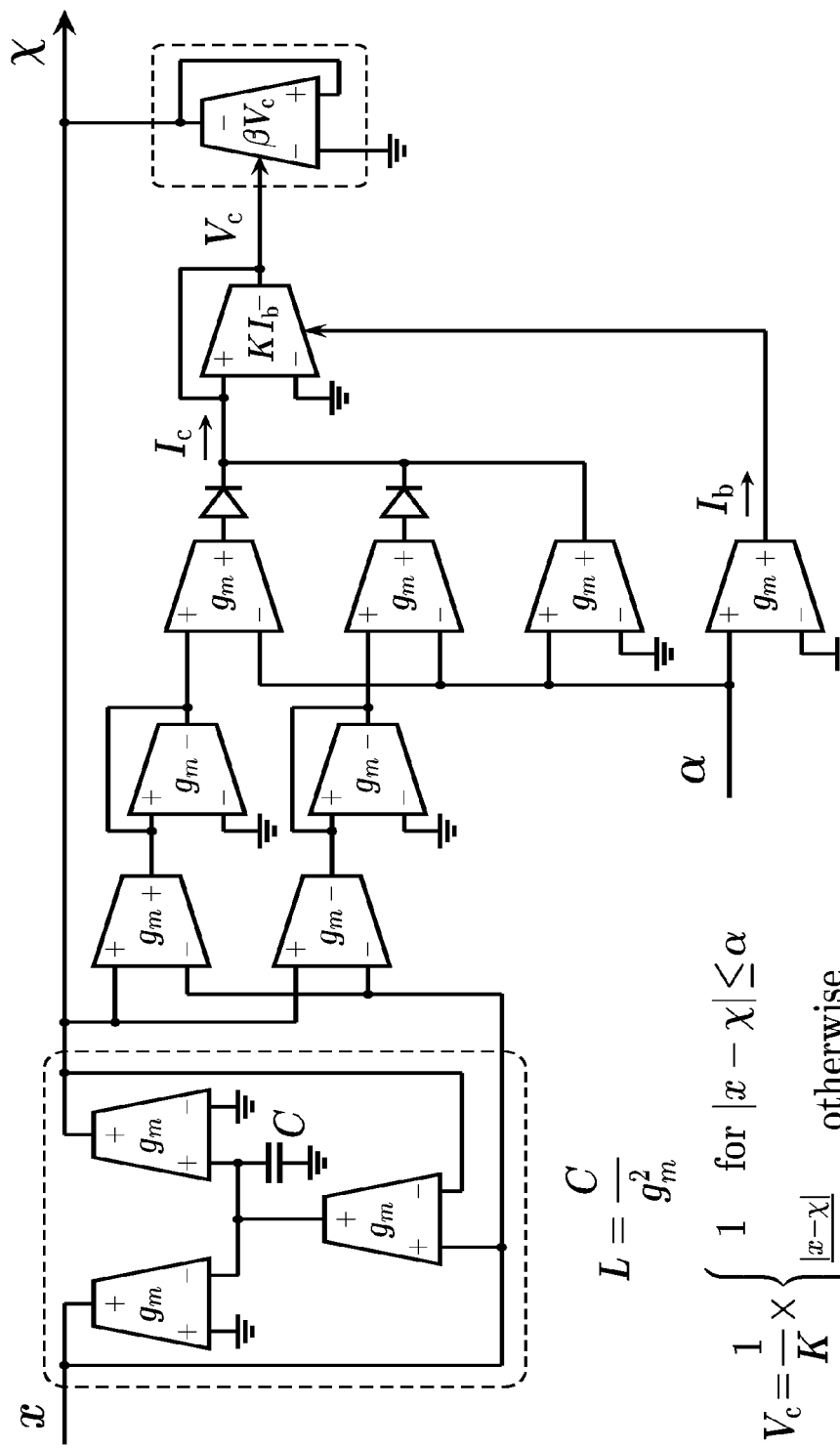
FIG. 42. Conceptual schematic for the 'LR' CDL outlined in FIG. 40.

FIG. 41 provides an OTA-based example of a control voltage circuit for the 'LR' CDL shown in FIG. 40, and FIG. 42 shows an example of conceptual schematic for the 'LR' CDL outlined in FIG. 40.

Figure 43:
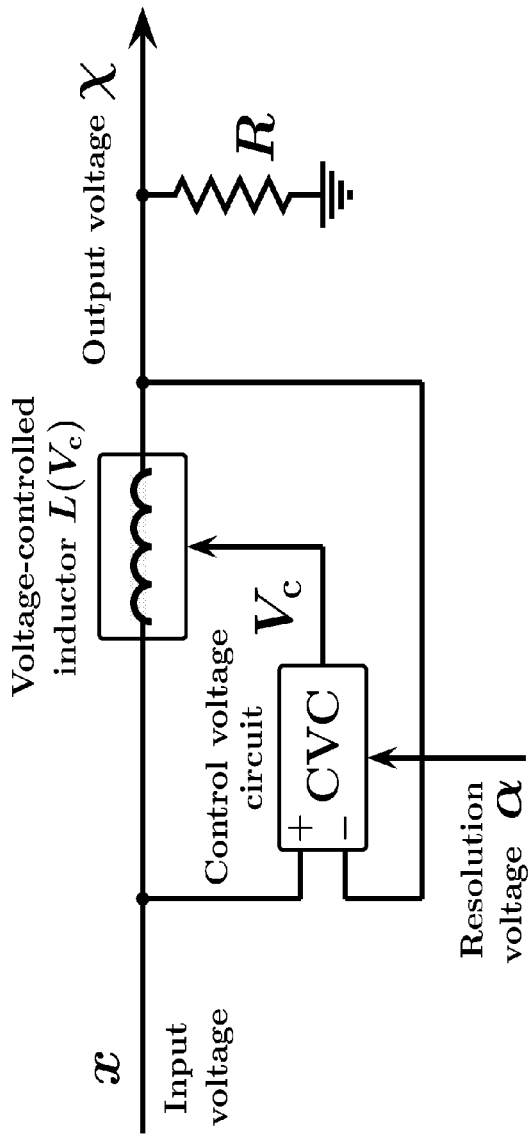
FIG. 43. Generalized block diagram of an 'LR' implementation of a 1st order CDL with the control of the reactive element.

10.5 'LR' OTA Implementation of 1st Order CDL with Control of Reactive Element FIG. 43 shows an example of a generalized block diagram of an 'LR' implementation of a 1st order CDL with the control of the reactive element, where the reactive element is an OTA-based active inductor (see, for example, Schaumann and Van Valkenburg [35], Zheng [41]).

If the inductance is given by $$L(V_c) = \frac{C}{g_m\beta V_c}, \quad (50)$$

and the control voltage is given by $$V_c = \frac{1}{K} \times \begin{cases} 1 & \text{for } |x - \chi| \leq \alpha \\ \frac{\alpha}{|x - \chi|} & \text{otherwise} \end{cases}, \quad (51)$$

then the resulting filter is a 1st order CDL with the time parameter $$\tau = \frac{C}{g_m R}\frac{K}{\beta} \times \begin{cases} 1 & \text{for } |x - \chi| \leq \alpha \\ \frac{|x - \chi|}{\alpha} & \text{otherwise} \end{cases}. \quad (52)$$

Figure 44:
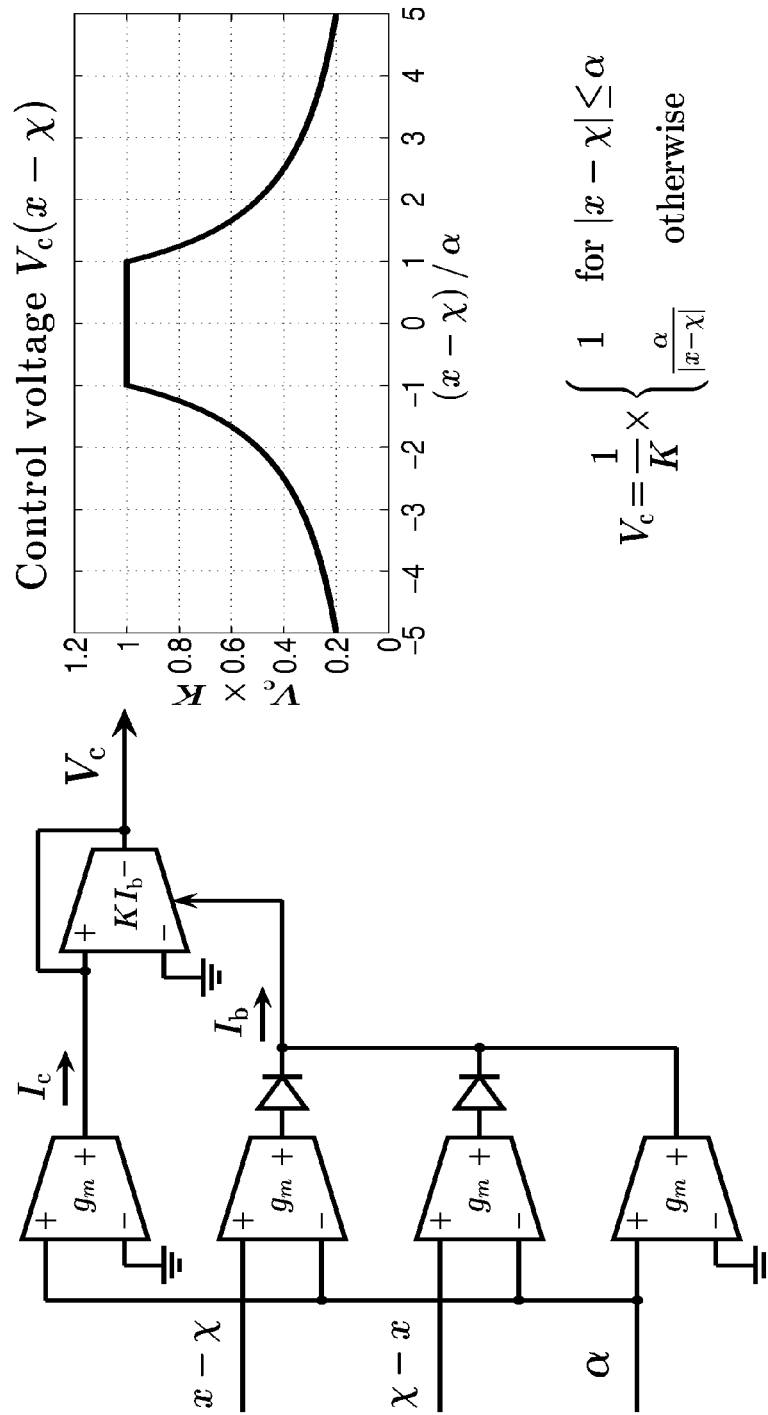
FIG. 44. OTA-based example of a control voltage circuit for the 'LR' CDL shown in FIG. 43.
Figure 45:
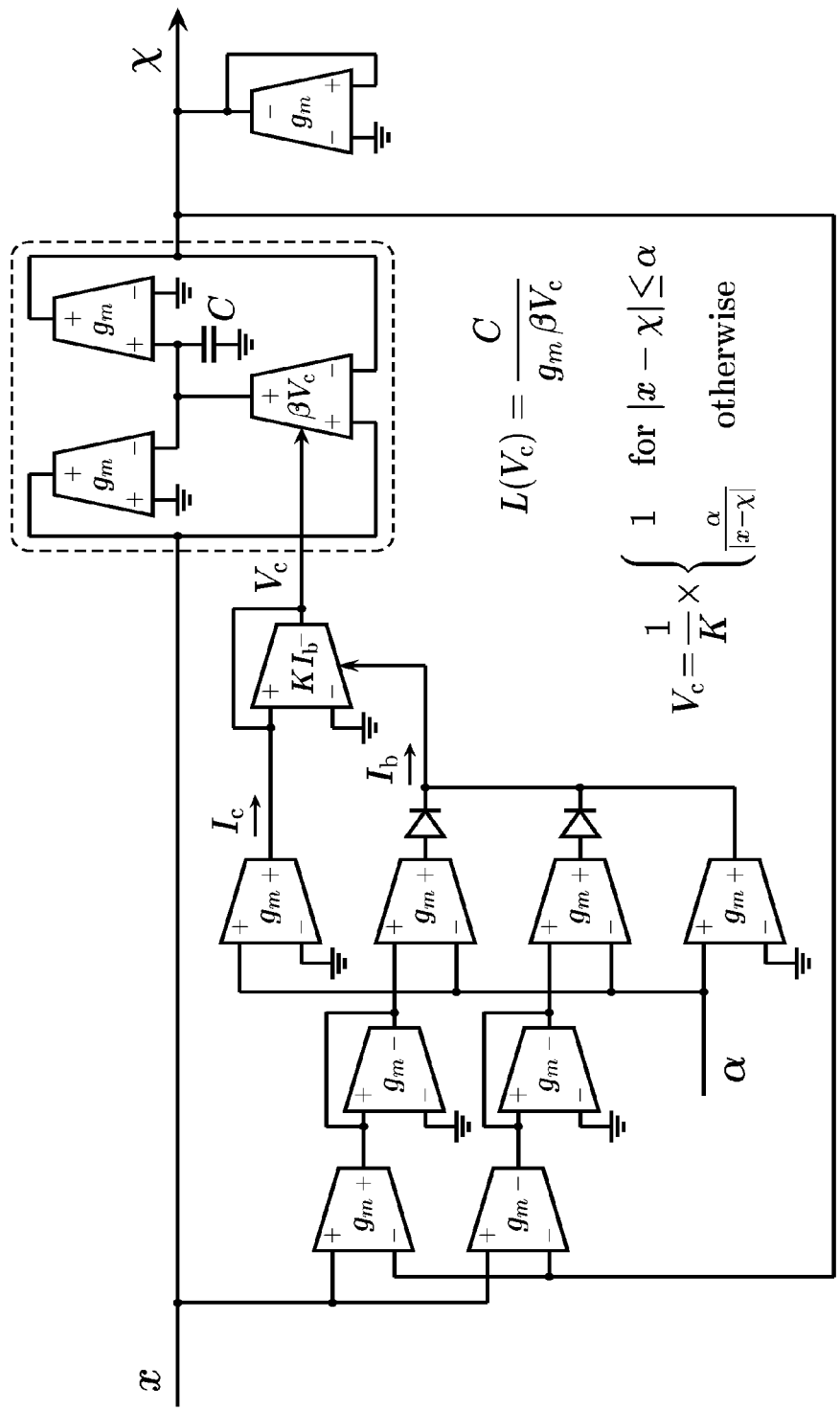
FIG. 45. Conceptual schematic for the 'LR' CDL outlined in FIG. 43.

FIG. 44 provides an OTA-based example of a control voltage circuit for the 'LR' CDL shown in FIG. 43, and FIG. 45 shows an example of conceptual schematic for the 'LR' CDL outlined in FIG. 43.

Figure 46:
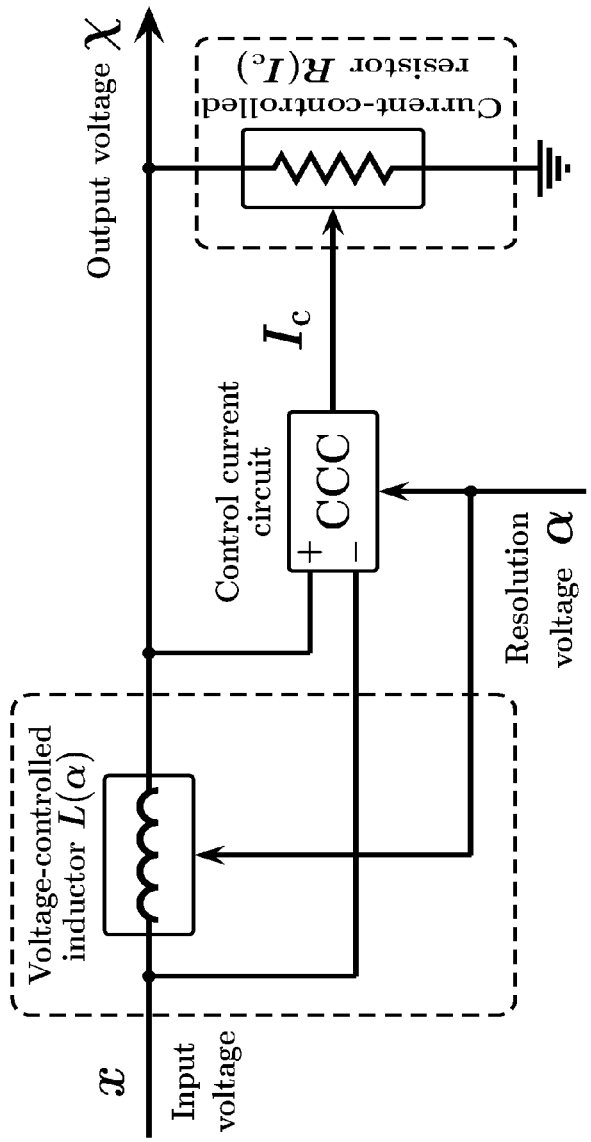
FIG. 46. Generalized block diagram of an 'LR' implementation of a 1st order CDL with the control of both resistive and reactive elements.

10.6 'LR' OTA Implementation of 1st Order CDL with Control of Both Resistive and Reactive Elements FIG. 46 shows an example of a generalized block diagram of an 'LR' implementation of a 1st order CDL with the control of both resistive and reactive elements. If the inductance is given by $$L(\alpha) = \frac{C}{K\alpha g_m^2}, \quad (53)$$

and the resistance is given by $$\frac{1}{R(I_c)} = KI_c = Kg_m \times \begin{cases} \alpha & \text{for } |x-\chi| \le \alpha \\ |x-\chi| & \text{otherwise} \end{cases}, \quad (54)$$

then the resulting filter is a 1st order CDL with the time parameter $$\tau = \frac{C}{g_m} \times \begin{cases} 1 & \text{for } |x-\chi| \le \alpha \\ \frac{|x-\chi|}{\alpha} & \text{otherwise} \end{cases}. \quad (55)$$

Figure 48:
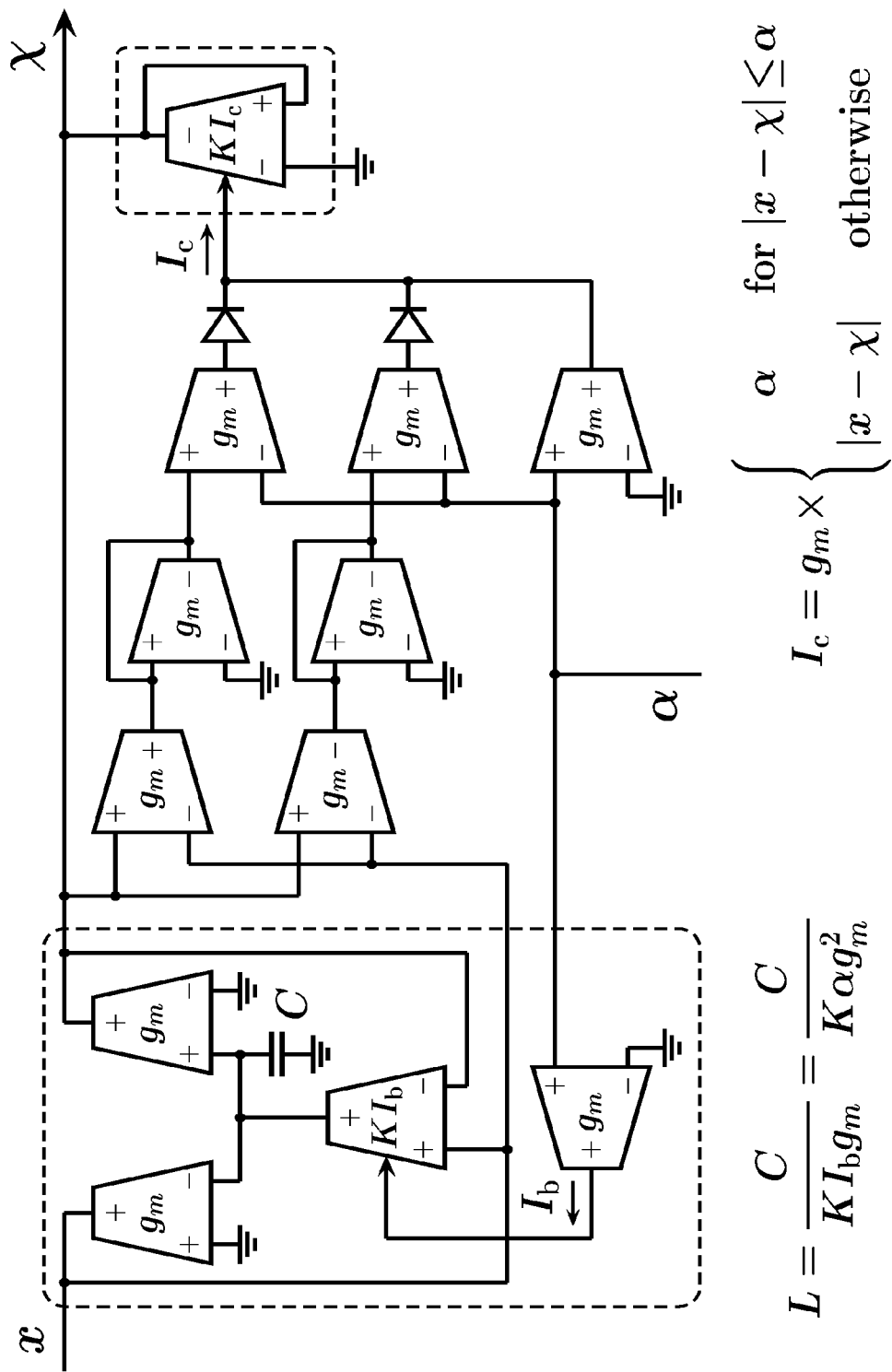
FIG. 48. Conceptual schematic for the 'LR' CDL outlined in FIG. 46.

FIG. 47 provides an OTA-based example of a control voltage circuit for the 'LR' CDL shown in FIG. 46, and FIG. 48 shows an example of conceptual schematic for the 'LR' CDL outlined in FIG. 46.

Figure 49:
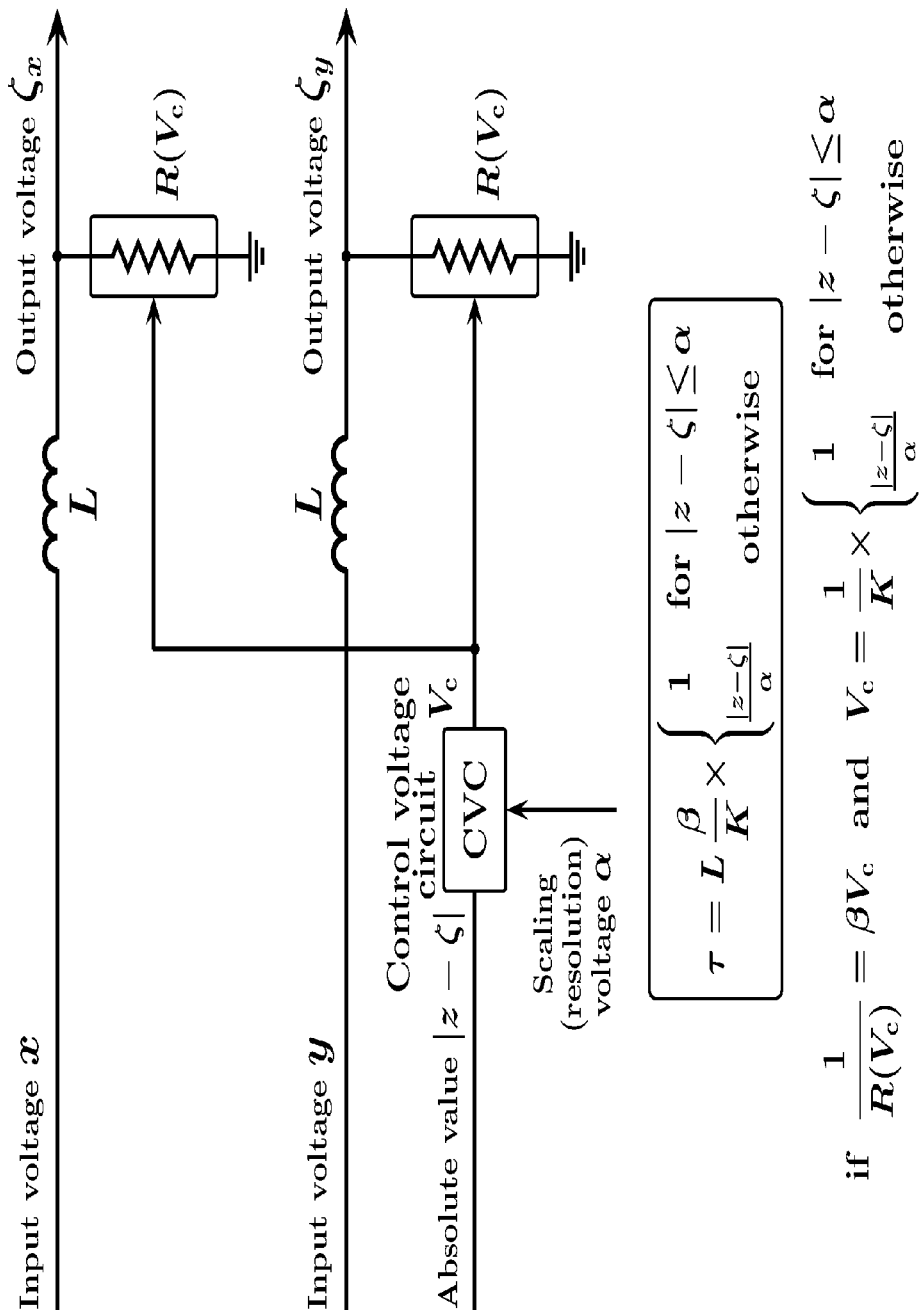
FIG. 49. Generalized block diagram of an 'LR' implementation of a 1st order complex-valued CDL with the control of the resistive elements.

10.7 'LR' OTA Implementations of 1st Order Complex-Valued CDL and DoL with Control of Resistive Elements FIG. 49 shows an example of a generalized block diagram of an 'LR' implementation of a 1st order complex-valued CDL with the control of the resistive elements. If the resistance is given by equation (47), and the control voltage is given by $$V_c = \frac{1}{K} \times \begin{cases} 1 & \text{for } |z-\varsigma| \le \alpha \\ \frac{|z-\varsigma|}{\alpha} & \text{otherwise} \end{cases}, \quad (56)$$

then the resulting filter is a 1st order complex-valued CDL with the time parameter $$\tau = L\frac{\beta}{K} \times \begin{cases} 1 & \text{for } |z-\varsigma| \le \alpha \\ \frac{|z-\varsigma|}{\alpha} & \text{otherwise} \end{cases}. \quad (57)$$

Figure 50:
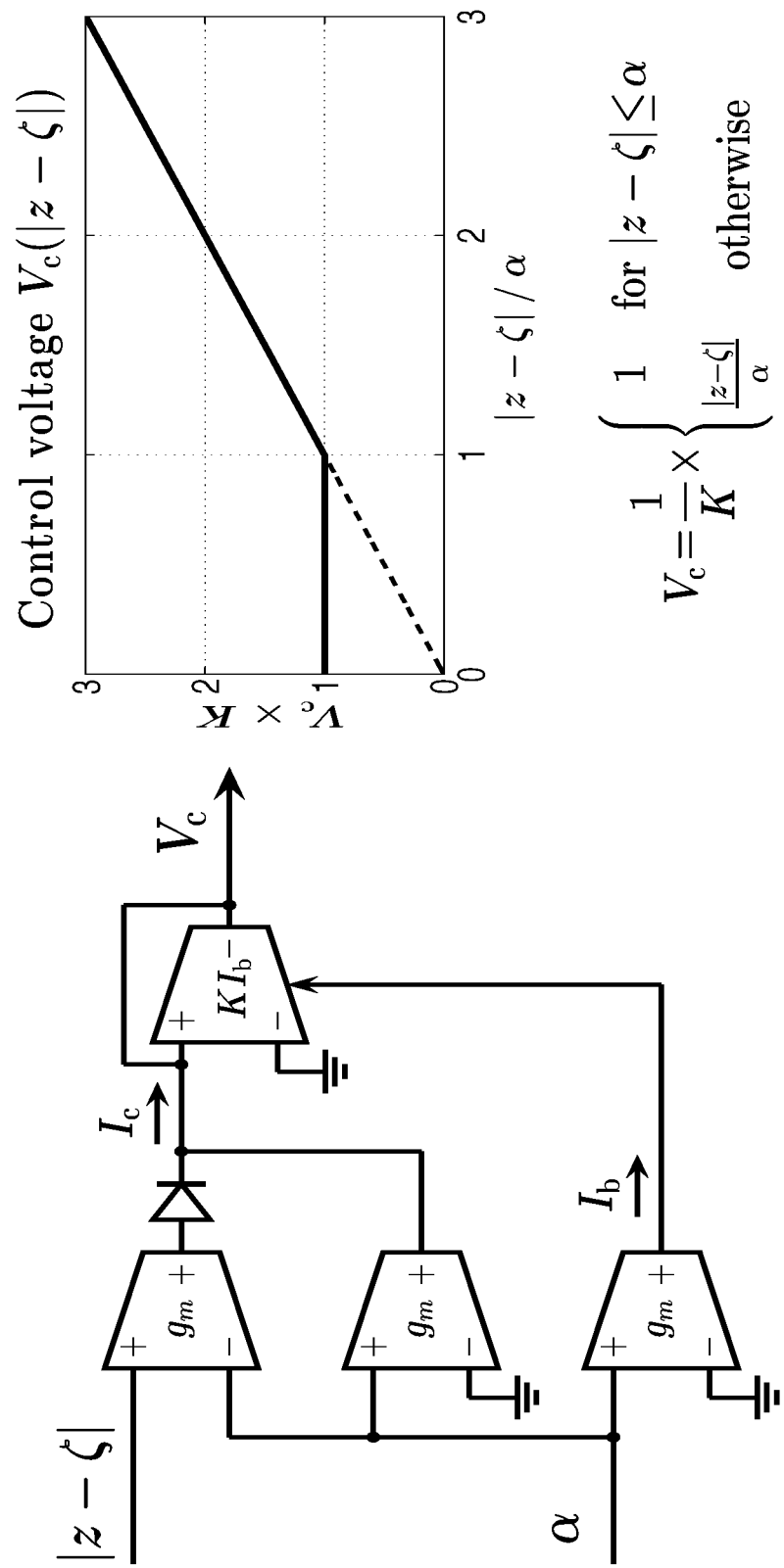
FIG. 50. Control voltage circuit for the complex-valued DoL shown in FIG. 49.

FIG. 50 provides an OTA-based example of a control voltage circuit for the 'LR' complex-valued CDL shown in FIG. 49.

Figure 51:
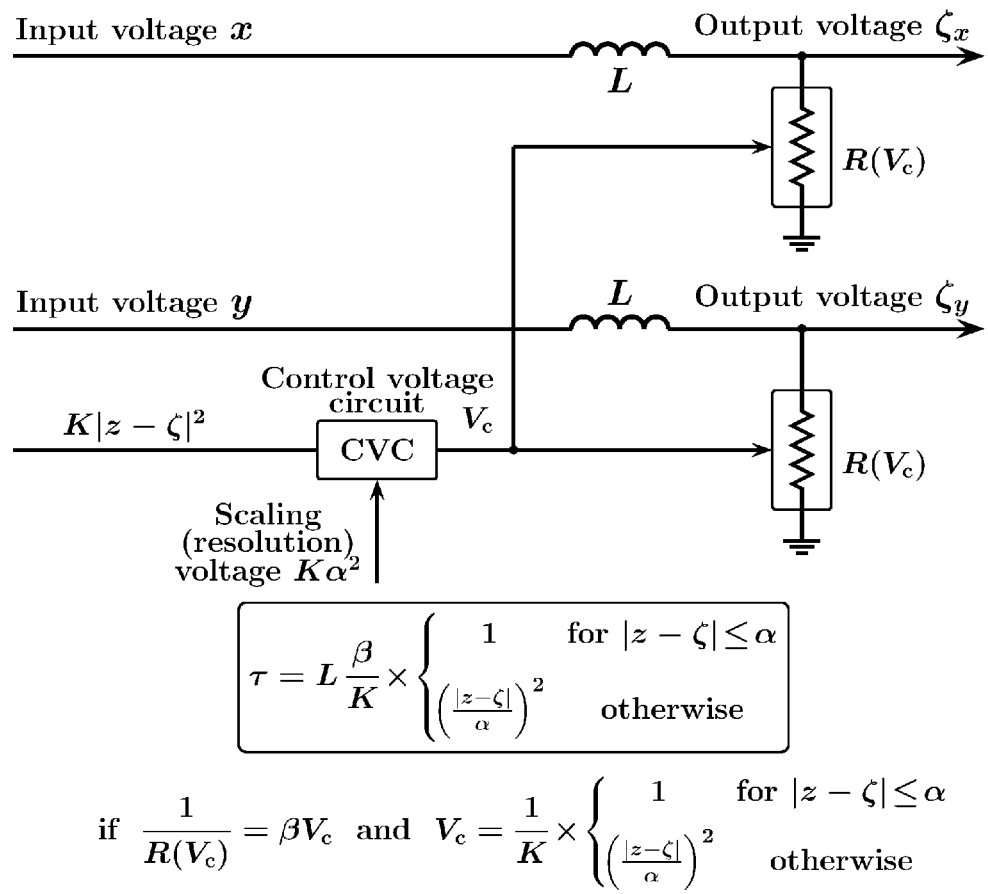
FIG. 51. Generalized block diagram of an 'LR' implementation of a particular 1st order complex-valued DoL with the control of the resistive elements.

FIG. 51 shows an example of a generalized block diagram of an 'LR' implementation of a 1st order complex-valued DoL with the control of the resistive elements. If the resistance is given by equation (47), and the control voltage is given by $$V_c = \frac{1}{K} \times \begin{cases} 1 & \text{for } |z-\varsigma| \le \alpha \\ \left(\frac{|z-\varsigma|}{\alpha}\right)^2 & \text{otherwise} \end{cases}, \quad (58)$$

then the resulting filter is a 1st order complex-valued DoL with the time parameter $$\tau = L\frac{\beta}{K} \times \begin{cases} 1 & \text{for } |z-\varsigma| \le \alpha \\ \left(\frac{|z-\varsigma|}{\alpha}\right)^2 & \text{otherwise} \end{cases}. \quad (59)$$

Figure 52:
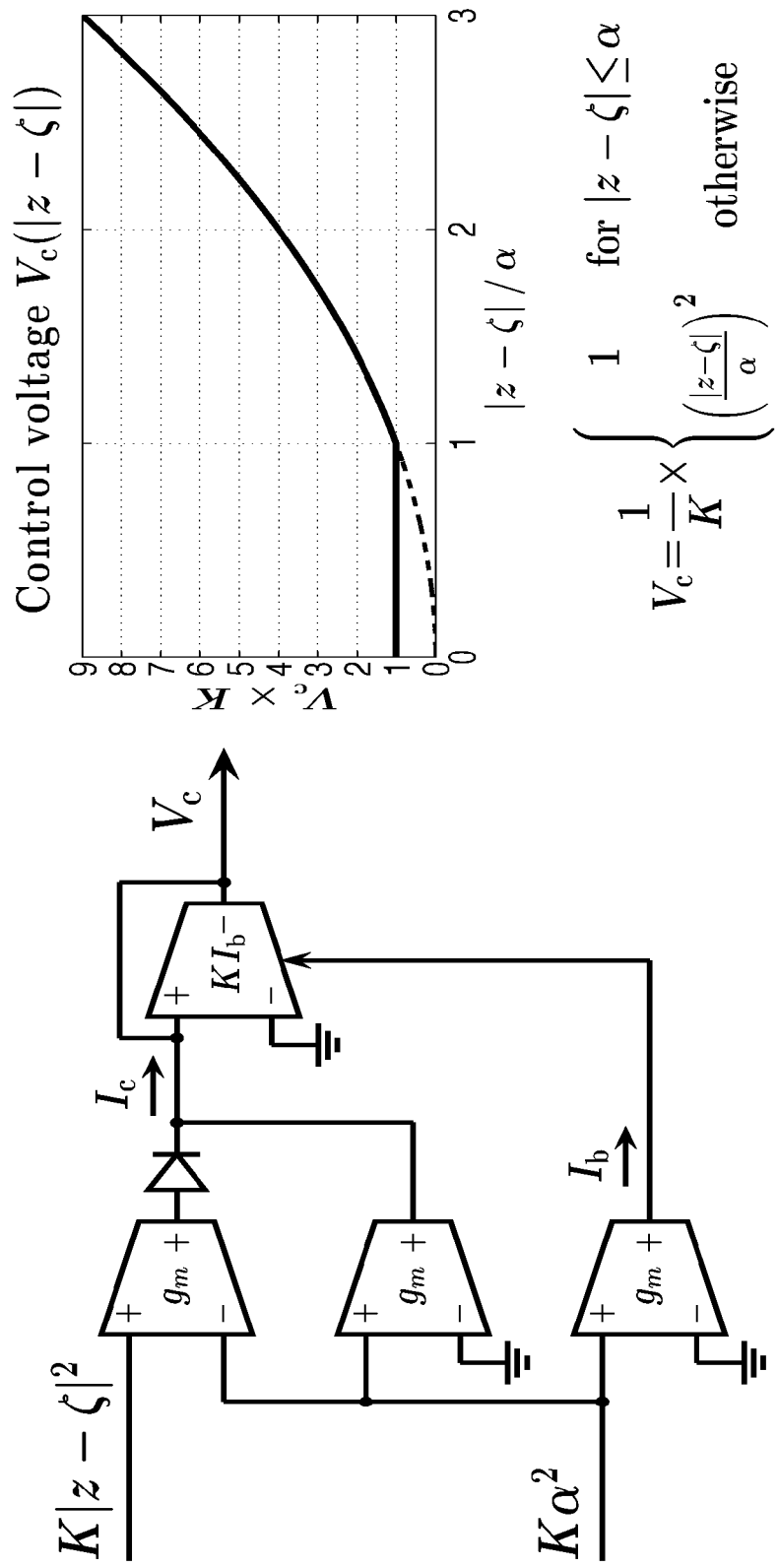
FIG. 52. Control voltage circuit for the complex-valued DoL shown in FIG. 51.

FIG. 52 provides an OTA-based example of a control voltage circuit for the 'LR' complex-valued DoL shown in FIG. 51.

10.8 Complex-Valued 'RC' CDL with Varicaps

Figure 53:
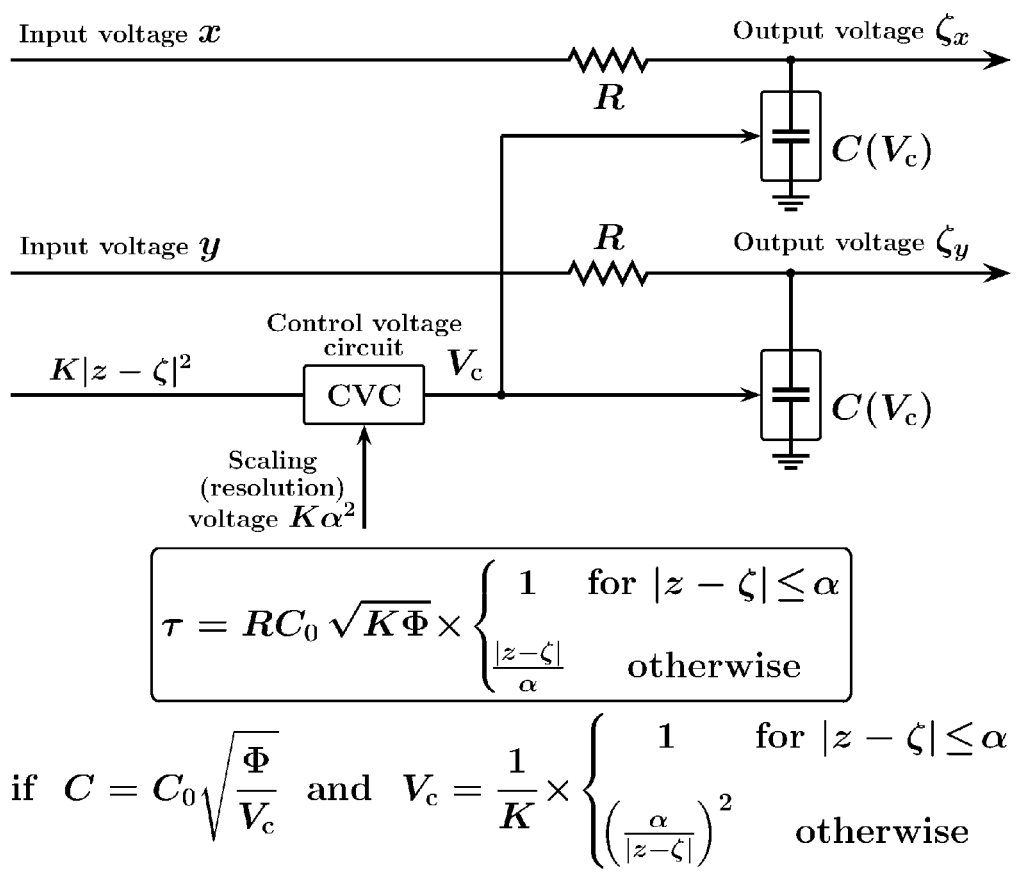
FIG. 53. Generalized block diagram of an 'RC' implementation of a 1st order complex-valued CDL with the control of the reactive elements (capacitors).

FIG. 53 shows an example of a generalized block diagram of an 'RC' implementation of a 1st order complex-valued CDL with the control of the capacitive elements (e.g. varicaps, see Stauffer [39]). If the capacitance is given by $$C = C_0 \sqrt{\frac{\Phi}{V_c}}, \quad (60)$$

and the control voltage is given by $$V_c = \frac{1}{K} \times \begin{cases} 1 & \text{for } |z-\varsigma| \le \alpha \\ \left(\frac{\alpha}{|z-\varsigma|}\right)^2 & \text{otherwise} \end{cases}, \quad (61)$$

then the resulting filter is a 1st order complex-valued CDL with the time parameter $$\tau = RC_0\sqrt{K\Phi} \times \begin{cases} 1 & \text{for } |z-\varsigma| \le \alpha \\ \frac{|z-\varsigma|}{\alpha} & \text{otherwise} \end{cases}. \quad (62)$$

Figure 54:
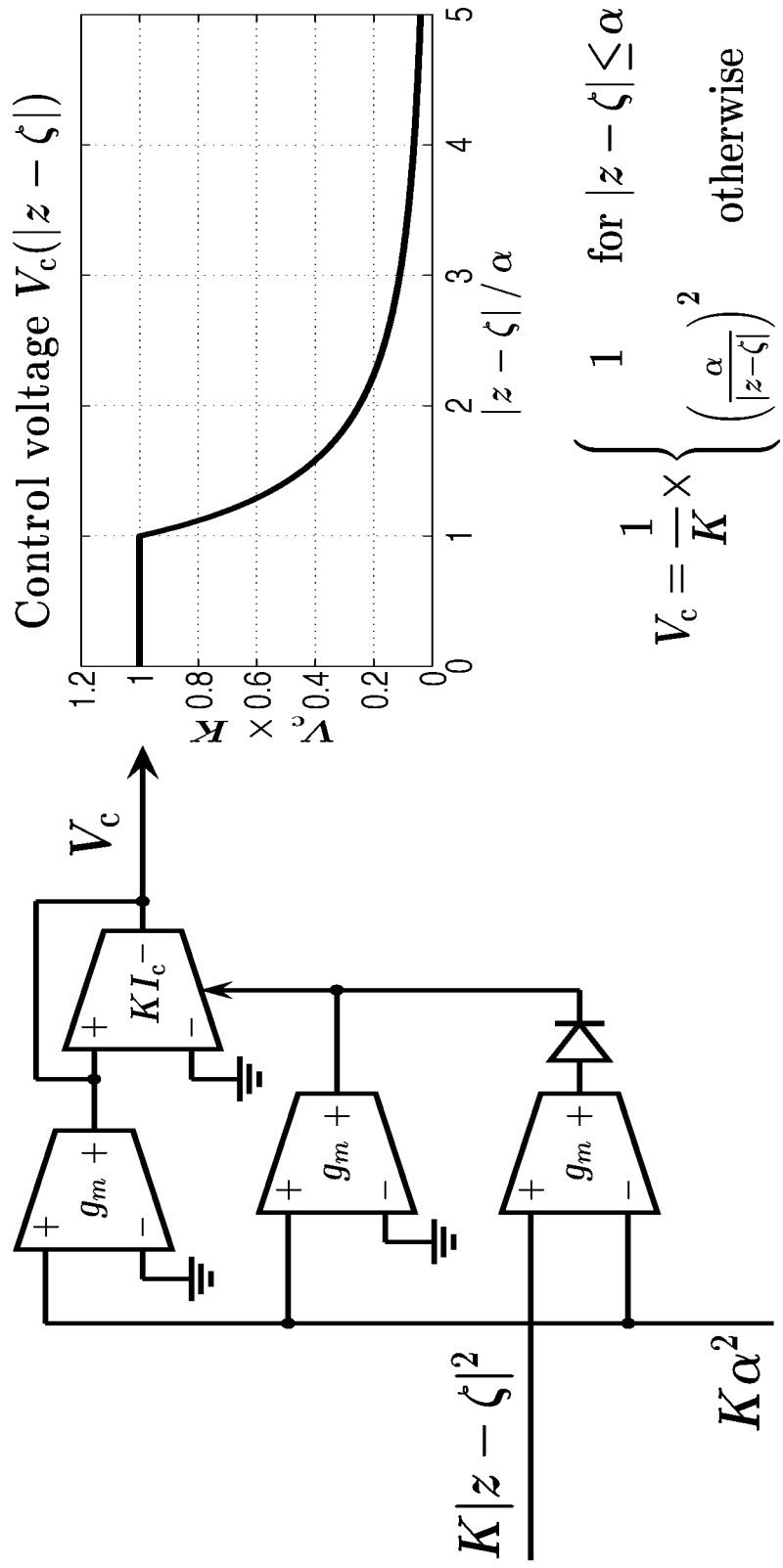
FIG. 54. Control voltage circuit for the complex-valued DoL shown in FIG. 53.

FIG. 54 provides an OTA-based example of a control voltage circuit for changing the varicap capacitances in the 'RC' complex-valued CDL circuit shown in FIG. 53.

10.9 OTA-Based Implementation of 2nd Order CDL

Figure 55:
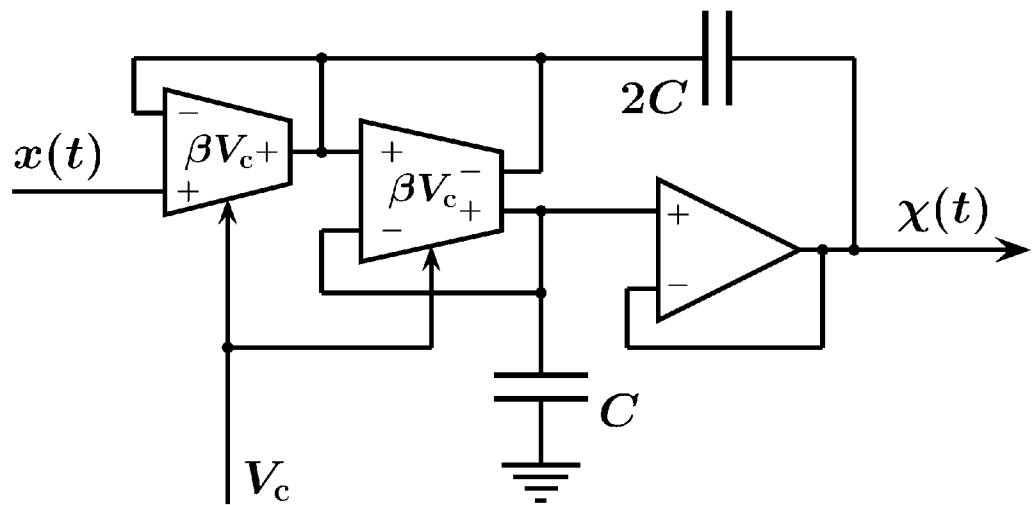
FIG. 55. OTA-based example of implementation of 2nd order constant-Q (Q=1/$\sqrt{2}$) CDL.

FIG. 55 provides an example of an OTA-based implementation of a 2nd order constant-Q (Q=1/√2) CDL. The lowpass filter is a 2nd order Butterworth filter (Q=1/√2) based on the Sallen-Key topology (Sallen and Key [32]) shown in FIG. 12. This lowpass filter is transformed into a 2nd order CDL by controlling the resistance R with the control voltage $V_c = V_c(|x-\chi|)$.

Figure 56:
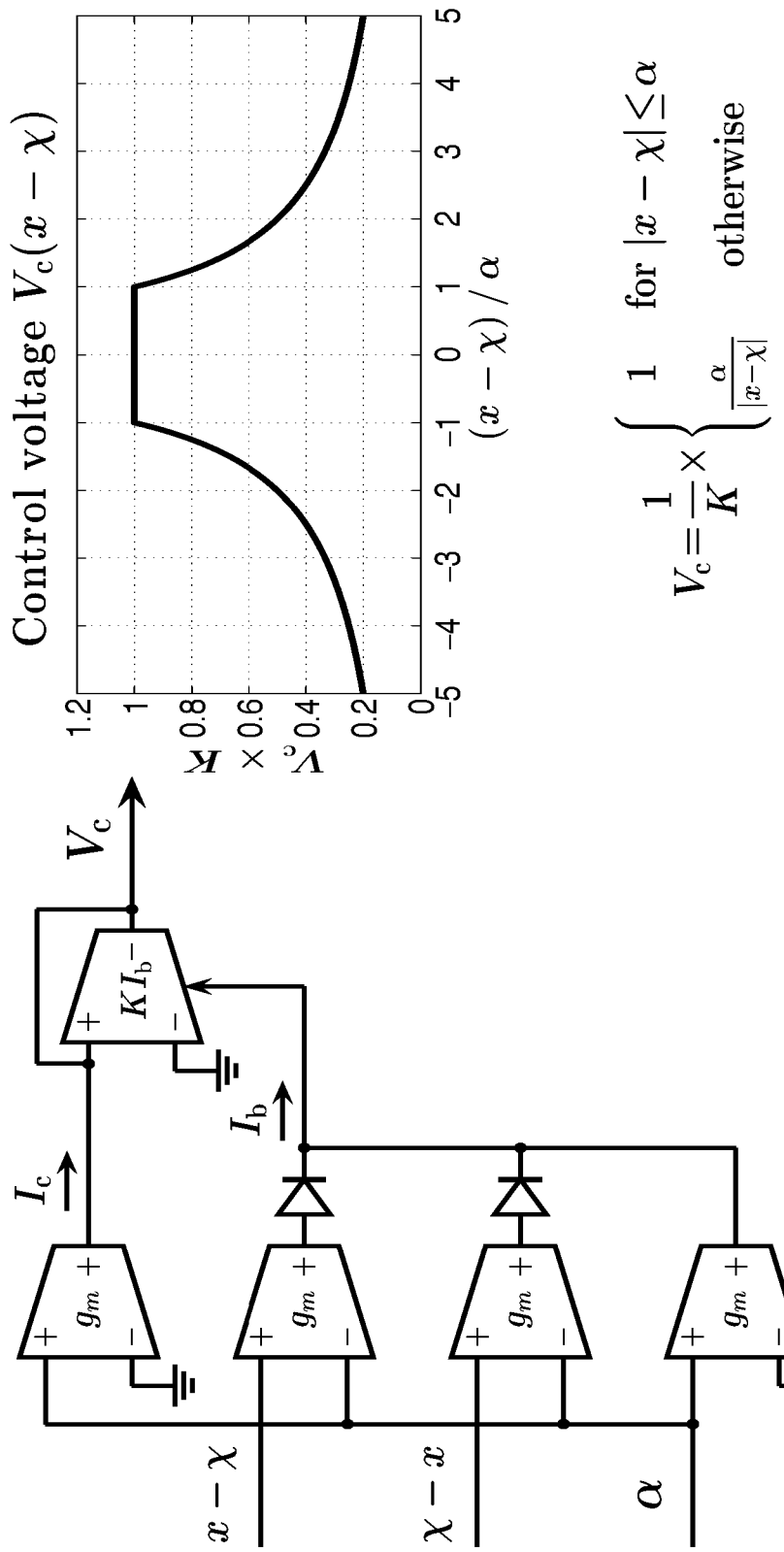
FIG. 56. Control voltage circuit for the 2nd order CDL shown in FIG. 55.

FIG. 56 provides an example of a control voltage circuit for the 2nd order CDL shown in FIG. 55.

11 Examples of High-Order NDLs for Replacement of Lowpass Filters

The particular embodiments of high-order NDLs described in this section merely provide illustrations to clarify the inventive ideas, and are not limitative of the claimed invention.

FIG. 57 provides an example of an odd order NDL-based lowpass filter comprising a 1st order NDL. A 5th order NDL is constructed as a 1st order NDL/ANDL (e.g. a 1st order CDL) followed by a 4th order linear lowpass filter. The difference signal is the difference between the input signal and a feedback of the output of the 1st order NDL.

FIG. 58 provides an example of an odd order NDL-based lowpass filter comprising a 3rd order NDL. A 5th order NDL is constructed as a 3rd order NDL/ANDL (e.g. a 3rd order CDL) followed by a 2nd order linear lowpass filter. The difference signal is the difference between the input signal and a feedback of the output of the 3rd order NDL. In this example, the filters are cascaded in the order of rising values of the pole quality factors.

FIG. 59 provides an example of an even order NDL-based lowpass filter comprising a 2nd order NDL. A 4th order NDL is constructed as a 2nd order NDL/ANDL (e.g. a 2nd order CDL) followed by a 2nd order linear lowpass filter, and the filters are cascaded in the order of rising values of the pole quality factors. The difference signal is the difference between the input signal and a feedback of the output of the 2nd order NDL. If, for example, the 4th order NDL-based filter is a 2nd order constant-Q CDL with $$Q = 1/\sqrt{2+\sqrt{2}}$$

and the initial cutoff frequency $\omega_0$, followed by a 2nd order linear filter with $$Q = 1/\sqrt{2-\sqrt{2}}$$

and the cutoff frequency $\omega_0$, then the resulting filter may be viewed as an NDL-based 4th order Butterworth lowpass filter.

11.1 Improved FrankenSPART Filtering Circuit

Nikitin [25] introduces the FrankenSPART filtering circuit for real-valued signals. The behavior of this circuit may be described by the operator $S=S(q,\mu,\tau)$ such that $$S(q,\mu,\tau)x(t)=\chi(q,\mu,\tau)(t)=\mu\int dt\{\tilde{\mathcal{F}}_{\mu\tau}[x(t)-\chi(q,\mu,\tau)(t)]+2q-1\}, \quad (63)$$

where $\int dt \ldots$ denotes the primitive (antiderivative), $x(t)$ is the input signal, $\chi(q,\mu,\tau)(t)$ is the output, and the comparator function $\tilde{\mathcal{F}}_{\mu\tau}(x)$ is given by $$\tilde{\mathcal{F}}_{\mu\tau}(x) = \begin{cases} \dfrac{x}{\mu\tau} & \text{for } |x| < \mu\tau \\ \text{sgn}(x) & \text{otherwise} \end{cases}, \quad (64)$$

where sgn(x) is the sign function. The parameters $\tau$, $\mu$, and q are the time constant, slew rate, and quantile parameters of the FrankenSPART filter, respectively.

Through mathematical manipulation it may be shown that, for a real-valued input, when $q=\frac{1}{2}$, $\tau=\tau_0$ and $$\mu = \frac{\alpha}{\tau_0},$$

the output of the FrankenSPART filtering circuit equals that of the 1st order Canonical Differential Limiter with the resolution parameter $\alpha$ and the time parameter given by equation (18).

Figure 60:
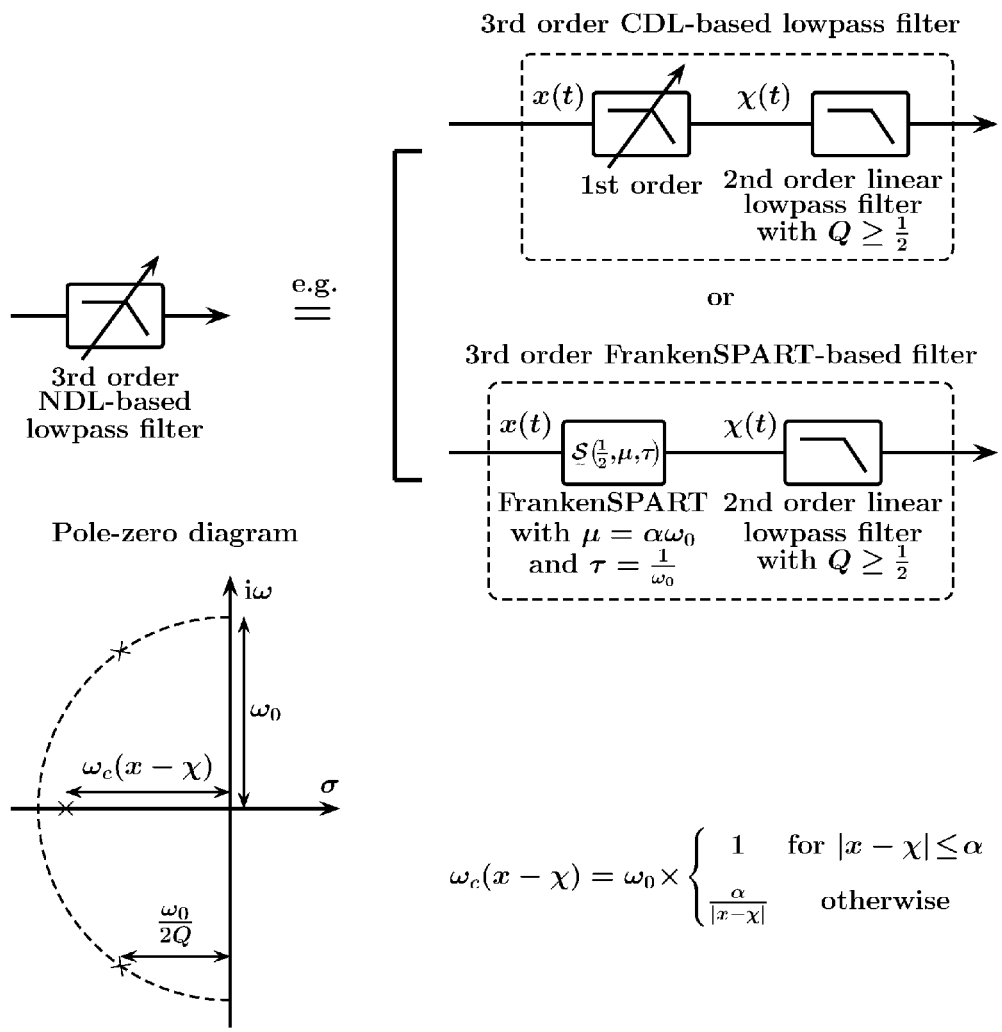
FIG. 60. Example of an odd order CDL/FrankenSPART-based lowpass filter.

Therefore, when an odd order NDL-based filter for real-valued signals employs a 1st order CDL, the latter may be replaced by a FrankenSPART filter, as illustrated in FIG. 60 that provides an example of an odd order CDL/FrankenSPART-based lowpass filter. When the order of the resulting FrankenSPART-based filter is greater or equal 3, this filter may be considered an improved FrankenSPART filter, wherein the improvement comprises the addition of an even order linear lowpass filter with the poles appropriately chosen to achieve the desired initial response of the filter. For example, a filter consisting of a FrankenSPART circuit with $q=\frac{1}{2}$, followed by a 2nd order linear filter with $Q=1$ and the cutoff frequency $1/\tau$, may be viewed as a FrankenSPART-based 3rd order Butterworth lowpass filter.

12 Improved NDL-Based Filters Comprising Linear Front-End Filters to Suppress Non-Impulsive Component of Interference and/or to Increase its Peakedness As discussed in Section 13.2.6 of this disclosure, when the interfering signal comprises a mixture of impulsive and non-impulsive components, the effectiveness of the mitigation of the interference by an NDL may be greatly improved if the non-impulsive component may be reduced (filtered out) by linear filtering without significantly affecting both the impulsive component of the interference and the signal of interest.

Figure 61:
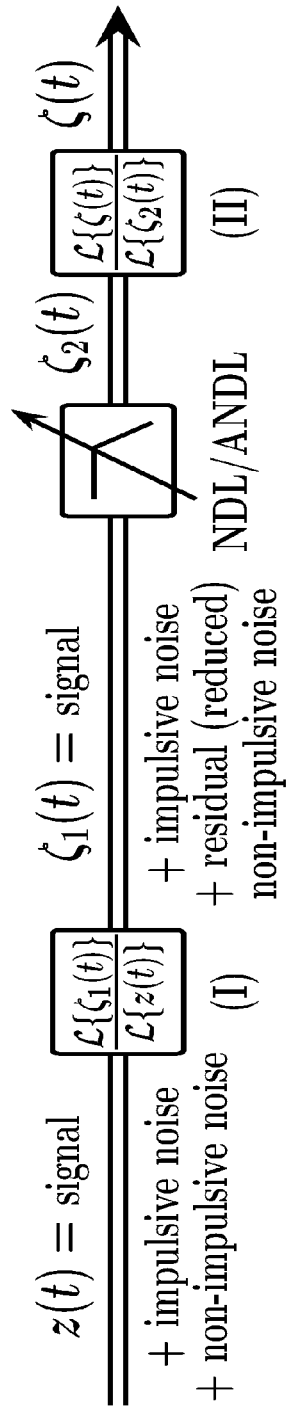
FIG. 61. Improved NDL-based filter comprising a linear front-end filter to suppress the non-impulsive component of the interference.

FIG. 61 provides a schematic illustration of such an improved NDL-based filter for the mitigation of an interference comprising impulsive and non-impulsive components. In the figure, the "initial response" should be understood as the total response of the filter when the NDL/ANDL is in its linear mode (i.e. in the limit of small absolute value of the difference signal $|\zeta_1-\zeta_2|$).

It is important to notice that linear filtering may be designed to increase peakedness of the interfering signal even if the latter is not a mixture of (independent) impulsive and non-impulsive components.

For example, unless the interfering signal is smooth (i.e. its time derivatives of any order are continuous), its time derivatives of some order may contain jump discontinuities, and subsequent differentiation of the signal containing such discontinuities will transform these discontinuities into singular $\delta$-functions (see Dirac [11], for example).

As an illustration, an idealized discrete-level (digital) signal may be viewed as a linear combination of Heaviside unit step functions (Bracewell [6], for example). Since the derivative of the Heaviside unit step function is a Dirac $\delta$-function (Dirac [11], for example), the derivative of an idealized digital signal is a linear combination of Dirac $\delta$-functions, which is a limitlessly impulsive signal with zero interquartile range and infinite peakedness.

Since multiplying by s in the complex S-plane has the effect of differentiating in the corresponding real time domain, if a linear filter contains N zeros at s=0 (e.g. it contains a highpass filter), the effect of such a filter on the input signal is equivalent to (i) differentiating the input signal N times, then (ii) applying to the resulting Nth derivative of the input a filter with a transfer function equal to the original transfer function divided by $s^N$ (that is, the original filter with N zeros at s=0 excluded).

Figure 62:
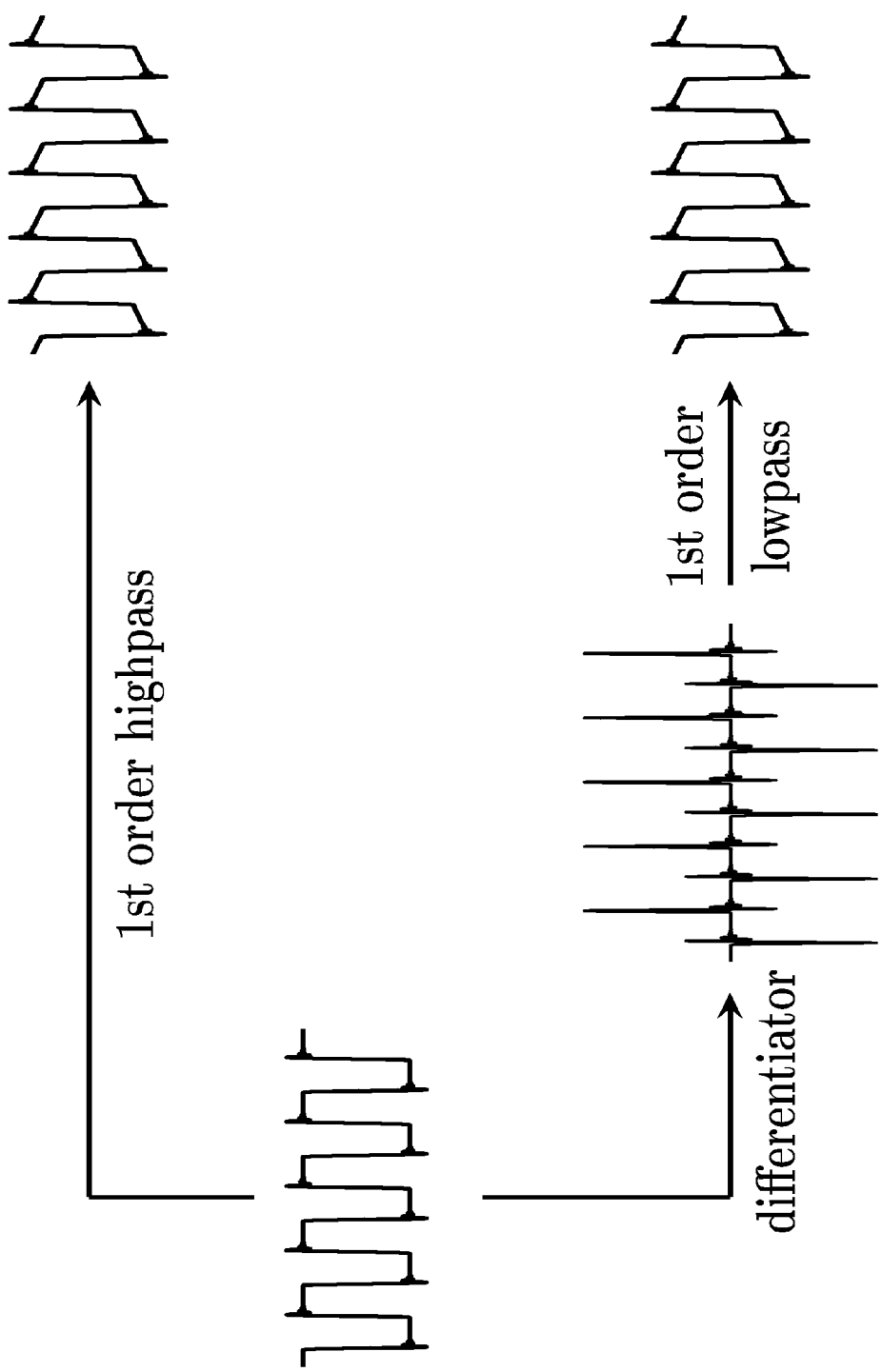
FIG. 62. 1st order highpass filter viewed as a differentiator followed by a 1st order lowpass filter. In this example, differentiation of the input signal transforms it into an impulsive pulse train.

For example, a 1st order highpass filter with the cutoff frequency $f_c$ may be viewed as a differentiator followed by a 1st order lowpass filter with the cutoff frequency $f_c$, as illustrated in FIG. 62. In this example, differentiation of the input signal transforms it into an impulsive pulse train.

Figure 63:
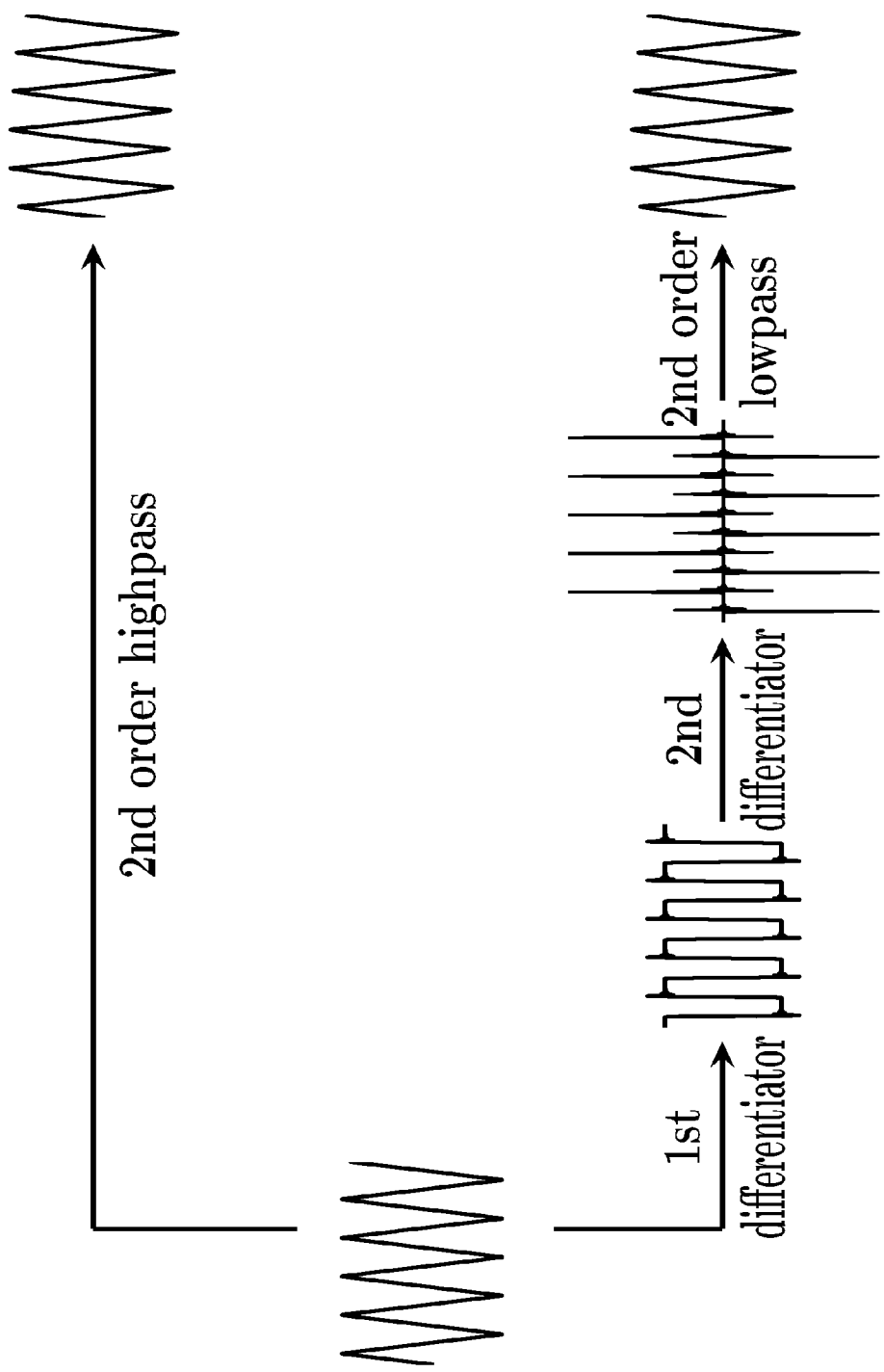
FIG. 63. 2nd order highpass filter viewed as two consecutive differentiators followed by a 2nd order lowpass filter. In this example, 2nd derivative of the input signal is an impulsive pulse train.

Likewise, a 2nd order highpass filter with the cutoff frequency $f_c$ and the pole quality factor Q may be viewed as two consecutive differentiators followed by a 2nd order lowpass filter with the cutoff frequency $f_c$ and the pole quality factor Q, as illustrated in FIG. 63. In this example, 2nd derivative of the input signal is an impulsive pulse train.

It should be easily deducible from the examples of FIG. 62 and FIG. 63 that, when $f_c$ is sufficiently large (e.g. approximately equal to, or larger than the bandwidth of the input signal), the output of a highpass filter of Nth order approximates that of a sequence of N differentiators.

When the signal of interest is a bandpass signal (i.e. a signal containing a band of frequencies away from zero frequency), a linear bandpass filter would typically be used to filter out the interference. Such a bandpass filter may be viewed as containing a sequence of lowpass and highpass filters, with the latter filters containing zeros at s=0, and a highpass filter of Nth order with sufficiently large cutoff frequency may be viewed as a sequence of N differentiators.

Since differentiation may increase the impulsiveness (peakedness) of the interfering signal in excess of that of the signal of interest, an improved NDL-based bandpass filter may thus include a sequence of a highpass filter followed by an NDL-based lowpass filter, as outlined in FIG. 64.

The filter sequence shown in panel (c) of FIG. 64 deserves a particular comment. The initial response (i.e. when the NDL is in its linear regime) of the first two stages in this panel is that of a broadband bandpass filter (an RC differentiator followed by an RC integrator). Thus such a sequence of two stages, provided that $f_0$ is sufficiently small and $f_c$ is sufficiently large, may constitute an interference suppressing front end for a large variety of linear filters with nonzero response confined to within the passband $[f_0, f_c]$.

Illustrative examples of using such improved NDL-based bandpass filters outlined in FIG. 64 to mitigate sub-Gaussian (non-impulsive) noise affecting a bandpass signal are given further in this disclosure.

Given an original linear filter, an equivalent linear filter can be constructed by cascading the original filter with two other linear filters, 1st and 2nd, where the transfer function of the second filter is a reciprocal of the transfer function of the first filter. A filter with an ideal differentiator (transfer function ∝ s) preceding the original linear filter and an ideal integrator (transfer function ∝ 1/s) following the original linear filter may be considered an example of such an equivalent linear filter.

Indeed, if w(t) is the impulse response of the original linear filter and z(t) is the input signal, then $$\int dt\, w(t) * \left[\frac{d}{dt} z(t)\right] = \int dt \frac{d}{dt}[w(t) * z(t)] = w(t) * z(t) + \text{const}, \quad (65)$$

where the asterisk denotes convolution, ∫dt denotes anti-derivative (aka primitive integral or indefinite integral), and 'const' is the constant of integration ('DC offset'). The latter may be ignored since in practice differentiation may be performed by a 1st order highpass filter with sufficiently large cutoff frequency, and integration may be performed by a 1st order lowpass filter with sufficiently small cutoff frequency.

Figure 65:
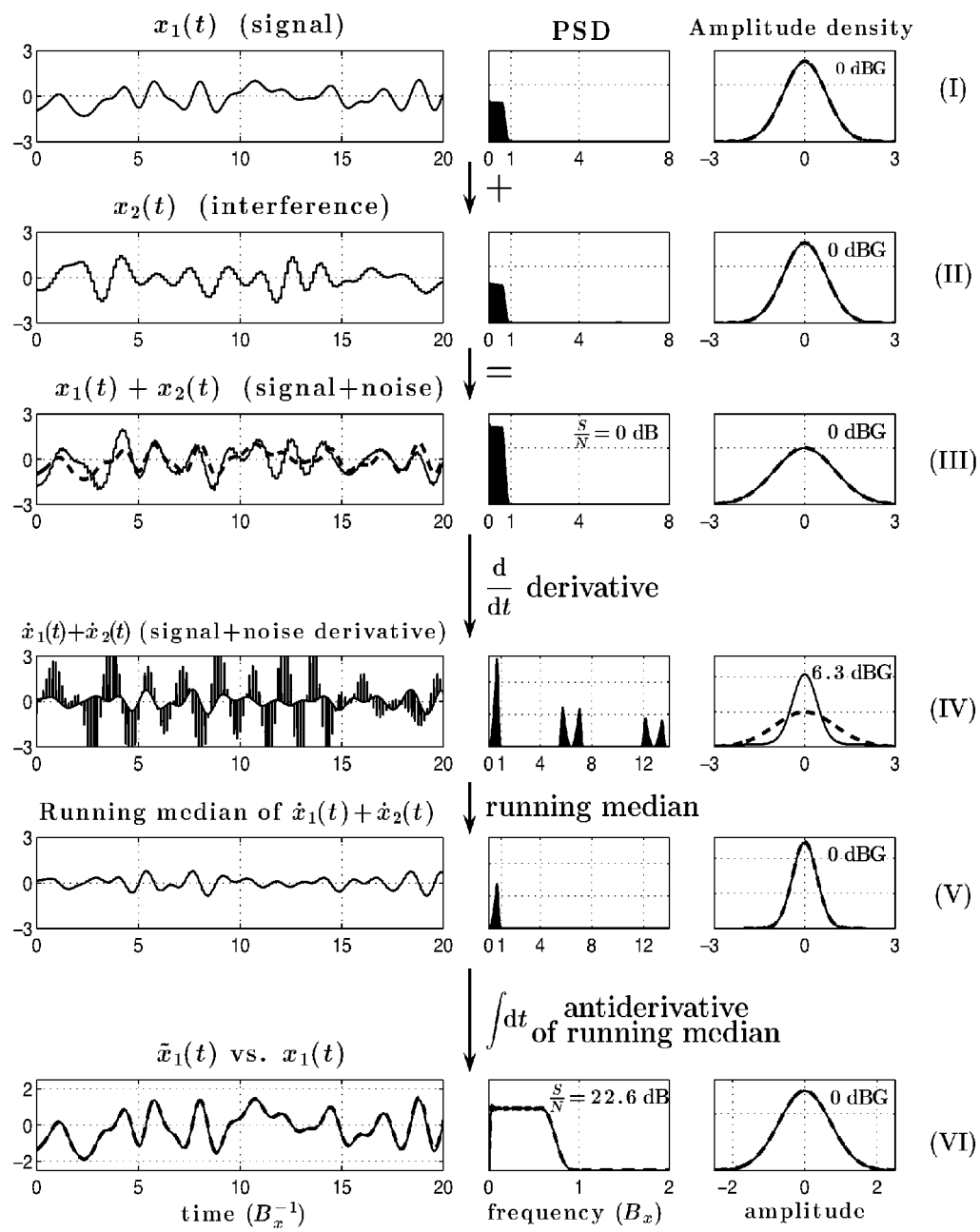
FIG. 65. Idealized illustration of using 'differentiator→(impulse noise filter)→integrator' sequence to improve interference suppression.

If differentiation noticeably increases impulsiveness of the interference without significantly affecting the signal of interest (or even decreasing the peakedness of the signal of interest), then replacing the linear lowpass filter in the 'differentiator-lowpass-integrator' sequence by a nonlinear impulsive noise filter (e.g. by a median filter or an NDL) may improve interference suppression. FIG. 65 provides an idealized illustration of this statement.

FIG. 65 consists of six rows of panels (I through VI), each row consisting of three panels. The left panels in each row show signal fragments in the time domain, the middle panels show the PSDs of the respective signals, and the right panels show the amplitude densities of the signals. In the right panels of rows I through V the dashed lines show, for comparison, the Gaussian densities with the same variance as the respective signals, and the dashed line in the right panel in row VI shows the amplitude density of the signal $x_1(t)$ which is designated as the signal of interest. The dashed lines in the left panels in rows III and VI show, for comparison, the time domain traces of the signal of interest, and the dashed line in the middle panel of row VI shows the PSD of the signal of interest.

The upper row of the panels (I) in FIG. 65 shows the incoming signal of interest $x_1(t)$ (left panel), along with its PSD (middle panel) and amplitude density (right panel). It is a bandlimited (raised cosine-shaped) signal with a Gaussian amplitude distribution (0 dBG peakedness).

The second row of panels (II) shows the interfering signal $x_2(t)$ that is independent of the signal of interest. This signal can be viewed as an idealized 'staircase' digital-to-analog converter (DAC) approximation of some other bandlimited (raised cosine-shaped) signal, with the same PSD and amplitude distribution as $x_1(t)$, and with finite-time transitions between the 'steps' such that the transition time is small in comparison with the duration of the steps. As can be seen in the middle panel, the PSD of the interfering signal is essentially identical to that of the signal of interest, as the PSD values at higher frequencies are insignificant in comparison with the PSD values in the nominal passband.

As can be seen in the third row of panels (III), the PSD of the $x_1(t)+x_2(t)$ mixture is the sum of the PSDs of $x_1(t)$ and $x_2(t)$, and is essentially double the PSD of the signal of interest. The amplitude distribution of the mixture remains Gaussian, with the standard deviation $\sqrt{2}$ times the standard deviation of the signal of interest.

The time derivative of the signal of interest $\dot{x}_1(t)$ is a continuous function of time, while the time derivative of the interfering signal $\dot{x}_2(t)$ is an impulsive pulse train consisting of pulses of the duration equal to the transition time, and the amplitudes proportional to the amplitudes of the respective transitions. Thus, as can be seen in the left panel of the fourth row (IV), the time derivative of the $x_1(t)+x_2(t)$ mixture is the derivative of the signal of interest $\dot{x}_1(t)$ affected by the impulsive noise $\dot{x}_2(t)$, and the peakedness of the $\dot{x}_1(t)+\dot{x}_2(t)$ mixture (6.3 dBG) is significantly higher than that of a Gaussian distribution. Since the PSD of the time derivative of a signal equals to the original signal's PSD multiplied by the frequency squared, the higher-frequency portions of the $\dot{x}_1(t)+\dot{x}_2(t)$ mixture's PSD become noticeable, as may be seen in the middle panel.

The impulsive noise $\dot{x}_2(t)$ can be mitigated by an impulse noise filter, e.g. an NDL. In the example of FIG. 65, a median filter is used to remove the impulsive component $\dot{x}_2(t)$ from the $\dot{x}_1(t)+\dot{x}_2(t)$ mixture. This filter suppresses the impulsive component, effectively removing all its associated frequency content, as can be seen in the fifth row of panels (V). The resulting median-filtered signal is the derivative of the signal of interest $\dot{x}_1(t)$, with the addition of a small residual noise.

As may be seen in the sixth row of panels (VI), integrating the output of the median filter produces the signal $\tilde{x}_1(t)$ that is equal to the signal of interest $x_1(t)$ with the addition of a noise that is much smaller than the original interfering signal $x_2(t)$, resulting in the SNR increase from 0 dB to 22.6 dB.

FIG. 65 thus illustrates that an impulse noise filter such as an NDL may improve separation between signal and noise even if neither the signal nor the noise is impulsive. If a linear filter turns either the signal or the noise into impulsive, the improved separation may be achieved by applying the sequence '(linear filter)→(impulse noise filter)→(inverse linear filter)' to the mixture of the signal and the noise.

FIG. 66 provides an illustrative schematic recipe for constructing an improved NDL-based filter comprising a linear front-end (LFE) filter to increase the impulsiveness of the interference. In the figure, an LFE filter is referred to as "a 1st sequence of linear stages."

FIG. 67 provides a particular illustration of constructing an improved NDL-based bandpass filter. Such a filter may improve interference suppression if differentiation increases impulsiveness of the interference in relation to the signal of interest. Since a highpass filter may be viewed as a differentiator followed by a lowpass filter, and since peakedness generally decreases with the reduction in the bandwidth, the front-end highpass filter should be the filter with the highest cutoff frequency.

FIG. 68 provides a particular illustration of constructing an improved 2nd order NDL-based bandpass filter. In practice, the differentiator may be constructed as a 1st order highpass filter with a sufficiently high cutoff frequency (e.g. much larger than $\omega_c$). Such a filter may improve interference suppression if differentiation increases impulsiveness of the interference in relation to the signal of interest.

FIG. 69 provides an idealized particular illustration of constructing an improved NDL-based lowpass filter. Such a filter may improve interference suppression if differentiation increases impulsiveness of the interference in relation to the signal of interest.

One skilled in the art will recognize that the improved NDL-based filters comprising LFE filters to suppress non-impulsive components of the interference and/or to increase impulsiveness of the interference discussed in this section (Section 12) may be varied in many ways. All such variations are not to be regarded as a departure from the spirit and scope of this invention, and all such modifications will be obvious to one skilled in the art.

In this disclosure, any sequence of filters comprising an NDL and/or an ANDL (e.g. an NDL/ANDL preceded and/or followed by a linear and/or nonlinear filter or filters), and/or any NDL/ANDL-based filter may be referred to as an NDL and/or ANDL, respectively.

13 Examples of NDL Applications

All examples of the NDL applications provided below are used only as illustrations to clarify the utility of the inventive ideas, and are not limitative of the claimed invention.

13.1 NDL-Based Antialiasing Filters to Improve Performance of ADCs

A transient outlier in the input signal will result in a transient outlier in the difference signal of a filter, and an increase in the input outlier by a factor of K will result, for a linear filter, in the same factor increase in the respective outlier of the difference signal. If a significant portion of the frequency content of the input outlier is within the passband of the linear filter, the output will typically also contain an outlier corresponding to the input outlier, and the amplitudes of the input and the output outliers will be proportional to each other.

Outliers in the output of an antialiasing filter may exceed the range of an ADC, causing it to saturate, and a typical automatic gain control (AGC) circuit may not be able to compensate for the outliers due to their short duration. Saturation of the ADC input may lead to noticeable degradation of the ADC performance, including significant nonlinearity of its output.

Due to high nonlinearity of the delta-sigma modulation, $\Delta\Sigma$ converters are especially susceptible to misbehavior when their input contains high-amplitude transients (impulse noise). When such transients are present, larger size and more expensive converters may need to be used, increasing the overall size and cost of a device, and its power consumption.

Also, if the output of a linear antialiasing filter is still impulsive as a consequence of the presence of impulsive noise at its input, to avoid ADC saturation the gain of the AGC may need to be reduced below that required for a Gaussian noise of the same power, due to 'heavier tails' of an impulsive noise distribution. That may reduce the effective resolution of an ADC with respect to the signal of interest, and/or require the use of a higher resolution converter.

Since an NDL-based antialiasing filter may mitigate impulsive interference affecting the signal of interest, the total power of the interference in the signal's passband may be reduced, enabling further increase of the effective resolution of an ADC with respect to the signal of interest.

Thus, with respect to ADC performance, replacing a linear antialiasing filter with an NDL/ANDL-based filter may address either or both issues, the ADC saturation due to outliers and the loss of the effective resolution due to impulsive interference. Also, since the output outliers of the antialiasing filter are suppressed, the automatic gain control becomes insensitive to outliers, which improves the linearity and the overall performance of an ADC.

Figure 70:
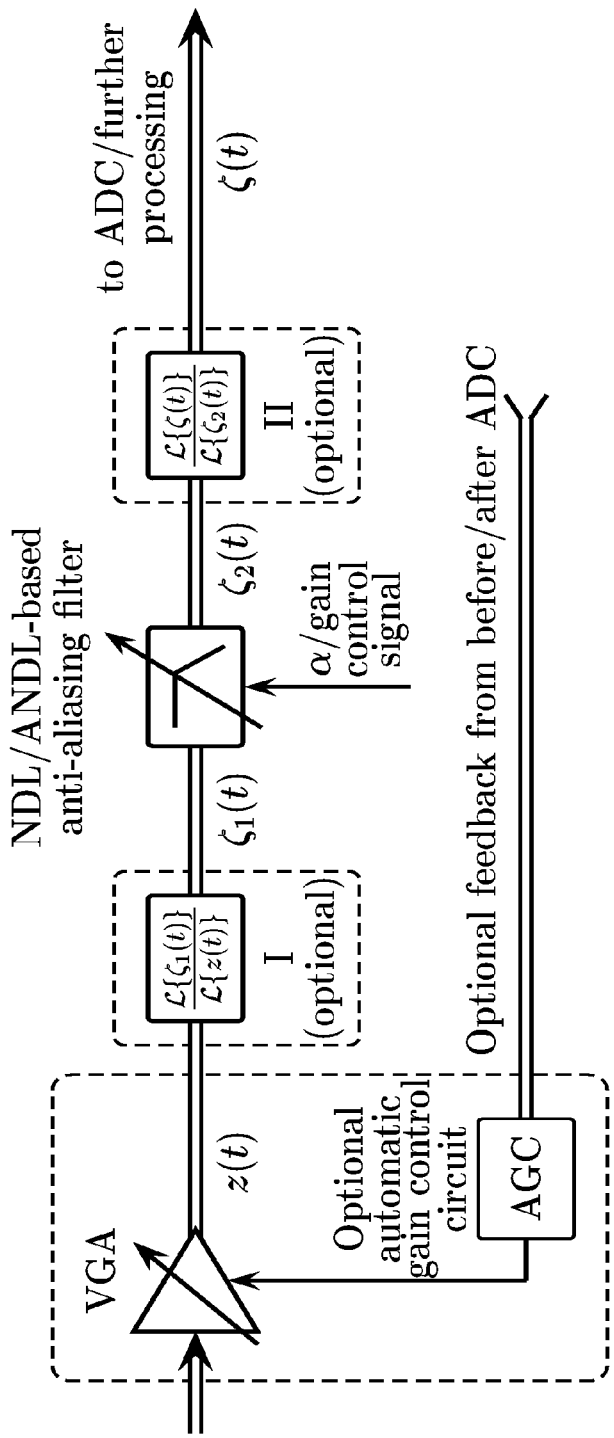
FIG. 70. Illustration of using an NDL/ANDL filter as a replacement for an anti-aliasing filter to improve performance of an analog-to-digital converter.

FIG. 70 provides an illustration of using an NDL/ANDL filter as a replacement for an anti-aliasing filter to improve performance of an analog-to-digital converter. An adaptive NDL (ANDL) may be preferred when an optional automatic gain control (AGC) is not enabled.

13.2 Impulsive Noise Mitigation

FIG. 71 through FIG. 98 illustrate the basic principles of the impulsive noise mitigation by nonlinear differential limiters.

Figure 71:
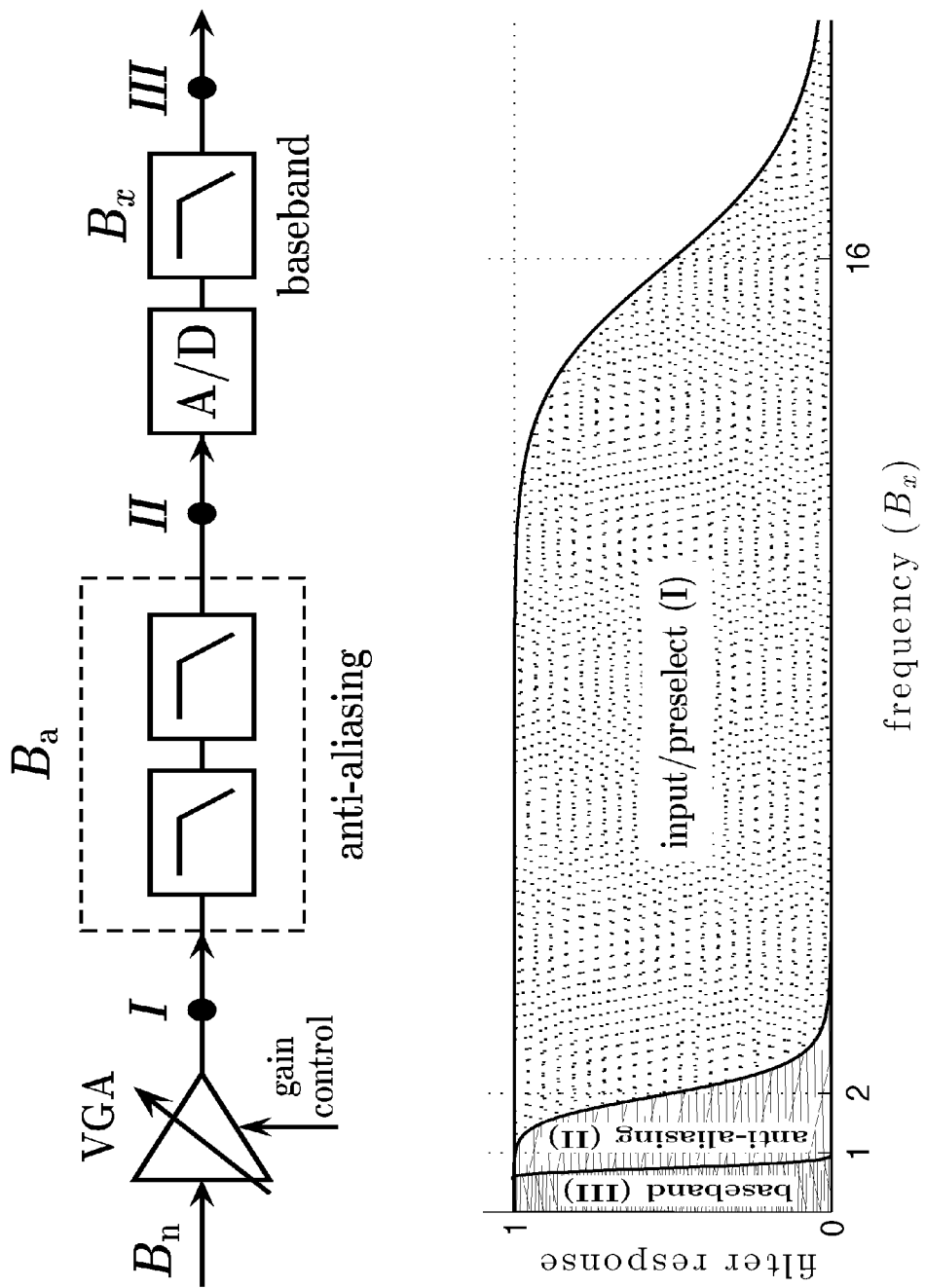
FIG. 71. Fragment of the signal processing chain used in the examples of FIG. 72 through FIG. 79, and the responses of the respective filters in the chain.

FIG. 71 shows the fragment of the signal processing chain used in the examples of FIG. 72 through FIG. 79, and the responses of the respective filters in the chain. In these examples, the analog filters are Butterworth filters (7th order for the preselect filter, and 4th order for the anti-aliasing filter), and the digital baseband filter is an FIR raised cosine filter (Proakis and Manolakis [31], for example) with roll-off factor 0.25. The anti-aliasing Butterworth filter is constructed out of two cascaded 2nd order filters with the respective pole quality factors $1/\sqrt{2+\sqrt{2}}$ and $1/\sqrt{2-\sqrt{2}}$.

Notice that the initial bandwidth (at point I after the preselect filter) is much larger than the bandwidth of both the anti-aliasing filter (point II) and the baseband filter (point III).

13.2.1 Measures of Peakedness

Referring to a noise as impulsive implies that the distribution of its instantaneous amplitude and/or power has a high degree of peakedness relative to some standard distribution, such as the Gaussian distribution. In this disclosure, "a high degree of peakedness" means "peakedness higher than that of the Gaussian distribution."

Various measures of peakedness may be constructed. Examples include, for instance, the excess-to-average power ratio described by Nikitin [29, 24], or the measures based on the real-time tests of normality and detection and quantification of impulsive interference disclosed in Section 7. One of the advantages of these measures is that they may be obtained in real time using analog circuitry, without high-rate digitization followed by intensive numerical computations. In the subsequent examples, however, we use a measure of peakedness based on the classical definition of kurtosis (Abramowitz and Stegun [2], for example).

The classical definition of kurtosis, or the fourth-order cumulant, of the signal x(t) is as follows:

$$\text{kurt}(x) = \langle (x - \langle x \rangle)^4 \rangle - 3 \langle (x - \langle x \rangle)^2 \rangle^2, \quad (66)$$

where the angular brackets denote the time averaging. Kurtosis is zero for a Gaussian random variable. For most (but not all) non-Gaussian random variables, kurtosis is nonzero.

Based on the above definition of kurtosis, the peakedness may be measured in units "decibels relative to Gaussian" (dBG) in relation to the kurtosis of the Gaussian (aka normal) distribution as follows:

$$K_{dBG}(x) = 10 \lg \left[ \frac{\langle (x - \langle x \rangle)^4 \rangle}{3 \langle (x - \langle x \rangle)^2 \rangle^2} \right]. \quad (67)$$

By this definition, the Gaussian distribution has zero dBG peakedness. Impulsive noise would typically have a higher peakedness than the Gaussian distribution (positive dBG). In time domain, high peakedness means a higher occurrence of outliers. In terms of the amplitude distribution of the signal, positive dBG peakedness normally translates into 'heavier tails' than those of the Gaussian distribution.

It is important to notice that while positive dBG peakedness would indicate the presence of an impulsive component, negative or zero dBG peakedness does not exclude the presence of such an impulsive component. This simply follows from the following linearity property of kurtosis: If $x_1$ and $x_2$ are two independent random variables, it holds that $$\text{kurt}(x_1 + x_2) = \text{kurt}(x_1) + \text{kurt}(x_2). \quad (68)$$

Thus a mixture of super-Gaussian (positive kurtosis) and sub-Gaussian (negative kurtosis) variables may have any value of kurtosis.

However, the examples of FIG. 72 through FIG. 79 do not involve sub-Gaussian noise, and thus the dBG measure given by equation (67) is appropriate for quantification of noise peakedness. Discussion of the mitigation of interference comprising both super- and sub-Gaussian components is given later in this disclosure in Section 13.2.6.

Figure 72:
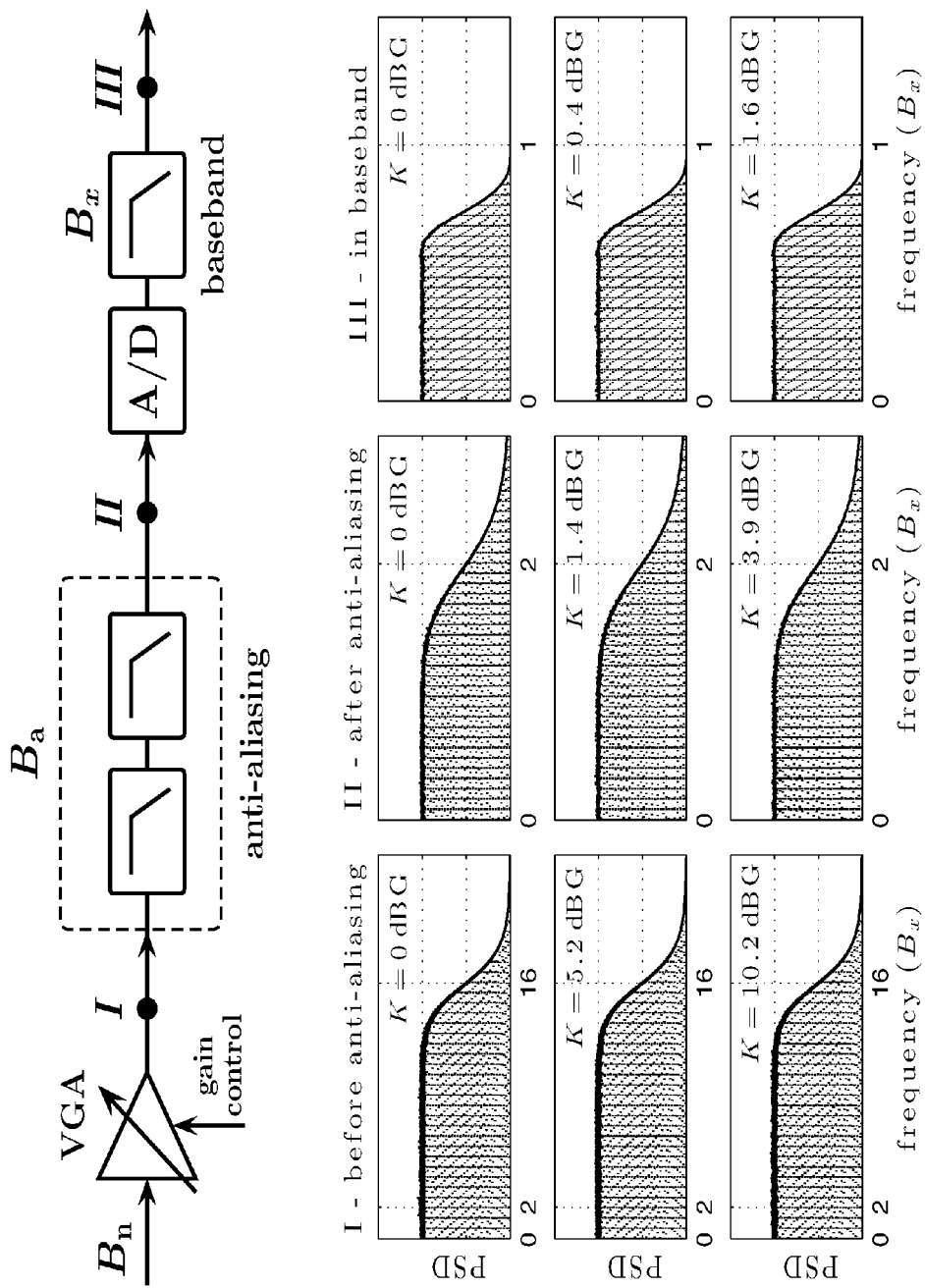
FIG. 72. PSDs of the input white noise which is Gaussian (top row of the panels), strongly impulsive (bottom row of the panels), and the 50/50 (in power) mixture of the Gaussian and impulsive noises (middle row of the panels), measured at points I, II, and III of the signal chain shown at the top of the figure.

13.2.2 Impulsive and Non-Impulsive Noises and their Peakedness Along the Signal Processing Chain FIG. 72 shows the PSDs of the input white noise which is Gaussian (top row of the panels), strongly impulsive (bottom row of the panels), and the 50/50 (in power) mixture of the Gaussian and impulsive noises (middle row of the panels), measured at points I, II, and III of the signal chain shown at the top of the figure. Initially, at point I, the peakedness of the strongly impulsive noise is 10.2 dBG, while the peakedness of the 50/50 mixture is 5.2 dBG as expected for this mixture from equations (67) and (68). One may see that (i) peakedness is not revealed by the power spectra and (ii) peakedness of impulsive noise decreases as the noise bandwidth is reduced by filtering.

Figure 73:
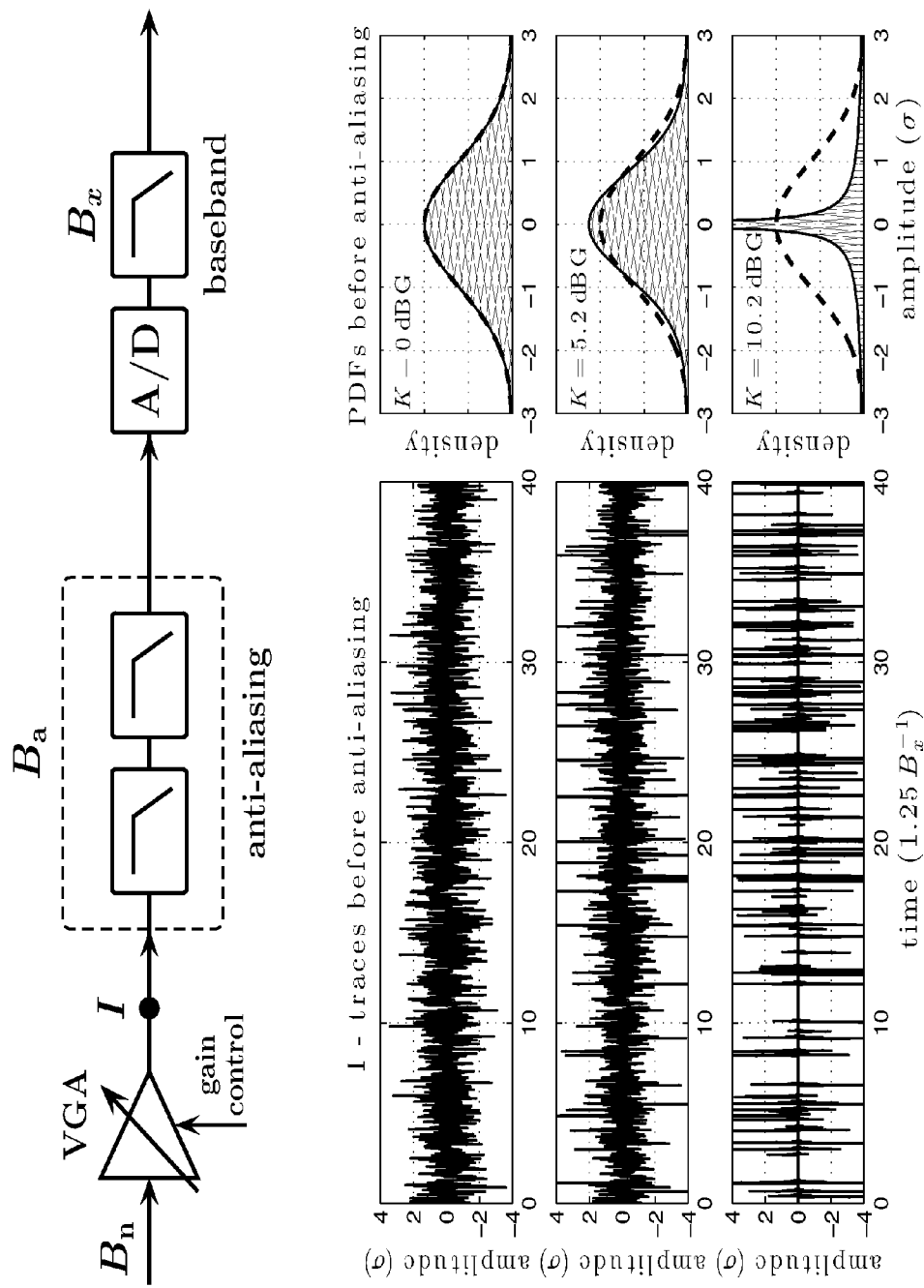
FIG. 73. Time domain traces and amplitude densities of the noise at point I (before the anti-aliasing filter) of the signal chain shown at the top. Left-hand panels: Time domain traces of the noise at point I. Right-hand panels: Amplitude densities of the noise at point I (solid lines) in comparison with the Gaussian distribution (dashed lines).

The left-hand panels in FIG. 73 show the time domain traces of the noise at point I (before the anti-aliasing filter), while the right-hand panels show the amplitude densities of the noise at point I (solid lines) in comparison with the Gaussian distribution (dashed lines).

Figure 74:
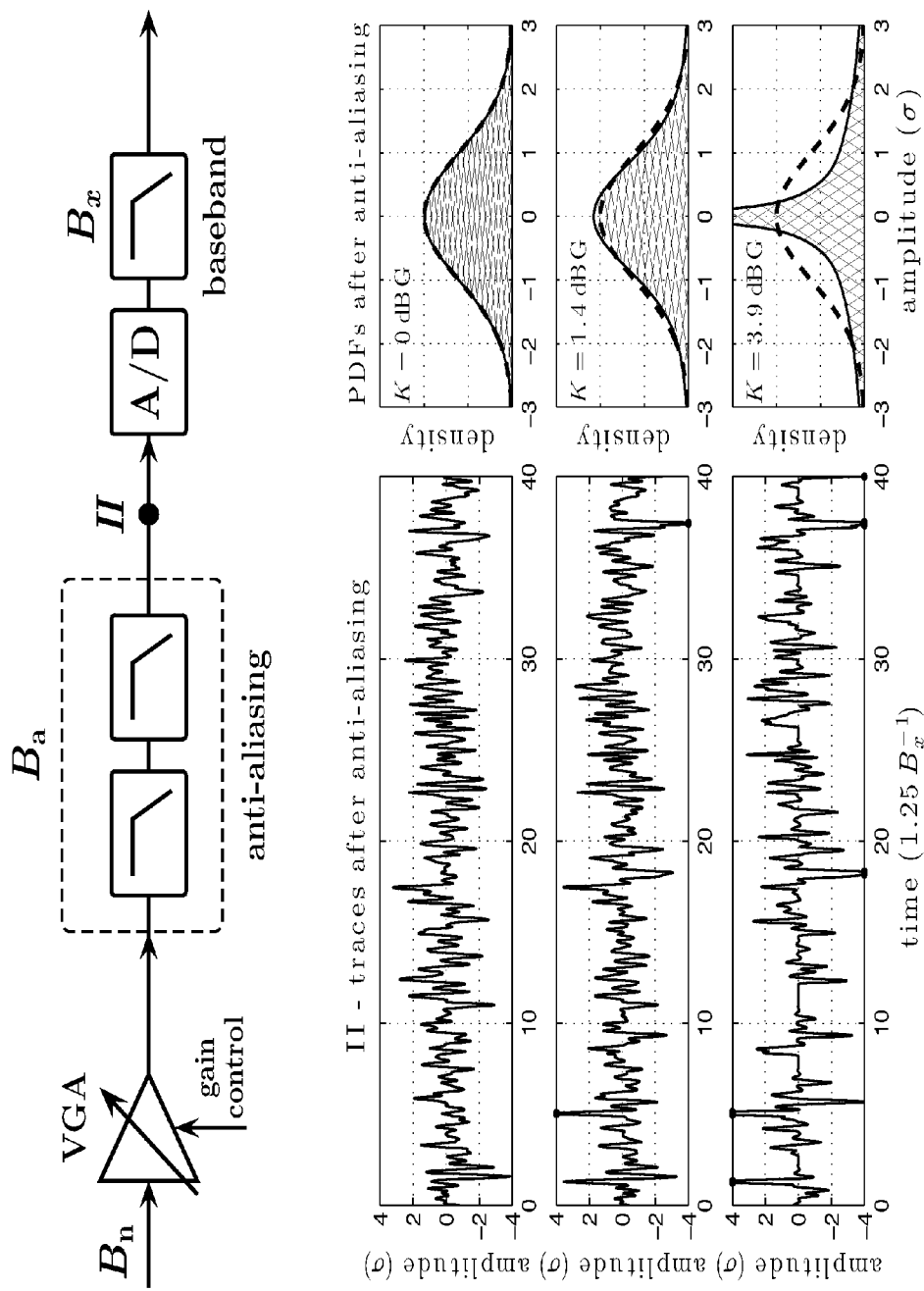
FIG. 74. Time domain traces and amplitude densities of the noise at point II (after the anti-aliasing filter) of the signal chain shown at the top. Left-hand panels: Time domain traces of the noise at point II. Right-hand panels: Amplitude densities of the noise at point II (solid lines) in comparison with the Gaussian distribution (dashed lines).

The left-hand panels in FIG. 74 show the time domain traces of the noise at point II (after the anti-aliasing filter), while the right-hand panels show the amplitude densities of the noise at point II (solid lines) in comparison with the Gaussian distribution (dashed lines). One may see that the noise outliers are broadened by the anti-aliasing filtering while their amplitude is reduced, which leads to the decrease in the peakedness of the noise.

Figure 75:
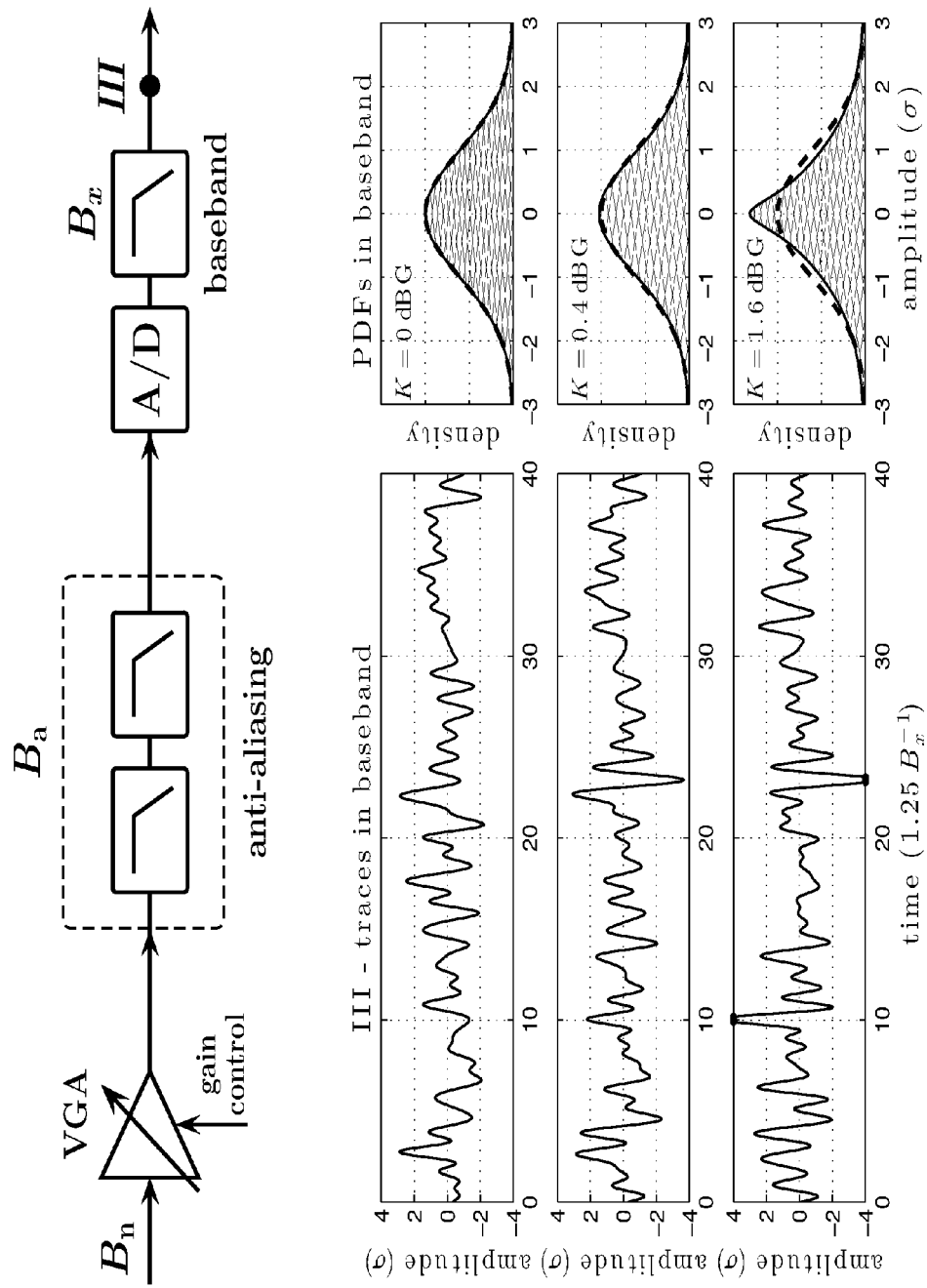
FIG. 75. Time domain traces and amplitude densities of the noise at point III (in baseband) of the signal chain shown at the top. Left-hand panels: Time domain traces of the noise at point III. Right-hand panels: Amplitude densities of the noise at point III (solid lines) in comparison with the Gaussian distribution (dashed lines).

The left-hand panels in FIG. 75 show the time domain traces of the noise at point III (in baseband), while the right-hand panels show the amplitude densities of the noise at point III (solid lines) in comparison with the Gaussian distribution (dashed lines). The noise peakedness is further reduced.

One may see from FIG. 73 through FIG. 75 that broadband white noise that starts out as impulsive becomes less impulsive, and its distribution becomes more Gaussian-like, as the noise bandwidth is reduced by linear filtering.

13.2.3 Linear Filtering of Signal Affected by Impulsive and Non-Impulsive Noises of the Same Power In FIG. 76 through FIG. 79, a signal of interest (a Gaussian signal within the baseband) is affected by the noises used in the examples of FIG. 72 through FIG. 75.

Figure 76:
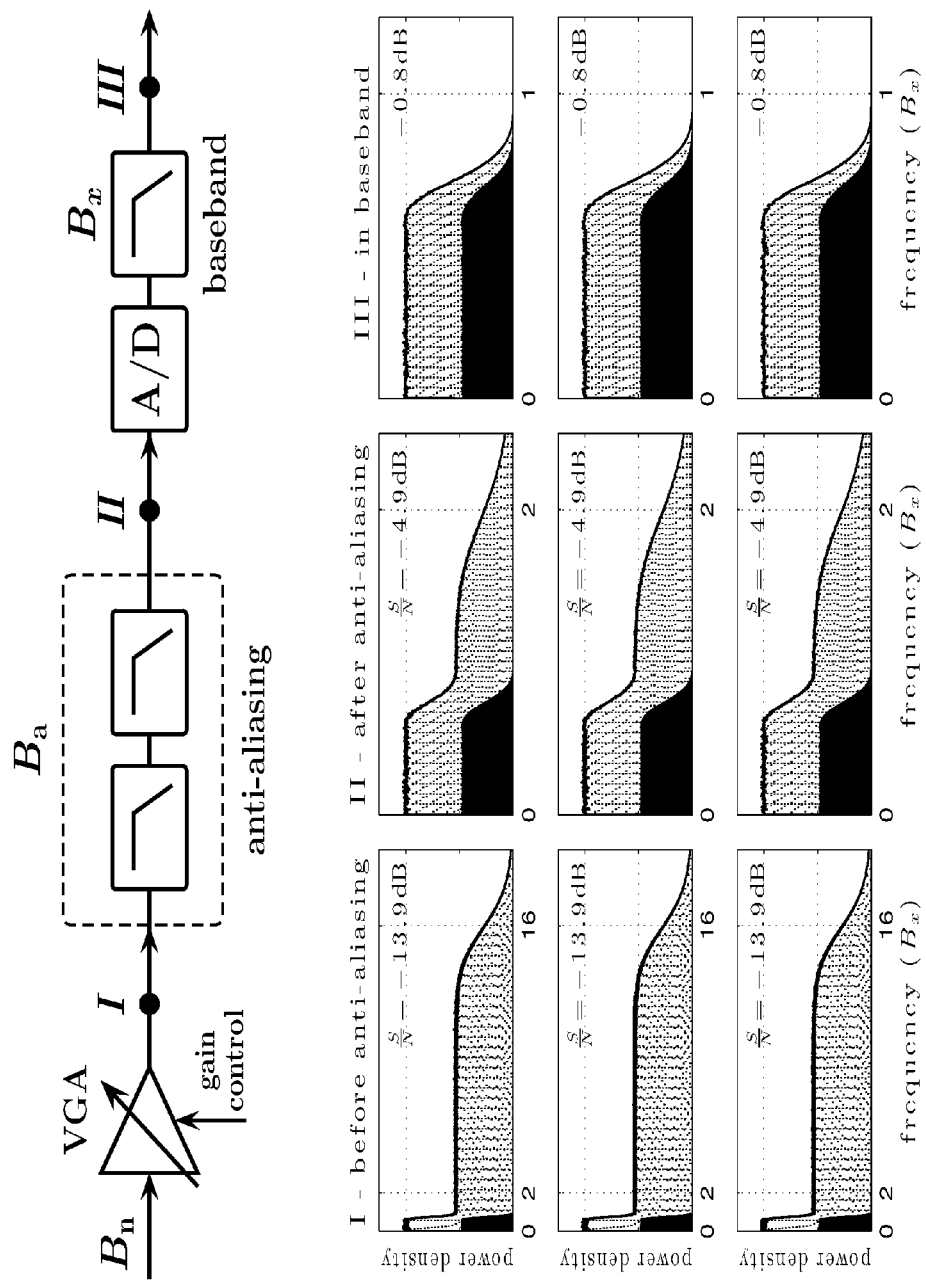
FIG. 76. Power spectral densities of the signal+noise mixtures along the signal chain shown at the top, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

FIG. 76 shows the power spectral densities of the signal+noise mixtures along the signal chain shown at the top, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure. One may see that when linear filtering is used in the signal chain, there is no difference in the power densities for signals affected by impulsive and/or non-impulsive noise, and that the signal-to-noise ratios along the signal processing chain remain the same regardless the noise composition/peakedness.

Figure 77:
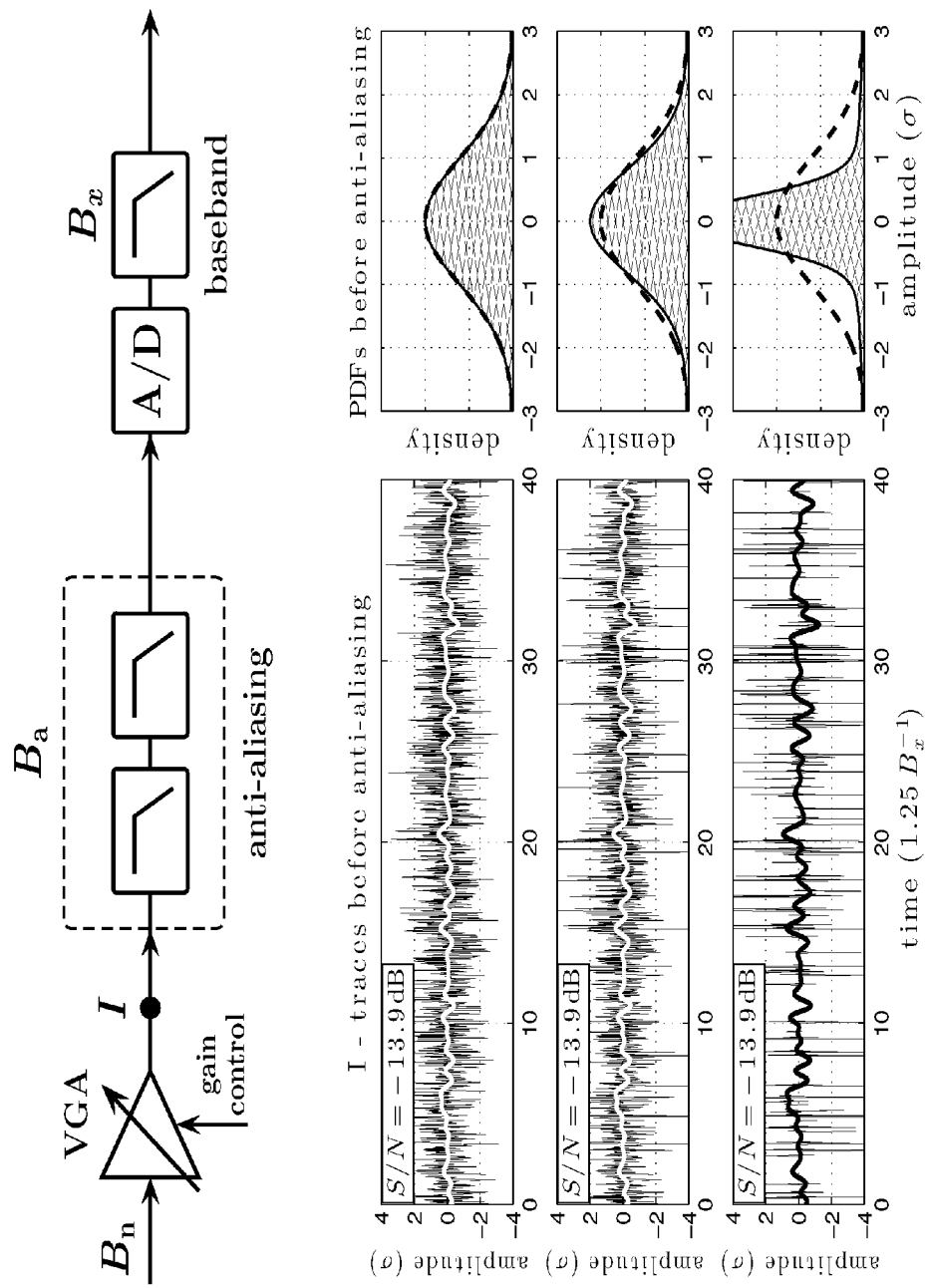
FIG. 77. Time domain traces and amplitude densities of the signal+noise mixtures at point I (before the anti-aliasing filter) of the signal chain shown at the top. Left-hand panels: Time domain traces of the signal+noise mixtures (thin black lines) at point I. Right-hand panels: Amplitude densities of the mixtures at point I (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 77 show the time domain traces of the signal+noise mixtures (thin black lines) at point I (before the anti-aliasing filter), while the right-hand panels show the amplitude densities of the mixtures at point I (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 78:
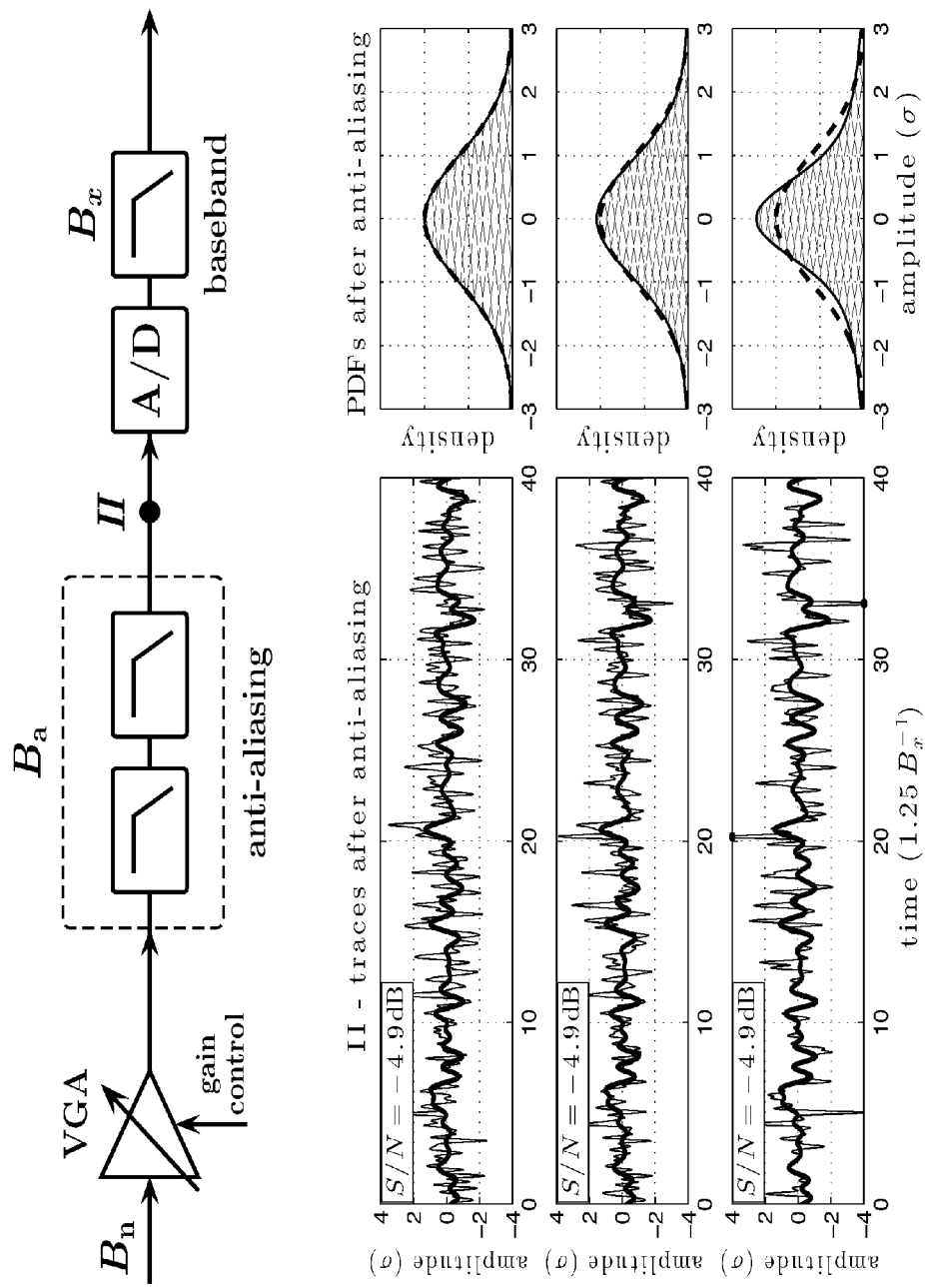
FIG. 78. Time domain traces and amplitude densities of the signal+noise mixtures at point II (after the anti-aliasing filter) of the signal chain shown at the top. Left-hand panels: Time domain traces of the signal+noise mixtures (thin black lines) at point II. Right-hand panels: Amplitude densities of the mixtures at point II (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 78 show the time domain traces of the signal+noise mixtures (thin black lines) at point II (after the anti-aliasing filter), while the right-hand panels show the amplitude densities of the mixtures at point II (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 79:
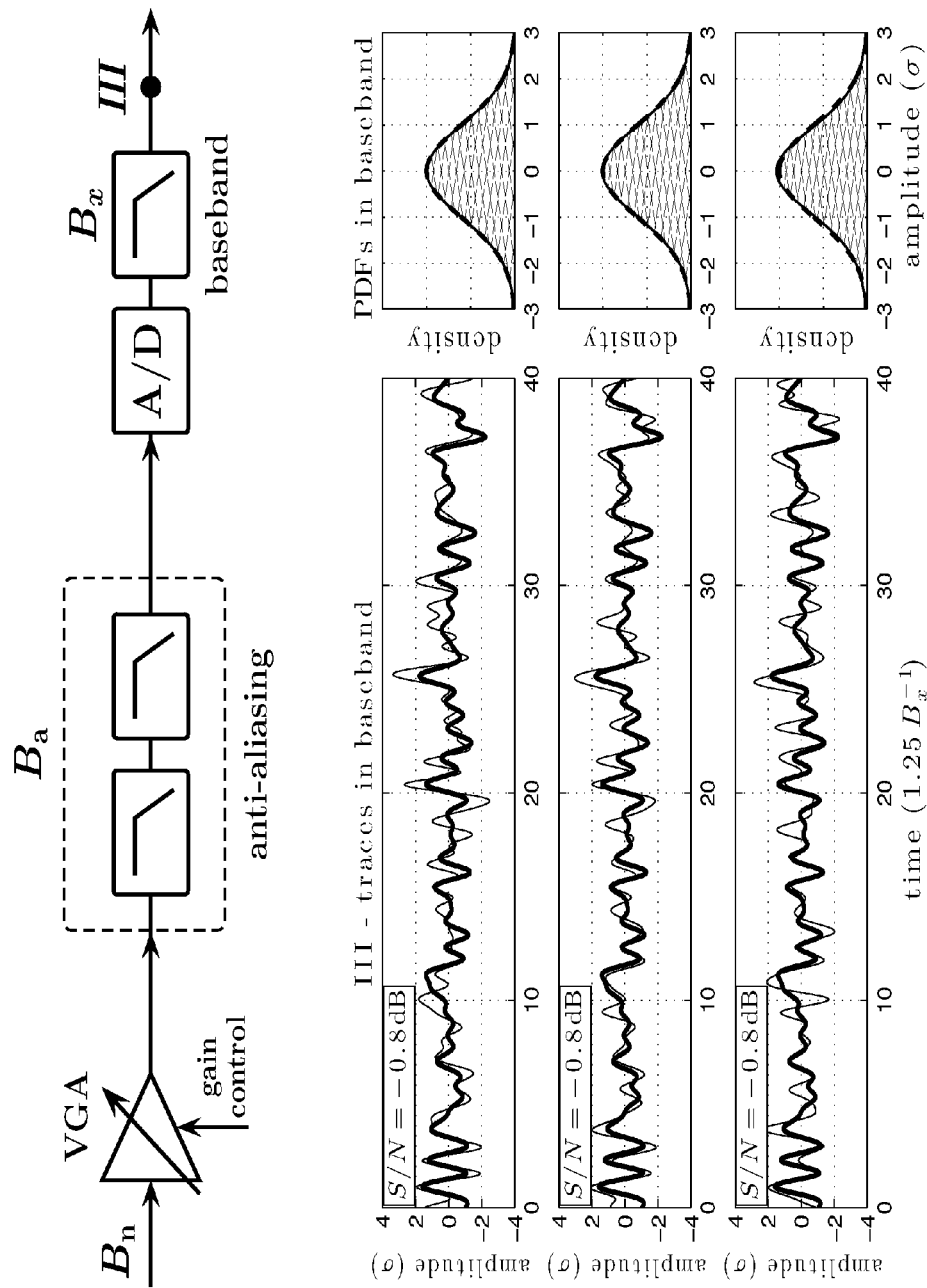
FIG. 79. Time domain traces and amplitude densities of the signal+noise mixtures at point III (in baseband) of the signal chain shown at the top. Left-hand panels: Time domain traces of the signal+noise mixtures (thin black lines) at point III. Right-hand panels: Amplitude densities of the mixtures at point III (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 79 show the time domain traces of the signal+noise mixtures (thin black lines) at point III (in baseband), while the right-hand panels show the amplitude densities of the mixtures at point III (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

13.2.4 NDL-Based Filtering of Signal Affected by Impulsive and Non-Impulsive Noises FIG. 80 through FIG. 83 illustrate, for the same signal+noise mixtures as those used in FIG. 76 through FIG. 79, that if an impulsive component is present in broadband noise, employing an NDL early in the signal chain lowers the noise floor without affecting the signal, and increases signal-to-noise ratios along the signal processing chain following the NDL. In these examples, an NDL (a 2nd order constant-Q CDL with $$Q = 1 \Big/ \sqrt{2 + \sqrt{2}}$$

replaces the respective linear filter in the anti-aliasing filter.

In the absence of impulsive noise, the NDL-based anti-aliasing is identical to the linear anti-aliasing filter, as may be seen from the comparison of the upper rows of panels in FIG. 80 through FIG. 83 with those in FIG. 76 through FIG. 79. If an impulsive component is present, however, the NDL-based anti-aliasing filter lowers the noise floor throughout the subsequent signal chain (including the baseband), without affecting the signal, as may be seen from the comparison of the lower and middle rows of panels in FIG. 80 through FIG. 83 with the respective panels in the top rows.

Figure 80:
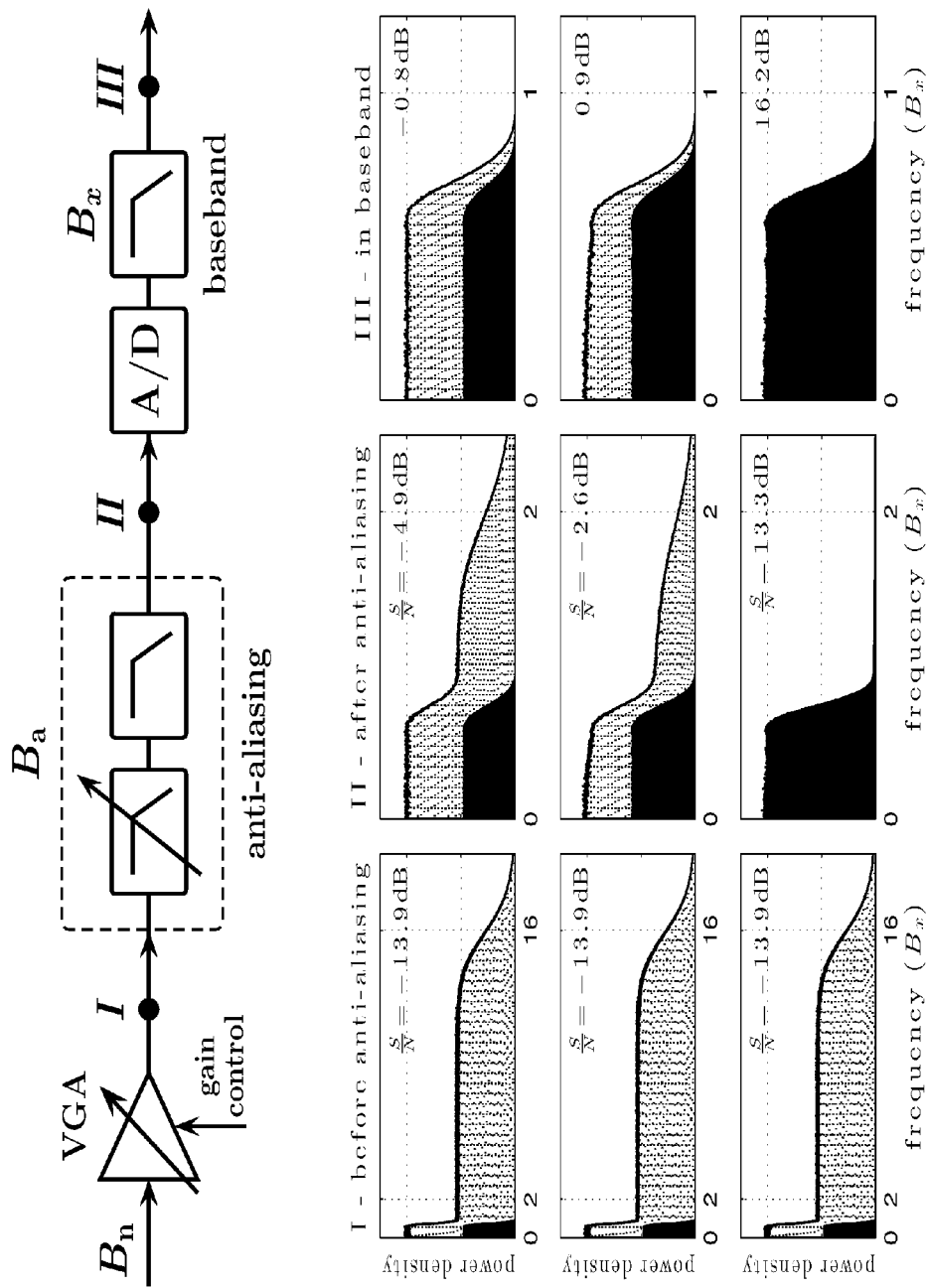
FIG. 80. Power spectral densities of the signal+noise mixtures along the signal chain shown at the top, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

FIG. 80 shows the power spectral densities of the signal+noise mixtures along the signal chain shown at the top, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

Figure 81:
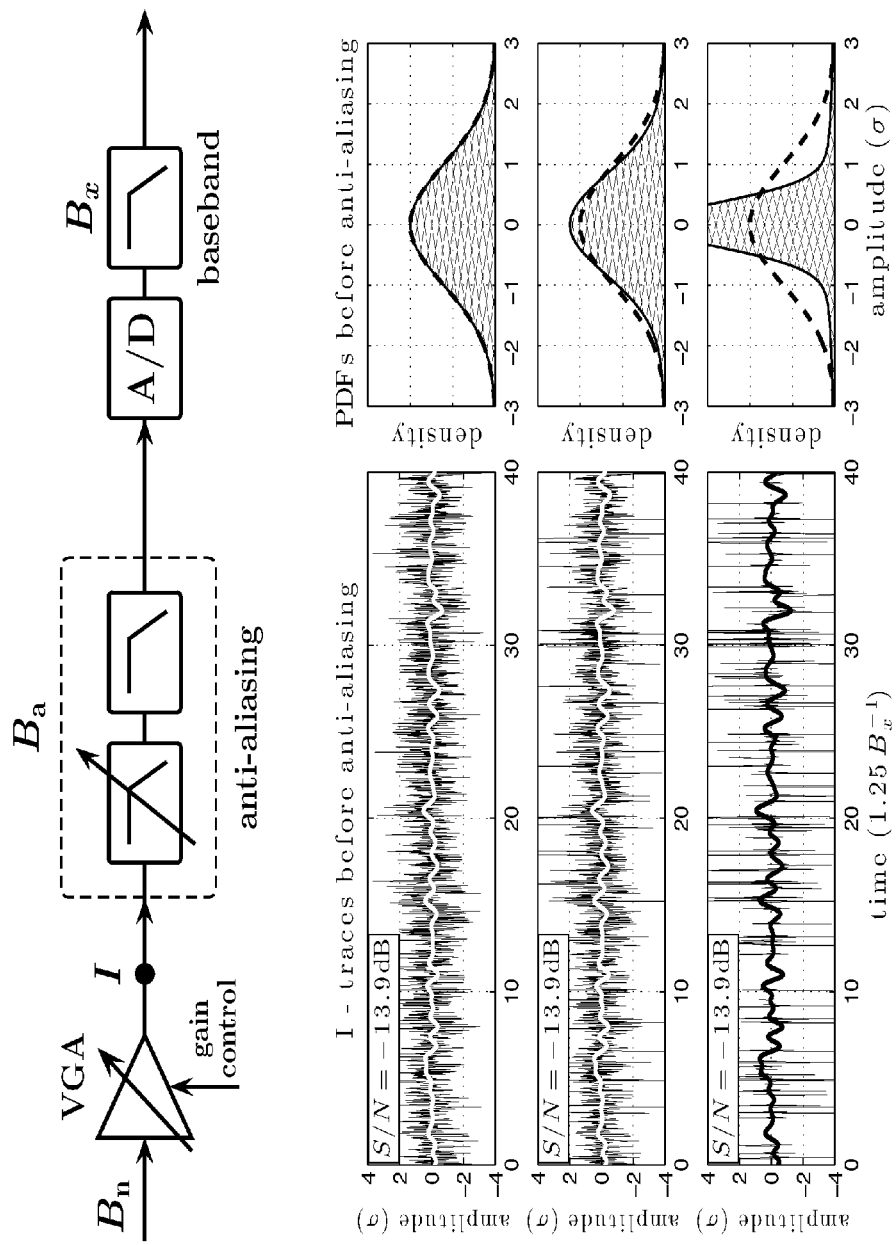
FIG. 81. Time domain traces and amplitude densities of the signal+noise mixtures at point I (before the anti-aliasing filter) of the signal chain shown at the top. Left-hand panels: Time domain traces of the signal+noise mixtures (thin black lines) at point I. Right-hand panels: Amplitude densities of the mixtures at point I (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 81 show the time domain traces of the signal+noise mixtures (thin black lines) at point I (before the anti-aliasing filter), while the right-hand panels show the amplitude densities of the mixtures at point I (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 82:
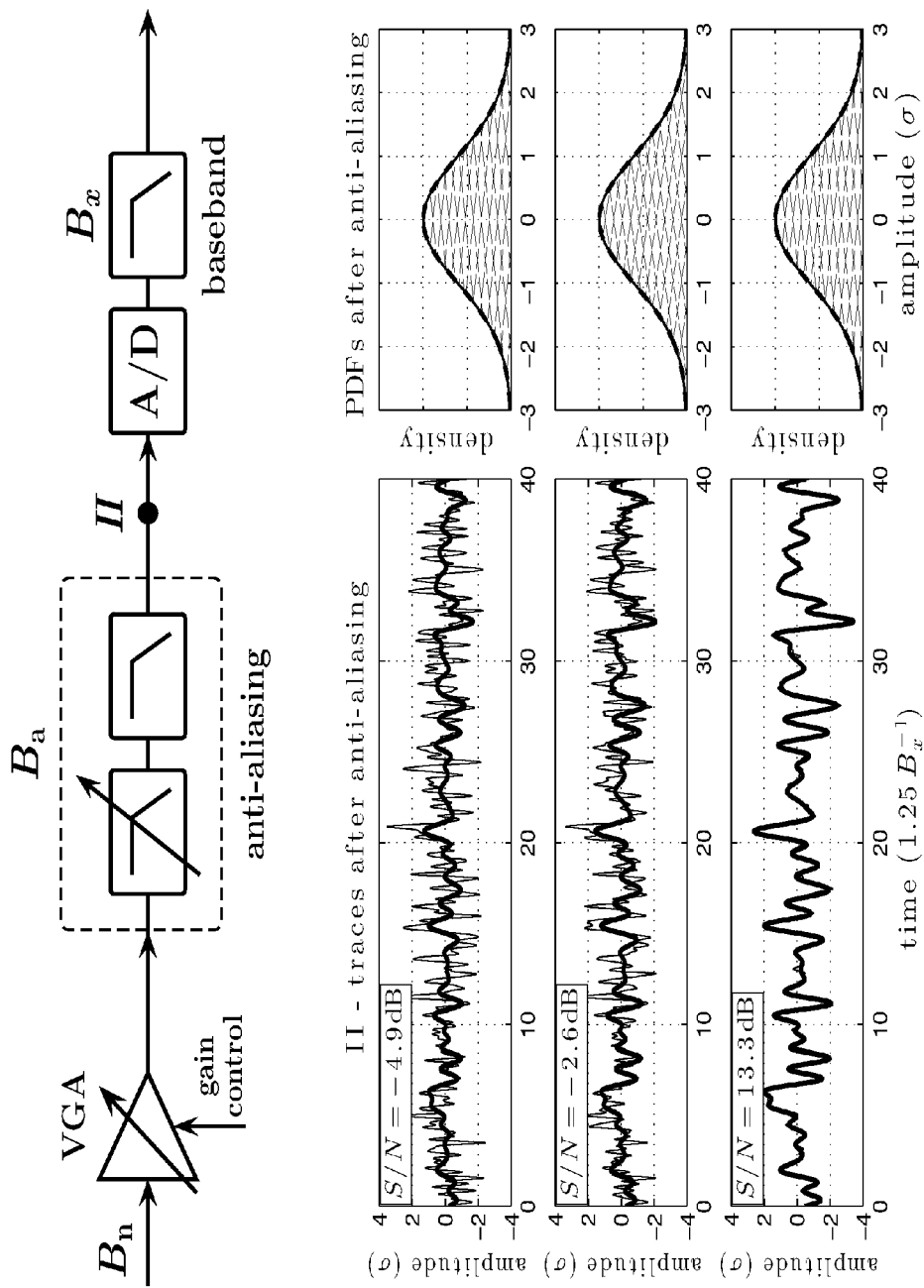
FIG. 82. Time domain traces and amplitude densities of the signal+noise mixtures at point II (after the anti-aliasing filter) of the signal chain shown at the top. Left-hand panels: Time domain traces of the signal+noise mixtures (thin black lines) at point II. Right-hand panels: Amplitude densities of the mixtures at point II (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 82 show the time domain traces of the signal+noise mixtures (thin black lines) at point II (after the anti-aliasing filter), while the right-hand panels show the amplitude densities of the mixtures at point II (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 83:
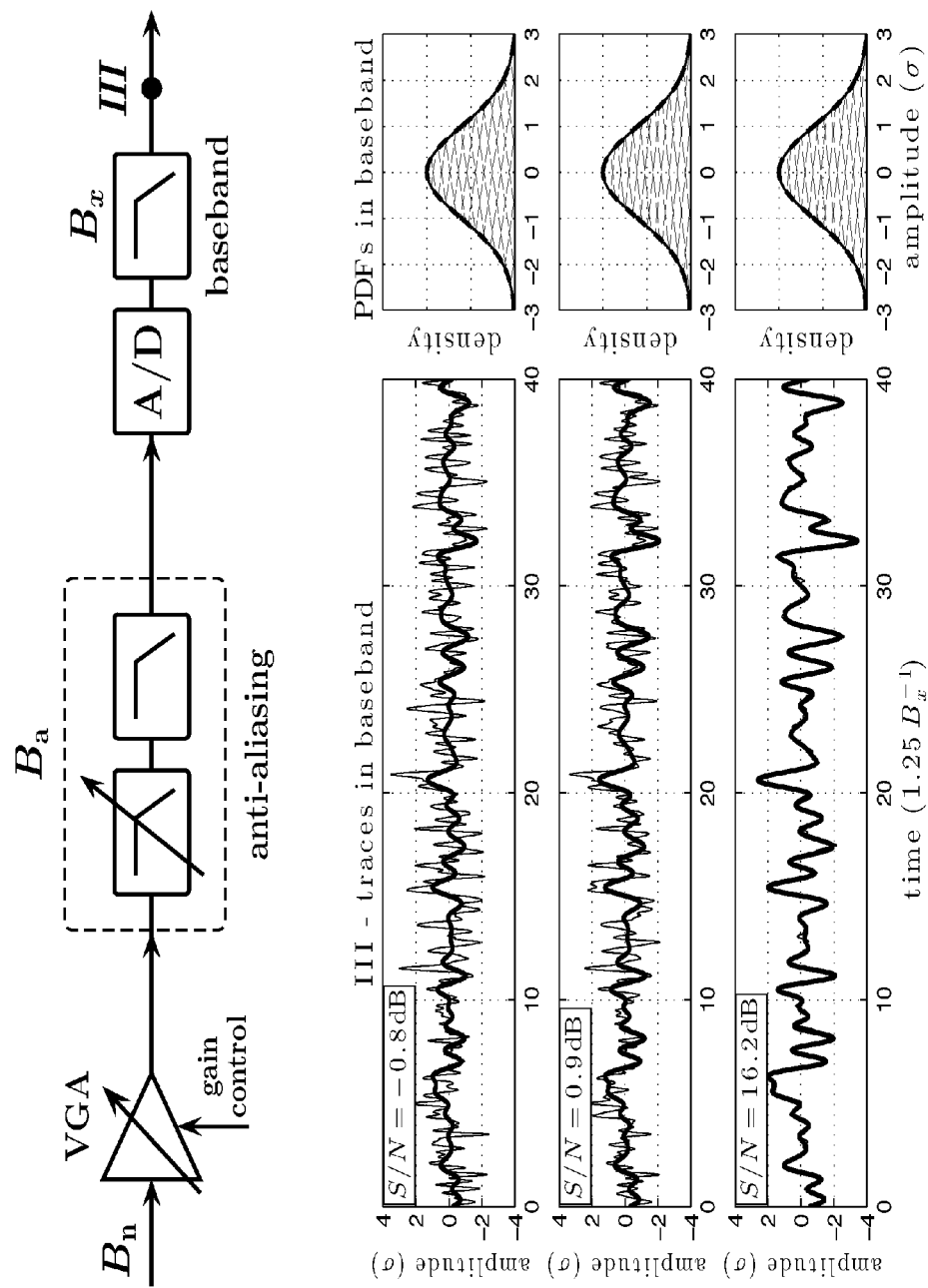
FIG. 83. Time domain traces and amplitude densities of the signal+noise mixtures at point III (in baseband) of the signal chain shown at the top. Left-hand panels: Time domain traces of the signal+noise mixtures (thin black lines) at point III. Right-hand panels: Amplitude densities of the mixtures at point III (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 83 show the time domain traces of the signal+noise mixtures (thin black lines) at point III (in baseband), while the right-hand panels show the amplitude densities of the mixtures at point III (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

If the Shannon formula (Shannon [36]) is used to calculate the capacity of a communication channel, the baseband SNR increase from −0.8 dB to 0.9 dB (linear filter vs. NDL for 50/50 mixture of the impulsive and thermal noise) results in a 33% increase in the channel capacity, while the SNR increase from −0.8 dB to 16.2 dB (linear filter vs. NDL for the impulsive noise only) results in a 520% increase in the channel capacity.

13.2.5 Mitigation of Impulsive Noise Coupled from Adjacent Circuitry

An idealized discrete-level (digital) signal may be viewed as a linear combination of Heaviside unit step functions (Bracewell [6], for example). Since the derivative of the Heaviside unit step function is a Dirac δ-function (Dirac [11], for example), the derivative of an idealized digital signal is a linear combination of Dirac δ-functions, which is a limitlessly impulsive signal with zero interquartile range and infinite peakedness. Then the derivative of a "real" (i.e. no longer idealized) digital signal may be represented by a convolution of a linear combination of Dirac δ-functions with a continuous kernel. If the kernel is sufficiently narrow, the resulting signal may appear as an impulse train protruding from a continuous background signal. Thus impulsive interference occurs "naturally" in digital electronics as the result of coupling between various circuit components and traces.

Figure 84:
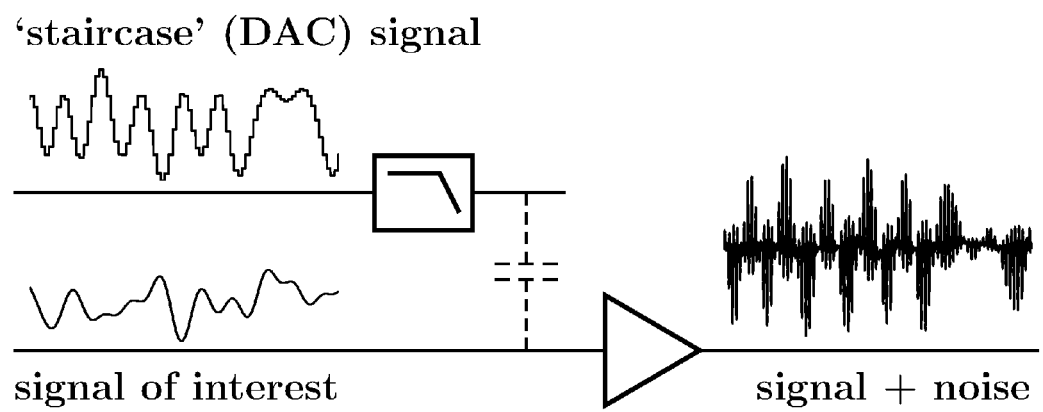
FIG. 84. Illustration of a simplified interference scenario where a 'staircase' DAC signal is "smoothened" by a lowpass filter, then capacitively coupled into an adjacent trace.

FIG. 84 provides an illustration of a simplified interference scenario where a 'staircase' DAC signal is "smoothened" by a lowpass filter, then capacitively coupled into an adjacent trace.

Figure 85:
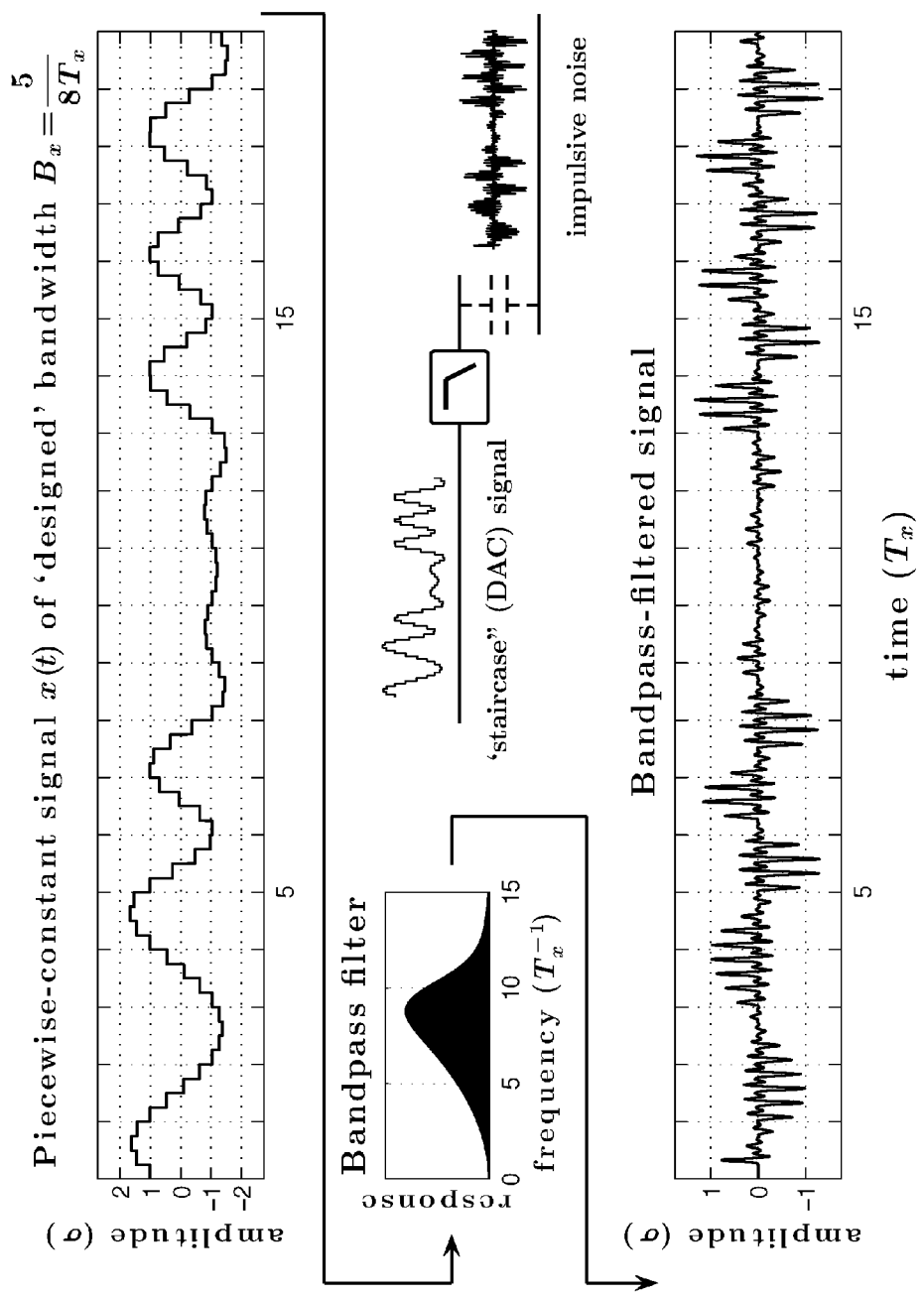
FIG. 85. Clarifying details for the interference scenario shown in FIG. 84.

FIG. 85 provides clarifying details for the interference scenario shown in FIG. 84. The capacitor performs time-domain differentiation, transforming the non-impulsive DAC signal into an impulsive interference. The combination of a lowpass filter and a capacitive coupling forms a bandpass filter with the response shown in the figure. When the input of this bandpass filter is the DAC signal shown in the top panel, the output is the impulsive pulse train shown in the bottom panel.

Figure 86:
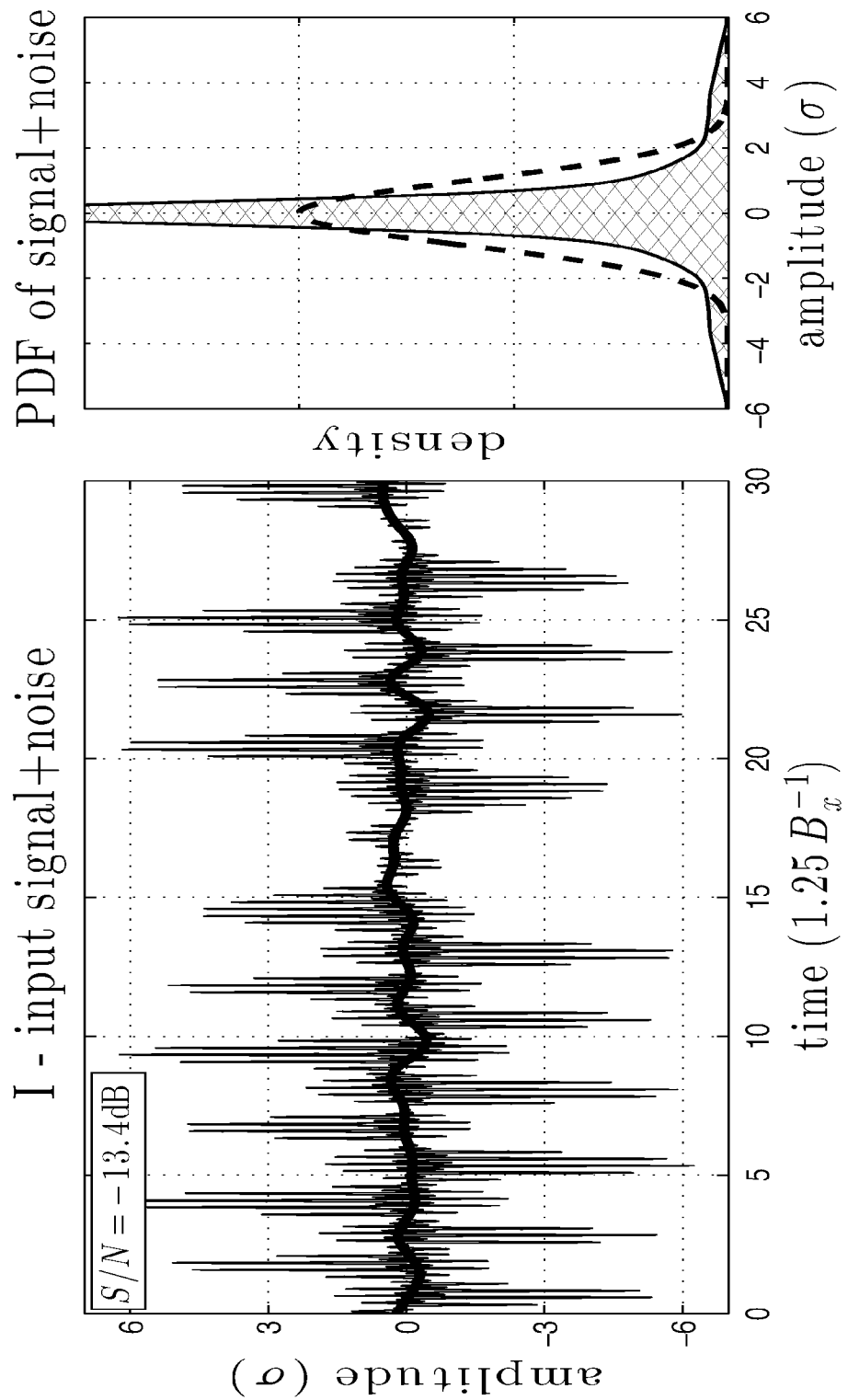
FIG. 86. Input signal at point I (before the anti-aliasing filter) of both signal chains shown in FIG. 87. Left-hand panel: Time domain trace of the signal+noise mixture where the noise is the DAC interference from the scenario illustrated in FIG. 84 and FIG. 85, and the signal of interest is some small signal within the baseband frequency. Right-hand panel: Amplitude density of the signal+noise mixture (solid line) in comparison with the Gaussian distribution (dashed line).

The left-hand panel of FIG. 86 shows the time domain trace of the signal+noise mixture where the noise is the DAC interference from the scenario illustrated in FIG. 84 and FIG. 85, and the signal of interest is some small signal within the baseband frequency. For reference, the signal without noise is overlaid on top of the signal+noise trace (thick line), and the signal-to-noise ratio is indicated in the upper left corner of the panel. The right-hand panel of FIG. 86 shows the amplitude density of the signal+noise mixture (solid line) in comparison with the Gaussian distribution (dashed line). This signal+noise mixture forms the input signal at point I (before the anti-aliasing filter) of both signal chains shown in FIG. 87.

Figure 87:
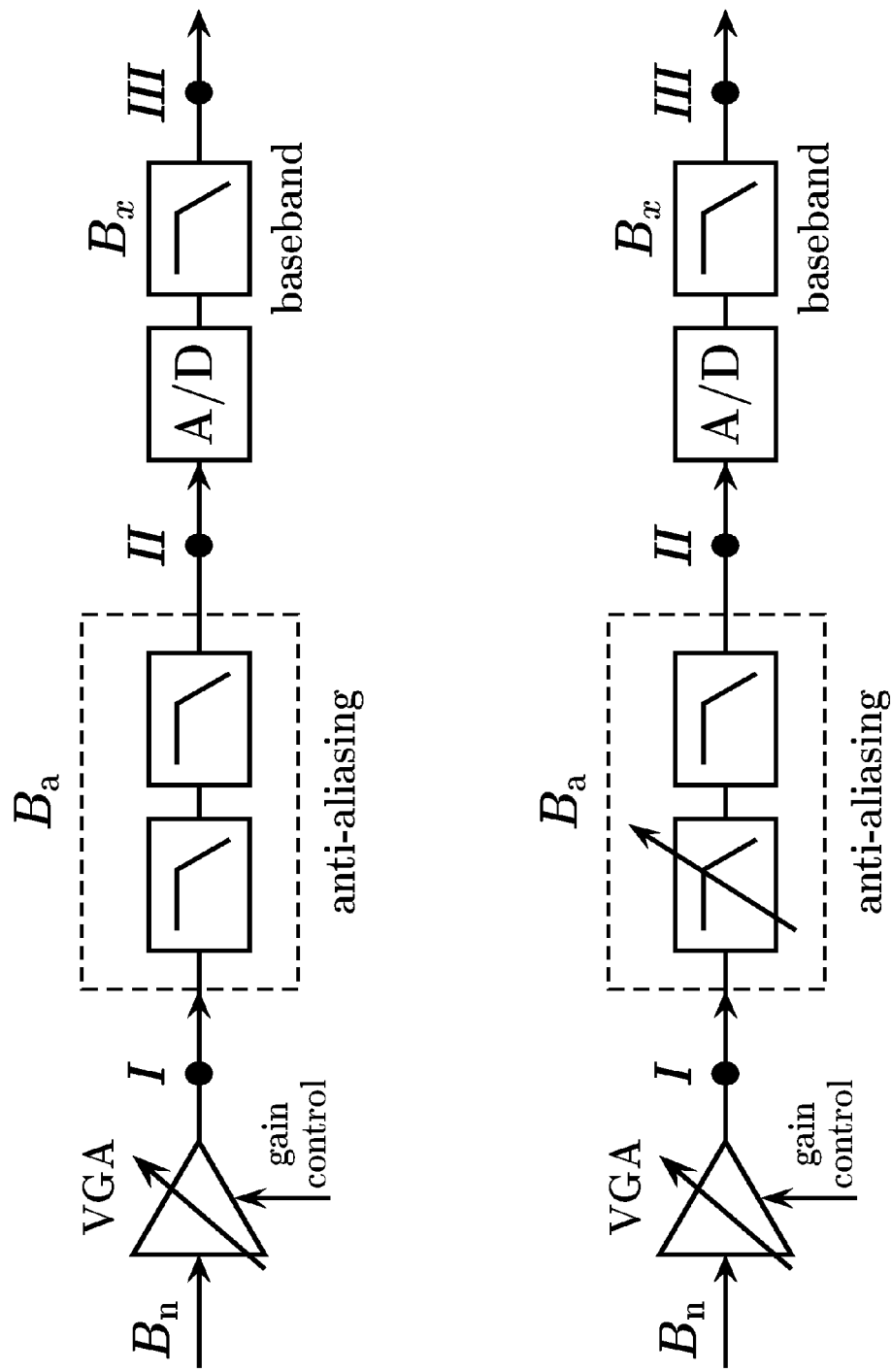
FIG. 87. Signal chain with a linear anti-aliasing filter (top), and a signal chain with an NDL-based anti-aliasing filter (bottom). All filters are the same as the respective filters used in the examples of FIG. 71 through FIG. 83.

FIG. 87 shows a signal chain with a linear anti-aliasing filter (top), and a signal chain with an NDL-based anti-aliasing filter (bottom). All filters are the same as the respective filters used in the examples of FIG. 71 through FIG. 83.

Figure 88:
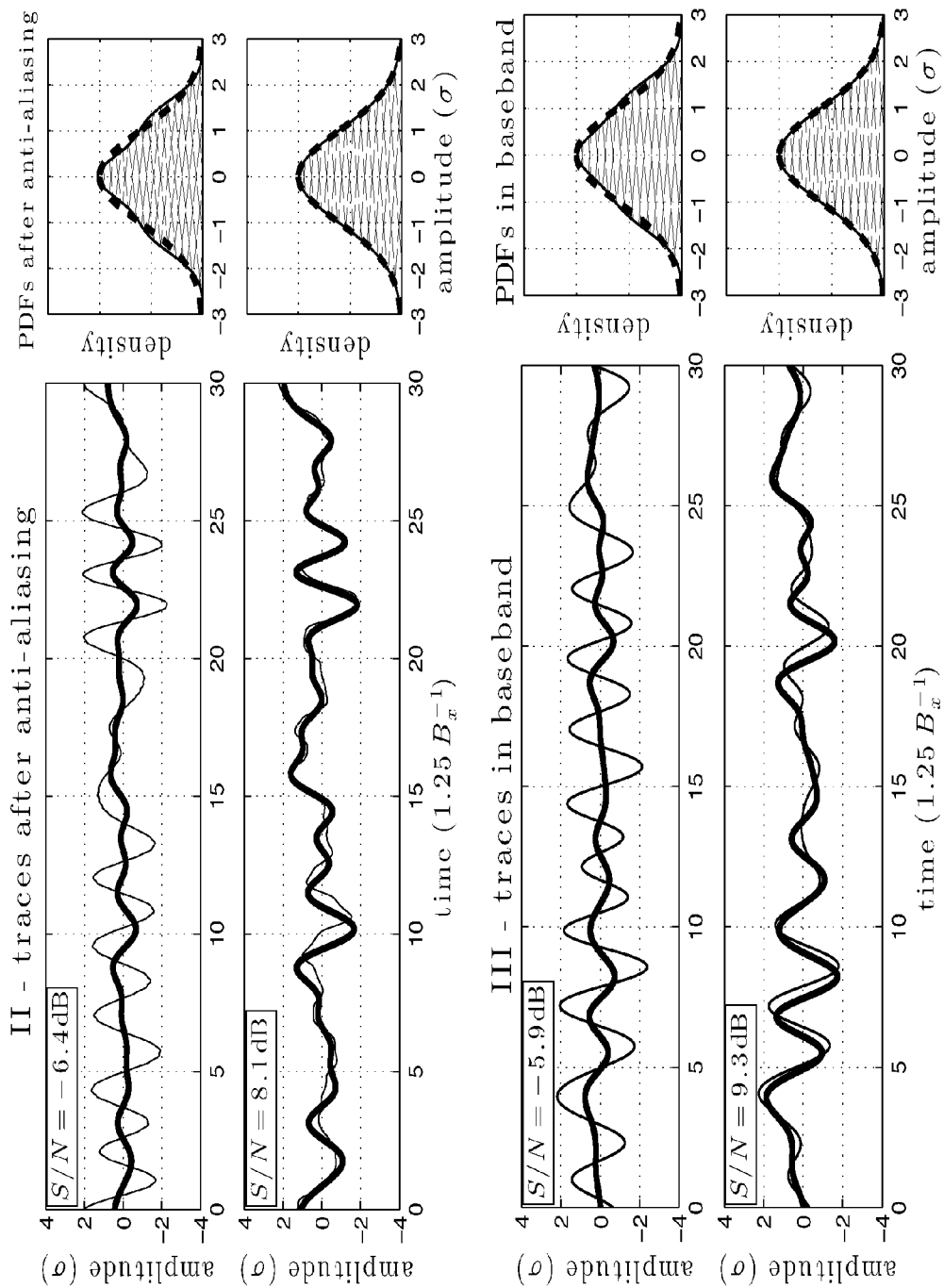
FIG. 88. Time domain traces of the signal+noise mixtures and their amplitude densities at point II (upper set of panels) and at point III (lower set of panels).

FIG. 88 shows the time domain traces of the signal+noise mixtures and their amplitude densities at point II (upper set of panels) and at point III (lower set of panels). The time domain traces are shown in the left-hand panels, while the right-hand panels show the amplitude densities of the mixtures in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 89:
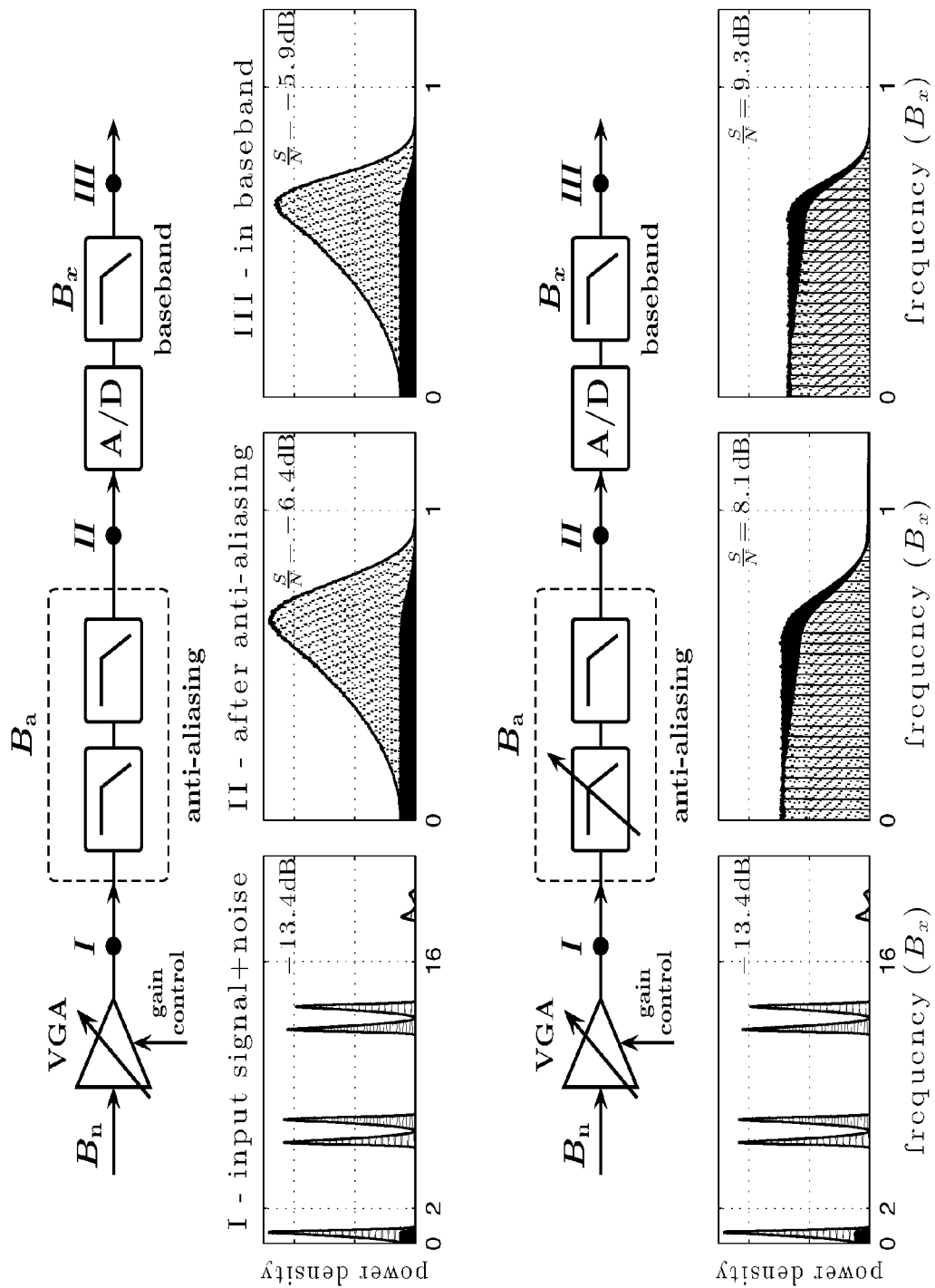
FIG. 89. PSDs of the signal+noise mixtures along the signal chains shown in FIG. 87, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

FIG. 89 shows the power spectral densities of the signal+noise mixtures along the respective signal chains, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

One may see from FIG. 89 that while the linear filtering eliminates only the noise components outside of the baseband, the NDL-based filtering suppresses all components of the impulsive noise, including those within the baseband, without significantly affecting the baseband signal of interest.

If the Shannon formula (Shannon [36]) is used to calculate the capacity of a communication channel, the baseband SNR increase from −5.9 dB to 9.3 dB (linear filter vs. NDL) results in an 885% increase in the channel capacity, or almost an order of magnitude.

13.2.6 Improving NDL-Based Mitigation of Interference when the Latter Comprises Impulsive and Non-Impulsive Components Typically, the NDL-based filters are more effective the higher the peakedness of the (broadband) impulsive noise affecting the signal of interest. When the interfering signal comprises a mixture of impulsive and non-impulsive components, the total peakedness is smaller than the peakedness of the most impulsive component, and the effectiveness of an NDL applied directly to the signal affected by such mixed interference may be greatly reduced.

However, in many instances the peakedness of a mixed interference may be increased by linear filtering preceding the NDL filter, provided that this filtering does not significantly affect the impulsive component.

Assume, for example, that the interference consists of two independent components $n_1(t)$ and $n_2(t)$, where $n_1$ is impulsive (high peakedness), and $n_2$ is non-impulsive (low peakedness).

If the frequency spectra (the PSDs) of $n_1$ and $n_2$ do not significantly overlap (e.g. one spectrum is a line spectrum, and the other one is a diffuse spectrum, or both are distinct line spectra), then the non-impulsive component $n_2$ may be significantly reduced (filtered out) by linear filtering without significantly affecting the impulsive component $n_1$.

For example, $n_1$ may be a broadband diffuse impulsive noise (e.g. the white impulsive noise used in the examples presented in FIG. 72 through FIG. 83), and $n_2$ may be a non-impulsive interferer with a line or narrow band spectrum. If, for instance, $n_2$ is a single tone with the frequency outside of the baseband, then a notch filter at the frequency of the tone $n_2$ may increase the peakedness of the interfering mixture without affecting the baseband signal of interest, and an NDL-based filter following the notch filter may more effectively mitigate the remaining interference.

If $n_1$ is an impulsive noise with a line spectrum (e.g. the coupled impulsive noise used in the examples of FIG. 85 through FIG. 89), and $n_2$ is an AWGN, then a properly configured bandstop filter with the stop bands between the lines of the $n_1$ power density spectrum (see the spectrum lines shown in the leftmost panels of FIG. 89) may increase the peakedness of the interfering mixture without affecting the baseband signal of interest, and an NDL-based filter following the bandstop filter may more effectively mitigate the remaining interference. Alternatively, an appropriate comb (multiple passband) filter may be used to pass through the impulsive portion $n_1$ of the interference and the baseband signal, while suppressing the non-impulsive portion $n_2$.

As yet another example, both $n_1$ and $n_2$ may have diffuse spectra, but $n_1$ is band-limited (e.g. within a certain range of relatively low frequencies) while $n_2$ occupies a wider spectrum range (e.g. extends to higher frequencies than $n_1$). Then a linear filter preceding an NDL and limiting the bandwidth of the interfering mixture to within the spectrum range of $n_1$ (e.g. a lowpass filter with the bandwidth equal to the bandwidth of the impulsive component) may increase the peakedness of the noise and may improve the mitigation of the remaining interference by the NDL.

Figure 90:
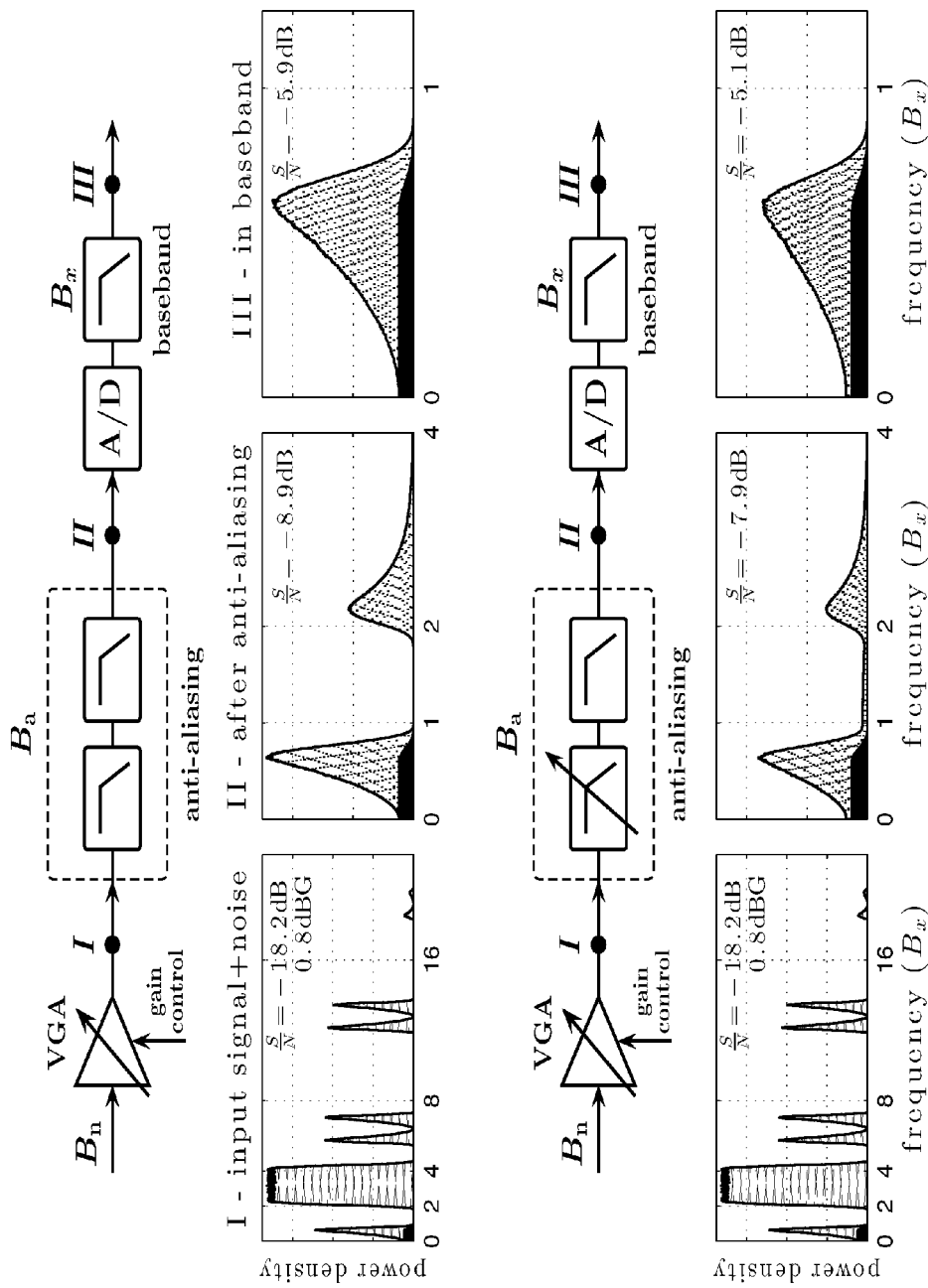
FIG. 90. Example of NDL-based mitigation of interference when the latter comprises impulsive and non-impulsive components.
Figure 91:
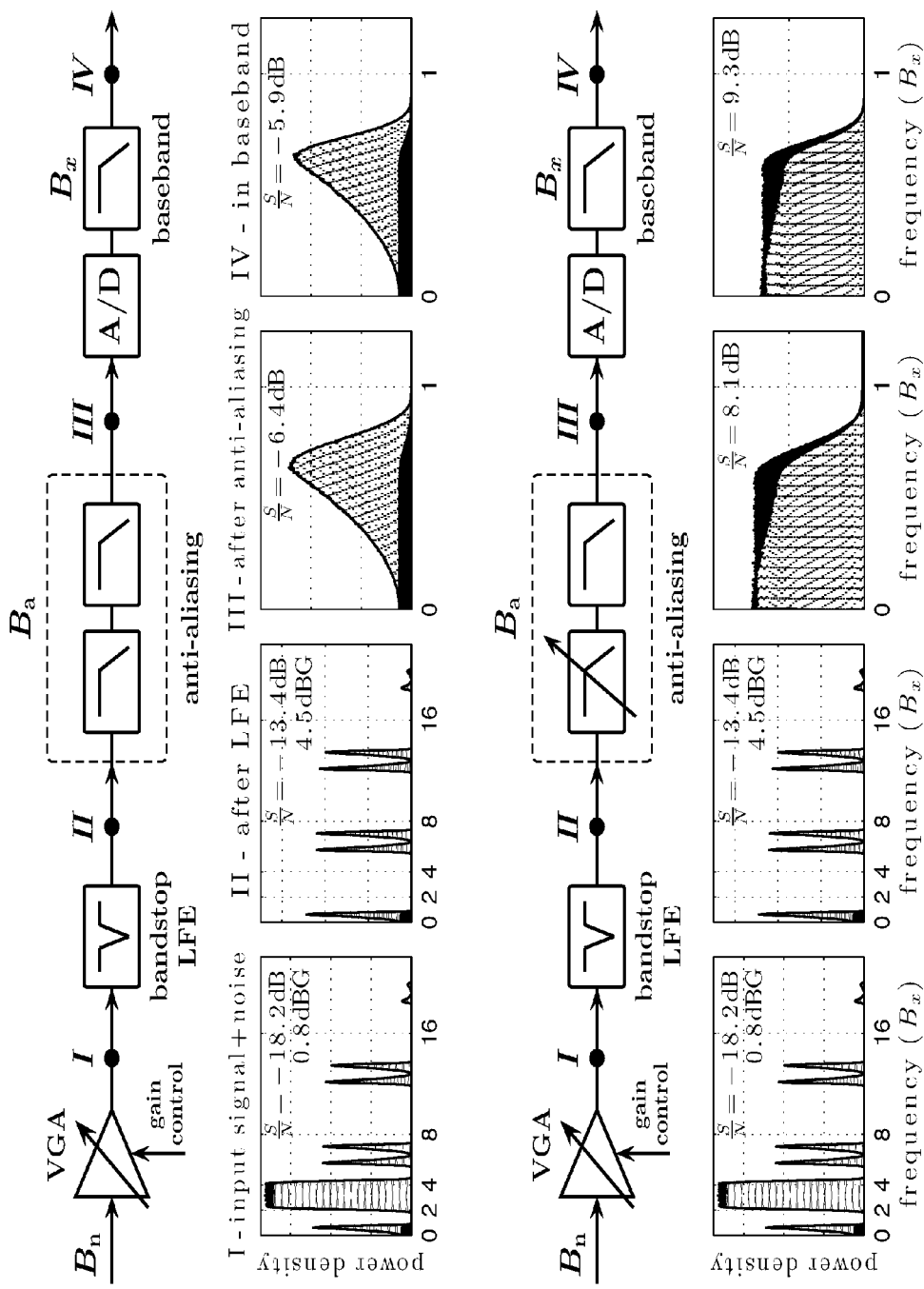
FIG. 91. Example of improving NDL-based mitigation of interference when the latter comprises impulsive and non-impulsive components.

In FIG. 90 and FIG. 91, the impulsive noise is the DAC interference from the scenario illustrated in FIG. 84 and FIG. 85, and the signal of interest is some small signal within the baseband frequency (see Section 13.2.5). The non-impulsive component of the interference comes from a strong transmitter in the band adjacent to the baseband signal, and the presence of a strong non-impulsive component reduces the total peakedness of the interference to 0.8 dBG, as may be seen from the leftmost panels in FIG. 90 and FIG. 91.

Low peakedness of such mixed interference greatly reduces the effectiveness of an NDL applied directly to the signal affected by this interference, as may be seen in the rightmost panels of FIG. 90. While the baseband SNR still increases, the increase is only from −5.9 dB to −5.1 dB, much smaller than the increase from −5.9 dB to 9.3 dB achieved in the absence of the non-impulsive component (see Section 13.2.5).

If the Shannon formula (Shannon [36]) is used to calculate the capacity of a communication channel, the baseband SNR increase from −5.9 dB to −5.1 dB (linear filter vs. NDL without LFE) results only in an 18% increase in the channel capacity.

Since the additional interference lies outside the baseband, this interference does not contribute to the baseband noise as linear filtering completely removes it. The only noise component affecting the baseband SNR is the impulsive component. A linear filter, while removing all noise outside the baseband, leaves the baseband component of the impulsive noise intact. As the result, the baseband SNR remains −5.9 dB in all linear filtering examples (the upper rows of panels) of FIG. 89, FIG. 90, and FIG. 91.

In the example of FIG. 91, an LFE filter (a bandstop filter with constant group delay) is used to filter out the non-impulsive component of the interference. As the result, the non-impulsive component is suppressed while the signal and the impulsive noise component remain intact. After the bandstop filter (at point II of FIG. 91), the signal+noise mixture is essentially identical to the input signal+noise mixture of the example of FIG. 89. The peakedness of the noise increases to 4.5 dBG, and the subsequent filtering with an NDL-based anti-aliasing filter (a 2nd order constant-Q CDL with $$Q = 1 \big/ \sqrt{2 + \sqrt{2}}$$

followed by a 2nd order linear filter with $$Q = 1 \big/ \sqrt{2 - \sqrt{2}}$$

effectively mitigates the impulsive interference, improving the baseband SNR to 9.3 dB.

If the Shannon formula (Shannon [36]) is used to calculate the capacity of a communication channel, the baseband SNR increase from −5.9 dB to 9.3 dB (linear filter vs. improved NDL with LFE) results in an 885% increase in the channel capacity, or the same increase as in the absence of the non-impulsive component of the interference (see Section 13.2.5).

13.2.7 Increasing Peakedness of Interference to Improve its NDL-Based Mitigation Linear filtering may be designed to increase peakedness of the interfering signal. For example, often a continuous interfering signal may be represented by a convolution of a continuous kernel with a signal containing jump discontinuities. Differentiation of a jump discontinuity transforms it into a singular δ-function multiplied by the signed magnitude of the 'jump' (see Dirac [11], for example), and, if the kernel is sufficiently narrow, its convolution with the resulting δ-function may appear as an "impulse" protruding from a continuous background signal.

Unless the interfering signal is smooth (i.e. its time derivatives of any order are continuous), its time derivatives of some order may contain jump discontinuities, and subsequent differentiation of the signal containing such discontinuities will transform these discontinuities into singular δ-functions. If the signal of interest is "smoother" than the interfering signal (i.e. it has continuous derivatives of higher order than the interfering signal), then differentiation may increase the impulsiveness (peakedness) of the interfering signal in excess of that of the signal of interest.

Figure 92:
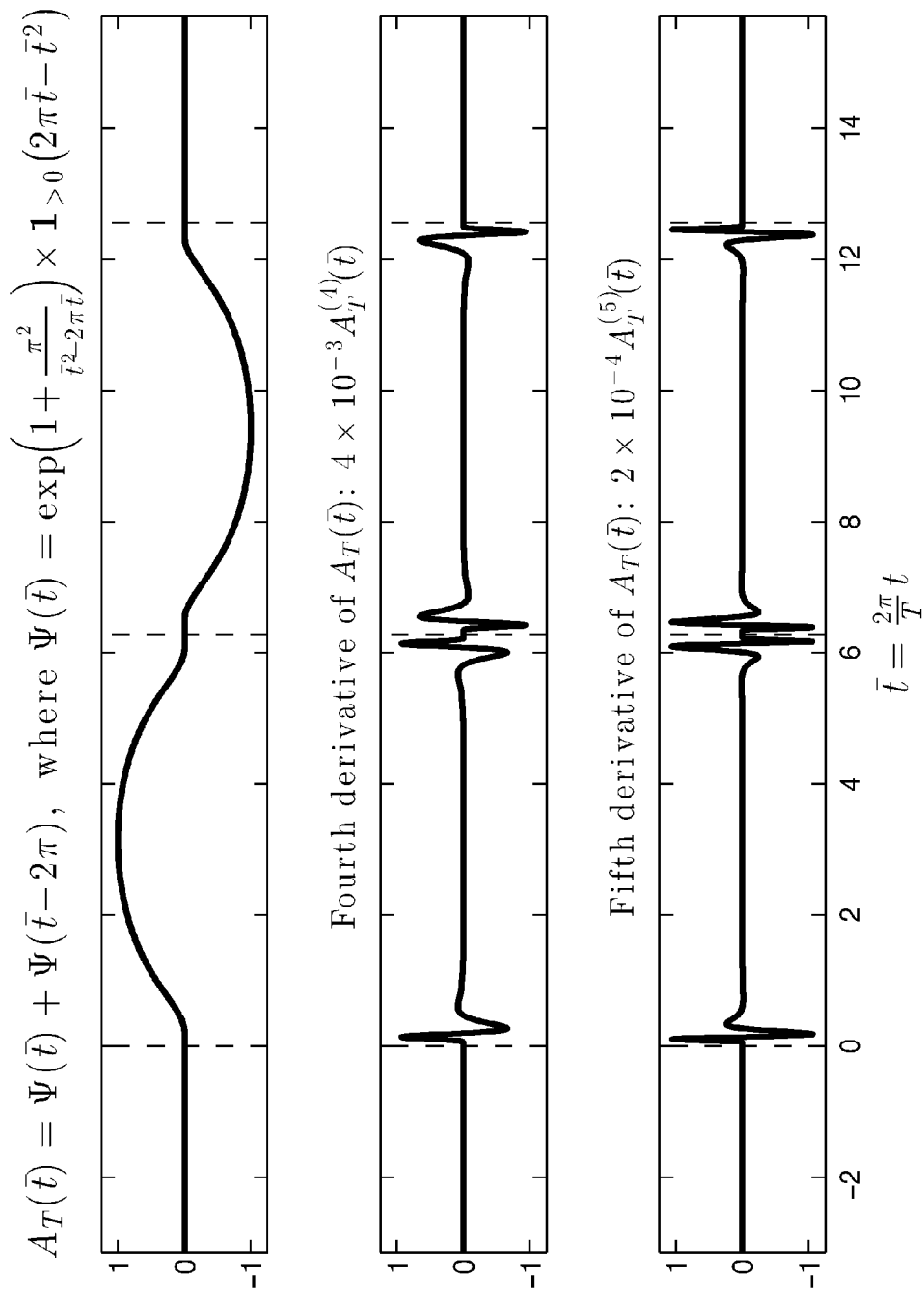
FIG. 92. Illustrative example of increasing impulsiveness of a truly smooth signal by consecutive differentiation.

It should be mentioned that consecutive differentiation may increase the impulsiveness (peakedness) of a signal even if the latter is truly "smooth" in mathematical sense, leaving aside the question of such a signal being physically realizable. This is illustrated in FIG. 92 for a mathematically smooth signal fragment. In FIG. 92, $1_{>0}(x)$ is the indicator function $$1_{>0}(x) = \begin{cases} 1 & \text{for } x > 0 \\ 0 & \text{otherwise} \end{cases}. \tag{69}$$

Figure 93:
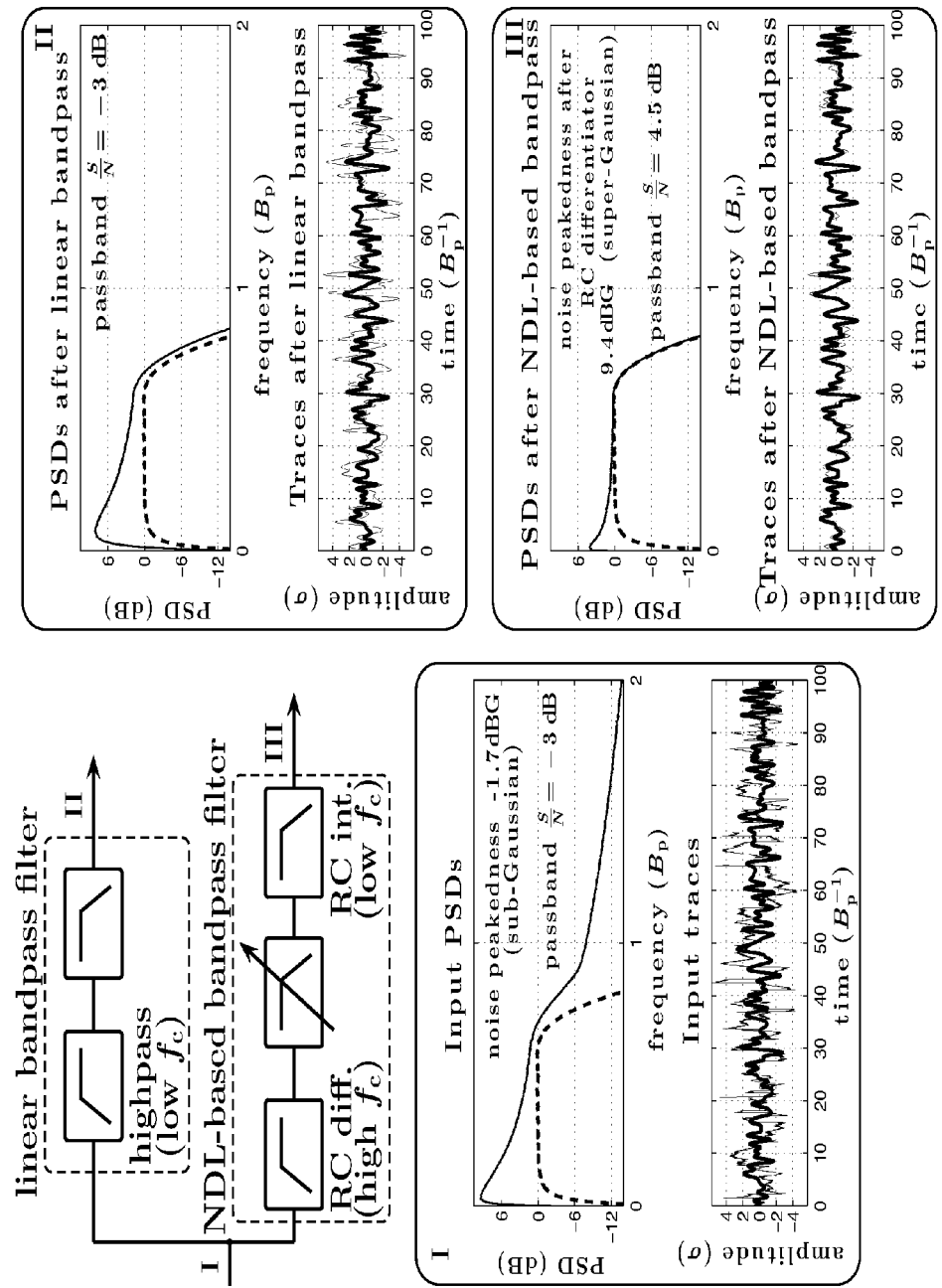
FIG. 93. Illustrative example of using an improved NDL-based bandpass filter to mitigate sub-Gaussian (non-impulsive) noise affecting a bandpass signal.
Figure 94:
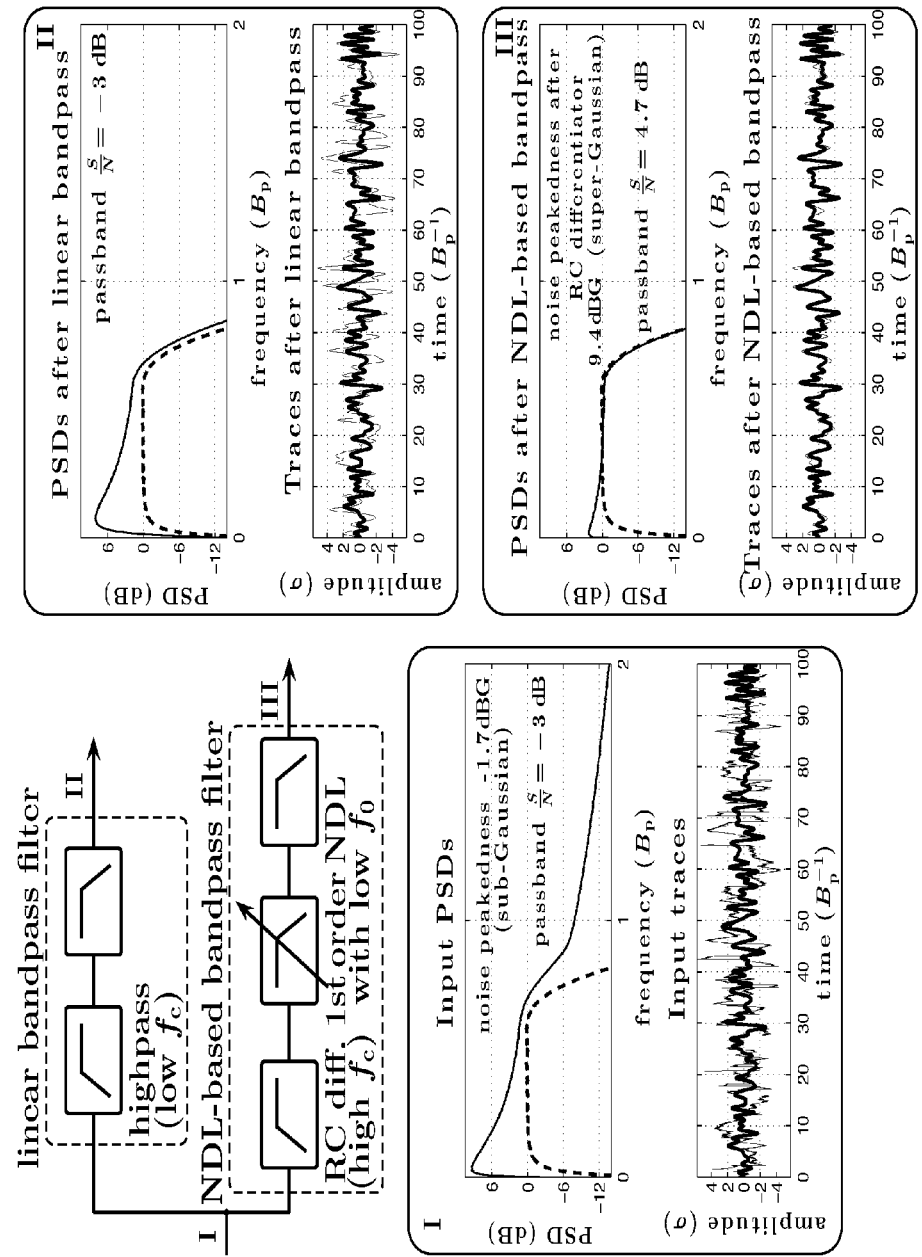
FIG. 94. Illustrative example of using an alternative improved NDL-based bandpass filter to mitigate sub-Gaussian (non-impulsive) noise affecting a bandpass signal.

In the examples of FIG. 93 and FIG. 94, a bandpass signal adjacent to the zero frequency is affected by a sub-Gaussian (−1.7 dBG peakedness) noise which is a mixture of a band-limited thermal noise and a band-limited $1/f^2$ Brownian noise (in particular, 'asynchronous random walk' where the spatial increment and the time increment are obtained separately).

Since the noise is sub-Gaussian (non-impulsive), if the bandpass filter is constructed as a lowpass filter followed by a highpass filter, replacing the front end lowpass filter with an NDL does not offer any improvement in the passband SNR.

Likewise, since the 1st order highpass filter with some cutoff frequency may be viewed as a differentiator followed by the 1st order lowpass filter with the same cutoff frequency, if the bandpass filter is constructed as a highpass filter with low cutoff frequency followed by a lowpass filter with relatively high cutoff frequency, the peakedness of the output of the highpass stage is low, and replacing the lowpass filter with an NDL still does not offer noticeable improvement in the passband SNR.

If, however, the highpass stage is a 1st order highpass filter with a relatively high cutoff frequency (a differentiator), such a stage essentially differentiates the signal+noise mixture and the interference becomes super-Gaussian (9.4 dBG peakedness in the examples of FIG. 93 and FIG. 94). Then an NDL-based filter (an NDL-based stage followed by a low cutoff frequency 1st order lowpass filter (RC integrator) in FIG. 93, or a low initial frequency 1st order NDL followed by a linear lowpass stage in FIG. 94) effectively suppresses the impulsive interference, increasing the passband SNR to 4.5 dB in FIG. 93, and to 4.7 dB in FIG. 94.

In FIG. 93 and FIG. 94, the dashed lines in the PSD plots, and the thick lines in the time domain plots show, for comparison, the PSD and the time domain traces of the signal of interest.

If the Shannon formula (Shannon [36]) is used to calculate the capacity of a communication channel, the passband SNR increase from −3 dB to 4.5 dB (linear bandpass filter vs. NDL-based bandpass filter in FIG. 93) results in a 230% increase in the channel capacity, and the passband SNR increase from −3 dB to 4.7 dB (linear bandpass filter vs. NDL-based bandpass filter in FIG. 94) results in a 238% increase in the channel capacity.

One skilled in the art will recognize that a qualitatively similar result to the examples of FIG. 93 and FIG. 94 may be obtained if the sub-Gaussian noise affecting the signal of interest is a 'square wave' signal from a digital clock.

13.2.8 Mitigation of Impulsive Noise in Communication Channels by Complex-Valued NDL-Based Filters When the condition $|z(t)-\zeta(t)| \le \alpha$ is satisfied, the response of an NDL circuit equals that of a lowpass filter with the NDL's initial parameters (that is, the parameters of the NDL in the limit of small $|z-\zeta|$). Otherwise, the nonlinear response of the NDL filter is such that it limits the magnitude of the outliers in the output signal. If an NDL circuit with appropriate initial bandwidth is deployed early in the signal chain of a receiver channel affected by non-Gaussian impulsive noise, it may be shown that there exists such resolution parameter α that maximizes signal-to-noise ratio and improves the quality of the channel. The simplified examples shown in FIG. 95 through FIG. 97 illustrate this statement.

Figure 95:
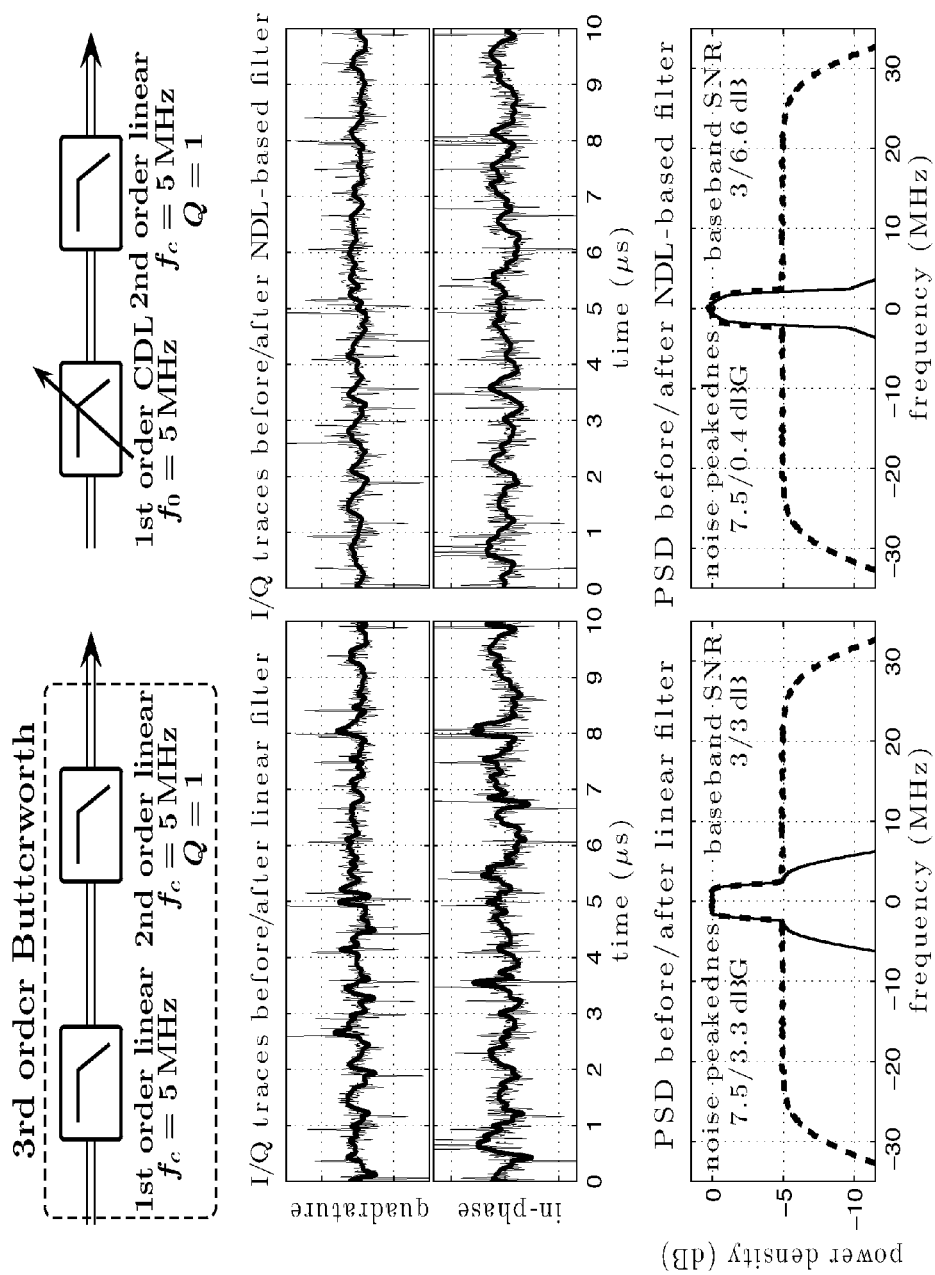
FIG. 95. Impulsive noise mitigation in communication channel by an NDL. The 3rd order NDL-based filter is a 1st order CDL followed by a 2nd order linear filter.
Figure 96:
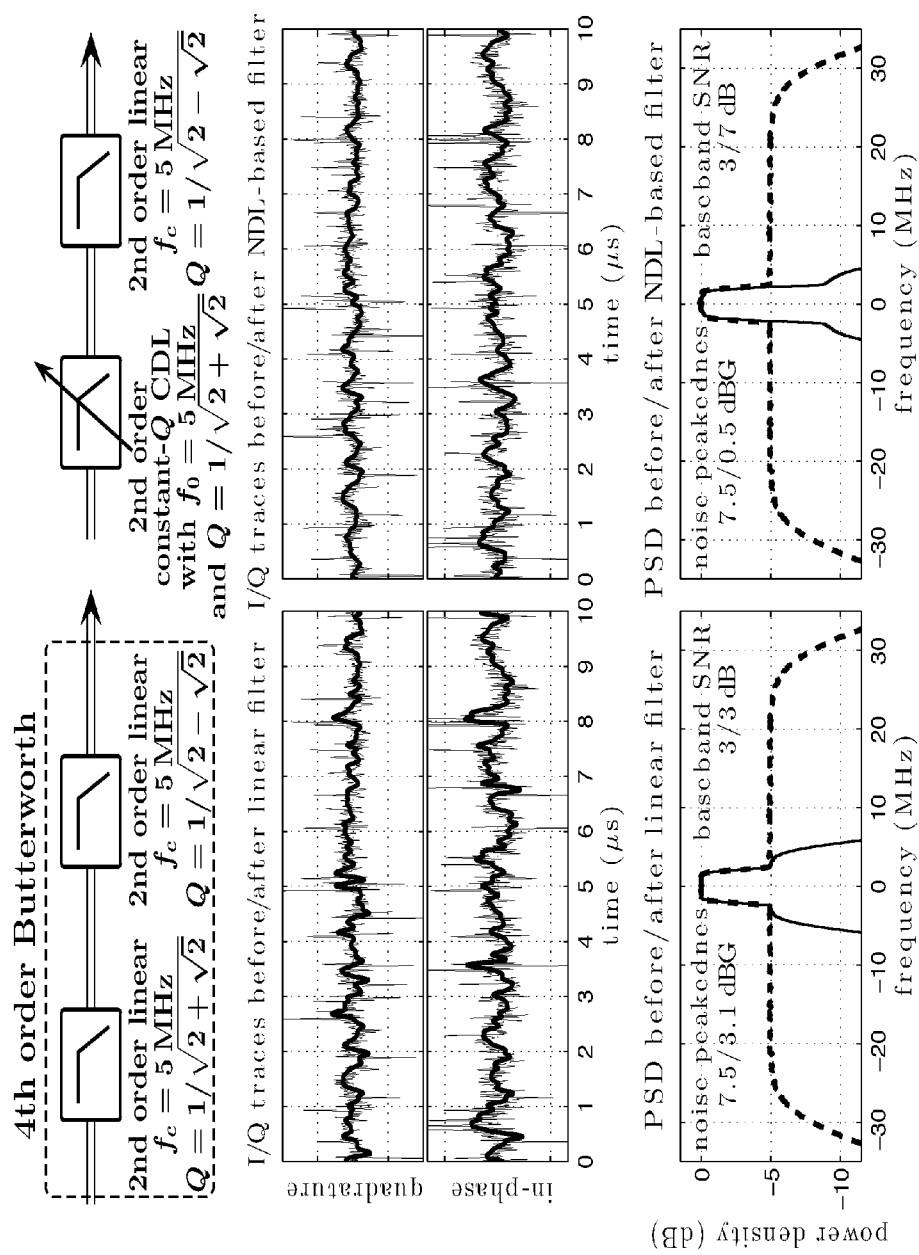
FIG. 96. Impulsive noise mitigation in communication channel by an NDL. The 4th order NDL-based filter is a 2nd order CDL followed by a 2nd order linear filter.
Figure 97:
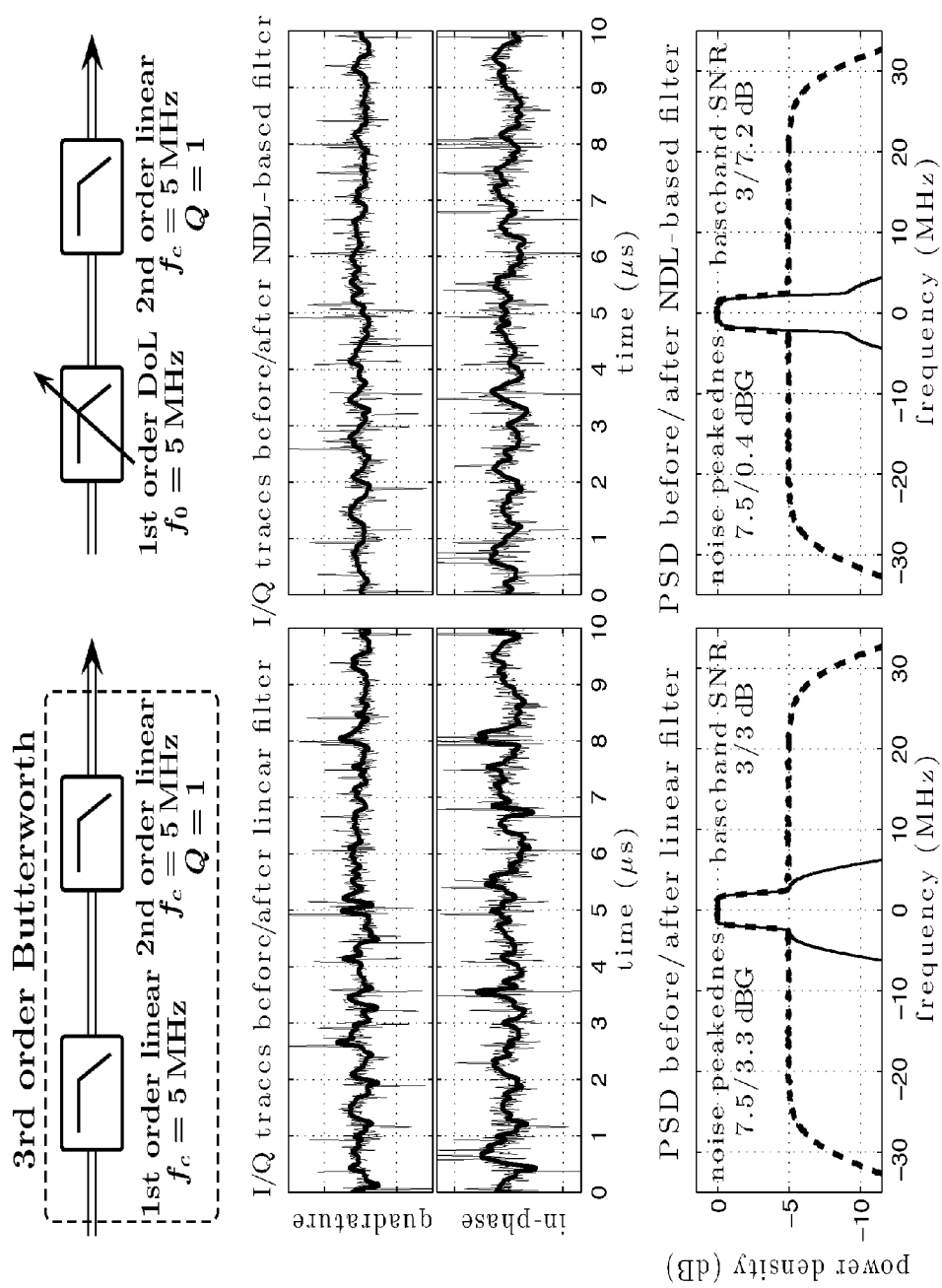
FIG. 97. Impulsive noise mitigation in communication channel by an NDL. The 3rd order NDL-based filter is a 1st order DoL ($\beta=1$ in equation (38)) followed by a 2nd order linear filter.

In FIG. 95 through FIG. 97, the dashed lines in the frequency domain panels, and the thin black lines in the time domain panels show the incoming signal-plus-noise mixture, for both time (separately for the in-phase and the quadrature (I/Q) traces) and frequency domains. The incoming signal represents a communication signal with the total bandwidth of 5 MHz, affected by a bandlimited mixture of thermal (Gaussian) and white impulsive noises, with the total noise peakedness of 7.5 dBc. The signal-to-noise ratio in the baseband is 3 dB, and the bandwidth of the noise is an order of magnitude greater than the channel bandwidth.

The incoming signal is filtered by (i) the linear filters shown at the top left of the figures and (ii) the NDL-based circuits (shown at the top right of the figures) with appropriately chosen resolution parameters. The filtered signals are shown by the solid lines in the frequency domain plots, and by the thick black lines in the time domain plots. Note that the linear filters are just the NDL-based circuits in the limit of a large resolution parameter.

The NDL-based filters are a 1st order CDL (FIG. 95) and a 1st order DoL with $\beta=1$ (FIG. 97) followed by a 2nd order linear filter with Q=1, and a 2nd order CDL with $$Q = 1 / \sqrt{2 + \sqrt{2}}$$

(FIG. 96) followed by a 2nd order linear filter with $$Q = 1 / \sqrt{2 - \sqrt{2}}.$$

As may be seen in the left-hand panels, the linear filters do not affect the baseband signal-to-noise ratio, as they only reduce the power of the noise outside of the channel. Also, the noise remains relatively impulsive (3.3 dBG for the 3rd order filters, and 3.1 dBG for the 4th order filter), as may be seen in the upper panels on the left showing the in-phase/quadrature (I/Q) time domain traces. On the other hand, the NDL-based circuits (the right-hand panels) improve the signal-to-noise ratio in the baseband (by 3.6 to 4.2 dB), effectively suppressing the impulsive component of the noise and significantly reducing the noise peakedness. By comparing the black lines in the time domain panels of the figures, for the linear and the NDL-based circuits, one may see how the NDL-based circuits remove the impulsive noise by "trimming" the outliers while following the narrower-bandwidth trend.

The peakedness of the complex-valued noise in FIG. 95 through FIG. 97 is computed as $$K_{dBG}(z) = 10 lg\left(\frac{\langle|z|^4\rangle - |\langle zz\rangle|^2}{2\langle|z|^2\rangle^2}\right), \quad (70)$$

where z(t) is the noise and the angular brackets denote time averaging (Hyvärinen et al. [16], for example). $K_{dBG}$ vanishes for a Gaussian distribution and attains positive and negative values for super- and sub-Gaussian distributions, respectively.

If the Shannon formula (Shannon [36]) is used to calculate the capacity of a communication channel, the SNR increase from 3 dB to 6.6 dB (FIG. 95) results in a 57% increase in the channel capacity, the SNR increase from 3 dB to 7 dB (FIG. 96) results in a 64% increase in the channel capacity, and the SNR increase from 3 dB to 7.2 dB (FIG. 97) results in a 67% increase.

Figure 98:
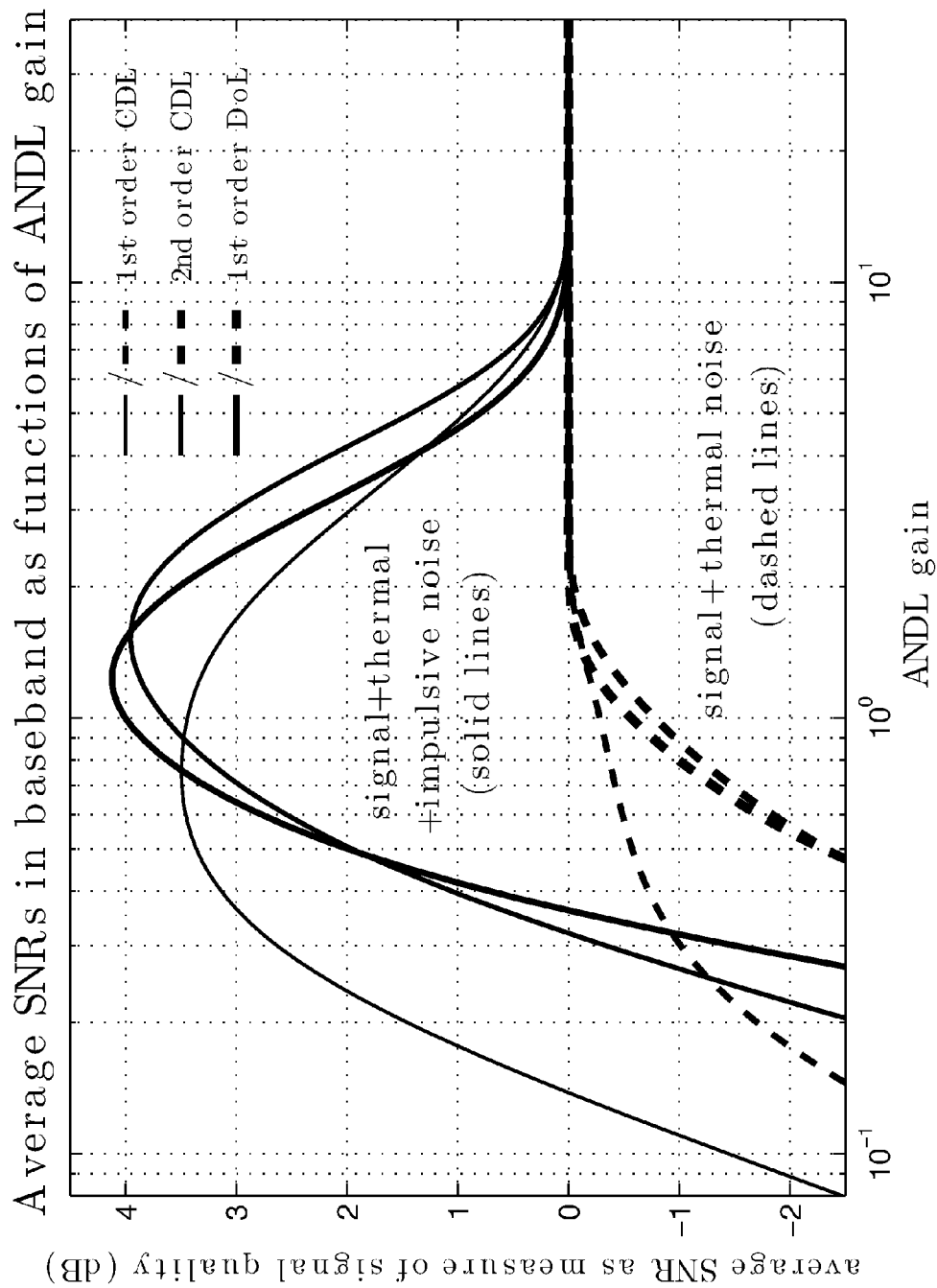
FIG. 98. Average baseband SNRs as functions of the ANDL gain for the examples shown in FIG. 95 through FIG. 97, where the respective NDLs are replaced by their adaptive versions according to the topology shown in FIG. 26, with zero quantile offset in the DcL.

FIG. 95 through FIG. 97 illustrate that if an NDL circuit (with sufficiently large initial bandwidth in order not to affect the baseband signal) is deployed early in the signal chain of a receiver channel affected by non-Gaussian impulsive noise, a properly chosen resolution parameter $\alpha$ maximizes SNR and improves the quality of the channel. Likewise, if an NDL circuit is an ANDL circuit (see, for example, FIG. 24 through FIG. 26), there exists such gain G that maximizes the SNR and improves the quality of the channel. FIG. 98 provides an illustration of the latter statement.

In the example of FIG. 98, the respective NDLs used in FIG. 95 through FIG. 97 are replaced by their adaptive versions according to the topology shown in FIG. 26, with zero quantile offset in the DcL, and the average baseband SNRs obtained for different gain values G are plotted as functions of the gain.

FIG. 98 shows that, when viewed as a function of the gain G, for any noise composition the channel quality measured by the average baseband SNR asymptotically approaches a constant value in the limit of large G, since in this limit the ANDLs become linear filters with their initial filter parameters. If the noise is purely thermal (Gaussian), for sufficiently large values of G the average SNR monotonically increases while approaching this asymptotic value (dashed lines in the figure). If, however, the total noise is impulsive and contains relatively short duration "bursts" of relatively high power, the average SNR exhibits an absolute maximum at some finite value of the gain (solid lines). One may see in this particular example that, in the case of the ANDL filter based on the 2nd order CDL (see FIG. 96), a single gain setting of about 2 (that provides the value for the resolution parameter $\alpha$ approximately equal to twice the median of the magnitude of the difference signal) ensures both the linear behavior of the ANDL when the noise is Gaussian (resulting in the asymptotic value of the baseband SNR), and a close to maximum increase in the baseband SNR for the impulsive noise mixture.

One may also see in FIG. 98 that the 1st order DoL offers an overall better performance in comparison with the 1st order CDL.

13.3 Mitigation of Inter- and/or Adjacent-Channel Interference

NDLs may help to mitigate interchannel and/or adjacent-channel interference, the problems that are becoming increasingly prevalent in the modern communications industry, caused by the wireless spectrum turning into a hot commodity.

Figure 99:
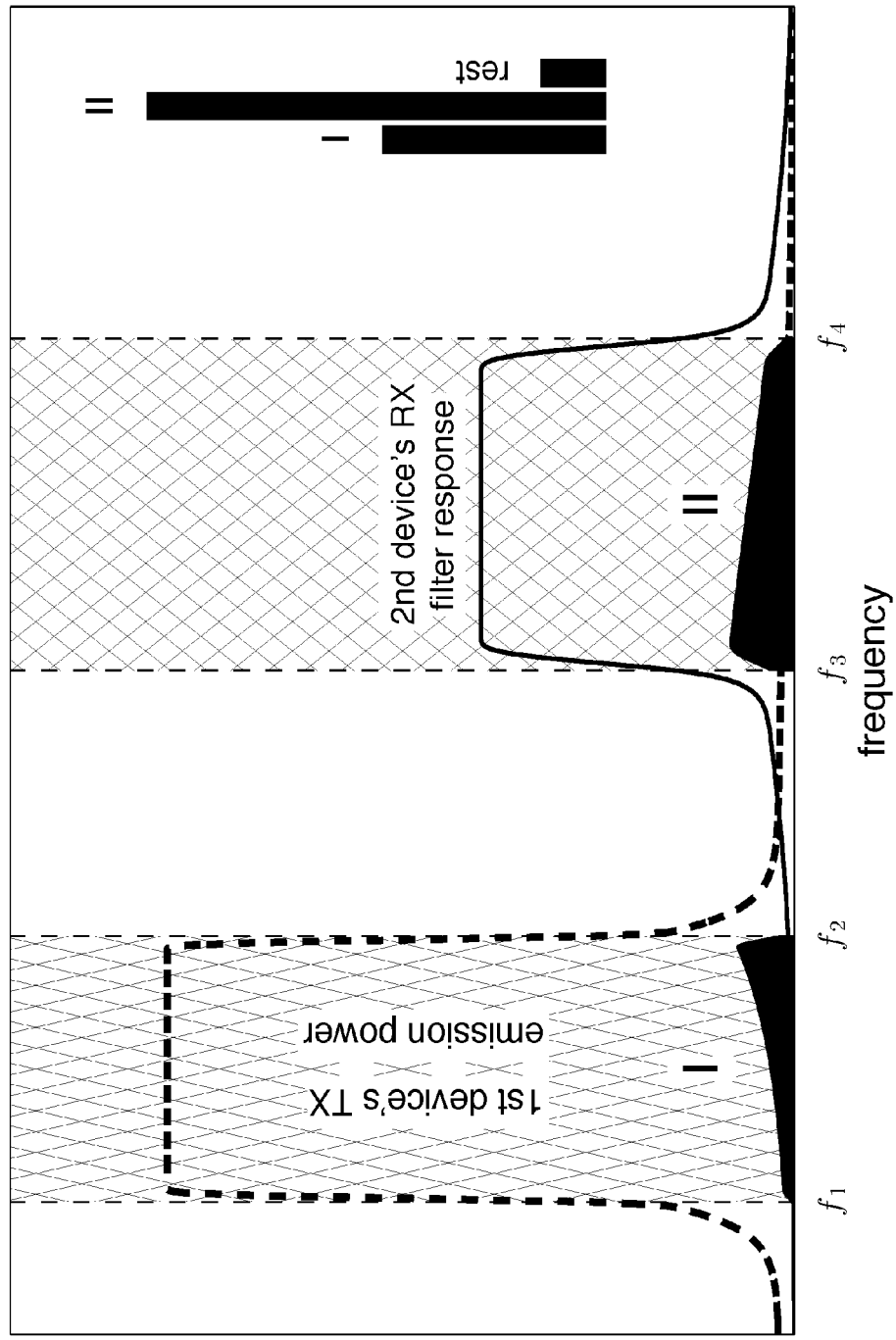
FIG. 99. Qualitative illustration of different contributions into the interference which the receiver (RX) of a 2nd device experiences from the transmitter (TX) of a 1st device.

FIG. 99 provides a qualitative illustration of different contributions into the interference which the receiver (RX) of a 2nd device experiences from the transmitter (TX) of a 1st device. Since real time 'brick-wall' filters are not physically realizable as they have infinite latency (i.e. their compact support in the frequency domain forces their time responses not to have compact support, meaning that they are ever-lasting) and infinite order (i.e. their responses cannot be expressed as a linear differential equation with a finite sum), the TX emissions 'leak' outside of the nominal (allocated) passband of the TX channel [$f_1$, $f^2$] as out-of-band (OOB) emissions. Likewise, the RX filter has non-zero response outside of its nominal (allocated) passband [$f_3$, $f_4$]. As a result, there is non-zero interference from the TX into the RX.

The total power of the interference may be broken into three parts. Part I is the power of the TX signal in its nominal band [$f_1$, $f^2$], weighted by the response of the RX filter in this band. Part II is the TX OOB emissions in the RX nominal band [$f_3$, $f_4$], weighted by the response of the RX filter in this band. The rest of the interference power comes from the TX emissions outside of the nominal bands of both channels, and may be normally ignored in practice since in those frequency regions both the emitted TX power and the RX filter response are relatively small.

While part I of the interference contributes into the total power in the RX channel and may cause overload (as, for example, LightSquared emissions may cause overload in GPS receivers (FAA [1])), it does not normally degrade the quality of the communications in the RX since the frequency content of this part of the interference lies outside of the RX channel. Part II, however, in addition to contributing to overload, also causes degradation in the RX communication signal as it raises the noise floor in the RX channel.

Theoretical (Nikitin [29, 24]) as well as the experimental (Nikitin et al. [28]) data show that the TX OOB interference in the RX channel (part II of the interference in FIG. 99) is likely to appear impulsive under a wide range of conditions, especially if intermodulation in the TX is insignificant. Thus, as also shown by Nikitin [29, 24], Nikitin et al. [28], while this interference may not be reduced by linear filtering in the RX channel, it may be effectively mitigated by such nonlinear filters as the NDLs disclosed in the present invention.

The impulsive nature of the OOB interference provides an opportunity to reduce its power. Since the apparent peakedness for a given transmitter depends on the characteristics of the receiver, in particular its bandwidth, an effective approach to mitigating the out-of-band interference may be as follows: (i) allow the initial stage of the receiver to have a relatively large bandwidth so that the transients are not excessively broadened and the OOB interference remains highly impulsive, then (ii) implement the final reduction of the bandwidth to within the specifications through nonlinear means, such as the NDL filters described in the present invention.

Figure 100:
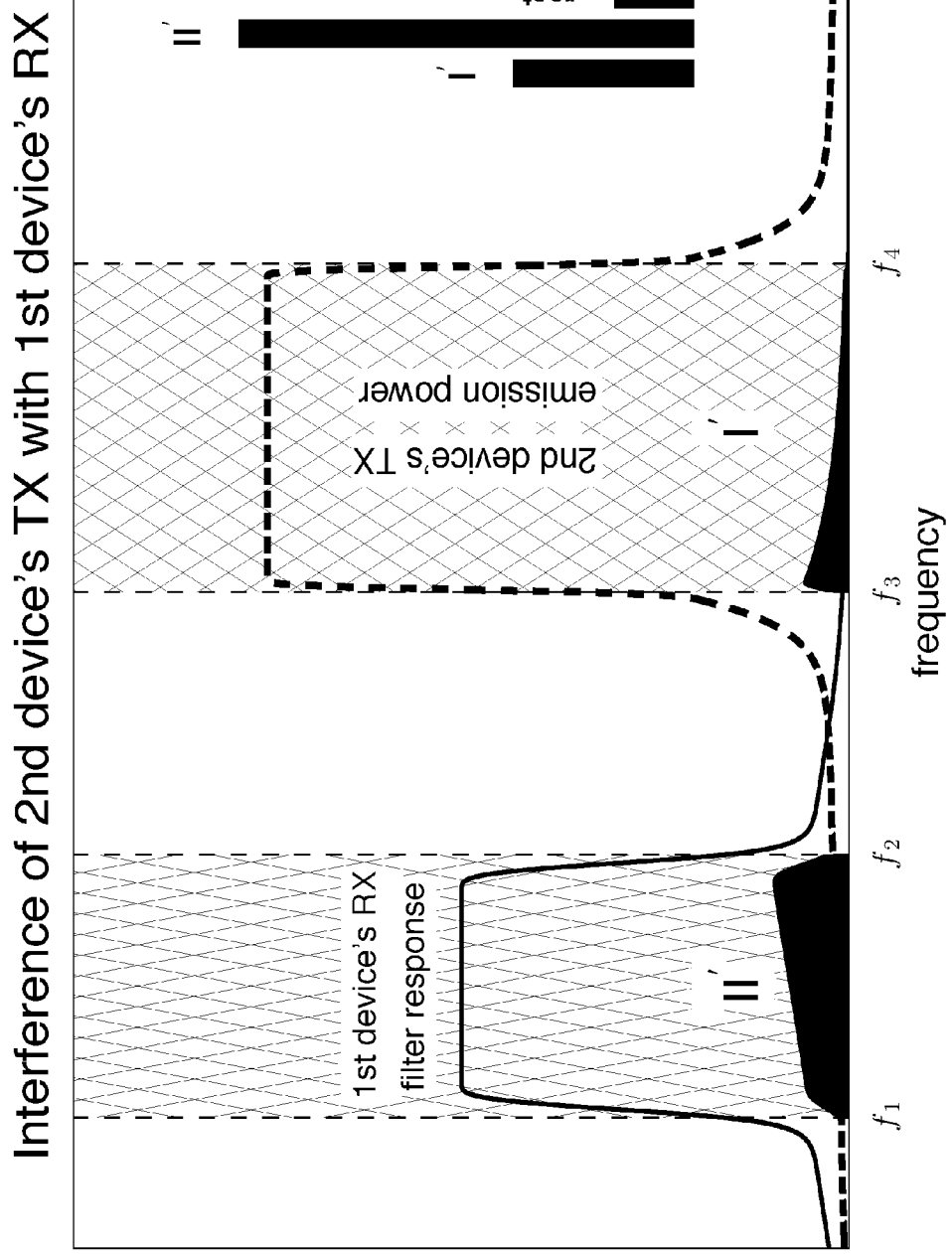
FIG. 100. Similar illustration of different contributions into the interference which the receiver of the 1st device experiences from the transmitter of the 2nd device.

FIG. 100 provides a similar illustration of different contributions into the interference which the receiver of the 1st device experiences from the transmitter of the 2nd device. The impulsive part of the interference (II') may be mitigated by the NDL filters properly deployed in the receiver channel.

It should be apparent to those skilled in the art that in the design, testing and implementation of communication devices operating in the co-interfering bands the method and apparatus for tests of normality and for detection and quantification of impulsive interference disclosed in Sections 7 and 14 may be used to assess the composition and properties of the interference, including its peakedness and the spectral composition of its impulsive component.

Figure 101:
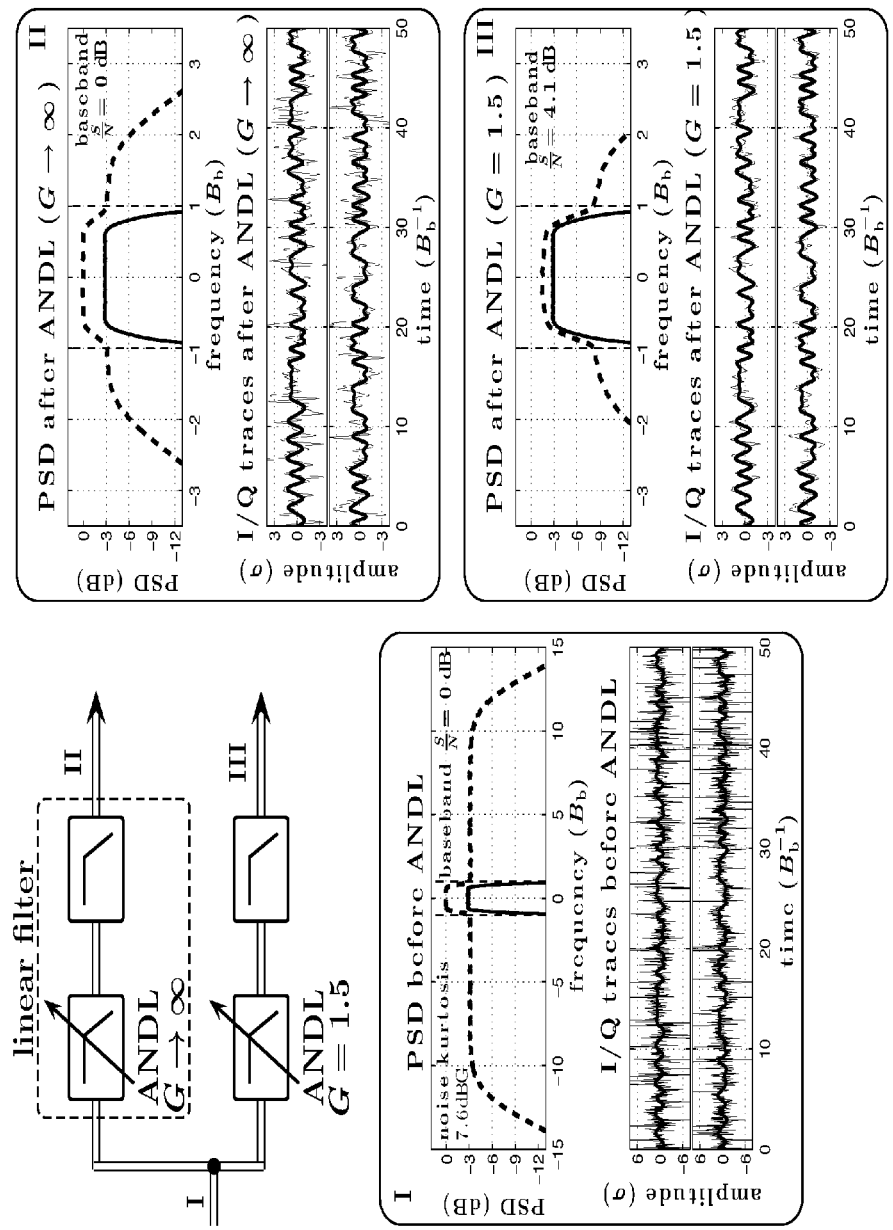
FIG. 101. Input and outputs of an ANDL for $G\to\infty$ and $G=1.5$ for a model signal. The ANDL is the 4th order NDL-based filter of FIG. 59, where the NDL is the 2nd order adaptive CDL according to the topology shown in FIG. 26, with zero quantile offset in the DcL.

FIG. 101 shows the input and outputs of an ANDL for G→∞ and G=1.5 for a model signal. The ANDL is the 4th order NDL-based filter of FIG. 59, where the NDL is a 2nd order adaptive CDL according to the topology shown in FIG. 26, with the pole quality factor $$1\big/\sqrt{2+\sqrt{2}}$$

and zero quantile offset in the DcL, and the pole quality factor of the 2nd order linear filter is $$1\big/\sqrt{2-\sqrt{2}}.$$

In FIG. 101, the dashed lines show the PSDs, and the thin black lines show the time domain traces of the input and the outputs of an ANDL filter applied to a model signal+noise mixture. The outputs of the ANDL are shown for the cases of a large gain (G→∞, panel II), and the gain G=1.5 that maximizes the SNR in the baseband (panel III). For reference, the respective PSDs for the signal without noise are shown by the solid lines, and the time domain traces for the signal without noise are shown by the thick black lines.

In the limit of a large gain (G→∞) the ANDL filter used in the example of FIG. 101 is a linear 4th order lowpass Butterworth filter with the 3 dB roll-off frequency $2B_b$. As may be seen in panel II, this filter does not affect the SNR in the baseband of interest (it remains 0 dB) as it only reduces the higher-frequency noise. If we start reducing the gain G, "trimming" of the short-duration, high-power outliers comes into effect before the reduction in the gain (and, as a consequence, reduction in the resolution parameter a) affects the narrower-bandwidth trend in the signal. If the noise contains such outliers (that is, the noise is impulsive), the value $G=G_{max}$ (G=1.5 in this example) produces the maximum in an appropriate measure of the signal quality, for example, in the baseband SNR.

This may be seen in panel III of FIG. 101. The time domain traces show that the ANDL with G=1.5 reduces the impulsive noise by "trimming" the outliers while following the narrower-bandwidth trend in the signal, and the PSD plot shows that the noise floor is reduced throughout the full frequency range (including the baseband), leading to the 4.1 dB increase in the baseband SNR.

If the Shannon formula (Shannon [36]) is used to calculate the capacity of a communication channel, the baseband SNR increase from 0 dB to 4.1 dB (linear vs. NDL-based filter) results in an 84% increase in the channel capacity.

14 Method and Apparatus for Detection and Quantification of Impulsive Component of Interference As discussed in Sections 12 and 13.2.6, improved NDL-based filters comprising linear front-end filters to suppress the non-impulsive component of the interference may greatly increase the effectiveness of the interference mitigation when the interfering signal comprises a mixture of impulsive and non-impulsive components.

To design an effective analog linear front-end filter for such an improved NDL-based filter, one would need to know the spectral composition of the impulsive component of the interference, in particular, in its relation to the total spectral composition of the interfering mixture. This knowledge may be obtained according to the following recipe.

In the limit of a large resolution parameter (α→∞) an NDL is a linear filter characterized by the NDL's initial filter parameters. By choosing the bandwidth of this filter large enough to include most of the frequency range of the interference z(t), we may ensure that the temporal as well as the spectral characteristics of the output ζ(t) of the filter are close to those of the input z(t), especially if the group delay of the filter is approximately flat. If we start reducing α, "trimming" of the short-duration, high-power outliers starts coming into effect, and the difference $\Delta_\alpha(t)=\zeta(t)-\zeta_\alpha(t)$ between the outputs of the NDL ($\zeta_\alpha$) and the respective linear filter ($\zeta$) may be mostly due to the presence of the impulsive component.

By choosing a finite, but not too small $\alpha$ (e.g. an order of magnitude of the IQR of the NDL's difference signal), the spectral characteristics of the difference $\Delta_\alpha(t)$ may be made indicative of the spectral characteristics of the impulsive component of the interference. This knowledge may then be used to design the linear front-end filter for an improved NDL-based filter for effective mitigation of this component.

Figure 102:
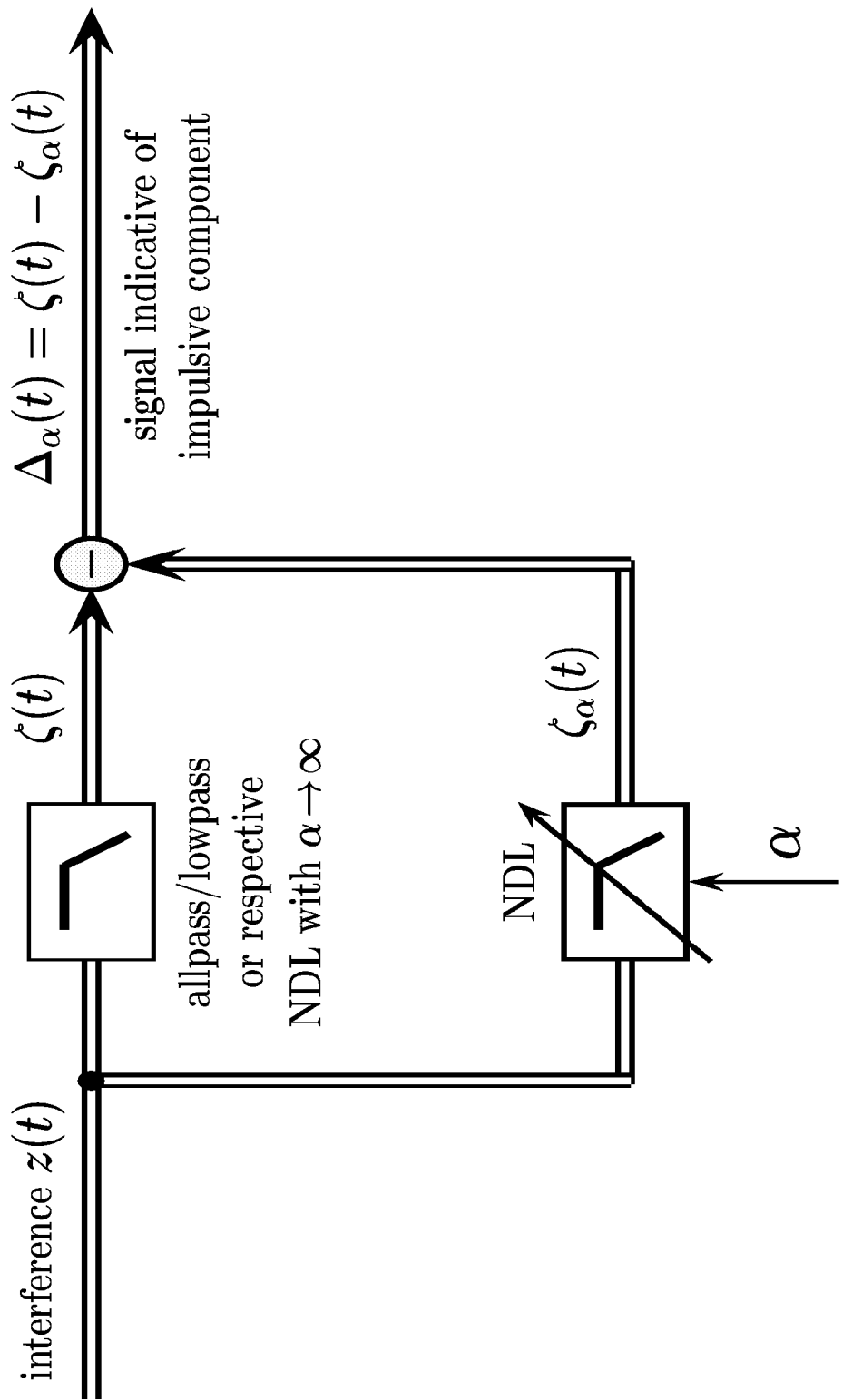
FIG. 102. Schematic illustration of obtaining a difference signal $\Delta_\alpha(t)$ that is indicative of the impulsive component of the incoming interference $z(t)$.

FIG. 102 provides a schematic illustration of obtaining a difference signal $\Delta_\alpha(t)$ that is indicative of the impulsive component of the incoming interference z(t). One skilled in the art will recognize that instead of an allpass or lowpass filter shown in the figure, a different filter (e.g. highpass or bandpass) may be used if the initial response of the respective NDL corresponds to the passband of the interference in question.

15 Improvements in Properties of Electronic Devices

Figure 103:
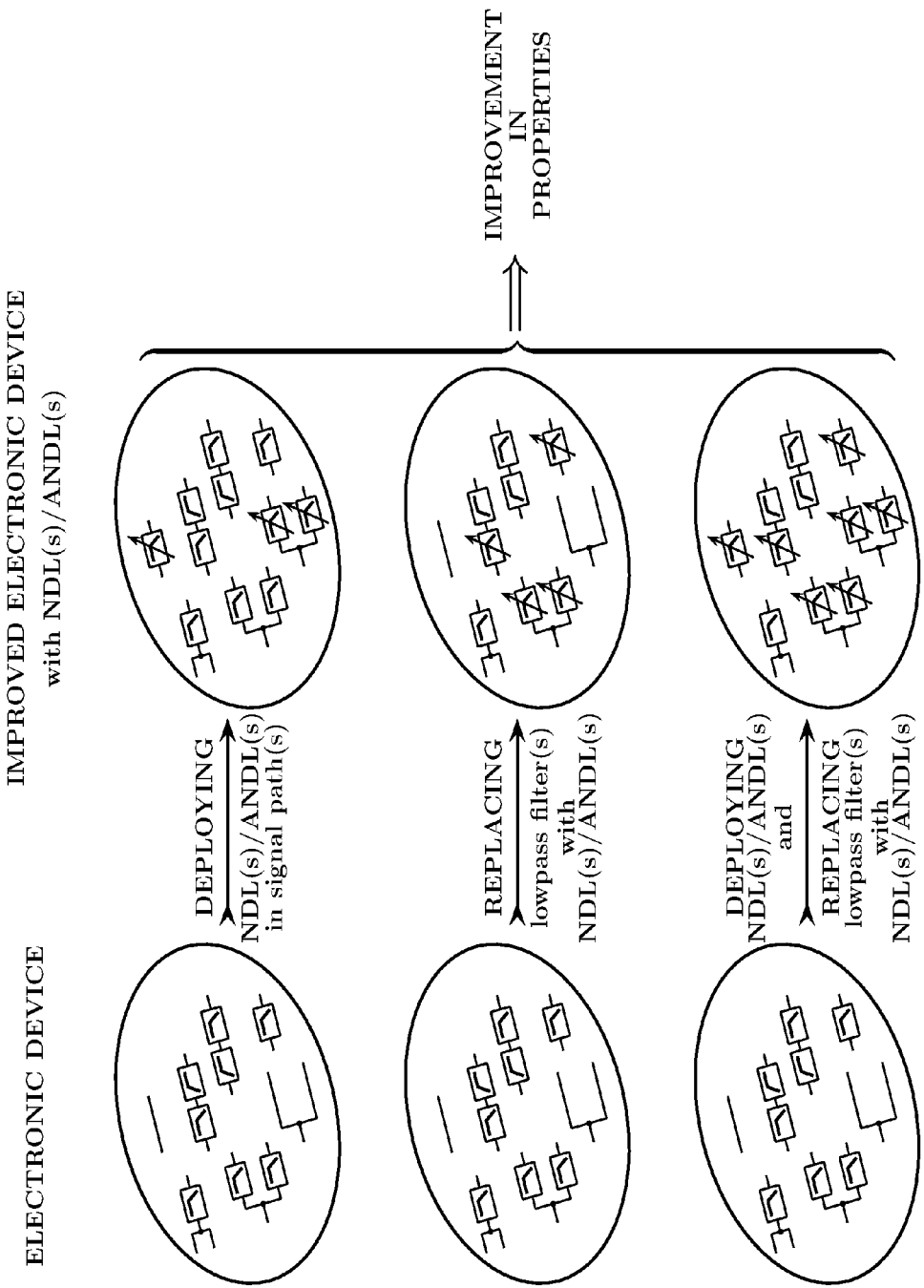
FIG. 103. Schematic illustration of improving properties of electronic devices by deploying NDL(s) in signal path(s), and/or by replacing linear filter(s) with NDL(s).

By improving mitigation of various types of interference affecting the signal(s) of interest, the novel NDL-based filtering method and apparatus of the present invention enable improvements in the overall properties of electronic devices including, but not limited to, improvements in performance, reduction in size, weight, cost, and power consumption, and, in particular for wireless devices, improvements in spectrum usage efficiency. The overall improvement (e.g. maximum value or lowest cost) for a given device may be achieved through optimization based on the relationship among various device requirements. FIG. 103 provides a schematic illustration of improving properties of electronic devices by deploying NDL(s) in signal path(s), and/or by replacing linear filter(s) with NDL(s).

Even though in FIG. 103 and the subsequent figures "replacing" is shown separately and in addition to "deploying," one will realize that in all these examples "to replace" may mean "to deploy instead of, in place of, or as a substitution for", and that "replacement" is "deployment" with a specific narrower meaning.

An electronic device may be characterized by its various properties. For convenience, these properties may be classified, according to their shared qualities, as physical, commercial, and operational properties.

Physical properties may include size, dimensions, form factor, weight, bill of materials, circuit complexity, component count, and any combinations of the physical properties, and improving physical properties may comprise reducing the device size, dimensions, form factor, weight, bill of materials, circuit complexity, component count, and achieving any combinations of these improvements.

Commercial properties may include cost of components, cost of materials, total cost, value, and any combinations of the commercial properties, and improving commercial properties may comprise reducing the cost of components and/or materials, reducing the total cost, increasing the device value (e.g. benefits per cost), and achieving any combinations of these improvements.

Operational properties may include performance specifications, communication channel capacity, power consumption, battery size, reliability, and any combinations of the operational properties, and improving operational properties may comprise increasing the performance specifications, increasing the channel capacity, reducing the power consumption, increasing the battery size, increasing reliability, and achieving any combinations of these improvements.

It should be obvious that such classification of various properties of a device is by no means exhaustive and/or unambiguous, and is used only for convenience of generalization. A single property and/or its improvements may simultaneously belong to more than one property/improvement group, comprise a combination of various properties and/or improvements, or be a part of such a combination. For example, a subjective commercial property "value" may be viewed as "benefits per cost," and thus may include an operational property ("benefits"). Or better performance (improvements in operational properties) may lead to a better service (improvements in commercial properties).

Figure 104:
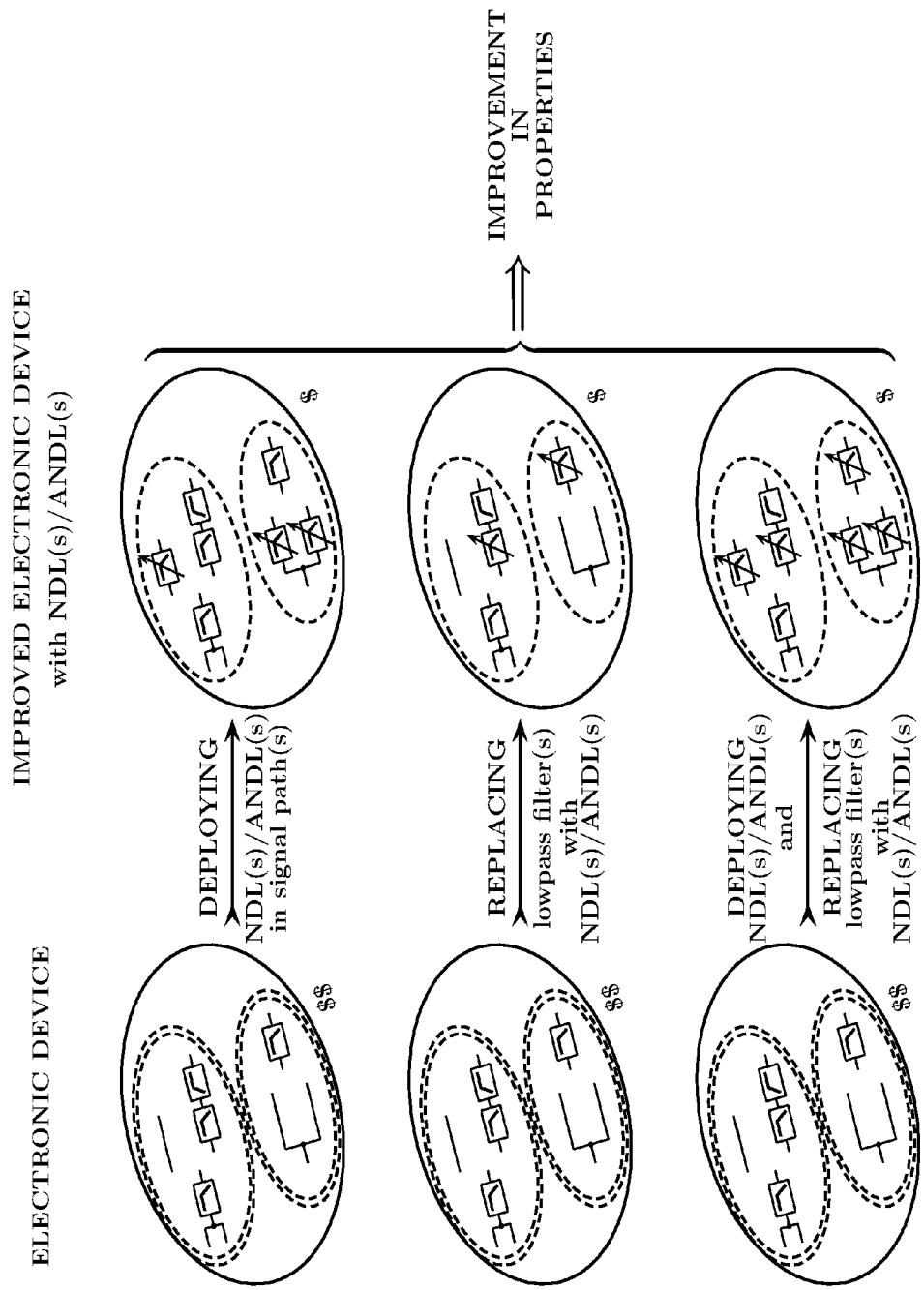
FIG. 104. Schematic illustration of improving properties of electronic devices by deploying NDL(s) in signal path(s), and/or by replacing linear filter(s) with NDL(s), with emphasis on the reduction in required shielding (dashed lines), cost of materials, and the total cost.

Increasingly high integration of multiple radios and high speed digital systems in a single device (e.g. a tablet or a laptop computer) leads to a significant platform noise that is generated by digital clocking and signaling technologies. This platform noise noticeably degrades the performance of the device and its components by reducing the quality of the signals of interest in the device. Shielding by conductive foil or paint is a typical means of reducing such noise. Deployment of NDLs in the signal paths of the device may provide a low cost enhancement and/or alternative to the electromagnetic shielding, leading to a decrease in the cost of materials and the total cost. FIG. 104 provides a schematic illustration of improving properties of electronic devices by deploying NDL(s) in signal path(s), and/or by replacing linear filter(s) with NDL(s), with emphasis on the reduction in required shielding (dashed lines), cost of materials, and the total cost.

The levels of the signals of interest may be elevated (for example, by increasing the power output of a transmitter) to compensate for increased interference. This elevation, however, results in an increase in the device power consumption. Active digital methods of interference reduction (e.g. controlling/managing protocols such as multiple access protocols, interference alignment and/or cancellation, or statistical mitigation) that estimate and cancel interference during data transmission also contribute to an increase in the power consumption, e.g. through an increase in the computational load. NDLs deployed in the signal paths of an electronic device may provide a low-cost means of interference mitigation, enabling reduction in the device power consumption through the reduction in the signal levels and/or in the computation load. For battery powered devices, reduction in power consumption leads to an increase in battery life.

Figure 105:
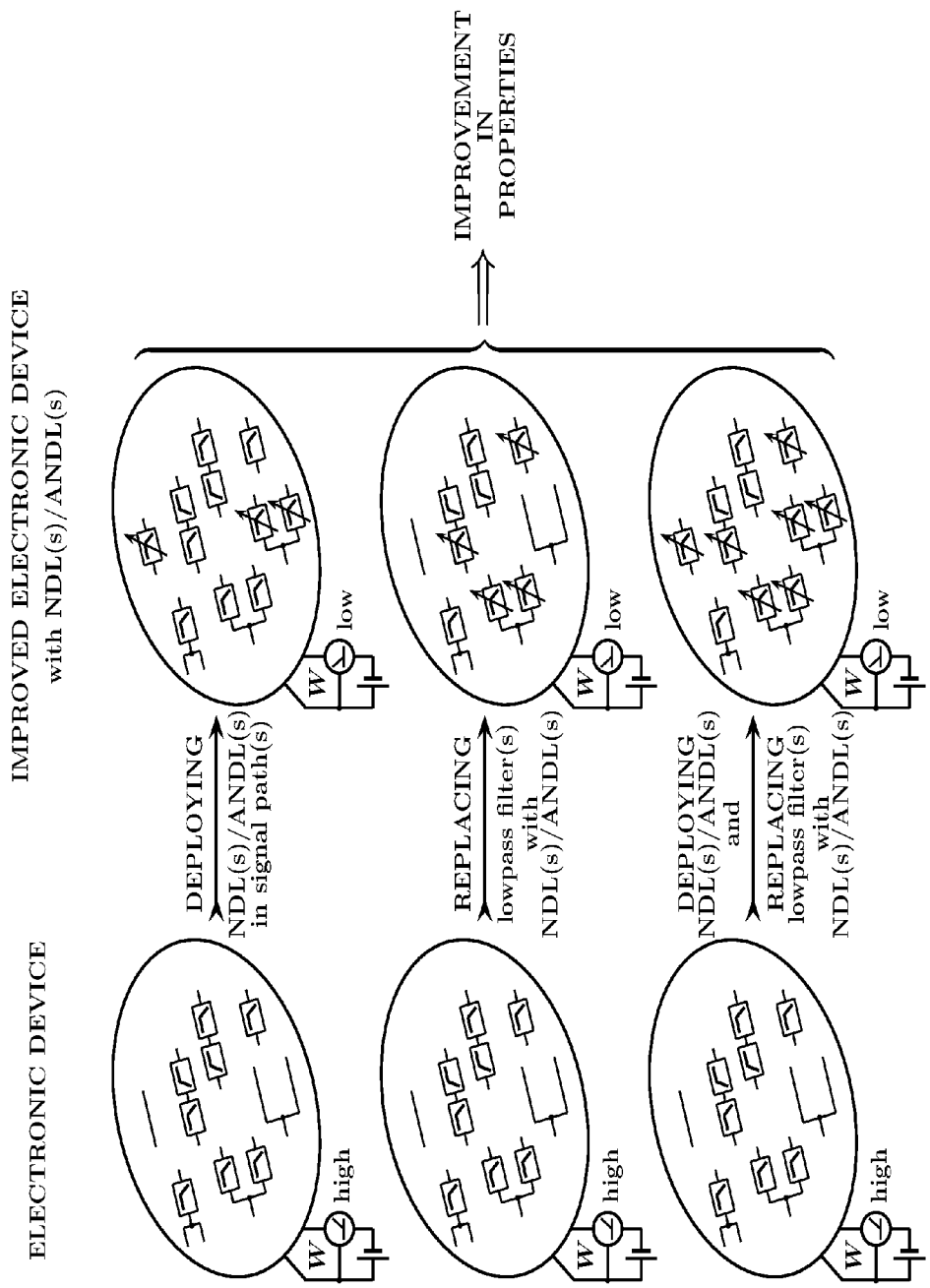
FIG. 105. Schematic illustration of improving properties of electronic devices by deploying NDL(s) in signal path(s), and/or by replacing linear filter(s) with NDL(s), with emphasis on the reduction in power consumption and/or increase in battery life.

By mitigating the impulsive noise problems (as both the emitted RFI and the electronic noise at the output terminals) caused by the switching currents of switched-mode power supplies (SMPS), NDLs may facilitate replacement of linear regulators by more efficient, smaller, lighter, and less expensive SMPS, which contributes to reduced power consumption. By suppressing high-amplitude transients (impulse noise), NDLs may facilitate replacing larger size, more expensive and power-hungry high resolution analog-to-digital converters (ADCs) by more economical delta-sigma ($\Delta\Sigma$) ADCs, reducing the overall power consumption. FIG. 105 provides a schematic illustration of improving properties of electronic devices by deploying NDL(s) in signal path(s), and/or by replacing linear filter(s) with NDL(s), with emphasis on the reduction in power consumption and/or increase in battery life.

Figure 106:
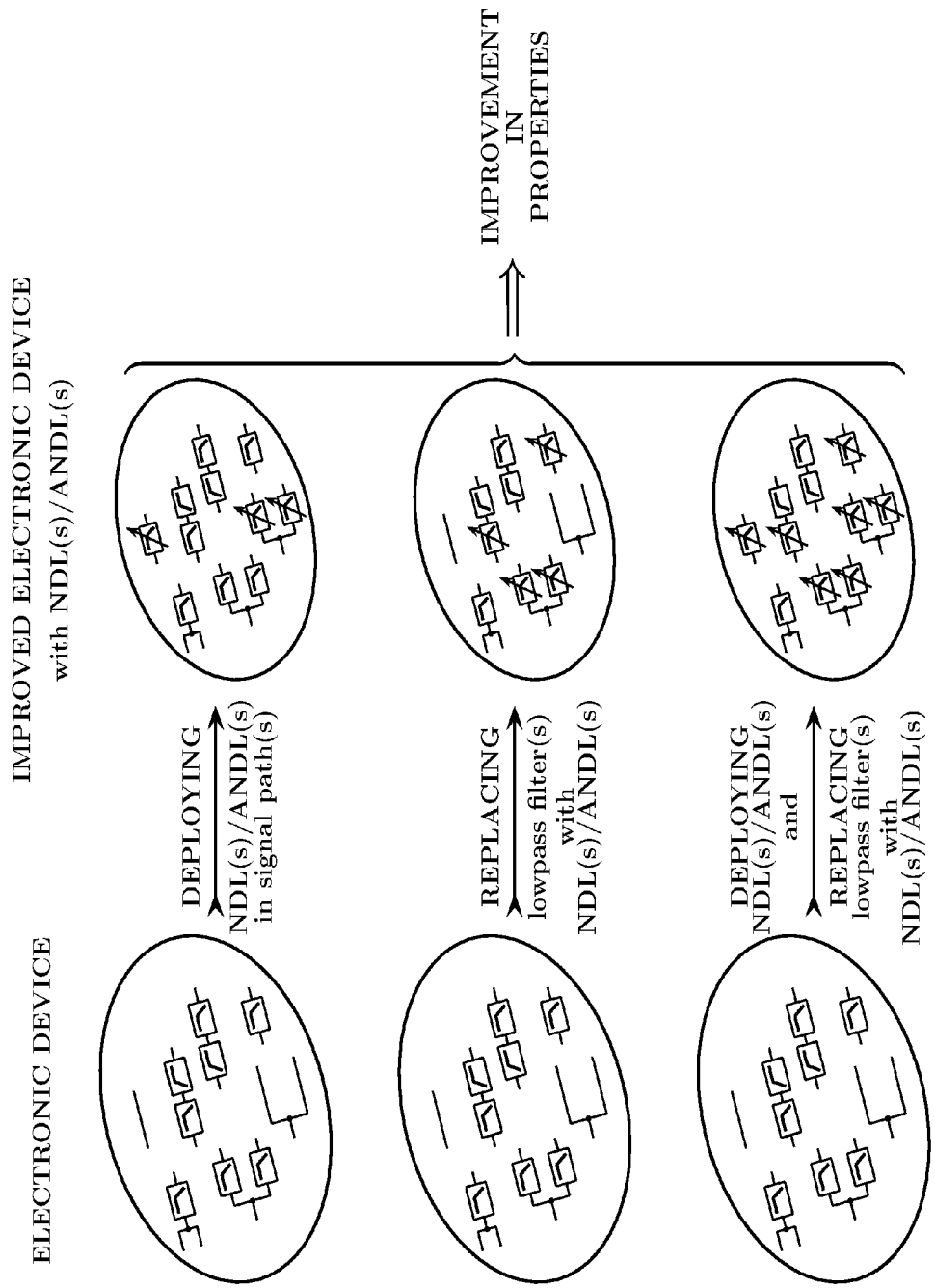
FIG. 106. Schematic illustration of improving properties of electronic devices by deploying NDL(s) in signal path(s), and/or by replacing linear filter(s) with NDL(s), with emphasis on the reduction in size, dimensions, and/or form factor.

Deployment of NDLs in a device may compensate for the increase in the platform noise caused by increased proximity of various components in the device, and may relax requirements on the layout, amount and location of shielding, and/or the size of and separation among transmit and receive antennas in the device. This may lead to a reduction in size, dimensions, and/or form factor of the device and its components. Through mitigation of various noise problems, NDLs may also contribute to a reduction in size, dimensions, and/or form factor of the device by facilitating the use of smaller components (e.g. facilitating the use of MEMS, and/or the use of $\Delta\Sigma$ ADCs instead of high resolution converters, and/or the use of SMPS instead of linear regulators). FIG. 106 provides a schematic illustration of improving properties of electronic devices by deploying NDL(s) in signal path(s), and/or by replacing linear filter(s) with NDL(s), with emphasis on the reduction in size, dimensions, and/or form factor.

Figure 107:
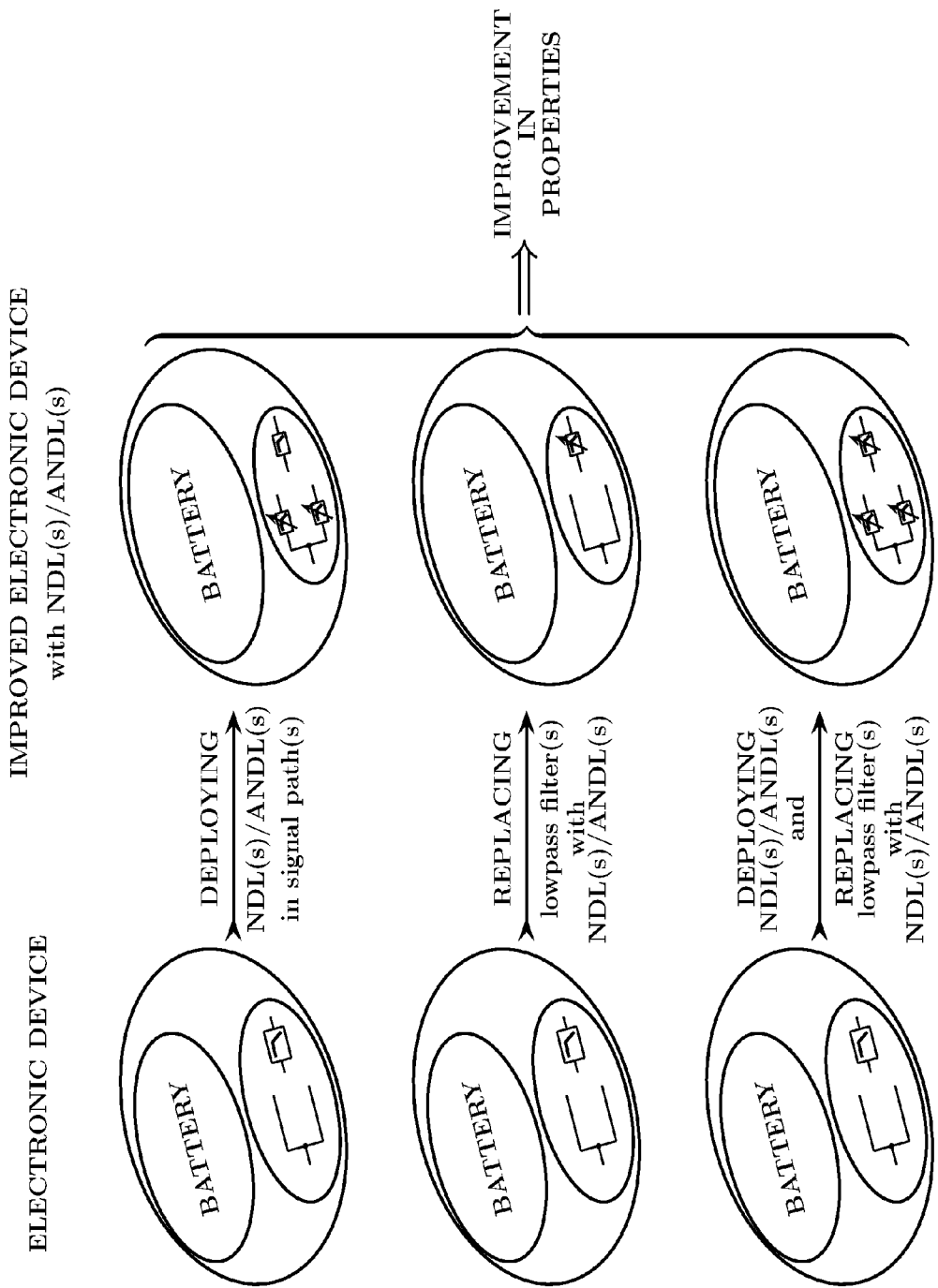
FIG. 107. Schematic illustration of improving properties of electronic devices by deploying NDL(s) in signal path(s), and/or by replacing linear filter(s) with NDL(s), with emphasis on the increase in battery size.

In a space-constrained battery powered device, reduction in size, dimensions, and/or form factor of the components of the device leaves more room for the battery. FIG. 107 provides a schematic illustration of improving properties of electronic devices by deploying NDL(s) in signal path(s), and/or by replacing linear filter(s) with NDL(s), with emphasis on the increase in battery size.

Multiple transmitters and receivers are increasingly combined in single devices, which produces mutual interference. A typical example is a smartphone equipped with cellular, WiFi, Bluetooth, and GPS receivers, or a mobile WiFi hotspot containing an HSDPA and/or LTE receiver and a WiFi transmitter operating concurrently in close physical proximity. This physical proximity, combined with a wide range of possible transmit and receive powers, creates a variety of challenging interference scenarios. This interference negatively affects the performance of the coexisting devices, and contributes to the increased size of a combined device. NDL-based mitigation of the interference may enable and/or improve coexistence of multiple devices, especially in a smaller form factor.

Figure 108:
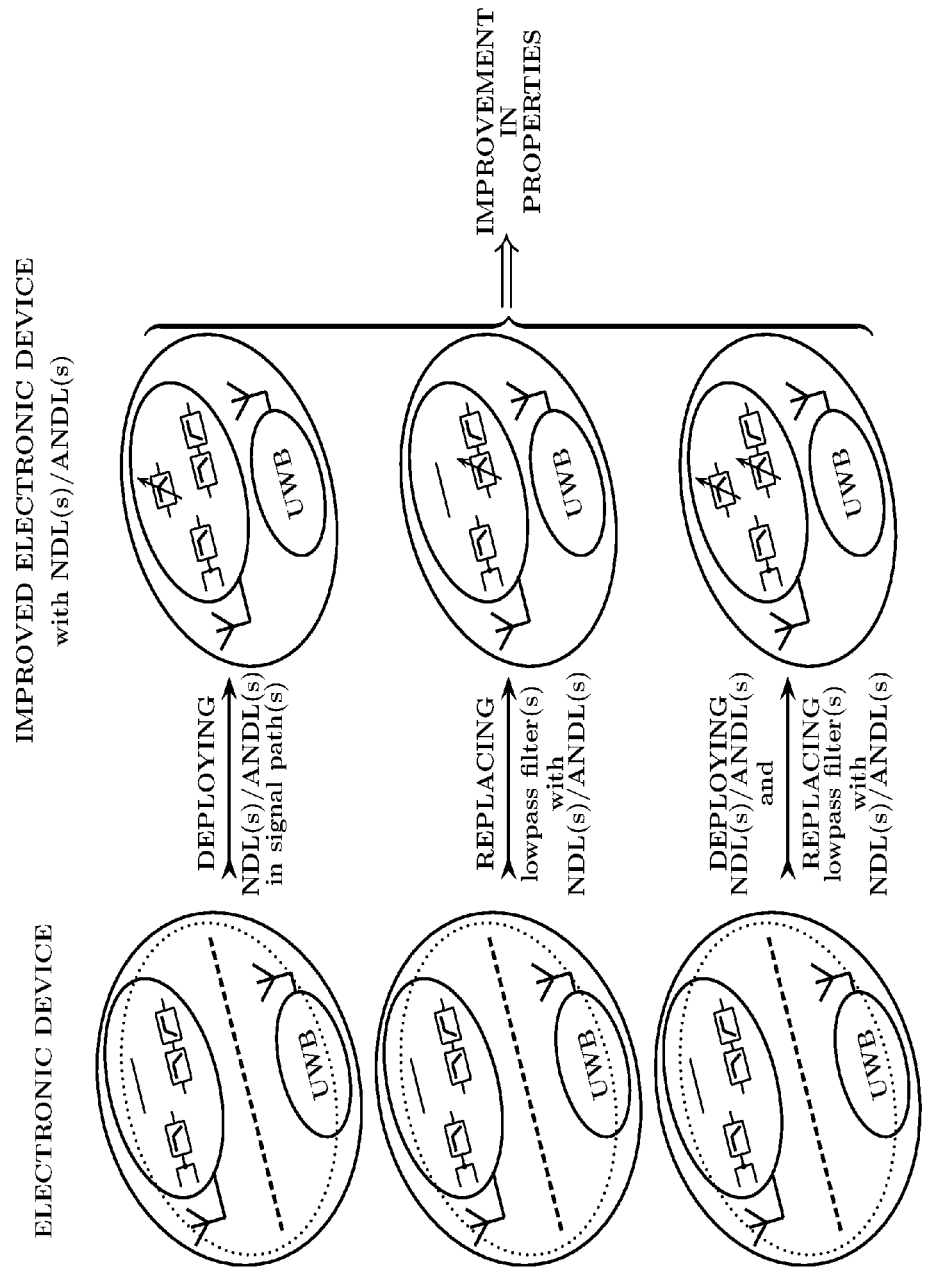
FIG. 108. Schematic illustration of improving properties of electronic devices by deploying NDL(s) in signal path(s), and/or by replacing linear filter(s) with NDL(s), with emphasis on enabling coexistence of multiple devices in a smaller form factor.

FIG. 108 provides a schematic illustration of improving properties of electronic devices by deploying NDL(s) in signal path(s), and/or by replacing linear filter(s) with NDL(s), with emphasis on enabling coexistence of multiple devices in a smaller form factor. This figure implies a particular example of a UWB device interfering with a narrowband communication system such as WLAN or a CDMA-based cellular system. A UWB device is seen by a narrowband receiver as a source of impulsive noise, which may be effectively suppressed by the NDL-based filtering. Such reduction in the UWB interference may enable and/or improve coexistence of the UWB and the narrowband devices in a smaller form factor.

Figure 109:
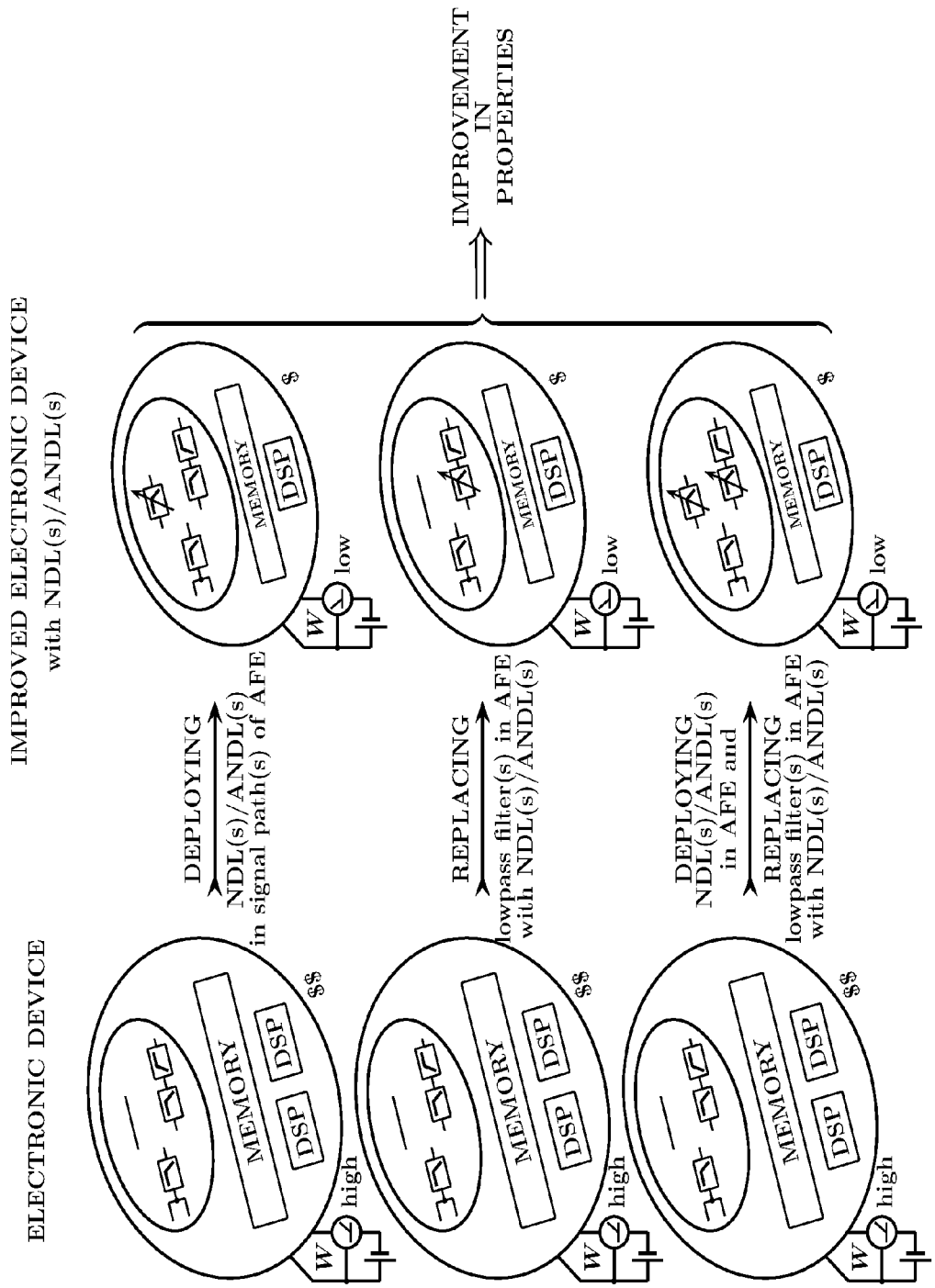
FIG. 109. Schematic illustration of improving properties of electronic devices by deploying NDL(s) in signal path(s), and/or by replacing linear filter(s) with NDL(s), with emphasis on the reduction in memory and DSP requirements, power consumption, size, dimensions, form factor, weight and cost.

Digital methods for reducing impulsive noise and artifacts typically involve non-real-time adaptive and non-adaptive nonlinear filtering, and digital nonlinear processing is computationally intensive. In addition, effective filtering of impulsive noise requires significant increase in the data bandwidth. This may lead to a "too much data" problem and to a dramatic increase in the computational load, that is, to an increase in memory and DSP requirements. This also contributes to the increase in power consumption, size, dimensions, form factor, weight and cost. Delegating the load of impulsive noise mitigation to real-time, inexpensive analog NDL-based filtering may greatly reduce these negative consequences of digital nonlinear processing. FIG. 109 provides a schematic illustration of improving properties of electronic devices by deploying NDL(s) in signal path(s), and/or by replacing linear filter(s) with NDL(s), with emphasis on the reduction in memory and DSP requirements, power consumption, size, dimensions, form factor, weight and cost.

Figure 110:
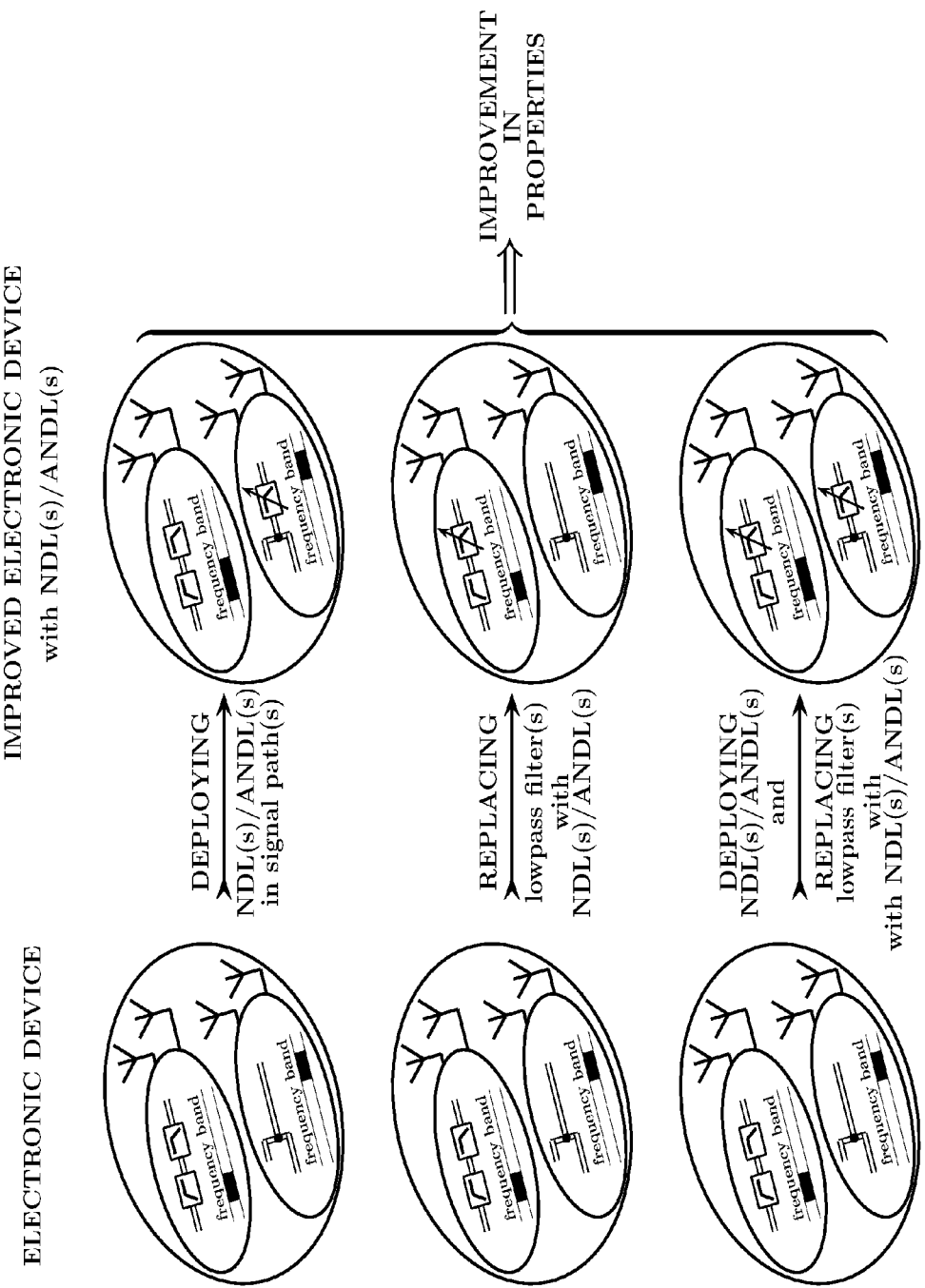
FIG. 110. Schematic illustration of improving properties of electronic devices by deploying NDL(s) in signal path(s), and/or by replacing linear filter(s) with NDL(s), with emphasis on the improvement in spectrum usage by communication devices through enabling closer band allocation.

As discussed in Section 13.3, NDLs may help to mitigate interchannel and/or adjacent-channel interference, the problems that are becoming increasingly prevalent in the modern communications industry, caused by the wireless spectrum turning into a hot commodity. Theoretical (Nikitin [29, 24]) as well as experimental (Nikitin et al. [28]) data show that an out-of-band interference from a transmitter induced in a receiver channel (part II of the interference in FIG. 99, and part II' of the interference in FIG. 100) is likely to appear impulsive under a wide range of conditions, especially if intermodulation in the transmitter is insignificant. As also shown by Nikitin [29, 24], Nikitin et al. [28], while this interference may not be reduced by linear filtering in the receiver channel, it may be effectively mitigated by such nonlinear filters as the NDLs disclosed in the present invention. In addition, as discussed in Section 12 and illustrated in Sections 13.2.6 and 13.2.7, NDL-based mitigation of an OOB interference may be enabled and/or improved even if this interference does not appear impulsive. By deploying NDL-based filters in receiver channels to reduce an OOB interference, spectrum usage by communication devices may be improved through enabling closer band allocation. FIG. 110 provides a schematic illustration of improving properties of electronic devices by deploying NDL(s) in signal path(s), and/or by replacing linear filter(s) with NDL(s), with emphasis on the improvement in spectrum usage by communication devices through enabling closer band allocation.

Figure 111:
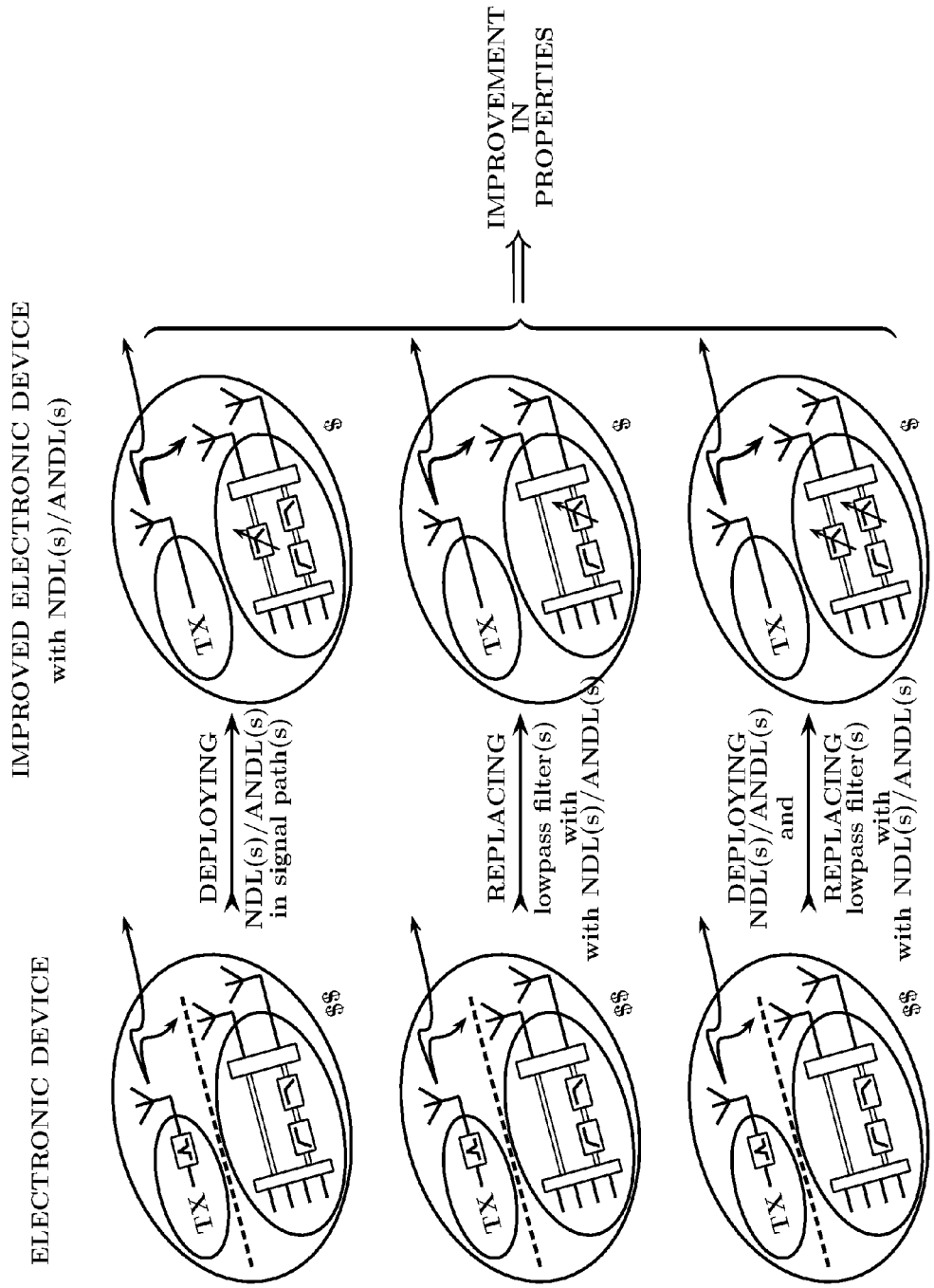
FIG. 111. Schematic illustration of improving properties of electronic devices by deploying NDL(s) in signal path(s), and/or by replacing linear filter(s) with NDL(s), with emphasis on the reduction in component count, cost of materials, and the total cost.

NDL-based filters deployed in receiver channels may provide cost-effective means of reducing an OOB interference, in addition and/or as an alternative to other available means. This may lead to reduction in component count, cost of materials, and the total cost of an electronic device. FIG. 111 provides a schematic illustration of improving properties of electronic devices by deploying NDL(s) in signal path(s), and/or by replacing linear filter(s) with NDL(s), with emphasis on the reduction in component count, cost of materials, and the total cost. This figure implies a particular example of a device comprising a transmitter (TX) that interferes with a receiver. In the original device (on the left), the interference is mitigated by (i) reducing the coupling between the antennas by electromagnetic shielding (indicated by the dashed line), and (ii) by deploying an additional high quality bandpass filter at the TX antenna. In the improved device (on the right), the NDLs deployed in the receiver allow the performance specifications of the device to be met in the absence of the shielding and the additional bandpass filter, thus reducing the component count, cost of materials, and the total cost of the device.

Figure 112:
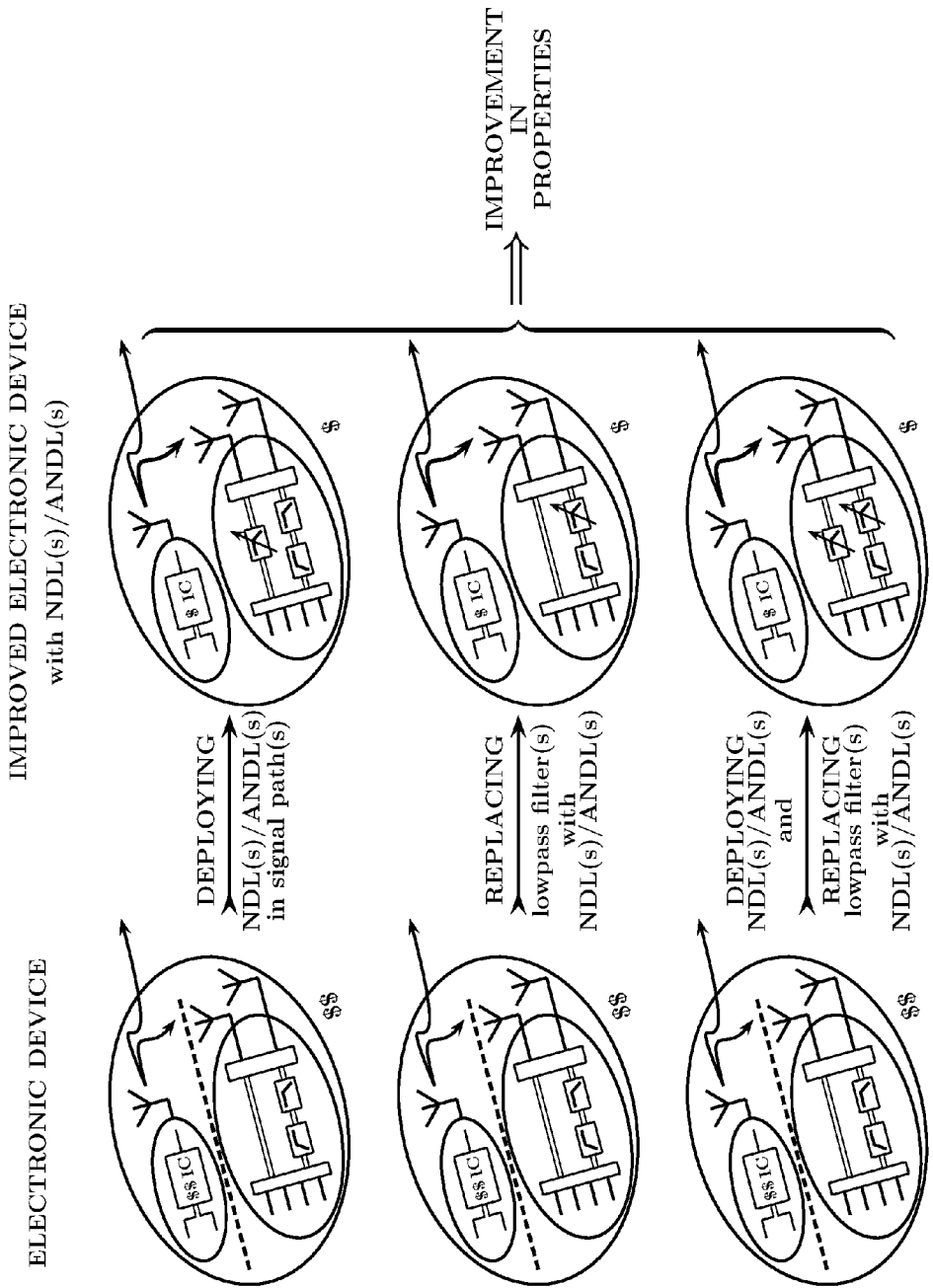
FIG. 112. Schematic illustration of improving properties of electronic devices by deploying NDL(s) in signal path(s), and/or by replacing linear filter(s) with NDL(s), with emphasis on the reduction in cost of components, materials, and the total cost.

The non-idealities in hardware implementation of designed modulation schemes such as non-smooth behavior of the modulator around zero exacerbate the OOB emissions (Nikitin [29, 24], Nikitin et al. [28], for example). Thus, in order to keep these emissions at a low level, expensive high-quality components such as IC modulators and power amplifiers may be used, which increases the complexity and the cost of the components. By reducing an OOB interference, NDL-based filters may relax the requirements on the quality of such modulators and power amplifiers, leading to reduction in cost of components, materials, and the total cost of a device. FIG. 112 provides a schematic illustration of improving properties of electronic devices by deploying NDL(s) in signal path(s), and/or by replacing linear filter(s) with NDL(s), with emphasis on the reduction in cost of components, materials, and the total cost. This figure implies that in the original device (on the left) the interference is mitigated by (i) reducing the coupling between the antennas by electromagnetic shielding (indicated by the dashed line), and (ii) by using expensive high-quality components ($$ IC) in the transmitter. In the improved device (on the right), the NDLs deployed in the receiver allow the performance specifications of the device to be met in the absence of the shielding, and using less expensive components ($ IC) in the transmitter, thus reducing the cost of materials and components, and the total cost of the device.

One skilled in the art will recognize that various other ways, in addition to those illustrated in Section 15, of improving physical, commercial, and operational properties of electronic devices may be enabled and achieved by the NDL-based mitigation of various types of interference affecting the signals of interest in a device.

16 Adaptive NDLs for Non-Stationary Signals and/or Time-Varying Noise Conditions The range of linear behavior of an NDL may be determined and/or controlled by the resolution parameter $\alpha$.

Typical use of an NDL for mitigation of impulsive technogenic noise may require that the NDL's response remains linear while the input signal is the signal of interest affected by the Gaussian (non-impulsive) component of the noise, and that the response becomes nonlinear only when a higher magnitude outlier is encountered. When the properties of the signal of interest and/or the noise vary significantly with time, a constant resolution parameter may not satisfy this requirement.

For example, the properties of such non-stationary signal as a speech signal would typically vary significantly in time, as the frequency content and the amplitude/power of the signal would change from phoneme to phoneme. Even if the impulsive noise affecting a speech signal is stationary, its effective mitigation may require that the resolution parameter of the NDL varies with time.

For example, for effective impulsive noise suppression throughout the speech signal the resolution parameter $\alpha$ should be set to a small value during the "quiet" periods of the speech (no sound), and to a larger value during the high amplitude and/or frequency phonemes (e.g. consonants, especially plosive and fricative).

Such adaptation of the resolution parameter $\alpha$ to changing input conditions may be achieved through monitoring the tendency of the magnitude of the difference signal, for example, in a moving window of time.

Figure 113:
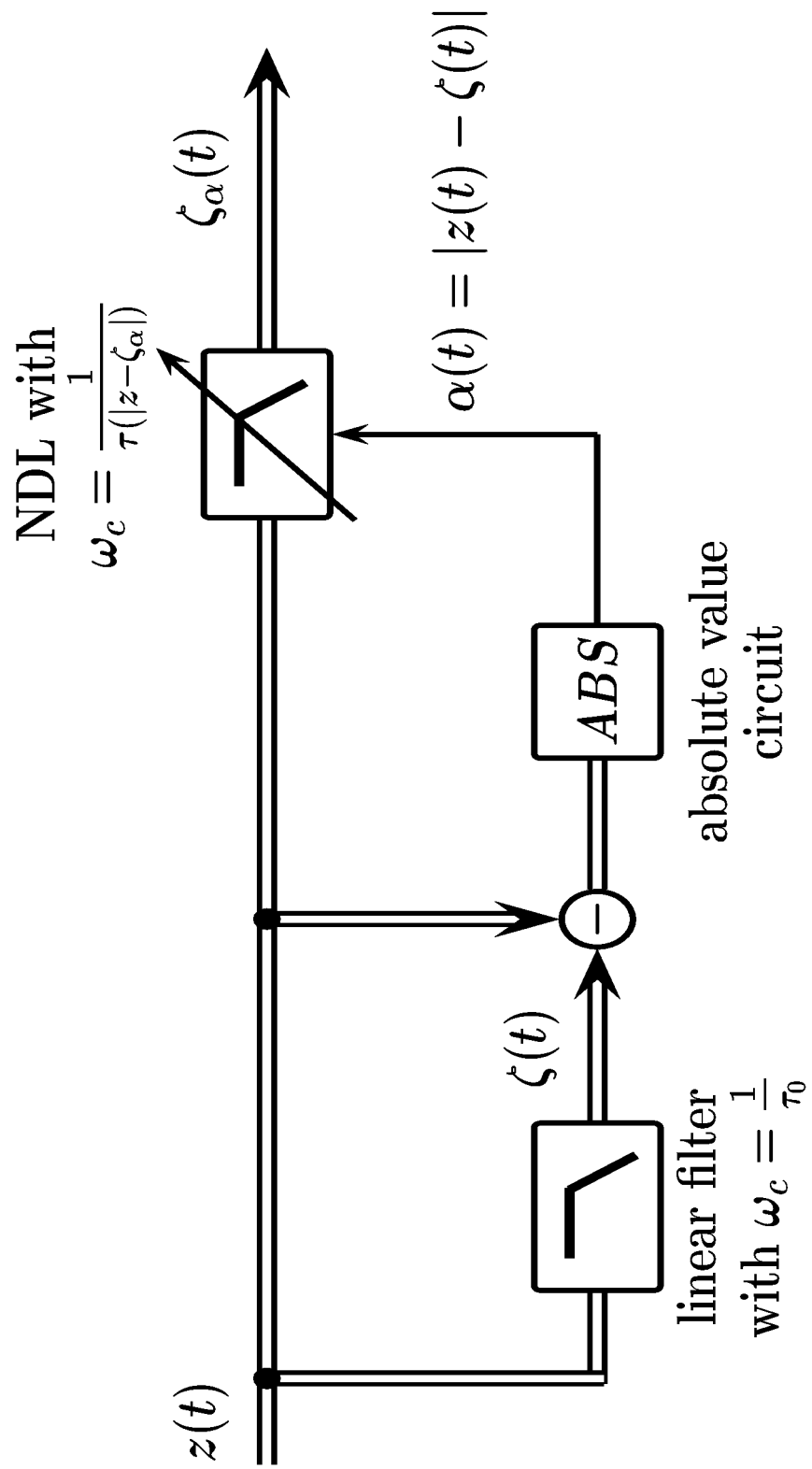
FIG. 113. NDL filtering arrangement equivalent to the linear filter ($\zeta_\alpha(t) \equiv \zeta(t)$) when the NDL time parameter is given by equation (71).

In order to convey the subsequent examples more clearly, let us first consider the filtering arrangement shown in FIG. 113. In this example, the NDL is of the same type and order as the linear filter, and only the time parameter $\tau$ of the NDL is a function of the difference signal, $\tau = \tau(|z - \zeta_\alpha|)$. It should be easily seen that, if $$\tau(|z - \zeta_\alpha|) = \tau_0 \times \begin{cases} 1 & \text{for } |z - \zeta_\alpha| \leq \alpha \\ > 1 & \text{otherwise} \end{cases}, \tag{71}$$

then $\zeta_\alpha(t) = \zeta(t)$ and thus the resulting filter is equivalent to the linear filter.

Figure 114:
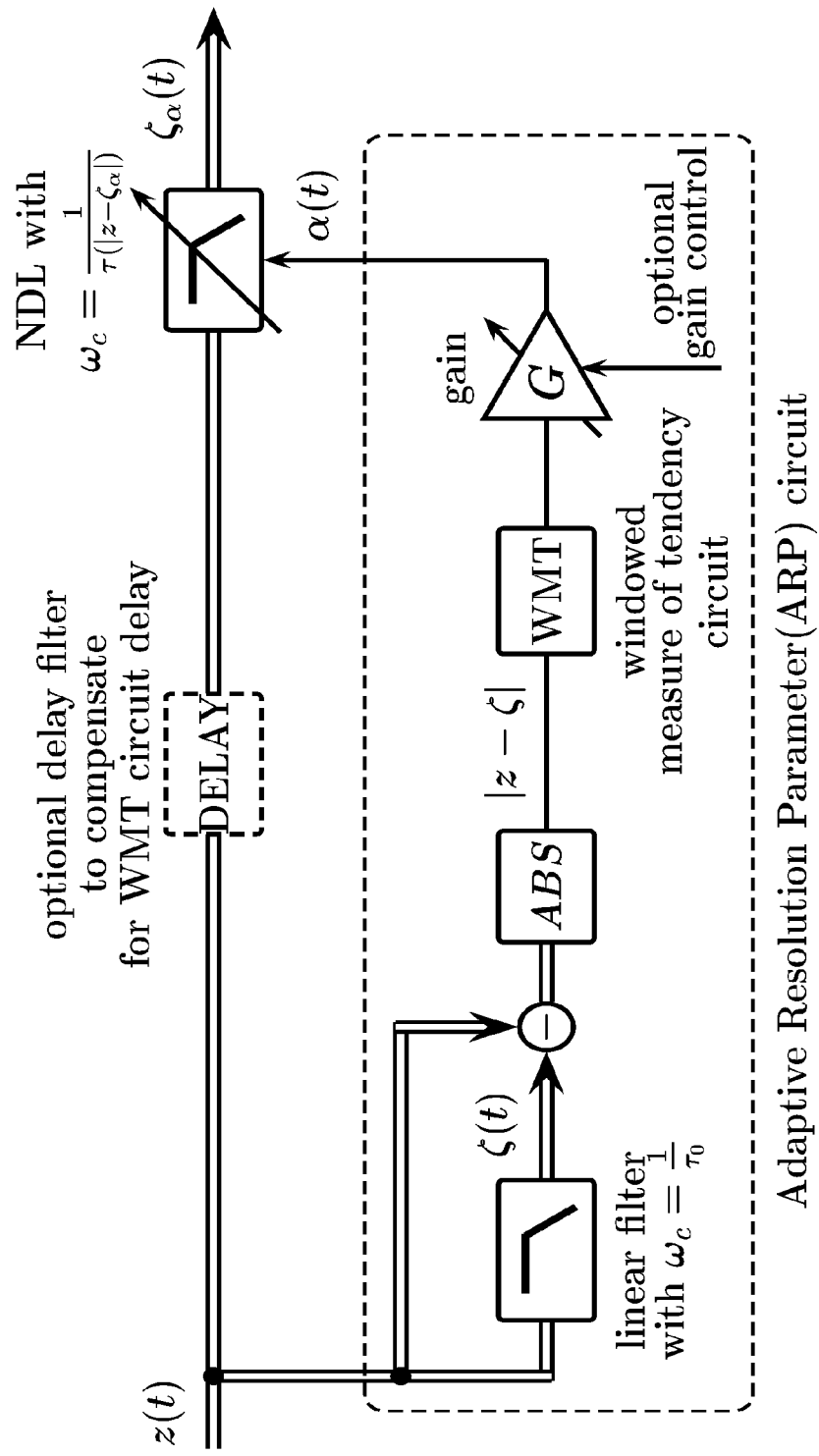
FIG. 114. Illustrative diagram of an Adaptive Nonlinear Differential Limiter for non-stationary signals and/or time-varying noise conditions.

Let us now modify the circuit shown in FIG. 113 in a manner illustrated in FIG. 114.

In FIG. 114, a Windowed Measure of Tendency (WMT) circuit is applied to the absolute value of the difference signal of the linear filter $|z(t) - \zeta(t)|$, providing the typical magnitude of this difference signal in a moving time window.

Let us first consider a WMT circuit outputting a windowed mean value (e.g. a lowpass filter), and assume a zero group delay of the WMT circuit. If the effective width of the moving window is comparable with the typical duration of an outlier in the input signal, or larger than the outlier's duration, then, as follows from the properties of the arithmetic mean, the attenuation of the outliers in the magnitude of the difference signal $|z(t) - \zeta(t)|$ by the WMT circuit will be greater in comparison with the attenuation of the portions of $|z(t) - \zeta(t)|$ not containing such outliers.

By applying an appropriately chosen gain G>1 to the output of the WMT circuit, the gained WMT output may be made larger than the magnitude of the difference signal $|z(t) - \zeta(t)|$ when the latter does not contain outliers, and smaller than $|z(t) - \zeta(t)|$ otherwise. As the result, if the gained WMT output is used as the NDL's resolution parameter, the NDL's response will become nonlinear only when an outlier is encountered.

Since a practical WMT circuit would employ a causal moving window with non-zero group delay, the input to the NDL circuit may need to be delayed to compensate for the delay introduced by the WMT circuit. Such compensation may be accomplished by, for example, an appropriately chosen delay filter (see, e.g., Schaumann and Van Valkenburg [34]) as indicated in FIG. 114.

In FIG. 113 and FIG. 114 the double lines indicate that the input and/or output signals of the circuit components represented by these lines may be complex and/or vector signals as well as real (scalar) signals, and it is implied that the respective operations (e.g. filtering and subtraction) are performed on a component-by-component basis. For complex and/or vector signals, the magnitude (absolute value) of the difference signal may be defined as the square root of the sum of the squared components of the difference signal.

In order to increase the attenuation of the outliers in the magnitude of the difference signal $|z(t) - \zeta(t)|$ by the WMT circuit, in comparison with the attenuation of the portions of $|z(t) - \zeta(t)|$ that do not contain such outliers, the measures of tendency different from the arithmetic mean may be employed. Such measures may include a power mean, a generalized $f$-mean, a median, and/or other measures of tendency and their combinations.

For example, the Adaptive Resolution Parameter (ARP) $\alpha(t)$ may be obtained as a linear combination of the outputs of different WMT circuits, $$\alpha(t) = \alpha_0 + \sum_i G_i \alpha_i(t), \tag{72}$$

where $G_i$ and $\alpha_i(t)$ are the gain and the output, respectively, of the ith WMT circuit, and $\alpha_0$ is an (optional) offset.

If the ith WMT circuit outputs a generalized $f$-mean, then $$\alpha_i(t) = f_i^{-1} \{w_i(t) * f_i[|z(t) - \zeta(t)|]\}, \tag{73}$$

where $f_i(x)$ is a function of x, $f_i^{-1}$ is its inverse (i.e. $f_i^{-1}[f_i(x)] = x$), $w_i(t)$ is the window function (i.e. the impulse response of the lowpass filter), and the asterisk denotes convolution.

A power mean is obtained if $f_i(x) = x^{1/p}$, namely $$\alpha_i(t) = \left\{ w_i(t) * |z(t) - \zeta(t)|^{\frac{1}{p}} \right\}^p, \tag{74}$$

and for p>1 a power mean WMT circuit is more robust to outliers than a simple weighted averaging circuit $\alpha_i(t)=w_i(t)*|z(t)-\zeta(t)|$.

The simplicity of implementations of squaring and square root circuits may suggest the weighted (or windowed) squared mean root (SMR) averaging for a particular (p=2) power mean ARP $\alpha(t)$ circuit, $$\alpha(t) = G\left\{w(t) * |z(t) - \zeta(t)|^{\frac{1}{2}}\right\}^2. \tag{75}$$

FIG. 115 provides an example of such windowed Squared Mean Root (SMR) circuit.

In FIG. 115, as an example, the averaging window is the impulse response of a 2nd order Bessel filter (2nd order lowpass filter with $\tau=\tau_0$ and $Q=1/\sqrt{3}$).

For a weighted median, the output $\alpha_i$ of the ith WMT circuit may be implicitly given by (see, for example, Nikitin and Davidchack [26])

$$w_i(t) * \theta\{\alpha_i - |z(t)-\zeta(t)|\} = \frac{1}{2}, \tag{76}$$

where $\theta(x)$ is the Heaviside unit step function (Bracewell [6], for example).

It should be obvious from the current disclosure that, in order to increase the attenuation of the outliers in the magnitude of the difference signal $|z(t)-\zeta(t)|$ by the WMT circuit, an NDL/ANDL circuit may also be used instead of a lowpass (averaging) filter with the impulse response w(t) to obtain a widowed measure of tendency.

FIG. 116 through FIG. 133 provide examples clarifying the roles and significance of various components of adaptive NDLs, and provide illustrations of performance for several different arrangements of adaptive NDLs.

Figure 116:
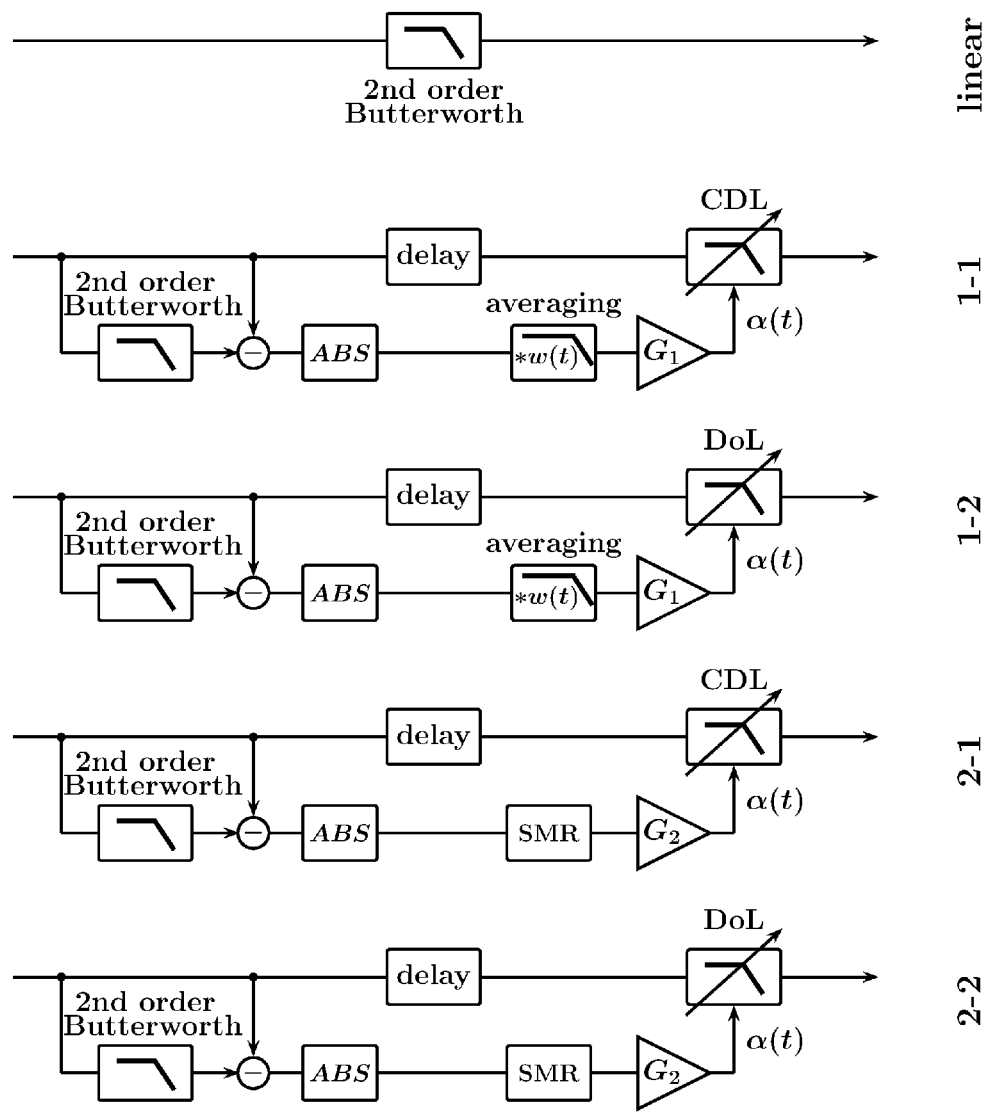
FIG. 116. Filtering arrangements used in the subsequent examples (FIG. 119 through FIG. 133).

FIG. 116 shows several different filtering arrangements used in the subsequent examples. The linear filter is a second order Butterworth filter with the cutoff frequency 6 kHz. The window function w(t) (in arrangements 1-1 and 1-2, and in the SMR circuits of arrangements 2-1 and 2-2) is a semi-Gaussian (Ahmed [3], for example) with 19 μs full width at half maximum (FWHM). The 22 μs delay introduced by the window function is compensated by the delay filter. The gain $G_1$ in arrangements 1-1 and 1-2 (after the averaging circuit) is $G_1=1.5$, and the gain $G_2$ in arrangements 2-1 and 2-2 (after the SMR circuit) is $G_2=1.7$.

In the examples, all filters (linear as well as NDLs) are the second order filters described by the following differential equation:

$$\chi(t) = x(t) - \tau\dot\chi(t) - Q^2\tau^2\ddot\chi(t), \tag{77}$$

where x(t) is the input signal, χ(t) is the output, τ is the time parameter of the filter, Q is the quality factor, and the dot and the double dot denote the first and the second time derivatives, respectively.

For a linear filter $\tau=\tau_0$=const, while for an NDL the time parameter is time-dependent. For example, for the CDLs in arrangements 1-1 and 2-1, $$\tau = \tau(t) = \tau_0 \times \begin{cases} 1 & \text{for } |x(t) - \chi(t)| \le \alpha(t) \\ \frac{|x(t) - \chi(t)|}{\alpha(t)} & \text{otherwise} \end{cases}, \tag{78}$$

where α(t) is the resolution parameter of the NDL provided by the ARP circuit.

In the examples corresponding to the arrangements 1-2 and 2-2 (those with the DoL circuits), τ has the following particular dependence on the magnitude of the difference signal $|x(t)-\chi(t)|$:

$$\tau = \tau(t) = \tau_0 \times \begin{cases} 1 & \text{for } |x(t) - \chi(t)| \le \alpha(t) \\ \left(\frac{|x(t) - \chi(t)|}{\alpha(t)}\right)^2 & \text{otherwise} \end{cases}, \tag{79}$$

where α(t) is the resolution parameter of the NDL provided by the ARP circuit.

Figure 117:
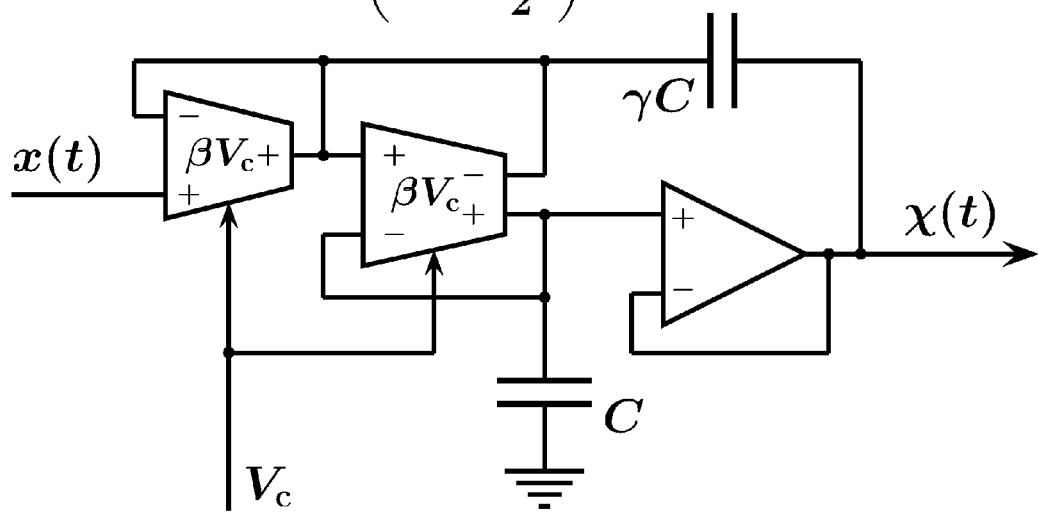
FIG. 117. Example of a conceptual schematic of a voltage-controlled 2nd order filter with Sallen-Key topology (Sallen and Key [32]) implementing the particular DoL given by equation (79).

FIG. 117 provides an example of a conceptual schematic of a voltage-controlled 2nd order filter with Sallen-Key topology (Sallen and Key [32]) implementing this particular DoL. If $\beta V_c$ is the transconductance of the circuit's OTAs, and the control voltage $V_c$ is given by $$V_c = \frac{1}{K} \times \begin{cases} 1 & \text{for } |x - \chi| \le \alpha \\ \left(\frac{\alpha}{|x - \chi|}\right)^2 & \text{otherwise} \end{cases}, \tag{80}$$

then the resulting filter is a 2nd order DoL with the resolution parameter α and the time parameter given by equation (79) with $$\tau_0 = 2C\frac{K}{\beta}.$$

FIG. 118 provides an example of a conceptual schematic of a control voltage circuit (CVC) for the DoL shown in FIG. 117. The resolution parameter α=α(t) is supplied to the CVC by the gained output of the windowed measure of tendency (WMT) circuit.

Figure 119:
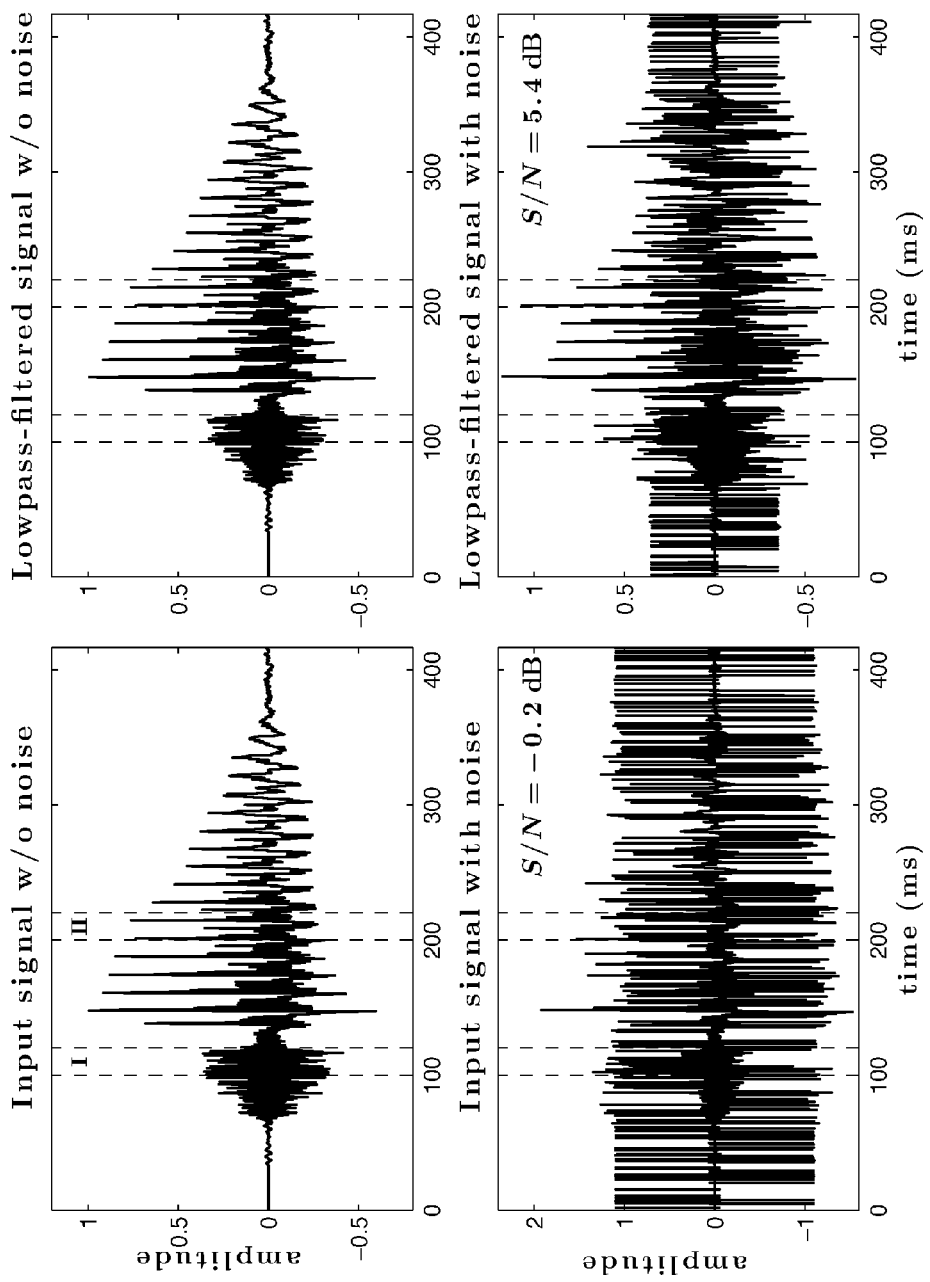
FIG. 119. Incoming and filtered fragments of a signal of interest with and without white impulsive noise.

The left-hand panels in FIG. 119 show a fragment of an incoming signal of interest (a fragment of a speech signal) affected by a white impulsive noise (lower left panel), and the same signal without noise (upper left panel). The right-hand panels in FIG. 119 show the respective signals filtered by a linear lowpass filter (a second order Butterworth filter with the cutoff frequency 6 kHz). By limiting the frequency content of the output signal to within the passband, the linear filter improves the SNR. The signal-to-noise ratios for the incoming and filtered signals affected by the noise are shown in the upper right corners of the respective lower panels (−0.2 dB and 5.4 dB, respectively). The specific time intervals I and II are indicated by the vertical dashed lines.

FIG. 120 and FIG. 121 show the outputs of the absolute value circuits (thin lines), and the gained outputs α(t) of the WMT circuits (thick lines), for the time intervals I and II, respectively. (Note that we have previously assumed a zero group delay of the WMT circuit.) The "envelopes" α(t) of the absolute value of the difference signal shown in the upper panels of both figures correspond to the averaging circuit (arrangements 1-1 and 1-2), while the lower panels show the respective envelopes α(t) obtained by the SMR circuit (arrangements 2-1 and 2-2). One may see from the figures that the SMR circuit is less sensitive to the outliers in the absolute value of the difference signal than the simple averaging circuit. The input noise pulses are indicated at the bottom of the figures.

By applying an appropriately chosen gain G>1 to the output of the WMT circuit, the gained WMT output may be made to be larger than the magnitude of the difference signal $|z(t)-\zeta(t)|$ when the latter does not contain outliers, and smaller than $|z(t)-\zeta(t)|$ otherwise. As the result, if the gained WMT output is used as the NDL's resolution parameter $\alpha(t)$, the NDL's response will become nonlinear when an outlier is encountered, reducing the bandwidth of the NDL and the magnitude of the output outlier.

This is illustrated in FIG. 122 and FIG. 123, which plot the time parameters versus time for the NDL circuits in the arrangements 1-1, 1-2, 2-1, and 2-2 shown in FIG. 116, for the time intervals I (FIG. 122) and II (FIG. 123). The input noise pulses are indicated at the bottom of the figures.

One may see in FIG. 122 and FIG. 123 that, for the majority of time, the time parameter of an NDL in either filtering arrangement remains equal and/or approximately equal to $\tau_0$, and significantly increases only in response to an incoming noise pulse. Since for an NDL with the topology shown in FIG. 117 the time parameter is inversely proportional to the control voltage $V_c$, the combination of the ARP circuit and the CVC may be viewed as an outlier detection circuit, providing an essentially constant control voltage in the absence of outliers, and a smaller control voltage otherwise.

One skilled in the art will recognize that the bandwidth B of a lowpass filter is inversely proportional to its time parameter, $B \propto 1/\tau$. Therefore the bandwidth of an NDL with the topology shown in FIG. 117 is proportional to the control voltage $V_c$.

Thus an ANDL may be represented by a block diagram shown in FIG. 124, which comprises a (fixed) lowpass filter, a delay circuit, an Outlier Detector Circuit (ODC), and a lowpass filter with a bandwidth B controlled by the control signal $\kappa$ (the output of the ODC), $B=B(\kappa)$. The ODC outputs a control signal $\kappa(t)$ that is essentially constant in the absence of outliers, and is a monotonically decreasing (or increasing) function of the magnitude of an outlier otherwise. The bandwidth B of the controlled-bandwidth lowpass filter is an increasing or decreasing function of the control signal, $B=B(\kappa)<B(\kappa+\epsilon)$ or $B=B(\kappa)>B(\kappa+\epsilon)$, $\epsilon>0$, respectively, causing B to decrease when an outlier is encountered.

For example, if the bandwidth is proportional to the control signal, $B=B_0 \kappa/\kappa_0$, and $\kappa$ is given by $$\kappa(t) = \kappa_0 \times \begin{cases} 1 & \text{for } |z'-\zeta'| \le Gw*|z-\zeta| \\ \frac{Gw*|z-\zeta|}{|z'-\zeta'|} & \text{otherwise} \end{cases} \quad (81)$$

the circuit shown in FIG. 124 would correspond to the arrangement 1-1 in FIG. 116.

Notice that the input signal $z(t)$ and the delayed input signal $z'(t)$ in FIG. 124 are indicative of each other.

Also notice that the control signal $\kappa$ to the controlled lowpass filter in FIG. 124 is not a resolution parameter $\alpha$ of an NDL. While the behavior of the $\kappa$-controlled lowpass filter in FIG. 124 is equivalent to an $\alpha$-controlled NDL when $\alpha$ is the gained output of the WMT circuit (see FIG. 114, for example), the $\kappa$-controlled lowpass filter in FIG. 124 is not a feedback circuit, but rather a lowpass filter with a bandwidth B directly controlled by the control signal $\kappa$, $B=B(\kappa)$.

It may be important to note that the "bandwidth" of an NDL would not be its "true," or "instantaneous" bandwidth, as defining such a bandwidth for a nonlinear filter may be meaningless. Rather, this bandwidth is a convenient computational proxy that may be understood as a bandwidth of a respective linear filter with the filter coefficients (e.g. $\tau$ and Q in (77)) equal to the instantaneous values of the NDL filter parameters. With such clarification of the NDL bandwidth in mind, FIG. 125 clarifies the relationship between a $\kappa$-controlled lowpass filter and an NDL/$\alpha$-controlled NDL.

In FIG. 125, the Control Signal Circuit (CSC) may be viewed as a simplified (non-adaptive) Outlier Detector Circuit (ODC), providing the control signal $\kappa(t)$ that reduces the bandwidth of the $\kappa$-controlled lowpass filter when an outlier is encountered.

FIG. 126 shows a block diagram of an NDL/ANDL circuit that comprises a lowpass filter with a bandwidth dynamically controlled by an output signal $\kappa(t)$ of a Control Signal Block (CSB) in a manner that reduces the magnitude of the outliers in the output signal $\zeta(t)$. The control signal $\kappa(t)$ is a function of a plurality of input signals of the CSB comprising the input signal $z(t)$ and a feedback of the output signal $\zeta(t)$. The plurality of input signals of the CSB may further comprise one or more signals such as the input signal filtered with a linear filter, a signal indicative of the input signal (e.g., the delayed input signal $z'(t)$ shown in FIG. 126), a gain control signal (G), and/or a signal controlling the resolution parameter ($\alpha$).

By comparing the arrangements 1-1 with 2-1, and 1-2 with 2-2 (see FIG. 116), one may see that the SMR circuit (arrangements 2-1 and 2-2) improves both the robustness and the sensitivity of the outlier detection in comparison with the simple averaging circuit (arrangements 1-1 and 1-2). One may also see in FIG. 122 and FIG. 123 that the outlier detection circuit employed in the DoL arrangements (1-2 and 2-2) provides higher sensitivity in comparison with the respective CDL arrangements (1-1 and 2-1). Overall, one may deduce from FIG. 122 and FIG. 123 that the arrangements shown in FIG. 116 may be ranked, in terms of their effectiveness in impulsive noise suppression, in the sequence (1-1)→(2-1)→(1-2)→(2-2), with 1-1 being the least effective, and 2-2 being the most effective. This deduction is reinforced by FIG. 127.

FIG. 127 shows an incoming signal of interest (a fragment of a speech signal) affected by a white impulsive noise (top panel), and the respective signals filtered by a linear lowpass filter and the ANDLs in the arrangements 1-1, 1-2, 2-1, and 2-2 shown in FIG. 116. The signal-to-noise ratios for the incoming and filtered signals are shown in the upper right corners of the respective panels. One may see from this example that ANDLs may significantly improve the signal quality, in excess of the improvement achievable by the respective linear filter, and may be suitable for filtering such highly non-stationary signals as speech signals.

In this specific example, the SNR improvements in comparison with the linear filter are 12.2 dB (arrangement 1-1), 15.3 dB (arrangement 2-1), 18.7 dB (arrangement 1-2), and 21.1 dB (arrangement 2-2).

FIG. 128 and FIG. 129 provide a closer look, for the arrangement 1-1 (the least effective), at the specific time intervals I (FIG. 128) and II (FIG. 129) indicated by the vertical dashed lines in FIG. 127, corresponding to a fricative consonant (I) and a vowel (II). The filtered signal without noise is shown by the thick lines, while the outputs of the respective filters for the noisy signal are shown by the thin lines. One may see that the ANDL more effectively reduces the impulsive outliers than the respective linear filter.

FIG. 130 and FIG. 131 provide a closer look, for the arrangement 2-2 (the most effective), at the specific time intervals I (FIG. 130) and II (FIG. 131) indicated by the vertical dashed lines in FIG. 127, corresponding to a fricative consonant (I) and a vowel (II). The filtered signal without noise is shown by the thick lines, while the outputs of the respective filters for the noisy signal are shown by the thin lines. One may see that the ANDL effectively suppresses the impulsive outliers without distorting the shape of the signal of interest.

FIG. 132 repeats the example of FIG. 127 for stronger (by 10 dB in power) impulsive noise. In this specific example, the SNR improvements in comparison with the linear filter are 14.4 dB (arrangement 1-1), 18.6 dB (arrangement 2-1), 21.0 dB (arrangement 1-2), and 25.4 dB (arrangement 2-2).

FIG. 133 repeats the example of FIG. 127 for weaker (by −10 dB in power) impulsive noise. In this specific example, the SNR improvements in comparison with the linear filter are 8.8 dB (arrangement 1-1), 10.0 dB (arrangement 2-1), 11.7 dB (arrangement 1-2), and 11.9 dB (arrangement 2-2).

One may see from the examples of FIG. 127, FIG. 132, and FIG. 133 that the stronger the impulsive noise the larger the improvement in the SNR provided by the ANDLs in comparison with the respective linear filter.

FIG. 134 quantifies the improvements in the signal quality by the ANDL shown at the top of the figure when the total noise is a mixture of the impulsive and thermal noises. The lower panel shows the total SNR as a function of the ANDL gain G for different fractions of the impulsive noise in the mixture (from 0 to 100%).

FIG. 135 shows the power spectral densities (PSDs) of the filtered signal of interest (thin solid line), the residual noise of the linear filter (dashed line), and the PSDs of the residual noise of the ANDL-filtered signals, for the gain value $G_0$ marked in FIG. 134 and different fractions of the impulsive noise (thick lines).

In the limit of high gain, $G \rightarrow \infty$, an ANDL becomes equivalent to the respective linear filter. This is an important property of an ANDL, enabling its full compatibility with linear systems. When the noise affecting the signal of interest contains outliers, however, the signal quality (e.g. that characterized by the SNR or by a throughput capacity of a communication channel) would exhibit a maximum at a certain finite value of the gain $G=G_{max}$, providing the qualitative behavior of an ANDL illustrated in FIG. 136.

FIG. 136 provides a qualitative illustration of improving quality of a signal of interest by a generic adaptive NDL characterized by the gain in its adaptive loop, when the signal is affected by an interfering noise. As indicated by the horizontal line in the figure, as long as the noise retains the same power and spectral composition, the signal quality (e.g. SNR) of the output of a linear filter remains unchanged regardless the proportion of the thermal and the technogenic components in the noise mixture.

In the limit of a large gain parameter, an adaptive NDL is equivalent to the respective linear filter, resulting in the same signal quality of the filtered output. When viewed as a function of the gain, however, the signal quality of the ANDL output exhibits a maximum in an appropriate measure of the signal quality (e.g. in the SNR). The larger the fraction of the technogenic noise in the mixture, the more pronounced is the maximum in the signal quality. This property of an ANDL enables its use for improving properties of electronic devices through mitigation of technogenic noise.

The ability of an ANDL to mitigate technogenic noise is enhanced by the fact that, unlike that of purely Gaussian (e.g. thermal) noise, the amplitude distribution of technogenic noise is modifiable by linear filtering, as illustrated in FIG. 137. In the lower panel, the Gaussian amplitude densities of the same power (cross-hatched) are shown for comparison with the amplitude densities of the technogenic signals. The effectiveness of the mitigation of technogenic noise by ANDLs may further be greatly increased by cascading them with appropriately configured linear filters (see, for example, Section 12).

Since the amount and strength of outliers in a technogenic (manmade) noise mixture may be controlled by linear filtering, such qualitative behavior may generally be achieved, by cascading an ANDL with appropriately configured linear filters, even when the interfering noise mixture is sub-Gaussian. For example, under a large variety of conditions, differentiation may transform a sub-Gaussian noise into a super-Gaussian (impulsive), with lesser effect on the signal of interest. In such cases, an ANDL preceded by a differentiator and followed by an integrator would still exhibit the same qualitative behavior as illustrated in FIG. 136.

While the qualitative behavior of an ANDL remains unchanged, the positions and magnitudes of the maxima of the "signal quality vs. gain" curves may depend on a variety of factors. For instance, real-life interference scenarios may be extremely complicated in their strength, type of the amplitude distribution, spectral and temporal composition, and may vary significantly with time. The same may hold true for the signals of interest.

Further, even for a given signal+noise mixture and fixed main ANDL parameters (i.e. the type, order, and the time parameter of the respective linear filter, and the dependence of the time parameter on the magnitude of the difference signal), the positions and magnitudes of the maxima of the "signal quality vs. gain" curves would depend on the properties of the WMT circuit, in particular, the shape and the width of its window function.

On one hand, for effective suppression of the outlier "bursts" in a signal, the width of the averaging window may need to be sufficiently large (e.g. comparable with, or larger than, the typical duration of an outlier in the input signal). On the other hand, the averaging window may need to be sufficiently narrow in order to adequately "track" the changes in a non-stationary input signal.

Thus, given an NDL of a particular type and order, and with particular initial parameters, the performance of the adaptive NDL with a given type of the WMT circuit may be further configured by adjusting the effective width (bandwidth) of the window in the WMT circuit. FIG. 138 provides an illustration of the dependence of the "signal quality vs. gain" curves on the width of the window function of the WMT circuit, for several different fractions of the impulsive noise in the mixture (0%, 50%, and 100%).

While the qualitative behavior of an ANDL may remain unchanged under a wide variety of signal and noise conditions and the ANDL circuit parameters, the ANDL algorithms may need to incorporate relatively simple systematic recipes for their optimization in various practical deployments.

For example, when an appropriate signal quality measure (e.g. the SNR or the throughput of a communication device) is available, such optimization may be achieved, based on a feedback of this measure, by applying a small number of control signals (e.g. currents or voltages) variable within a small range (e.g. less than an order of magnitude), in a systematic and predictable manner, to the ANDL circuit components that affect the gain (primary, or "first" control) and the width of the WMT sub-circuit's window (secondary, or "second" control).

The ANDL block diagram in FIG. 139 explicitly shows such control signals applied to change/modify the gain G and/or the width of the WMT sub-circuit's window.

FIG. 139 also shows the control for the delay compensation, and an optional front-end high-bandwidth lowpass filter.

FIG. 140 provides an illustration of the dependence of the "signal quality vs. gain" curves on the delay introduced by the delay circuit, for several different fractions of the impulsive noise in the mixture (0%, 50%, and 100%). As may be seen in FIG. 140 that, when significant amount of impulsive noise is present, the SNR improvement achieved by an ANDL may be sensitive to the delay of the delay circuit. Also, without a full delay compensation, the maximum in the SNR improvement for different noise mixtures may be achieved at significantly different gain values (that is, the maxima in the SNR vs. gain curves for different noise mixtures are "misaligned"). Thus a full delay compensation, albeit optional, may be preferred.

Delay compensation may be accomplished by, for example, an appropriately chosen all-pass filter as indicated in FIG. 139. An optional high-bandwidth lowpass filter may be used as the front end of the ANDL circuit to improve the signal shape preservation by the all-pass filter. As also indicated in FIG. 139, the control of the delay compensation may be performed by the same signal controlling the width of the WMT sub-circuit's window.

Examples of the approaches and the circuit topologies for the CMOS-based implementations of all-pass filters with controlled time delay may be found in, for example, Bult and Wallinga [7], Schaumann and Van Valkenburg [34], Diaz-Sanchez et al. [10], Keskin et al. [18], Zheng [41]. The absolute value (ABS) sub-circuit (rectifier) may be implemented using the approaches and the circuit topologies described, for example, in Sanchez-Sinencio et al. [33], Minhaj [21], Schaumann and Van Valkenburg [34].

As was stated earlier in this disclosure, the optimization of the gain and the window width may be achieved based on a feedback of an appropriate signal quality measure (e.g. the SNR or the throughput of a communication device). It may also be possible to relate the optimal gain and window width to a small number of simple general quantifiers of the signal+noise mixtures, e.g. the relative signal and noise bandwidths, the input SNR, and the noise sparsity factor (Nikitin [25], for example).

Also, for an appropriately chosen width of the WMT sub-circuit's window, the optimal gain may be approximately invariant to at least some parameters of the signal+noise mixture, such as, for example, the SNR for a given noise composition, and/or the fraction of a particular impulsive noise in the thermal+impulsive noise mixture (see, e.g., FIG. 134). Such "unsupervised" use of ANDLs under certain constraints on the signal+noise mixtures may be an attractive "one size fits all" feature, enabling the use of ANDLs as a simple replacement for the respective linear filters, without a need for adjusting any parameters.

17 NDL-Based ΔΣ Modulators

NDLs may improve ΔΣ modulators by replacing linear loop filters in the noise-shaping loops by NDL-based loop filters in a manner outlined in this section.

FIG. 141(*a*) shows a simplified diagram of a ΔΣ modulator that may be described as follows. The input D to the flip-flop, or latch, is proportional to an integrated difference between the input signal ("input") of the modulator and the output Q. The clock input to the flip-flop provides a control signal. If the input D to the flip-flop is greater than zero, D>0, at a definite portion of the clock cycle (such as the rising edge of the clock then the output Q takes a positive value $V_c$, $Q=V_c$. If D<0 at a rising edge of the clock, then the output Q takes a negative value $-V_c$, $Q=-V_c$. At other times, the output Q does not change.

Without loss of generality, we may require that if D=0 at a clock's rising edge, the output Q retains its previous value.

One may see in FIG. 141(*a*) that the output Q is a quantized representation of the input signal, and the flip-flop may be viewed as a quantizer. One may also see that the integrated difference between the input signal of the modulator and the output Q (the input D to the flip-flop) may be viewed as a particular type of a weighted difference between the input and the output signals. One may further see that the output Q is indicative of this weighted difference, since the sign of the output values (positive or negative) is determined by the sign of the weighted difference (the input D to the flip-flop).

FIG. 141(*b*) shows a variation of the ΔΣ modulator shown in FIG. 141(*a*) outputting an analog modulated signal, where the digital quantizer is replaced by its analog "equivalent" (Schmitt trigger, or comparator with hysteresis).

FIG. 142 shows a simplified diagram of a modified ΔΣ modulator that is equivalent to the one shown in FIG. 141(*a*). In FIG. 142, the input D to the flip-flop is proportional to a difference between an integrated input signal ("input") of the modulator and an integrated output Q.

FIG. 143 shows a simplified diagram of an improved ΔΣ modulator, where the improvement consists of (i) replacing the integrator integrating the output Q by a 1st order linear lowpass filter with a time constant $\tau_0$, and (ii) replacing the integrator integrating the input signal ("input") x(t) by a 1st order CDL with a time parameter τ such that $$\tau(|x - \chi|) = \tau_0 \times \begin{cases} 1 & \text{for } |x - \chi| \le \alpha \\ \dfrac{|x - \chi|}{\alpha} & \text{otherwise} \end{cases}, \qquad (82)$$

where χ(t) is the output of the CDL.

FIG. 144 shows an incoming signal of interest (a fragment of a speech signal) affected by a white impulsive noise (top panel), and the respective signals acquired by a 1st order ΔΣ ADC (middle panel) and an improved CDL-based 1st order ΔΣ ADC (bottom panel), and subsequently filtered by digital lowpass filters to within approximately 8 kHz band.

The signal-to-noise ratios for the incoming analog and for the digital filtered signals are shown in the upper right corners of the respective panels. One may see that, in this example, the improved CDL-based 1st order ΔΣ ADC significantly increases the signal quality (over 10 dB increase in the SNR in comparison with the unmodified 1st order ΔΣ ADC).

In the example shown in FIG. 144, the ADC sampling frequency $F_s$ is 64×48 kHz, $\tau_0 = 128/(2\pi F_s)$, and $\alpha \approx V_c/(\tau_0 F_s) \approx V_c/20$.

FIG. 145 provides a closer look at the specific time intervals I and II indicated by the vertical dashed lines in FIG. 144, corresponding to a fricative consonant (I) and a vowel (II). The signal without noise is shown by the thick lines, while the outputs of the respective ADCs for the noisy signal are shown by the thin lines. One may see that the improved CDL-based 1st order ΔΣ ADC effectively suppresses the impulsive outliers without distorting the shape of the signal of interest.

One skilled in the art will recognize that ΔΣ architectures may vary in many ways that provide different tradeoffs among resolution, bandwidth, circuit complexity, and modulator stability, and may include higher order, multi-bit, and multi-stage (cascaded) architectures.

One skilled in the art will also recognize that such other $\Delta\Sigma$ modulators may be improved in a similar manner by (i) constructing an equivalent representation of a given $\Delta\Sigma$ modulator that employ separate integration and/or linear filtering for the input and feedback signals, and by (ii) replacing the integrators and/or linear filters in the input signal path(s) by appropriately chosen NDLs (of 1st or higher order).

For example, panels B and C in FIG. 146 provide examples of equivalent configurations of a second order $\Delta\Sigma$ modulator shown in panel A. Based on these configurations, improved 2nd order $\Delta\Sigma$ modulators may be constructed by replacing the 1st integrator in the configuration shown in panel B by a 1st order NDL (e.g., a 1st order CDL with sufficiently large initial time parameter), or by replacing the double integrator in the configuration shown in panel C by a respective 2nd order NDL (e.g., by a 2nd order CDL with sufficiently large initial time parameter and a constant quality factor Q=½).

$\Delta\Sigma$ modulator structures realize the shaping of noise with an error minimizing feedback loop in which the input signal is compared with the quantized output signal, as depicted in the upper panel of FIG. 147 (see Janssen and van Roermund [17], for example). The difference between these two signals is weighed with the loop filter. Differences between the input and output that fall in the signal band are passed to the output without attenuation, out-of-band differences are suppressed by the filter. The result of the weighing is passed to the quantizer, which generates the next output value. The output is also fed back to the input, to be used in the next comparison. The result of this strategy is a close match of input signal and quantized output in the passband of the filter, and shaping of the quantization errors such that those fall outside the signal band.

Thus, as illustrated in FIG. 147, improving $\Delta\Sigma$ modulators may be described as replacing linear loop filters in the noise-shaping loops by NDL-based loop filters in a manner outlined above.

FIG. 148 provides an example of an improved 2nd order $\Delta\Sigma$ modulator where the loop filter is a CDL-based loop filter consisting of a 2nd order linear lowpass filter and a 2nd order CDL.

FIG. 149 shows an incoming signal of interest (a fragment of a speech signal) affected by a white impulsive noise (top panel), and the respective signals acquired by a 2nd order $\Delta\Sigma$ ADC (middle panel) and an improved CDL-based 2nd order $\Delta\Sigma$ ADC shown in FIG. 148 (bottom panel), and subsequently filtered by digital lowpass filters to within approximately 8 kHz band.

The signal-to-noise ratios for the incoming analog and for the digital filtered signals are shown in the upper right corners of the respective panels. One may see that, in this example, the improved CDL-based 2nd order $\Delta\Sigma$ ADC significantly increases the signal quality (approximately 14 dB increase in the SNR in comparison with the unmodified 2nd order $\Delta\Sigma$ ADC).

In the example shown in FIG. 149, the ADC sampling frequency $F_s$ is 64×48 kHz, $\tau_0=128/(2\pi F_s)$, and $\alpha \approx V_c \sqrt{2}/(\tau_0 F_s) \approx V_c/14$. The linear filter is a 2nd order Butterworth, and the CDL is a 2nd order Butterworth CDL (Q=1/$\sqrt{2}$).

FIG. 150 provides a closer look at the specific time intervals I and II indicated by the vertical dashed lines in FIG. 149, corresponding to a fricative consonant (I) and a vowel (II). The signal without noise is shown by the thick lines, while the outputs of the respective ADCs for the noisy signal are shown by the thin lines. One may see that the improved CDL-based 2nd order $\Delta\Sigma$ ADC effectively suppresses the impulsive outliers without distorting the shape of the signal of interest.

18 Communications Receivers Resistant to Technogenic Interference

ANDLs may replace certain existing linear filters in the receiver (for example, the anti-aliasing filters preceding the analog-to-digital converters), providing resistance to the technogenic interference independent of the modulations schemes and communication protocols.

Technogenic (man-made) signals are typically distinguishable from purely random (e.g. thermal), specifically, in terms of their amplitude distributions/densities (non-Gaussian). At any given frequency, linear filters affect the power of both the noise and the signal of interest proportionally, and cannot improve the SNR in passband. NDLs/ANDLs, however, may reduce the PSD of non-Gaussian interferences in the signal's passband without significantly affecting the signals of interest, increasing the passband SNR and the channel capacity, and providing resistance to technogenic interferences.

This is schematically illustrated in FIG. 151. As one may see in the figure, in a receiver with linear filters the channel capacity decreases with the increase of interference. NDLs/ANDLs, however, may provide "disproportional" (nonlinear) suppression of technogenic interference, and in a receiver with NDLs/ANDLs, the channel capacity may be made to be insensitive to the man-made interference.

FIG. 152 provides an example of an ANDL that may be used to replace a linear lowpass filter in a receiver. This filter contains a sub-circuit (characterized by a gain parameter G) that monitors a chosen measure of the signal+noise mixture and provides a time-dependent resolution parameter $\alpha=\alpha(t)$ to the main NDL circuit.

In FIG. 152, 1 is an NDL of a given type and order (for example, of the same type, order (e.g., 1st or 2nd), and the initial bandwidth as the lowpass filter the ANDL is replacing). Further, 2 is a linear filter equivalent to the NDL in the limit of a large resolution parameter a (e.g., $\alpha \to \infty$). The WMT circuit (3) outputs a windowed measure of tendency of the absolute value of the difference signal of the linear filter 2, and the gained value of this measure is used as the time-dependent resolution parameter $\alpha=\alpha(t)$ supplied to the main NDL circuit 1.

In the example of FIG. 152, an allpass filter 4 is used to compensate for the delay introduced by the WMT circuit 3. For example, if the WMT circuit uses a 2nd order Bessel window (a second order lowpass filter with the time constant $\tau_b=2\tau_0/\sqrt{3}$ and the quality factor Q=1/$\sqrt{3}$), then an allpass filter with the delay $2\tau_0$ may be used.

The lowpass filter 5 may be deployed to ensure that the allpass filter 4 indeed provides the delay compensating for the delay of the WMT circuit without much distortion of the shape of the NDL input signal. The bandwidth of the filter 5 needs to be much larger (for example, about ten times larger) than the initial bandwidth of the NDL, to avoid excessive reduction of peakedness of the interference to be mitigated by the NDL.

FIG. 153 provides an illustrative example of reducing technogenic interference by an ANDL shown in FIG. 152. The technogenic (OOB) interference affecting the "native" receiver signal is produced by the OOB transmitter, and the baseband signal quality (baseband SNR) is compared for the linear and the ANDL-based receivers for 3 initial ("preinterference", or purely thermal) SNRs (0, 10, and 20 dB), and 5 relative OOB interference powers (no interference, and 1, 3, 6, and 10 dB interference relative to the thermal noise power).

The left panel in FIG. 153 shows the baseband SNRs in the presence of the OOB interference relative to the respective thermal SNRs, for the linear receiver (horizontal dashed lines), and for the ANDL-based receiver as functions of the ANDL gain (curves). As may be seen in this panel, the signal quality (as characterized by the baseband SNR) of the ANDL-based receiver reaches a maximum value for the gain values in the neighborhood of $G_0$ (indicated by the vertical dashed line), for various initial (thermal) SNRs and interference powers.

The right panel in FIG. 153 shows the relative baseband SNRs for the linear (dashed curve) and the ANDL-based receiver with gain $G_0$ (same line types as the curves in the left panel) as functions of the interference power in baseband (relative to the thermal noise power). As one may see, in the linear receiver the signal quality decreases with the increase of interference, while the ANDL-based receiver mainly maintains the initial (thermal) signal quality and is insensitive to the OOB interference.

18.1 Increasing Peakedness of Interference to Improve its NDL-Based Mitigation

As discussed earlier in this disclosure, the amplitude distribution of a technogenic signal is generally modifiable by linear filtering. Given a linear filter and an input technogenic signal characterized by some peakedness, the peakedness of the output signal may be smaller, equal, or greater than the peakedness of the input signal, and the relation between the input and the output peakedness may be different for different technogenic signals and/or their mixtures. Such a contrast in the modification of the amplitude distributions of different technogenic signals by linear filtering may be used for separation of these signals by nonlinear filters such as the NDLs/ANDLs.

For example, let us assume that an interfering signal affects a signal of interest in a passband of interest. Let us further assume that a certain front-end linear filter transforms an interfering sub-Gaussian signal into an impulsive signal, or increases peakedness of an interfering super-Gaussian signal, while the peakedness of the signal of interest remains relatively small. The impulsive interference may then be mitigated by a nonlinear filter such as an NDL. If the front-end linear filter does not affect the passband of interest, the output of the nonlinear filter would contain the signal of interest with improved quality. If the front-end linear filter affects the passband of interest, the output of the nonlinear filter may be further filtered with a linear filter reversing the effect of the front-end linear filter in the signal passband, for example, by a filter canceling the poles and zeros of the front-end filter. As a result, employing appropriate linear filtering preceding an NDL in a signal chain allows effective NDL-based mitigation of technogenic noise even when the latter is not impulsive but sub-Gaussian.

Let us illustrate the above statement using a particular interference example. For the transmitter-receiver pair schematically shown at the top, FIG. 154 provides time (left panels) and frequency (middle panels) domain quantification, and the average amplitude densities of the in-phase (I) and quadrature (Q) components (right panels) of the receiver signal without thermal noise after the lowpass filter (upper row of panels), and after the lowpass filter cascaded with a 65 MHz notch filter (lower row of panels).

The passband of the receiver signal of interest (baseband) is indicated by the vertical dashed lines in the middle panels, and thus the signal induced in the receiver by the external transmitter may be viewed as a wide-band non-Gaussian noise affecting a narrower-band baseband signal of interest. In this example, the technogenic noise dominates over the thermal noise (horizontal dashed lines in the middle panels).

The interference in the nominal ±40 MHz passband of the receiver lowpass filter is due to the non-zero end values of the finite impulse response filters used for pulse shaping of the transmitter modulating signal, and is impulsive due to the mechanism described in [29, 24]. However, the response of the receiver 40 MHz lowpass filter at 65 MHz is relatively large, and, as may be seen in the upper row of panels of FIG. 154, the contribution of the transmitter signal in its nominal band becomes significant, reducing the peakedness of the total interference and making it sub-Gaussian (−0.5 dBG peakedness). Since the sub-Gaussian part of the interference lies outside of the baseband, cascading a 65 MHz notch filter with the lowpass filter reduces this part of the interference without affecting either the signal of interest or the power spectral density (PSD) of the impulsive interference around the baseband. Then, as shown in the lower row of panels of FIG. 154, the interference becomes super-Gaussian (10.9 dBG peakedness), enabling its effective mitigation by the NDLs/ANDLs.

18.2 Digital NDLs/ANDLs

Conceptually, NDLs/ANDLs are analog filters that combine bandwidth reduction with mitigation of interference. One may think of non-Gaussian interference as having some temporal and/or amplitude structure that distinguishes it form a purely random Gaussian (e.g. thermal) noise. Such structure may be viewed as some "coupling" among different frequencies of a non-Gaussian signal, and may typically require a relatively wide bandwidth to be observed.

A linear filter that suppresses the frequency components outside of its passband, while reducing the non-Gaussian signal's bandwidth, may destroy this coupling, altering the structure of the signal. That may complicate further identification of the non-Gaussian interference and its separation from a Gaussian noise and the signal of interest.

In order to mitigate non-Gaussian interference effectively, the input signal to an NDL would need to include the noise and interference in a relatively wide band, much wider (e.g., ten times wider) than the bandwidth of the signal of interest. Thus the best conceptual placement for an NDL may be in the analog part of the signal chain, for example, as part of the antialiasing filter preceding the analog-to-digital converter (ADC). However, digital NDL implementations may offer many advantages typically associated with digital processing, including, but not limited to, simplified development and testing, configurability, and reproducibility.

For example, one of the challenges of analog implementation of the ANDL shown in FIG. 152 may be constructing the allpass filter 4, and/or the wide-band filter 5. On one hand, the delay introduced by the lowpass filter of the WMT circuit may be relatively large, since this filter's bandwidth may be relatively small (similar, or narrower, than the bandwidth of the signal of interest). On the other hand, the bandwidth of the allpass filter's input would be relatively large, and thus an analog allpass filter may need to be of relatively high order, or contain many low-order stages, to provide a relatively large accurate delay of a wide-band signal. In addition, the order of the lowpass filter 5 may also need to be large to ensure that the bandwidth of the allpass filter's input is indeed sufficiently limited. Further, changing the delay magnitude and/or the input bandwidth to modify the ANDL's behavior may require circuit modifications that may be complicated and/or expensive, especially for complex-valued and/or vector signals.

In contrast, a digital delay may be relatively easily implemented (as, for example, a circular buffer), and would not require a front-end lowpass filter for its proper operation. In addition, a wide range of various delays may be provided by the same digital delay line, which may facilitate "on-the-fly" ANDL re-configurability without hardware changes.

Further, as discussed earlier in this section and in Sections 12 and 13, enhancing effectiveness of NDL-based filters for mitigation of non-Gaussian interference may be achieved by preceding the basic NDLs/ANDLs with linear front-end filters in order to suppress the non-impulsive component of the interference and/or to increase the peakedness of the interference. If the interference conditions change, such LFE filters may need to be re-configured. Unlike analog, digital filters may offer a relatively easy "on-the-fly" re-configurability of the LFE filters without hardware changes.

While NDLs/ANDLs are analog filters that may be described by (nonlinear) differential equations in the time domain, these equations may be expressed and solved in finite differences, allowing for digital implementations that may be relatively simple, computationally inexpensive, and would have low memory requirements. An example of a numerical algorithm implementing a finite-difference version of a complex-valued 2nd order constant-Q CDL with a time-variant resolution parameter $\alpha=\alpha(t)$ may be given by the following MATLAB function:

```
function zeta = CDL0_2nd_order(z,dt,tau0,Q,alpha)
  zeta = zeros(size(z));
  zeta(1) = z(1);
  tau0 = tau0 + dt*(dt/(tau0+dt));
  T1sq0 = .5*dt*tau0/Q;
  T2sq0 = tau0^2;
  zeta(2) = ( 2*T2sq0*zeta(1) + zeta(1)*(T1sq0-T2sq0) ) /
     (T1sq0+T2sq0);
  for i = 3:length(z);
    dZ = z(i-1)-zeta(i-1);
    if abs(dZ)<alpha(i-1)
      zeta(i)=(dt^2*dZ+2*T2sq0*zeta(i-1)+zeta(i-2)*
        (T1sq0-T2sq0))/(T1sq0+T2sq0);
    else
      if alpha(i-1)>0
        FAC = abs(dZ)/alpha(i-1);
        T1sq = T1sq0*FAC;
        T2sq = T2sq0*FAC^2;
      else
        T1sq = T1sq0*1e6;
        T2sq = T2sq0*1e12;
      end
      zeta(i) = (dt^2*dZ+2*T2sq*zeta(i-1)+zeta(i-2)*
        (T1sq-T2sq)) / (T1sq+T2sq);
    end
  end
return
```

The above example, as well as the example given in Section 6.2, may be viewed as a filtering function wherein a new value of the output is determined by a difference between an input signal value and a previous value of the output, and by one or more previous values of the output. In particular, a new value of the output may be viewed as a linear combination of a difference between an input signal value and a previous value of the output, and of one or more previous values of the output.

Further, the coefficients (or parameters) in said linear combination may be chosen in such a way that said filtering function is a lowpass filtering function characterized by a bandwidth, and said bandwidth may be determined by the values of said coefficients (or parameters). For example, a bandwidth of a lowpass filtering function CDL0_2nd_order in the example above would be a monotonically increasing function of the quality factor Q, and a monotonically decreasing function of the time parameter tau, where, for this particular filtering function, tau may be given by the following expression:

$$\text{tau} = \text{tau0} \times \begin{cases} 1 & \text{for abs}(dZ) < \text{alpha}(i-1) \\ \text{abs}(dZ)/\text{alpha}(i-1) & \text{otherwise} \end{cases} \quad (83)$$

As may be seen from equation (83), said bandwidth is also a non-increasing function of abs(dZ), which is a magnitude of a difference between an input signal value and a previous value of the output. Further, dependence of said bandwidth on said difference dZ is characterized by a resolution parameter alpha, and said bandwidth remains constant when the magnitude of said difference is smaller than said resolution parameter (abs(dZ)<alpha(i-1)), and decreases with the increase of said magnitude when said magnitude is larger than said resolution parameter.

It may be important to note that the "bandwidth" of an NDL would not be its "true," or "instantaneous" bandwidth, as defining such a bandwidth for a nonlinear filter may be meaningless. Rather, this bandwidth is a convenient computational proxy that may be understood as a bandwidth of a respective linear filter with the filter coefficients (e.g. tau in equation (83) and Q in CDL0_2nd_order) equal to the instantaneous values of the NDL filter parameters.

A hardware implementation of an NDL filtering function may be achieved by various means including, but not limited to, general-purpose and specialized microprocessors (DSPs), microcontrollers, FPGAs, ASICs, and ASSPs. A digital or a mixed-signal processing unit performing such a filtering function may also perform a variety of other similar and/or different functions.

An example of a numerical algorithm implementing the respective linear lowpass filter equivalent to the above NDL (a complex-valued 2nd order constant-Q CDL in the example function CDL0_2nd_order above) in the limit of a large resolution parameter $\alpha$ (e.g., $\alpha \to \infty$) may be given by the following MATLAB function:

```
function zeta = lowpass_2nd_order(z,dt,tau0,Q)
  zeta = zeros(size(z));
  zeta(1) = z(1);
  tau0 = tau0 + dt*(dt/(tau0+dt));
  T1sq0 = .5*dt*tau0/Q;
  T2sq0 = tau0^2;
  zeta(2) = ( 2*T2sq0*zeta(1) + zeta(1)*(T1sq0-T2sq0) ) /
     (T1sq0+T2sq0);
  for i = 3:length(z);
    dZ = z(i-1)-zeta(i-1);
    zeta(i)=(dt^2*dZ+2*T2sq0*zeta(i-1)+zeta(i-2)*
      (T1sq0-T2sq0))/(T1sq0+T2sq0);
  end
return
```

While real-time finite-difference implementations of the NDLs described above would be relatively simple and computationally inexpensive, their effective use would still require a digital signal with a sampling rate much higher (for example, ten times or more higher) than the Nyquist rate of the signal of interest (for example, to ensure a good correspondence between an analog NDL and its finite-difference implementation). Since, as have been discussed previously in this disclosure, the bandwidth of an NDL/ANDL input would need to be much larger then the bandwidth of the signal of interest, the sampling rate of the input signal would be much higher than the Nyquist rate of the signal of interest, and this condition may be automatically satisfied.

Since the magnitude of a noise affecting the signal of interest would typically increase with the increase in the bandwidth, while the amplitude of the signal+noise mixture would need to remain within the ADC range, a high-rate sampling may have a perceived disadvantage of lowering the effective ADC resolution with respect to the signal of interest, especially for strong noise and/or weak signal of interest, and especially for impulsive noise. However, since the sampling rate would be much higher (for example, ten times or more higher) than the Nyquist rate of the signal of interest, the NDL output may be downsampled using an appropriate decimation filter (for example, a polyphase filter) to provide the desired higher-resolution signal at lower sampling rate. Such a decimation filter would counteract the apparent resolution loss, and may further increase the resolution (for example, if the ADC is based on $\Delta\Sigma$ modulators).

FIG. 155 provides an example of a digital ANDL. In the figure, 1 is a digital NDL of a given type and order (e.g., 1st or 2nd), and 2 is a linear lowpass filter equivalent to the NDL in the limit of a large resolution parameter $\alpha$ (e.g., $\alpha \to \infty$). The WMT module (3) outputs a gained windowed measure of tendency of the absolute value of the difference signal of the linear filter 2, and this output is used as a variable resolution parameter $\alpha = \alpha(n)$ supplied to the NDL. In it simplest form, the WMT module is an FIR lowpass filter, or an IIR lowpass filter with a reasonably flat group delay in its passband (e.g., a 2nd order IIR Bessel lowpass filter). To make the WMT module more robust to outliers, one may employ a generalized $f$-mean. For example, if the function $f$ is a square root, then its inverse $f^{-1}$ is a square, and the resulting module would produce a windowed Squared Mean Root (SMR).

The delay line 4 is used to compensate for the delay introduced by the WMT module 3. For example, if the WMT module uses a 2nd order Bessel window (a second order lowpass filter with the time constant $\tau_b = 2\tau_0/\sqrt{3}$ and the quality factor $Q=1/\sqrt{3}$), then the delay $\Delta n=[2\tau_0 f_s + \frac{1}{2}]$ may be used, where $f_s$ is the sampling frequency.

An optional LFE filter 5 may be deployed to suppress the non-impulsive component of the interference and/or to increase the peakedness of the interference in order to enhance the ANDL effectiveness, as discussed earlier in this section and in Sections 12 and 13. Further, an optional module 6 may comprise additional processing/filtering components, such as a decimation filter and/or an equalization filter (e.g., to compensate, if needed, for the effects of the LFE filter).

FIG. 156 provides a schematic illustration of improving wireless and/or wired communications receivers (e.g. through providing resistance to man-made interference) by means of deploying analog or digital NDLs/ANDLs. As discussed earlier, the improvements may be achieved by deploying analog NDLs/ANDLs (e.g. by replacing the respective analog linear filters such as antialiasing filters) in the analog front end of the receiver. Alternatively, wider-bandwidth analog filters may be employed in the analog part of the receiver, and an ADC with a respectively higher sampling rate may be employed in the digital part. Digital NDLs/ANDLs may then be used to reduce the bandwidth of the input digital signal while also reducing non-Gaussian interference affecting a narrower-band signal of interest. Then the output of the NDLs/ANDLs may be (optionally) downsampled, and passed to the subsequent digital signal processing.

It should be understood that the specific examples of digital NDLs/ANDLs given above are presented for illustration only, and are not limitative of the claimed invention. Their various modifications within the spirit and scope of the invention will be obvious to one skilled in the art.

REFERENCES

[1] Assessment of compatibility of planned LightSquared Ancillary Terrestrial Component transmissions in the 1526-1536 MHz band with certified aviation GPS receivers. Federal Aviation Administration status report, 25 Jan. 2012.

[2] M. Abramowitz and I. A. Stegun, editors. *Handbook of Mathematical Functions with Formulas, Graphs, and Mathematical Tables*. 9th printing. New York: Dover, 1972.

[3] J. F. Adlard, T. C. Tozer, and A. G. Burr. Interference rejection in impulsive noise for VLF communications. *IEEE Proceedings of Military Communications Conference*, 1: 296-300, 1999.

[4] S. N. Ahmed. *Physics and Engineering of Radiation Detection*, chapter 8.3 "Pulse Shaping", pages 480-490. Elsevier, 2007.

[5] S. Ambike, J. Ilow, and D. Hatzinakos. Detection for binary transmission in a mixture of gaussian noise and impulsive noise modeled as an alpha-stable process. *IEEE Signal Processing Letters*, 1 (3): 55-57, 1994.

[6] S. H. Ardalan and J. J. Paulos. An analysis of nonlinear behavior in delta-sigma modulators. *IEEE Transactions on Circuits and Systems*, CAS-34 (6), 1987.

[7] G. B. Arfken, H. J. Weber, and F. E. Harris. *Mathematical Methods for Physicists: A Comprehensive Guide*. Academic Press, 7th edition, 2012.

[8] S. A. Bhatti, Q. Shan, R. Atkinson, M. Vieira, and I. A. Glover. Vulnerability of Zigbee to impulsive noise in electricity substations. In *General Assembly and Scientific Symposium*, 2011 XXXth URSI, 13-20 Aug. 2011.

[9] R. Bracewell. *The Fourier Transform and Its Applications*, chapter "Heaviside's Unit Step Function, H(x)", pages 61-65. McGraw-Hill, New York, 3rd edition, 2000.

[10] R. N. Bracewell. *The Fourier Transform and Its Applications*, chapter "The Hilbert transform", pages 359-367. McGraw-Hill, 3rd edition, 2000.

[11] K. Bult and H. Wallinga. A CMOS analog continuous-time delay line with adaptive delay-time control. *IEEE Journal of Solid-State Circuits (JCCS)*, 23 (3): 759-766, 1988.

[12] J. Carey. Noise wars: Projected capacitance strikes back against internal noise. *EDN*, pages 61-65, Jan. 19, 2012.

[13] A. Chopra. *Modeling and Mitigation of Interference in Wireless Receivers with Multiple Antennae*. Phd thesis, The University of Texas at Austin, December 2011.

[14] L. Cohen. *Time-frequency analysis*. Prentice-Hall, Englewood, N.J., 1995.

[15] A. Díaz-Sánchez, J. Ramírez-Angulo, A. Lopez-Martin, and E. Sánchez-Sinencio. A fully parallel CMOS analog median filter. *IEEE Transactions on Circuits and Systems II: Express Briefs*, 51 (3): 116-123, 2004.

[16] P. A. M. Dirac. *The Principles of Quantum Mechanics*. Oxford University Press, London, 4th edition, 1958.

[17] R. Dragomir, S. Puscoci, and D. Dragomir. A synthetic impulse noise environment for DSL access networks. In *Proceedings of the 2nd International conference on Circuits, Systems, Control, Signals (CSCS'11)*, pages 116-119, 2011.

[18] C. Fischer. Analysis of cellular CDMA systems under UWB interference. In *International Zurich Seminar on Communications*, pages 130-133, 2006.

[19] T. B. Gabrielson. Mechanical-thermal noise in micromachined acoustic and vibration sensors. *IEEE Transactions on Electron Devices*, 40 (5): 903-909, 1993.

[20] V. Guillet, G. Lamarque, P. Ravier, and C. Léger. Improving the power line communication signal-to-noise ratio during a resistive load commutation. *Journal of Communications*, 4 (2): 126-132, 2009.

[21] A. Hyvärinen, J. Karhunen, and E. Oja. *Independent component analysis*. Wiley, New York, 2001.

[22] E. Janssen and A. van Roermund. *Look-Ahead Based Sigma-Delta Modulation*. Springer, 2011.

[23] A. Ü. Keskin, K. Pal, and E. Hancioglu. Resistorless first-order all-pass filter with electronic tuning. *Int. J. Electron. Commun. (AEÜ)*, 62: 304-306, 2008.

[24] F. Leferink, F. Silva, J. Catrysse, S. Batterman, V. Beauvois, and A. Roc'h. Man-made noise in our living environments. *Radio Science Bulletin*, (334): 49-57, September 2010.

[25] H.-N. Lin. *Wireless Communications and Networks—Recent Advances*, chapter "Analysis of Platform Noise Effect on Performance of Wireless Communication Devices". InTech, 2012.

[26] S. R. Mallipeddy and R. S. Kshetrimayum. Impact of UWB interference on IEEE 802.11a WLAN system. In *National Conference on Communications (NCC)*, 2010.

[27] B. A. Minch. Analysis and synthesis of static translinear circuits. Technical Report CSL-TR-2000-1002, Cornell University, Ithaca, N.Y., March 2000.

[28] N. Minhaj. OTA-based non-inverting and inverting precision full-wave rectifier circuits without diodes. *International Journal of Recent Trends in Engineering*, 1 (3): 72-75, 2009.

[29] F. Mohd-Yasin, D. J. Nagel, and C. E. Korman. Noise in MEMS. *Meas. Sci. Technol.*, 21 (012001), 2010.

[30] A. V. Nikitin. Method and apparatus for real-time signal conditioning, processing, analysis, quantification, comparison, and control, 2006, 2008, and 2009. U.S. Pat. No. 7,107,306 (Sep. 12, 2006), U.S. Pat. No. 7,418,469 (Aug. 26, 2008), and U.S. Pat. No. 7,617,270 (Nov. 10, 2009).

[31] A. V. Nikitin. On the interchannel interference in digital communication systems, its impulsive nature, and its mitigation. *EURASIP Journal on Advances in Signal Processing*, 2011 (137), 2011.

[32] A. V. Nikitin. Method and apparatus for adaptive real-time signal conditioning and analysis, 2011. US Patent Application Publication 2011/0112784 (12 May 2011).

[33] A. V. Nikitin and R. L. Davidchack. Signal analysis through analog representation. *Proc. R. Soc. Lond. A*, 459 (2033): 1171-1192, 2003.

[34] A. V. Nikitin and R. L. Davidchack. Method and apparatus for analysis of variables, 2006 and 2007. U.S. Pat. No. 7,133,568 (Nov. 7, 2006) and U.S. Pat. No. 7,242,808 (Jul. 10, 2007).

[35] A. V. Nikitin, M. Epard, J. B. Lancaster, R. L. Lutes, and E. A. Shumaker. Impulsive interference in communication channels and its mitigation by SPART and other nonlinear filters. *EURASIP Journal on Advances in Signal Processing*, 2012 (79), 2012.

[36] Alexei V Nikitin. On the impulsive nature of interchannel interference in digital communication systems. In *Proc. IEEE Radio and Wireless Symposium*, pages 118-121, Phoenix, Ariz., 2011.

[37] C. R. Popa. High-accuracy function synthesizer circuit with applications in signal processing. *EURASIP Journal on Advances in Signal Processing*, 2012 (146), 2012.

[38] J. G. Proakis and D. G. Manolakis. *Digital signal processing: principles, algorithms, and applications*. Prentice Hall, 4th edition, 2006.

[39] R. P. Sallen and E. L. Key. A practical method of designing RC active filters. *IRE Transactions on Circuit Theory*, CT-2: 78-85, 1955.

[40] E. Sánchez-Sinencio, J. Ramírez-Angulo, B. Linares-Barranco, and A. Rodríguez-Vázquez. Operational transconductance amplifier-based nonlinear function syntheses. *IEEE Journal of Solid-State Circuits (JCCS)*, 24 (6): 1576-1586, 1989.

[41] R. Schaumann and M. E. Van Valkenburg. *Design of analog filters*. Oxford University Press, 2001.

[42] R. Schaumann and M. E. Van Valkenburg. *Design of analog filters*, chapter 16. Oxford University Press, 2001.

[43] C. E. Shannon. Communication in the presence of noise. *Proc. Institute of Radio Engineers*, 37 (1): 10-21, January 1949.

[44] I. Shanthi and M. L. Valarmathi. Speckle noise suppression of SAR image using hybrid order statistics filters. *International Journal of Advanced Engineering Sciences and Technologies (IJAEST)*, 5 (2): 229-235, 2011.

[45] K. Slattery and H. Skinner. *Platform Interference in Wireless Systems*. Elsevier, 2008.

[46] G. H. Stauffer. Finding the lumped element varactor diode model. *High Frequecy Electronics*, 2 (6): 22-28, November 2003.

[47] X. Yang and A. P. Petropulu. Co-channel interference modeling and analysis in a Poisson field of interferers in wireless communications. *IEEE Transactions on Signal Processing*, 51 (1): 64-76, 2003.

[48] Y. Zheng. *Operational transconductance amplifiers for gigahertz applications*. Phd thesis, Queen's University, Kingston, Ontario, Canada, September 2008.

Regarding the invention being thus described, it will be obvious that the same may be varied in many ways. Such variations are not to be regarded as a departure from the spirit and scope of the invention, and all such modifications as would be obvious to one skilled in the art are intended to be included within the scope of the claims. It is to be understood that while certain now preferred forms of this invention have been illustrated and described, it is not limited thereto except insofar as such limitations are included in the following claims.

I claim:

1. An apparatus for analog-to-digital conversion capable of converting an input signal into an output signal, wherein said input signal is a physical signal and wherein said output signal is a quantized representation of said input signal, the apparatus comprising a quantizer and a nonlinear loop filter, wherein said nonlinear loop filter comprises a nonlinear filtering stage characterized by a bandwidth and transforming a nonlinear filtering stage input signal into a nonlinear filtering stage output signal, and wherein said bandwidth is a non-increasing function of a magnitude of a difference between said nonlinear filtering stage input signal and a feedback of said nonlinear filtering stage output signal.

2. The apparatus of claim 1 wherein said input signal comprises a signal of interest and an interfering signal affecting said signal of interest, wherein said output signal is characterized by signal quality, and wherein said nonlinear filtering stage is configured to improve said signal quality.

3. The apparatus of claim 1 wherein dependence of said bandwidth on said difference is further characterized by a resolution parameter, wherein said bandwidth remains essentially constant when said magnitude of said difference is smaller than said resolution parameter, and wherein said bandwidth decreases with the increase of said magnitude when said magnitude is larger than said resolution parameter.

4. The apparatus of claim 3 wherein said input signal comprises a signal of interest and an interfering signal affecting said signal of interest, wherein said output signal is characterized by signal quality, and wherein said nonlinear filtering stage is configured to improve said signal quality.

5. The apparatus of claim 3 wherein said resolution parameter is proportional to a measure of central tendency of said magnitude of said difference between said nonlinear filtering stage input signal and a feedback of said nonlinear filtering stage output signal.

6. The apparatus of claim 5 wherein said input signal comprises a signal of interest and an interfering signal affecting said signal of interest, wherein said output signal is characterized by signal quality, and wherein said nonlinear filtering stage is configured to improve said signal quality.

7. The apparatus of claim 1 wherein said bandwidth depends on nonlinear filtering stage filter parameters, wherein at least one of said nonlinear filtering stage filter parameters is a controlled parameter dynamically controlled by said difference between said nonlinear filtering stage input signal and a feedback of said nonlinear filtering stage output signal, and wherein dependence of said controlled parameter on said difference is configured in such a way that said bandwidth is a non-increasing function of said magnitude of said difference.

8. The apparatus of claim 7 wherein said input signal comprises a signal of interest and an interfering signal affecting said signal of interest, wherein said output signal is characterized by signal quality, and wherein said nonlinear filtering stage is configured to improve said signal quality.

9. The apparatus of claim 7 wherein said dependence of said controlled parameter on said difference is further characterized by a resolution parameter, wherein said bandwidth remains essentially constant when said magnitude is smaller than said resolution parameter, and wherein said bandwidth decreases with the increase of said magnitude when said magnitude is larger than said resolution parameter.

10. The apparatus of claim 9 wherein said input signal comprises a signal of interest and an interfering signal affecting said signal of interest, wherein said output signal is characterized by signal quality, and wherein said nonlinear filtering stage is configured to improve said signal quality.

11. The apparatus of claim 9 wherein said resolution parameter is proportional to a measure of central tendency of said magnitude of said difference between said nonlinear filtering stage input signal and a feedback of said nonlinear filtering stage output signal.

12. The apparatus of claim 11 wherein said input signal comprises a signal of interest and an interfering signal affecting said signal of interest, wherein said output signal is characterized by signal quality, and wherein said nonlinear filtering stage is configured to improve said signal quality.

13. The apparatus of claim 1 wherein said nonlinear filtering stage comprises electronic components, wherein said bandwidth depends on values of said electronic components, wherein at least one of said values is a controlled value dynamically controlled by said difference between said nonlinear filtering stage input signal and a feedback of said nonlinear filtering stage output signal, and wherein dependence of said controlled value on said difference is configured in such a way that said bandwidth is a non-increasing function of said magnitude of said difference.

14. The apparatus of claim 13 wherein said input signal comprises a signal of interest and an interfering signal affecting said signal of interest, wherein said output signal is characterized by signal quality, and wherein said nonlinear filtering stage is configured to improve said signal quality.

15. The apparatus of claim 13 wherein dependence of said bandwidth on said difference is further characterized by a resolution parameter, wherein said bandwidth remains essentially constant when said magnitude of said difference is smaller than said resolution parameter, and wherein said bandwidth decreases with the increase of said magnitude when said magnitude is larger than said resolution parameter.

16. The apparatus of claim 15 wherein said input signal comprises a signal of interest and an interfering signal affecting said signal of interest, wherein said output signal is characterized by signal quality, and wherein said nonlinear filtering stage is configured to improve said signal quality.

17. The apparatus of claim 15 wherein said resolution parameter is proportional to a measure of central tendency of said magnitude of said difference between said nonlinear filtering stage input signal and a feedback of said nonlinear filtering stage output signal.

18. The apparatus of claim 17 wherein said input signal comprises a signal of interest and an interfering signal affecting said signal of interest, wherein said output signal is characterized by signal quality, and wherein said nonlinear filtering stage is configured to improve said signal quality.

19. The apparatus of claim 1 wherein said quantizer is selected from the group consisting of a digital quantizer and an analog quantizer.

20. The apparatus of claim 19 wherein said input signal comprises a signal of interest and an interfering signal affecting said signal of interest, wherein said output signal is characterized by signal quality, and wherein said nonlinear filtering stage is configured to improve said signal quality.

21. The apparatus of claim 19 wherein dependence of said bandwidth on said difference is further characterized by a resolution parameter, wherein said bandwidth remains essentially constant when said magnitude of said difference is smaller than said resolution parameter, and wherein said bandwidth decreases with the increase of said magnitude when said magnitude is larger than said resolution parameter.

22. The apparatus of claim 21 wherein said input signal comprises a signal of interest and an interfering signal affecting said signal of interest, wherein said output signal is characterized by signal quality, and wherein said nonlinear filtering stage is configured to improve said signal quality.

23. The apparatus of claim 21 wherein said resolution parameter is proportional to a measure of central tendency of said magnitude of said difference between said nonlinear filtering stage input signal and a feedback of said nonlinear filtering stage output signal.

24. The apparatus of claim 23 wherein said input signal comprises a signal of interest and an interfering signal affecting said signal of interest, wherein said output signal is characterized by signal quality, and wherein said nonlinear filtering stage is configured to improve said signal quality.

25. The apparatus of claim 19 wherein said bandwidth depends on nonlinear filtering stage filter parameters, wherein at least one of said nonlinear filtering stage filter parameters is a controlled parameter dynamically controlled by said difference between said nonlinear filtering stage input signal and a feedback of said nonlinear filtering stage output signal, and wherein dependence of said controlled parameter on said difference is configured in such a way that said bandwidth is a non-increasing function of said magnitude of said difference.

26. The apparatus of claim 25 wherein said input signal comprises a signal of interest and an interfering signal affecting said signal of interest, wherein said output signal is characterized by signal quality, and wherein said nonlinear filtering stage is configured to improve said signal quality.

27. The apparatus of claim 25 wherein said dependence of said controlled parameter on said difference is further characterized by a resolution parameter, wherein said bandwidth remains essentially constant when said magnitude is smaller than said resolution parameter, and wherein said bandwidth decreases with the increase of said magnitude when said magnitude is larger than said resolution parameter.

28. The apparatus of claim 27 wherein said input signal comprises a signal of interest and an interfering signal affecting said signal of interest, wherein said output signal is characterized by signal quality, and wherein said nonlinear filtering stage is configured to improve said signal quality.

29. The apparatus of claim 27 wherein said resolution parameter is proportional to a measure of central tendency of said magnitude of said difference between said nonlinear filtering stage input signal and a feedback of said nonlinear filtering stage output signal.

30. The apparatus of claim 29 wherein said input signal comprises a signal of interest and an interfering signal affecting said signal of interest, wherein said output signal is characterized by signal quality, and wherein said nonlinear filtering stage is configured to improve said signal quality.

31. The apparatus of claim 19 wherein said nonlinear filtering stage comprises electronic components, wherein said bandwidth depends on values of said electronic components, wherein at least one of said values is a controlled value dynamically controlled by said difference between said nonlinear filtering stage input signal and a feedback of said nonlinear filtering stage output signal, and wherein dependence of said controlled value on said difference is configured in such a way that said bandwidth is a non-increasing function of said magnitude of said difference.

32. The apparatus of claim 31 wherein said input signal comprises a signal of interest and an interfering signal affecting said signal of interest, wherein said output signal is characterized by signal quality, and wherein said nonlinear filtering stage is configured to improve said signal quality.

33. The apparatus of claim 31 wherein dependence of said bandwidth on said difference is further characterized by a resolution parameter, wherein said bandwidth remains essentially constant when said magnitude of said difference is smaller than said resolution parameter, and wherein said bandwidth decreases with the increase of said magnitude when said magnitude is larger than said resolution parameter.

34. The apparatus of claim 33 wherein said input signal comprises a signal of interest and an interfering signal affecting said signal of interest, wherein said output signal is characterized by signal quality, and wherein said nonlinear filtering stage is configured to improve said signal quality.

35. The apparatus of claim 33 wherein said resolution parameter is proportional to a measure of central tendency of said magnitude of said difference between said nonlinear filtering stage input signal and a feedback of said nonlinear filtering stage output signal.

36. The apparatus of claim 35 wherein said input signal comprises a signal of interest and an interfering signal affecting said signal of interest, wherein said output signal is characterized by signal quality, and wherein said nonlinear filtering stage is configured to improve said signal quality.

* * * * *